(12) United States Patent
Yu et al.

(10) Patent No.: US 11,150,494 B2
(45) Date of Patent: Oct. 19, 2021

(54) WAVEGUIDE MODULATOR STRUCTURES

(71) Applicant: ROCKLEY PHOTONICS LIMITED, London (GB)

(72) Inventors: Guomin Yu, Glendora, CA (US); Hooman Abediasl, Pasadena, CA (US); Aaron L. Birkbeck, San Diego, CA (US); Jeffrey Driscoll, San Jose, CA (US); Haydn Frederick Jones, Reading (GB); Damiana Lerose, Pasadena, CA (US); Amit Singh Nagra, Altadena, CA (US); David Arlo Nelson, Fort Collins, CO (US); Dong Yoon Oh, Alhambra, CA (US); Pradeep Srinivasan, Fremont, CA (US); Aaron John Zilkie, Pasadena, CA (US)

(73) Assignee: Rockley Photonics Limited, Oxford (GB)

( * ) Notice: Subject to any disclaimer, the term of this patent is extended or adjusted under 35 U.S.C. 154(b) by 0 days.

(21) Appl. No.: 16/550,141

(22) Filed: Aug. 23, 2019

(65) Prior Publication Data

US 2020/0124878 A1 Apr. 23, 2020

Related U.S. Application Data

(63) Continuation-in-part of application No. 16/420,096, filed on May 22, 2019, and a continuation-in-part of
(Continued)

(30) Foreign Application Priority Data

Jul. 18, 2017 (GB) ...................................... 1711525

(51) Int. Cl.
*G02F 1/01* (2006.01)
*G02F 1/225* (2006.01)
(Continued)

(52) U.S. Cl.
CPC ............ *G02F 1/011* (2013.01); *G01J 1/0425* (2013.01); *G02B 6/131* (2013.01); *G02B 6/136* (2013.01);
(Continued)

(58) Field of Classification Search
CPC ....................................................... G02F 1/011
See application file for complete search history.

(56) References Cited

U.S. PATENT DOCUMENTS

| | | |
|---|---|---|
| 4,093,345 A | 6/1978 | Logan et al. |
| 4,720,468 A | 1/1988 | Menigaux et al. |

(Continued)

FOREIGN PATENT DOCUMENTS

| | | |
|---|---|---|
| CN | 101529306 A | 9/2009 |
| CN | 101868745 A | 10/2010 |

(Continued)

OTHER PUBLICATIONS

Kimoto, Koji et al., "Metastable ultrathin crystal in thermally grown SiO2 film on Si substrate", AIP Advances, Nov. 12, 2012, pp. 042144-1 through 042144-5, vol. 2, AIP Publishing.
(Continued)

*Primary Examiner* — Rhonda S Peace

(74) *Attorney, Agent, or Firm* — Lewis Roca Rothgerber Christie LLP

(57) ABSTRACT

A Mach-Zehnder waveguide modulator. In some embodiments, the Mach-Zehnder waveguide modulator includes a first arm including a first optical waveguide, and a second arm including a second optical waveguide. The first optical waveguide includes a junction, and the Mach-Zehnder waveguide modulator further includes a plurality of electrodes for providing a bias across the junction to enable control of the phase of light travelling through the junction.

18 Claims, 90 Drawing Sheets

Related U.S. Application Data application No. 16/393,889, filed on Apr. 24, 2019, and a continuation-in-part of application No. 16/231,257, filed on Dec. 21, 2018, now Pat. No. 10,678,115, and a continuation-in-part of application No. 16/144,994, filed on Sep. 27, 2018, now Pat. No. 10,401,656, and a continuation-in-part of application No. PCT/EP2017/080216, filed on Nov. 23, 2017, which is a continuation-in-part of application No. 15/700,053, filed on Sep. 8, 2017, now Pat. No. 10,133,094, and a continuation of application No. 15/700,053, filed on Sep. 8, 2017, now Pat. No. 10,133,094, and a continuation-in-part of application No. 15/555,431, filed as application No. PCT/GB2016/050570 on Mar. 4, 2016, now Pat. No. 10,191,350.

(60) Provisional application No. 62/750,226, filed on Oct. 24, 2018, provisional application No. 62/528,900, filed on Jul. 5, 2017, provisional application No. 62/427,132, filed on Nov. 28, 2016, provisional application No. 62/426,117, filed on Nov. 23, 2016, provisional application No. 62/152,696, filed on Apr. 24, 2015, provisional application No. 62/128,949, filed on Mar. 5, 2015.

(51) Int. Cl.
  *G02B 6/136* (2006.01)
  *G01J 1/04* (2006.01)
  *H01L 27/30* (2006.01)
  *H01L 21/78* (2006.01)
  *G02B 6/13* (2006.01)

(52) U.S. Cl.
  CPC ............ *G02F 1/0102* (2013.01); *G02F 1/225* (2013.01); *H01L 21/78* (2013.01); *H01L 27/30* (2013.01)

(56) References Cited

U.S. PATENT DOCUMENTS

| | | |
|---|---|---|
| 4,739,287 A | 4/1988 | Staupendahl et al. |
| 4,943,133 A | 7/1990 | Deri et al. |
| 5,438,444 A | 8/1995 | Tayonaka et al. |
| 5,446,751 A | 8/1995 | Wake |
| 5,511,088 A | 4/1996 | Loualiche et al. |
| 5,524,076 A | 6/1996 | Rolland et al. |
| 5,559,624 A | 9/1996 | Darcie et al. |
| 5,581,396 A | 12/1996 | Kubota et al. |
| 5,715,076 A | 2/1998 | Alexander et al. |
| 5,726,784 A | 3/1998 | Alexander et al. |
| 5,757,986 A | 5/1998 | Crampton et al. |
| 5,784,184 A | 7/1998 | Alexander et al. |
| 5,861,966 A | 1/1999 | Ortel |
| 5,908,305 A | 6/1999 | Crampton et al. |
| 5,917,642 A | 6/1999 | O'Donnell et al. |
| 5,999,300 A | 12/1999 | Davies et al. |
| 6,229,189 B1 | 5/2001 | Yap et al. |
| 6,233,077 B1 | 5/2001 | Alexander et al. |
| 6,298,177 B1 | 10/2001 | House |
| 6,349,106 B1 | 2/2002 | Coldren |
| 6,396,801 B1 | 5/2002 | Upton et al. |
| 6,445,839 B1 | 9/2002 | Miller |
| 6,549,313 B1 | 4/2003 | Doerr et al. |
| 6,563,627 B2 | 5/2003 | Yoo |
| 6,580,739 B1 | 6/2003 | Coldren |
| 6,584,239 B1 | 6/2003 | Dawnay et al. |
| 6,597,824 B2 | 7/2003 | Newberg et al. |
| 6,614,819 B1 | 9/2003 | Fish et al. |
| 6,636,662 B1 | 10/2003 | Thompson et al. |
| 6,678,479 B1 | 1/2004 | Naoe et al. |
| 6,680,791 B2 | 1/2004 | Demir et al. |
| 6,710,911 B2 | 3/2004 | LoCascio et al. |
| 6,768,827 B2 | 7/2004 | Yoo |
| 6,845,198 B2 | 1/2005 | Montgomery et al. |
| 6,873,763 B2 | 3/2005 | Nikonov |
| 7,031,617 B2 | 4/2006 | Zucchelli et al. |
| 7,085,443 B1 | 8/2006 | Gunn, III et al. |
| 7,092,609 B2 | 8/2006 | Yegnanarayanan et al. |
| 7,133,576 B2 | 11/2006 | Coldren et al. |
| 7,174,058 B2 | 2/2007 | Coldren et al. |
| 7,180,148 B2 | 2/2007 | Morse |
| 7,184,438 B2 | 2/2007 | Loge et al. |
| 7,256,929 B1 | 8/2007 | Rong et al. |
| 7,394,948 B1 | 7/2008 | Zheng et al. |
| 7,418,166 B1 | 8/2008 | Kapur et al. |
| 7,505,686 B2 | 3/2009 | Jennen |
| 7,536,067 B2 | 5/2009 | Handelman |
| 7,558,487 B2 | 7/2009 | Liu et al. |
| 7,570,844 B2 | 8/2009 | Handelman |
| 7,603,016 B1 | 10/2009 | Soref |
| 7,747,122 B2 | 6/2010 | Shetrit et al. |
| 7,811,844 B2 | 10/2010 | Carothers et al. |
| 7,826,700 B2 | 11/2010 | Knights et al. |
| 7,885,492 B2 | 2/2011 | Welch et al. |
| 7,916,377 B2 | 3/2011 | Witzens et al. |
| 7,920,790 B2 | 4/2011 | Toliver |
| 7,941,014 B1 | 5/2011 | Watts et al. |
| 8,053,790 B2 | 11/2011 | Feng et al. |
| 8,073,029 B2 | 12/2011 | Hashimoto |
| 8,093,080 B2 | 1/2012 | Liao et al. |
| 8,160,404 B2 | 4/2012 | Pan et al. |
| 8,242,432 B2 | 8/2012 | Feng et al. |
| 8,346,028 B2 | 1/2013 | Feng et al. |
| 8,362,494 B2 | 1/2013 | Lo et al. |
| 8,401,385 B2 | 3/2013 | Spivey et al. |
| 8,403,571 B2 | 3/2013 | Walker |
| 8,410,566 B2 | 4/2013 | Qian et al. |
| 8,493,976 B2 | 7/2013 | Lin |
| 8,693,811 B2 | 4/2014 | Morini et al. |
| 8,724,988 B2 | 5/2014 | Andriolli et al. |
| 8,737,772 B2 | 5/2014 | Dong et al. |
| 8,774,625 B2 | 7/2014 | Binkert et al. |
| 8,792,787 B1 | 7/2014 | Zhao et al. |
| 8,809,906 B2 | 8/2014 | Zhu et al. |
| 8,817,354 B2 | 8/2014 | Feng et al. |
| 8,942,559 B2 | 1/2015 | Binkert et al. |
| 9,110,348 B2 | 8/2015 | Goi et al. |
| 9,128,309 B1 | 9/2015 | Robertson |
| 9,142,698 B1 | 9/2015 | Cunningham et al. |
| 9,182,546 B2 | 11/2015 | Prosyk et al. |
| 9,229,249 B2 | 1/2016 | Akiyama |
| 9,279,936 B2 | 3/2016 | Qian et al. |
| 9,282,384 B1 | 3/2016 | Graves |
| 9,306,698 B2 | 4/2016 | Chen et al. |
| 9,329,415 B2 | 5/2016 | Song et al. |
| 9,411,177 B2 * | 8/2016 | Cunningham ........... G02B 6/12 |
| 9,438,970 B2 | 9/2016 | Jones et al. |
| 9,448,425 B2 | 9/2016 | Ogawa et al. |
| 9,513,498 B2 | 12/2016 | Jones et al. |
| 9,541,775 B2 | 1/2017 | Ayazi et al. |
| 9,548,811 B2 | 1/2017 | Kucharski et al. |
| 9,575,337 B2 | 2/2017 | Adams et al. |
| 9,668,037 B2 | 5/2017 | Jones et al. |
| 9,733,542 B2 | 8/2017 | Bai |
| 10,128,957 B2 | 11/2018 | Welch et al. |
| 10,133,094 B1 | 11/2018 | Yu et al. |
| 10,185,203 B1 | 1/2019 | Yu et al. |
| 10,191,350 B2 | 1/2019 | Yu et al. |
| 10,216,059 B2 | 2/2019 | Yu et al. |
| 10,222,677 B2 | 3/2019 | Yu et al. |
| 10,231,038 B2 | 3/2019 | Rickman et al. |
| 10,401,656 B2 | 9/2019 | Yu et al. |
| 2001/0030787 A1 | 10/2001 | Tajima |
| 2001/0040907 A1 | 11/2001 | Chakrabarti |
| 2002/0048289 A1 | 4/2002 | Atanackovic et al. |
| 2002/0102046 A1 | 8/2002 | Newberg et al. |
| 2002/0154847 A1 | 10/2002 | Dutt et al. |
| 2002/0159117 A1 | 10/2002 | Nakajima et al. |
| 2002/0186453 A1 | 12/2002 | Yoo |
| 2003/0031445 A1 | 2/2003 | Parhami et al. |

(56) References Cited

U.S. PATENT DOCUMENTS

| | | |
|---|---|---|
| 2003/0063362 A1 | 4/2003 | Demir et al. |
| 2003/0095737 A1 | 5/2003 | Welch et al. |
| 2003/0133641 A1 | 7/2003 | Yoo |
| 2003/0142943 A1 | 7/2003 | Yegnanarayanan et al. |
| 2003/0156789 A1 | 8/2003 | Bhardwaj et al. |
| 2003/0176075 A1 | 9/2003 | Khan et al. |
| 2003/0223672 A1 | 12/2003 | Joyner et al. |
| 2004/0008395 A1 | 1/2004 | McBrien et al. |
| 2004/0013429 A1 | 1/2004 | Duelk et al. |
| 2004/0033004 A1 | 2/2004 | Welch et al. |
| 2004/0126057 A1 | 7/2004 | Yoo |
| 2004/0207016 A1 | 10/2004 | Patel et al. |
| 2004/0208454 A1 | 10/2004 | Montgomery et al. |
| 2004/0246557 A1 | 12/2004 | Lefevre et al. |
| 2005/0053377 A1 | 3/2005 | Yoo |
| 2005/0089269 A1 | 4/2005 | Cheng et al. |
| 2005/0089273 A1 | 4/2005 | Squires et al. |
| 2005/0286850 A1 | 12/2005 | German et al. |
| 2006/0140528 A1 | 6/2006 | Coldren et al. |
| 2006/0257065 A1 | 11/2006 | Coldren et al. |
| 2007/0065076 A1 | 3/2007 | Grek et al. |
| 2007/0104441 A1 | 5/2007 | Ahn et al. |
| 2007/0116398 A1 | 5/2007 | Pan et al. |
| 2007/0280309 A1 | 12/2007 | Liu |
| 2008/0013881 A1 | 1/2008 | Welch et al. |
| 2008/0095486 A1 | 4/2008 | Shastri et al. |
| 2008/0138088 A1 | 6/2008 | Welch et al. |
| 2009/0003841 A1 | 1/2009 | Ghidini et al. |
| 2009/0169149 A1 | 7/2009 | Block |
| 2009/0185804 A1 | 7/2009 | Kai et al. |
| 2009/0245298 A1 | 10/2009 | Sysak et al. |
| 2010/0002994 A1 | 1/2010 | Baehr-Jones et al. |
| 2010/0060970 A1 | 3/2010 | Chen |
| 2010/0060972 A1 | 3/2010 | Kucharski et al. |
| 2010/0078680 A1 | 4/2010 | Cheng et al. |
| 2010/0080504 A1 | 4/2010 | Shetrit et al. |
| 2010/0128336 A1 | 5/2010 | Witzens et al. |
| 2010/0135347 A1 | 6/2010 | Deladurantaye et al. |
| 2010/0200733 A1 | 8/2010 | McLaren et al. |
| 2010/0290732 A1 | 11/2010 | Gill |
| 2010/0296768 A1 | 11/2010 | Wu et al. |
| 2010/0310208 A1 | 12/2010 | Wang et al. |
| 2010/0330727 A1 | 12/2010 | Hill et al. |
| 2011/0013905 A1 | 1/2011 | Wang et al. |
| 2011/0013911 A1 | 1/2011 | Alexander et al. |
| 2011/0142390 A1 | 6/2011 | Feng et al. |
| 2011/0142391 A1 | 6/2011 | Asghari et al. |
| 2011/0158582 A1 | 6/2011 | Su et al. |
| 2011/0170819 A1 | 7/2011 | Zheng et al. |
| 2011/0180795 A1 | 7/2011 | Lo et al. |
| 2011/0200333 A1 | 8/2011 | Schrenk et al. |
| 2011/0293279 A1 | 12/2011 | Lam et al. |
| 2012/0080672 A1 | 4/2012 | Rong et al. |
| 2012/0093519 A1 | 4/2012 | Lipson et al. |
| 2012/0189239 A1 | 7/2012 | Tu et al. |
| 2012/0207424 A1 | 8/2012 | Zheng et al. |
| 2012/0213531 A1 | 8/2012 | Nazarathy et al. |
| 2012/0328292 A1 | 12/2012 | Testa et al. |
| 2013/0020556 A1 | 1/2013 | Bowers |
| 2013/0051727 A1 | 2/2013 | Mizrahi et al. |
| 2013/0051798 A1 | 2/2013 | Chen et al. |
| 2013/0058606 A1 | 3/2013 | Thomson et al. |
| 2013/0089340 A1 | 4/2013 | Huang et al. |
| 2013/0094797 A1 | 4/2013 | Zheng et al. |
| 2013/0182305 A1 | 7/2013 | Feng et al. |
| 2013/0188902 A1 | 7/2013 | Gardes et al. |
| 2013/0259483 A1 | 10/2013 | McLaren et al. |
| 2013/0315599 A1 | 11/2013 | Lam et al. |
| 2014/0161457 A1 | 6/2014 | Ho et al. |
| 2014/0226976 A1 | 8/2014 | Britz et al. |
| 2014/0307300 A1 | 10/2014 | Yang et al. |
| 2014/0341498 A1 | 11/2014 | Manouvrier |
| 2014/0341499 A1 | 11/2014 | Manouvrier |
| 2014/0355925 A1 | 12/2014 | Manouvrier |
| 2015/0010307 A1 | 1/2015 | Zhong et al. |
| 2015/0071651 A1 | 3/2015 | Asmanis et al. |
| 2015/0162182 A1 | 6/2015 | Edmonds et al. |
| 2015/0277041 A1 | 10/2015 | Nakagawa et al. |
| 2015/0277157 A1 | 10/2015 | Jones et al. |
| 2015/0293384 A1 | 10/2015 | Ogawa et al. |
| 2015/0346520 A1 | 12/2015 | Lee et al. |
| 2015/0373433 A1 | 12/2015 | McLaren et al. |
| 2016/0080844 A1 | 3/2016 | Jones et al. |
| 2016/0103382 A1 | 4/2016 | Liboiron-Ladouceur et al. |
| 2016/0211921 A1 | 7/2016 | Welch et al. |
| 2016/0218811 A1 | 7/2016 | Chen et al. |
| 2016/0358954 A1 | 12/2016 | Hoyos et al. |
| 2016/0365929 A1 | 12/2016 | Nakamura et al. |
| 2017/0082876 A1 | 3/2017 | Jones et al. |
| 2017/0155452 A1 | 6/2017 | Nagra et al. |
| 2017/0250758 A1 | 8/2017 | Kikuchi |
| 2017/0288781 A1 | 10/2017 | Carpentier et al. |
| 2018/0046057 A1 | 2/2018 | Yu et al. |
| 2018/0101082 A1 | 4/2018 | Yu et al. |
| 2018/0217469 A1 | 8/2018 | Yu et al. |
| 2018/0267238 A1 | 9/2018 | Wang et al. |
| 2018/0335569 A1 | 11/2018 | Saito et al. |
| 2018/0335653 A1* | 11/2018 | Mentovich ............ G01M 11/00 |
| 2019/0011799 A1 | 1/2019 | Yu et al. |
| 2019/0146304 A1 | 5/2019 | Yu et al. |
| 2020/0124878 A1* | 4/2020 | Yu ......................... H01L 27/30 |

FOREIGN PATENT DOCUMENTS

| | | |
|---|---|---|
| CN | 101937135 A | 1/2011 |
| CN | 102162137 A | 8/2011 |
| CN | 102713703 A | 10/2012 |
| CN | 102955265 A | 3/2013 |
| CN | 103137777 A | 6/2013 |
| CN | 103907049 A | 7/2014 |
| CN | 104885003 A | 9/2015 |
| CN | 105445854 A | 3/2016 |
| EP | 0 310 058 A2 | 4/1989 |
| EP | 1 761 103 A1 | 3/2007 |
| EP | 3 046 275 A1 | 7/2016 |
| JP | 06-232384 A | 8/1994 |
| JP | 2004-163753 A | 6/2004 |
| JP | 2005-300678 A | 10/2005 |
| WO | WO 91/13375 A1 | 9/1991 |
| WO | WO 92/10782 A1 | 6/1992 |
| WO | WO 02/41663 A2 | 5/2002 |
| WO | WO 02/086575 A1 | 10/2002 |
| WO | WO 2008/024458 A2 | 2/2008 |
| WO | WO 2009/048773 A1 | 4/2009 |
| WO | WO 2011/069225 A1 | 6/2011 |
| WO | WO 2015/060820 A1 | 4/2015 |
| WO | WO 2016/094808 A1 | 6/2016 |
| WO | WO 2016/139484 A1 | 9/2016 |
| WO | WO 2016/154764 A2 | 10/2016 |
| WO | WO 2017/135436 A1 | 8/2017 |
| WO | WO 2017/151055 A1 | 9/2017 |
| WO | WO 2018/096035 A1 | 5/2018 |

OTHER PUBLICATIONS

RefractiveIndex.Info, Refractive index database, https://RefractiveIndex. Info, 2015, 2 pages.
RP Photonics Encyclopedia, Refractive Index, 2015, 3 pages, RP Photonics Consulting GmbH.
U.S. Office Action from U.S. Appl. No. 16/195,774, dated Apr. 20, 2020, 41 pages.
"40Gb/s 2R Optical Regenerator (wavelength converter)", CIP Technologies, Preliminary Datasheet, Nov. 2013, 2 pages.
Bregni, Stefano et al., "Architectures and Performance of AWG-Based Optical Switching Nodes for IP Networks", IEEE Journal on Selected Areas in Communications, Sep. 2003, pp. 1113-1121, vol. 21, No. 7.
Chinese Notification of the First Office Action and Search Report, for Patent Application No. 201580009961.1, dated Sep. 5, 2018, 8 pages.
Chinese Notification of the First Office Action, for Patent Application No. 201710650505.6, dated Mar. 21, 2019, 5 pages.

(56) References Cited

OTHER PUBLICATIONS

Chinese Patent Office Notification of the Second Office Action, for Patent Application No. 201580009961.1, dated May 13, 2019, 5 pages.
Dong, Po et al., "Wavelength-tunable silicon microring modulator", Optics Express, May 10, 2010, pp. 10941-10946, vol. 18, No. 11.
Dong, Po et al., "High-speed low-voltage single-drive push-pull silicon Mach-Zehnder modulators", Optics Express, Mar. 12, 2012, pp. 6163-6169, vol. 20, No. 6.
Dubé-Demers, Raphaël et al., "Low-power DAC-less PAM-4 transmitter using a cascaded microring modulator", Optics Letters, Nov. 15, 2016, pp. 5369-5372, vol. 41, No. 22, Optical Society of America.
Durhuus, Terji et al., "All-Optical Wavelength Conversion by Semiconductor Optical Amplifiers", Journal of Lightwave Technology, Jun. 1996, pp. 942-954, vol. 14, No. 6.
Edagawa, Noboru et al., "Novel Wavelength Converter Using an Electroabsorption Modulator", IEICE Trans. Electron., Aug. 1998, pp. 1251-1257, vol. E81-C, No. 8.
Ellis, A.D. et al., "Error free 100Gbit/s wavelength conversion using grating assisted cross-gain modulation in 2mm long semiconductor amplifier", Electronics Letters, Oct. 1, 1998, pp. 1958-1959, vol. 34, No. 20.
European Patent Office Communication pursuant to Article 94(3) EPC, for Patent Application No. 15 707 725.6, dated Jun. 7, 2019, 7 pages.
Farrell, Nick, "Intel pushes photonic tech for the data center", TechRadar, Apr. 2, 2014, http://www.techradar.com/news/internet/data-centre/intel-pushes-its-photonic-tech-for-the-data-centre-1239198, 6 pages.
Farrington, Nathan et al., "A Demonstration of Ultra-Low-Latency Data Center Optical Circuit Switching," ACM SIGCOMM Computer Communication Review, vol. 42, No. 4, 2012, pp. 95-96.
Farrington, Nathan et al., "Helios: A Hybrid Electrical/Optical Switch Architecture for Modular Data Centers", SIGCOMM'10, Aug. 30-Sep. 3, 2010, 12 Pages, New Delhi, India.
Feng, Dazeng et al., "High-Speed GeSi Electroabsorption Modulator on the SOI Waveguide Platform", IEEE Journal of Selected Topics in Quantum Electronics, Nov./Dec. 2013, 10 pages, vol. 19, No. 6.
Fidaner, Onur et al., "Integrated photonic switches for nanosecond packet-switched optical wavelength conversion", Optics Express, Jan. 9, 2006, pp. 361-368, vol. 14, No. 1.
Fidaner, Onur et al., "Waveguide Electroabsorption Modulator on Si Employing Ge/SiGe Quantum Wells", Optical Society of America, 2007, 1 page.
Foster, Mark A., "Broad-band continuous-wave parametric wavelength conversion in silicon nanowaveguides", Optics Express, Sep. 24, 2007, pp. 12949-12958, vol. 15, No. 20.
Fu, Enjin et al., "Traveling Wave Electrode Design for Ultra Compact Carrier-injection HBT-based Electroabsorption Modulator in a 130nm BiCMOS Process", Proc. of SPIE, 2014, 11 pages, vol. 8989.
Geis, M.W. et al., "Silicon waveguide infrared photodiodes with >35 GHz bandwidth and phototransistors with 50 AW-1 response", Optics Express, Mar. 18, 2009, pp. 5193-5204, vol. 17, No. 7.
Gripp, Jürgen et al., "Optical Switch Fabrics for Ultra-High-Capacity IP Routers", Journal of Lightwave Technology, Nov. 2003, pp. 2839-2850, vol. 21, No. 11.
Hsu, A. et al., "Wavelength Conversion by Dual-Pump Four-Wave Mixing in an Integrated Laser Modulator", IEEE Photonics Technology Letters, Aug. 2003, pp. 1120-1122, vol. 15, No. 8.
Hu, Hao et al., "Ultra-high-speed wavelength conversion in a silicon photonic chip", Optics Express, Sep. 26, 2011, pp. 19886-19894, vol. 19, No. 21.
Hussain, Ashiq et al., "Optimization of Optical Wavelength Conversion in SOI Waveguide", Applied Mechanics and Materials, 2012, 5 pages, vol. 110-116.

International Search Report and Written Opinion of the International Searching Authority, dated Jun. 8, 2015, dated Jun. 15, 2015, Corresponding to PCT/GB2015/050523, 14 pages.
International Search Report and Written Opinion of the International Searching Authority, dated Jun. 8, 2015, dated Sep. 16, 2015, Corresponding to PCT/GB2015/050524, 18 pages.
International Search Report and Written Opinion of the International Searching Authority, dated Aug. 29, 2018, Corresponding to PCT/EP2018/062269, 15 pages.
International Search Report and Written Opinion of the International Searching Authority, dated Jun. 6, 2016, Corresponding to PCT/GB2016/050570, 13 pages.
International Search Report and Written Opinion of the International Searching Authority, dated Mar. 28, 2018, Corresponding to PCT/EP2017/083028, 14 pages.
International Search Report and Written Opinion of the International Searching Authority, dated Mar. 8, 2018, Corresponding to PCT/EP2017/080216, 14 pages.
International Search Report and Written Opinion of the International Searching Authority, dated Mar. 8, 2018, Corresponding to PCT/EP2017/080221, 13 pages.
International Search Report and Written Opinion of the International Searching Authority, dated May 26, 2017, Corresponding to PCT/IT2017/000004, 13 pages.
International Search Report and Written Opinion of the International Searching Authority, dated May 8, 2015, Corresponding to PCT/GB2015/050520, 11 pages.
International Search Report and Written Opinion of the International Searching Authority, dated Sep. 11, 2017, Corresponding to PCT/GB2017/051998, 15 pages.
Kachris, Christoforos et al., "A Survey on Optical Interconnects for Data Centers", IEEE Communications Surveys & Tutorials, vol. 14, No. 4, Fourth Quarter 2012, pp. 1021-1036.
Kachris, Christoforos et al., "Optical Interconnection Networks in Data Centers: Recent Trends and Future Challenges", IEEE Communications Magazine, Optical Technologies for Data Center Networks, Sep. 2013, pp. 39-45.
Knoll, Dieter et al., "BiCMOS Silicon Photonics Platform for Fabrication of High-Bandwidth Electronic-Photonic Integrated Circuits", IEEE, 2016, pp. 46-49.
Lal, Vikrant et al., "Monolithic Wavelength Converters for High-Speed Packet-Switched Optical Networks", IEEE Journal of Selected Topics in Quantum Electronics, Jan./Feb. 2007, pp. 49-57, vol. 13, No. 1.
Leuthold, J. et al., "All-optical wavelength conversion between 10 and 100 Gb/s with SOA delayed-interference configuration", Optical and Quantum Electronics, 2001, pp. 939-952, vol. 33, Nos. 7-10.
Lever, L. et al., "Adiabatic mode coupling between SiGe photonic devices and SOI waveguides", Optics Express, Dec. 31, 2012, pp. 29500-29506, vol. 20, No. 28.
Liao, Ling et al., "High speed silicon Mach-Zehnder modulator", Optics Express, Apr. 18, 2005, pp. 3129-3135, vol. 13, No. 8.
Liu, Ansheng et al., "High-speed optical modulation based on carrier depletion in a silicon waveguide", Optics Express, Jan. 22, 2007, pp. 660-668, vol. 15, No. 2.
Liu, Y. et al., "Error-Free 320-Gb/s All-Optical Wavelength Conversion Using a Single Semiconductor Optical Amplifier", Journal of Lightwave Technology, Jan. 2007, pp. 103-108, vol. 25, No. 1.
Maxwell, G. et al., "WDM-enabled, 40Gb/s Hybrid Integrated All-optical Regenerator", ECOC 2005 Proceedings, 2005, pp. 15-16, vol. 6.
Meuer, Christian et al., "80 Gb/s wavelength conversion using a quantum-dot semiconductor optical amplifier and optical filtering", Optics Express, Mar. 3, 2011, pp. 5134-5142, vol. 19, No. 6.
Moerman, Ingrid et al., "A Review on Fabrication Technologies for the Monolithic Integration of Tapers with III-V Semiconductor Devices", IEEE Journal of Selected Topics in Quantum Electronics, Dec. 1997, pp. 1308-1320, vol. 3, No. 6.
Nakamura, Shigeru et al., "168-Gb/s All-Optical Wavelength Conversion With a Symmetric-Mach-Zehnder-Type Switch", IEEE Photonics Technology Letters, Oct. 2001, pp. 1091-1093, vol. 13, No. 10.

(56) References Cited

OTHER PUBLICATIONS

Neilson, David T., "Photonics for Switching and Routing", IEEE Journal of Selected Topics in Quantum Electronics, Jul./Aug. 2006, pp. 669-678, vol. 12, No. 4.
Ngo, Hung Q. et al, "Nonblocking WDM Switches Based on Arrayed Waveguide Grating and Limited Wavelength Conversion", Proceedings from the 23rd Conference of the IEEE Communications Society, 2004, 11 pages.
Ngo, Hung Q. et al., "Constructions and Analyses of Nonblocking WDM Switches Based on Arrayed Waveguide Grating and Limited Wavelength Conversion", IEEE/ACM Transactions on Networking, Feb. 2006, pp. 205-217, vol. 14, No. 1.
Ngo, Hung Q. et al., "Optical Switching Networks with Minimum Number of Limited Range Wavelength Converters," 24th Annual Joint Conference of the IEEE Computer and Communications Societies. Proceedings IEEE vol. 2, 2005, pp. 1128-1138.
Nishimura, Kohsuke et al., "Optical wavelength conversion by electro-absorption modulators", Active and Passive Optical Components for WDM Communications IV, Proceedings of SPIE, 2004, pp. 234-243, vol. 5595.
Partial English translation of the Chinese Notification of the First Office Action and Search Report, for Patent Application No. 201580009961.1, dated Sep. 5, 2018, 12 pages.
Partial English translation of the Chinese Patent Office Notification of the Second Office Action, for Patent Application No. 201580009961. 1, dated May 13, 2019, 7 pages.
Partial English translation of the Chinese Notification of the First Office Action, for Patent Application No. 201710650505.6, dated Mar. 21, 2019, 7 pages.
Proietti, Robert et al., "TONAK: A Distributed Low-latency and Scalable Optical Switch Architecture," 39th European Conference and Exhibition on Optical Communication, 2013, pp. 1005-1007.
Proietti, Roberto et al., "40 Gb/s 8×8 Low-latency Optical Switch for Data Centers," OSA/OFC/NFOEC 2011, 3 pages.
Quad 40Gb/s 2R Optical Regenerator, CIP Technologies, Preliminary Datasheet, Nov. 2013, 2 pages.
Reed, Graham T. et al., "Silicon optical modulators", Materials Today, Jan. 2005, pp. 40-50, vol. 8, No. 1.
Roelkens, Gunther et al., "III-V-on-Silicon Photonic Devices for Optical Communication and Sensing", Photonics, 2015, 29 pages, vol. 2, No. 3.
Rouifed, Mohamed-Saïd et al., "Advances Toward Ge/SiGe Quantum-Well Waveguide Modulators at 1.3μm", IEEE Journal of Selected Topics in Quantum Electronics, Jul./Aug. 2014, 7 pages, vol. 20, No. 4.
Segawa, Toru et al., "All-optical wavelength-routing switch with monolithically integrated filter-free tunable wavelength converters and an AWG", Optics Express, Feb. 17, 2010, pp. 4340-4345, vol. 18, No. 5.
Stamatiadis, C. et al., "Fabrication and experimental demonstration of the first 160 Gb/s hybrid silicon-on-insulator integrated all-optical wavelength converter", Optics Express, Feb. 1, 2012, pp. 3825-3831, vol. 20, No. 4.
Stamatiadis, Christos et al., "Photonic Provisioning Using a Packaged SOI Hybrid All-Optical Wavelength Converter in a Meshed Optical Network Testbed", Journal of Lightwave Technology, Sep. 15, 2012, pp. 2941-2947, vol. 30, No. 18.
Stubkjaer, Kristian E., "Semiconductor Optical Amplifier-Based All-Optical Gates for High-Speed Optical Processing", IEEE Journal on Selected Topics in Quantum Electronics, Nov./Dec. 2000, pp. 1428-1435, vol. 6, No. 6.
Summers, Joseph A. et al., "Monolithically Integrated Multi-Stage All-Optical 10Gbps Push-Pull Wavelength Converter", Optical Fiber Communication Conference, 2007, 3 pages, Anaheim, CA, USA.
Sysak, M.N. et al., "Broadband return-to-zero wavelength conversion and signal regeneration using a monolithically integrated, photocurrent-driven wavelength converter", Electronics Letters, Dec. 7, 2006, 2 pages, vol. 42, No. 25.

Tauke-Pedretti, Anna et al., "Separate Absorption and Modulation Mach-Zehnder Wavelength Converter", Journal of Lightwave Technology, 2008, pp. 1-8, vol. 26, No. 1.
Turner-Foster, Amy C. et al., "Frequency conversion over two-thirds of an octave in silicon nanowaveguides", Optics Express, Jan. 15, 2010, pp. 1904-1908, vol. 18, No. 3.
U.K. Intellectual Property Office Examination Report, dated Apr. 12, 2019, for Patent Application No. GB1703716.9, 5 pages.
U.K. Intellectual Property Office Examination Report, dated Aug. 10, 2017, for Patent Application No. GB1420064.6, 5 pages.
U.K. Intellectual Property Office Examination Report, dated Aug. 20, 2018, for Patent Application No. GB 1711525.4, 4 pages.
U.K. Intellectual Property Office Examination Report, dated Mar. 21, 2018, for Patent Application No. GB 1420064.6, 3 pages.
U.K. Intellectual Property Office Search and Examination Report, dated Apr. 20, 2017, for Patent Application No. GB 1703716.9, 7 pages.
U.K. Intellectual Property Office Search and Examination Report, dated Mar. 13, 2018, for Patent Application No. GB1800519.9, 9 pages.
U.K. Intellectual Property Office Search and Examination Report, dated Sep. 12, 2017, for Patent Application No. GB1711525.4, 5 pages.
U.K. Intellectual Property Office Search Report, dated Aug. 6, 2014, for Patent Application No. GB1403191.8, 5 pages.
U.K. Intellectual Property Office Search Report, dated Jul. 13, 2017, for Patent Application No. GB1706331.4, 3 pages.
U.K. Intellectual Property Office Search Report, dated Jun. 10, 2015, for Patent Application No. GB1420063.8, 4 pages.
U.K. Intellectual Property Office Search Report, dated Jun. 4, 2015, for Patent Application No. GB1420064.6, 5 pages.
U.K. Intellectual Property Office Search Report, dated Sep. 19, 2017, for Patent Application No. GB1704739.0, 4 pages.
U.K. Intellectual Property Office Search Report, dated Sep. 5, 2014, for Patent Application No. GB1403191.8, 2 pages.
U.K. Intellectual Property Office Examination Report, dated Dec. 2, 2015, for Patent Application No. GB 1403191.8, 3 pages.
U.K. Intellectual Property Office Examination Report, dated Oct. 20, 2015, for GB 1420063.8, 3 pages.
U.S. Appl. No. 14/629,922, filed Feb. 24, 2015.
U.S. Appl. No. 14/827,200, filed Aug. 14, 2015.
U.S. Appl. No. 15/120,861, filed Aug. 23, 2016.
U.S. Appl. No. 15/256,321, filed Sep. 2, 2016.
U.S. Appl. No. 15/369,804, filed Dec. 5, 2016.
U.S. Appl. No. 15/430,314, filed Feb. 10, 2017.
U.S. Appl. No. 15/555,431, filed Sep. 1, 2017.
U.S. Appl. No. 15/700,053, filed Sep. 8, 2017.
U.S. Appl. No. 15/700,055, filed Sep. 8, 2017.
U.S. Appl. No. 15/833,990, filed Dec. 6, 2017.
U.S. Appl. No. 15/927,943, filed Mar. 21, 2018.
U.S. Appl. No. 16/144,994, filed Sep. 27, 2018.
U.S. Appl. No. 16/195,774, filed Nov. 19, 2018.
U.S. Appl. No. 16/231,257, filed Dec. 21, 2018.
U.S. Appl. No. 16/275,157, filed Feb. 13, 2019.
U.S. Appl. No. 16/420,096, filed May 22, 2019.
U.S. Office Action from U.S. Appl. No. 14/629,922 dated Nov. 25, 2015, 13 pages.
U.S. Office Action from U.S. Appl. No. 14/629,922, dated May 11, 2016, 14 pages.
U.S. Office Action from U.S. Appl. No. 15/120,861, dated Apr. 25, 2018, 15 pages.
U.S. Office Action from U.S. Appl. No. 15/120,861, dated Aug. 10, 2018, 20 pages.
U.S. Office Action from U.S. Appl. No. 15/120,861, dated Nov. 17, 2017, 22 pages.
U.S. Office Action from U.S. Appl. No. 15/256,321, dated Oct. 31, 2016, 24 pages.
U.S. Office Action from U.S. Appl. No. 15/369,804 dated Jul. 6, 2017, 14 pages.
U.S. Office Action from U.S. Appl. No. 15/430,314, dated Jan. 29, 2018, 26 pages.
U.S. Office Action from U.S. Appl. No. 15/555,431, dated Apr. 6, 2018, 11 pages.

(56) References Cited

OTHER PUBLICATIONS

U.S. Office Action from U.S. Appl. No. 15/927,943, dated Jun. 15, 2018, 13 pages.
U.S. Office Action from U.S. Appl. No. 16/195,774, dated Aug. 20, 2019, 38 pages.
U.S. Office Action from U.S. Appl. No. 16/231,257, dated Oct. 24, 2019, 8 pages.
U.S. Office Action from U.S. Appl. No. 16/275,157, dated Feb. 21, 2020, 14 pages.
U.S. Office Action from U.S. Appl. No. 16/275,157, dated Sep. 6, 2019, 13 pages.
U.S. Office Action from U.S. Appl. No. 16/420,096, dated Jan. 17, 2020, 11 pages.
Vivien, L. et al., "High speed silicon modulators and detectors", ACP Technical Digest, Communications and Photonics Conference, Nov. 7, 2012, 3 pages.
Vivien, Laurent et al., "High speed and high responsivity germanium photodetector integrated in a Silicon-On-Insulator microwaveguide", Optics Express, Jul. 23, 2007, pp. 9843-9848, vol. 15, No. 15.
Vlachos, Kyriakos et al., "Photonics in switching: enabling technologies and subsystem design", Journal of Optical Networking, May 2009, pp. 404-428, vol. 8, No. 5.
Wang, J. et al., "Evanescent-Coupled Ge p-i-n Photodetectors on Si-Waveguide With SEG-Ge and Comparative Study of Lateral and Vertical p-i-n Configurations", IEEE Electron Device Letters, May 2008, pp. 445-448, vol. 29, No. 5.
Website: "Silicon dioxide", Wikipedia, 2013, http://web.archive.org/web/20130423194808/https://en.wikipedia.org/wiki/Silicon_dioxide, printed Aug. 14, 2019, 13 pages.
Website: "Intel primes market for silicon photonics to lift data centre interconnect speeds", The Inquirer, http://www.theinquirer.net/inquirer/news/234 5 61 O/intel-primes-market-for - silicon-photonics-to-lift-data-centre-interconnect-speeds, printed Jan. 18, 2017, 8 pages.
Xi, Kang et al., "Petabit Optical Switch for Data Center Networks," Polytechnic Institute of New York University, Brooklyn, New York, 9 pages, 2010.
Yao, Shun et al., "A Unified Study of Contention-Resolution Schemes in Optical Packet-Switched Networks", Journal of Lightwave Technology, 2003, 31 pages, vol. 21, No. 3.
Ye, Tong et al., "A Study of Modular AWGs for Large-Scale Optical Switching Systems," Journal of Lightwave Technology, vol. 30, No. 13, Jul. 1, 2012, pp. 2125-2133.
Ye, Tong et al., "AWG-based Non-blocking Clos Networks", Aug. 21, 2013, pp. 1-13.
U.S. Office Action from U.S. Appl. No. 16/420,096, dated Jul. 28, 2020, 10 pages.
Coldren et al. "Diode Lasers and Photonic Integrated Circuits", 2012, pp. 1-12, Second Edition, John Wiley & Sons, Inc.
Pogossian, S.P. et al., "Analysis of high-confinement SiGe/Si waveguides for silicon-based optoelectronics", J. Opt. Soc. Am. A, Mar. 1999, pp. 591-595, vol. 16, No. 3, Optical Society of America.
U.S. Office Action from U.S. Appl. No. 16/195,774, dated Oct. 9, 2020, 30 pages.
Website: "Cladding (fiber optics)", Wikipedia, 2012, http://en.wikipedia.org/w/index.php?title=Cladding_(fiber_optics)&oldid=508909143, 1 page.
Website: "Epitaxy", Wikipedia, 2015, https://en.wikipedia.org/w/index.php?title=Epitaxy&oldid=686946039, 6 pages.
Website: "Silicon on insulator", Wikipedia, 2015, https://en.wikipedia.org/w/index.php?title=Silicon_on_insulator&oldid=670386829, 5 pages.
Chinese Notification of the First Office Action, for Patent Application No. 201680025793.X, dated Apr. 29, 2020, 10 pages.
Chinese Notification of the Second Office Action, for Patent Application No. 201680025793.X, dated Dec. 14, 2020, 7 pages.
Partial English translation of the Chinese Notification of the First Office Action, for Patent Application No. 201680025793.X, dated Apr. 29, 2020, 18 pages.
Partial English translation of the Chinese Notification of the Second Office Action, for Patent Application No. 201680025793.X, dated Dec. 14, 2020, 13 pages.
Chinese Notification Decision of Rejection, for Patent Application No. 201680025793.X, dated Apr. 27, 2021, 5 pages.
Partial English Translation of Chinese Notification Decision of Rejection, for Patent Application No. 201680025793.X, dated Apr. 27, 2021, 12 pages.
U.K. Intellectual Property Office Examination Report, dated Feb. 19, 2020, for Patent Application No. GB1800519.9, 4 pages.
U.K. Intellectual Property Office Examination Report, dated Mar. 15, 2021, for Patent Application No. GB1916147.0, 3 pages.
U.K. Intellectual Property Office Examination Report, dated Nov. 3, 2020, for Patent Application No. GB1715242.2, 2 pages.
U.K. Intellectual Property Office Examination Report, dated Oct. 23, 2018, for Patent Application No. GB1812209.3, 6 pages.
U.K. Intellectual Property Office Search and Examination Report, dated Dec. 20, 2019, for Patent Application No. GB1916147.0, 10 pages.
U.S. Notice of Allowance from U.S. Appl. No. 16/195,774, dated Apr. 16, 2021, 9 pages.

* cited by examiner

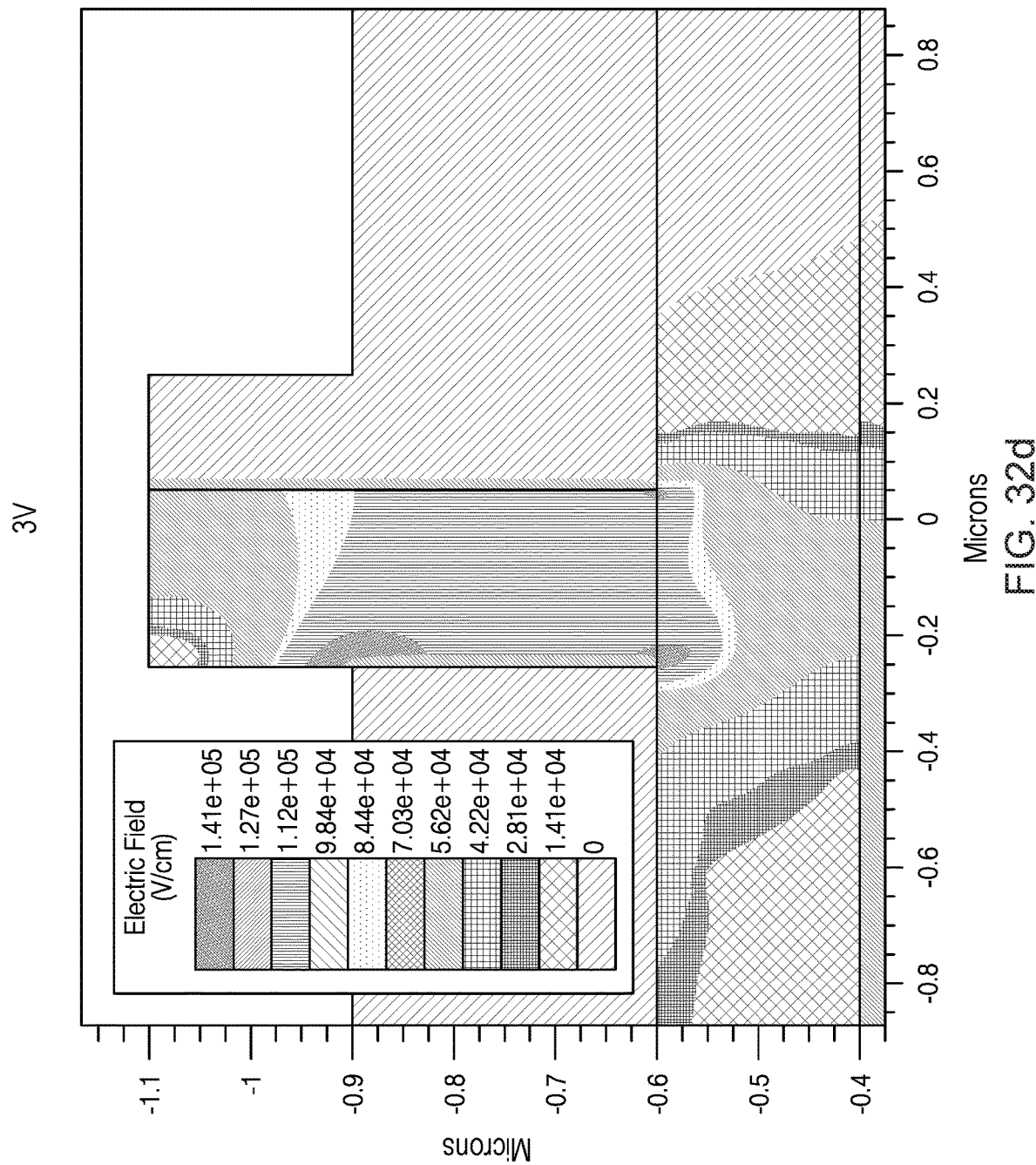

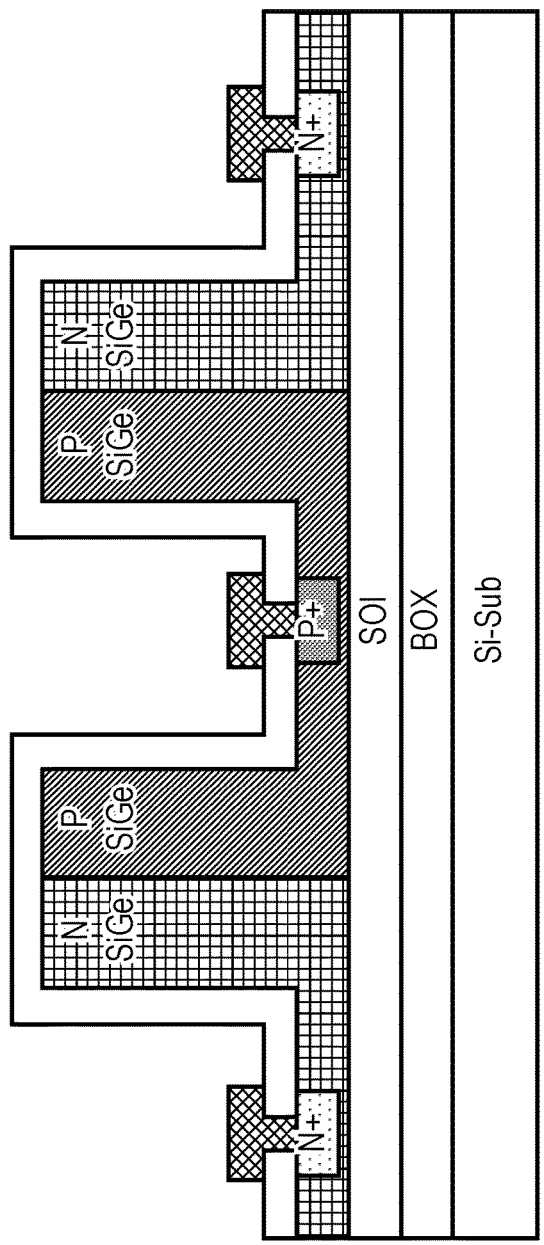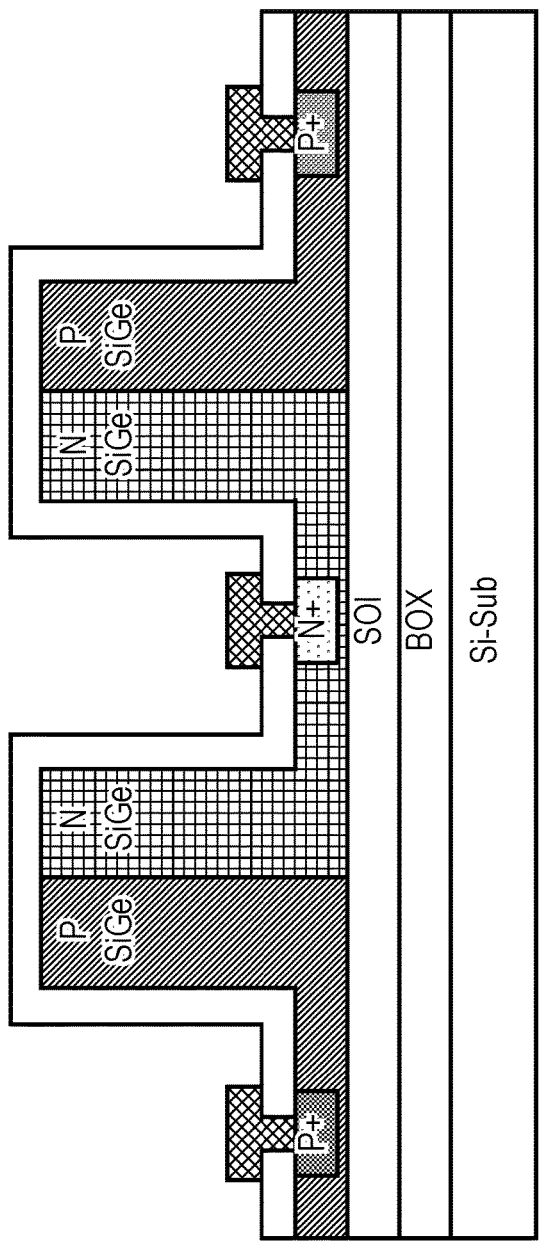
FIG. 43
FIG. 44

WAVEGUIDE MODULATOR STRUCTURES

CROSS-REFERENCE TO RELATED APPLICATION(S)

This application is a continuation-in-part of U.S. patent application Ser. No. 16/231,257, filed Dec. 21, 2018, which is a continuation-in-part of U.S. patent application Ser. No. 15/555,431, filed Sep. 1, 2017, which is a National Stage Patent Application of International Application No. PCT/GB2016/050570, filed Mar. 4, 2016, which claims the benefit of U.S. Provisional Patent Application No. 62/128,949, filed Mar. 5, 2015, and claims the benefit of U.S. Provisional Patent Application No. 62/152,696, filed Apr. 24, 2015; this application is a continuation-in-part of U.S. patent application Ser. No. 16/420,096, filed May 22, 2019, which is a continuation-in-part of International Application No. PCT/EP2017/080216, filed Nov. 23, 2017, and a continuation-in-part of U.S. application Ser. No. 16/144,994, filed Sep. 27, 2018; International Application No. PCT/EP2017/080216 claims priority to (i) U.S. Provisional Application No. 62/426,117, filed Nov. 23, 2016, (ii) U.S. Provisional Application No. 62/427,132, filed Nov. 28, 2016, (iii) U.S. Provisional Application No. 62/528,900, filed Jul. 5, 2017, (iv) United Kingdom Patent Application Number GB1711525.4, filed Jul. 18, 2017, (v) U.S. application Ser. No. 15/700,055, filed Sep. 8, 2017, now U.S. Pat. No. 10,185,203, issued Jan. 22, 2019, which claims priority to and the benefit of U.S. Provisional Application No. 62/528,900, filed Jul. 5, 2017, and which claims priority to United Kingdom Patent Application Number GB1711525.4, filed Jul. 18, 2017; (vi) U.S. application Ser. No. 15/700,053, filed Sep. 8, 2017, now U.S. Pat. No. 10,133,094, issued Nov. 20, 2018, which claims priority to and the benefit of U.S. Provisional Application No. 62/528,900, filed Jul. 5, 2017, and which claims priority to United Kingdom Patent Application Number GB1711525.4, filed Jul. 18, 2017; U.S. application Ser. No. 16/144,994 is a continuation of U.S. application Ser. No. 15/700,053, filed Sep. 8, 2017, which claims priority to and the benefit of U.S. Provisional Application No. 62/528,900, filed Jul. 5, 2017, and which claims priority to United Kingdom Patent Application Number GB1711525.4, filed Jul. 18, 2017; this application is a continuation-in-part of U.S. patent application Ser. No. 16/393,889, filed Apr. 24, 2019, which claims priority to and the benefit of U.S. Provisional Application No. 62/750,226, filed Oct. 24, 2018. The entire contents of all of the above-identified documents are incorporated herein by reference.

FIELD

One or more aspects of embodiments according to the present invention relate to waveguide modulator structures and methods, and more particularly to Mach Zehnder waveguide modulator structures and methods.

BACKGROUND

Optical modulation on a silicon waveguide platform is well known including waveguide modulators based upon: electro-optic, quantum confined Stark, Franz-Keldysh, and carrier plasma dispersion.

Waveguide modulators can include silicon, III-V, other semiconductors, and polymer waveguides. They are typically symmetrical structures, although doped areas may not be symmetrical (e.g. U.S. Pat. No. 7,085,443, PN phase shift modulator) where the doping of silicon is asymmetric across the waveguide).

For modulators with a silicon/germanium (SiGe) medium, it is known that the Franz-Keldysh (FK) effect with lumped electrodes is used to achieve small size, high speed, low driving power consumption and ease of manufacture at 1550 nm. A silicon/germanium region provides an electro-absorption effect that is advantageous when operation is required in the C- and L-bands of the optical spectrum.

Several possible modulator waveguide structures have been proposed including U.S. Pat. No. 8,346,028 where the active waveguide is made of (typically) SiGe and the SiGe waveguides are doped on their sides to provide effective electric contacts and to generate the necessary electric field in the SiGe waveguide.

However, such a structure suffers from the drawback that the optical mode is forced to be in close proximity to doping on both sides of the waveguide, which causes optical losses.

SUMMARY

According to various embodiments of the present invention, there is provided a Mach-Zehnder waveguide modulator comprising: a left arm including a left SiGe optical waveguide, and a right arm including a right SiGe optical waveguide; wherein each of the left and right optical waveguides comprises a junction region and a plurality of electrodes for providing a bias across the junction to enable control of the phase of light travelling through the junction regions via dispersion.

Dispersion may be understood to be the dispersion effect and more particularly an enhanced plasma dispersion effect.

According to a first set of embodiments, there is provided a Mach-Zehnder waveguide modulator comprising a left arm including a left SiGe optical waveguide, and a right arm including a right SiGe optical waveguide; wherein each of the left and right optical waveguides comprises a PIN junction region, the PIN junction formed from: a first semiconductor region corresponding to either the p-doped region or the n-doped region; a second semiconductor region corresponding to the other of the p-doped or n-doped region; and a central SiGe waveguide region; wherein the first semiconductor region of the left optical waveguide is integral with the first semiconductor region of the right optical waveguide in a region between the left and right arms, forming a common doped region; and a plurality of electrodes configured to apply a forward bias applied across one or both of the PIN junctions to enable control of the phase of light travelling through the respective PIN junction region(s) via dispersion.

According to a second set of embodiments, there is provided a Mach-Zehnder waveguide modulator comprising: a left arm including a left SiGe optical waveguide, and a right arm including a right SiGe optical waveguide; wherein each of the left and right optical waveguides comprises a PIN junction region, the PIN junction formed from: a first semiconductor region corresponding to either the p-doped region or the n-doped region; a second semiconductor region corresponding to the other of the p-doped or n-doped region; and a central SiGe waveguide region; wherein the first semiconductor region of the left optical waveguide is electrically isolated from the first semiconductor region of the right optical waveguide by a central isolated region between the left and right arms, forming a common doped region; and a plurality of electrodes configured to apply a forward bias applied across one or both of the PIN junctions to enable control of the phase of light travelling through the respective PIN junction region(s) via dispersion.

In U.S. Pat. Nos. 8,346,028 and 8,093,080 are described waveguide structures for modulators and light sensors where both side walls of the waveguide are appropriately doped. The advantage of side wall doping is that the electric field necessary to operate the FK effect is closely contained in the waveguide but the disadvantage is that the doping close to the optical mode absorbs light and causes a great deal of optical loss.

U.S. Pat. No. 8,737,772 discloses a device which is a depletion phase modulator with carrier plasma dispersion effect and in which the p- and n-doped regions are disposed asymmetrically with the one doped area extending to the top to the waveguide and the opposite doped region being in the base. The purpose of this structure is to reduce optical loss by forming a depletion region in the rib waveguide and distancing the electrical contact (metal) from the optical mode.

In the symmetrically side wall doped structures of the prior art, including those of U.S. Pat. Nos. 8,346,028 and 8,093,080, the electric field created by applying a voltage across is an essentially a parallel and uniform field. In this invention we disclose a novel structure in which the electric field created across doped regions is non-parallel and non-uniform but the optical mode is effectively unaffected by the asymmetry of doping. Consequently, in the structure of the present invention, the loss is less because there is doping only on one side of the waveguide but the electric field, although not uniform, is effective in producing the required FK effect. Thus a high speed modulator is achieved without the disadvantages of prior designs such as that of U.S. Pat. No. 8,346,028.

The structure can also be used for photo-detectors with germanium replacing SiGe. Comparing to the prior structures such as that of U.S. Pat. No. 8,093,080, the structures of the present invention have higher responsivity due to the lower optical loss.

According to a third set of embodiments, there is provided a Mach-Zehnder waveguide modulator according to claim 1, wherein the junction of each of the left and right optical waveguides comprises a PN junction, the PN junction formed from: a first semiconductor region corresponding to either the p-doped region or the n-doped region; a second semiconductor region corresponding to the other of the p-doped or n-doped region; and a plurality of electrodes configured to apply a reverse bias across one or both of the PN junctions to enable control of the phase of light travelling through the respective PN junction region(s) via dispersion.

Each of the first set and the second set of embodiments may include one of or any combination of the following optional features. Where these features do not relate to the intrinsic region, they are also applicable to the third set of embodiments.

Optionally, the first semiconductor region includes a first lateral portion extending laterally away from the waveguide wall on a first side of the waveguide; the second semiconductor region includes a second lateral portion extending laterally away from the waveguide wall on a second side of the waveguide; and the plurality of electrodes comprises: a first electrode located directly on top of the first lateral portion; and a second electrode located directly on top of the first lateral portion.

Optionally, one of the first or second semiconductor regions includes a vertical doped portion which extends along the side of the waveguide.

Optionally, the vertical doped portion only extends in the vertical direction along a portion of the side wall of the waveguide, such that the central SiGe waveguide region has a greater height than the vertical doped region.

Optionally, the vertical doped portion extends along the entire side of the waveguide.

Optionally, for a given waveguide arm of the modulator, no more than one side of the waveguide comprises a vertically doped portion.

Optionally, the Mach-Zehnder waveguide modulator comprises: an intervening lightly p-doped semiconductor region located between the p-doped semiconductor region and the central waveguide region; wherein the intervening lightly p-doped semiconductor region has a lower dopant concentration than the p-doped semiconductor region.

Optionally, the Mach-Zehnder waveguide modulator comprises: intervening lightly n-doped semiconductor region located between the n-doped semiconductor region and the central waveguide region; wherein the intervening lightly n-doped semiconductor region has a lower dopant concentration than the n-doped semiconductor region.

Optionally, the central waveguide is composed of SiGe and the doped semiconductor regions are composed of Si.

Optionally, the central waveguide region, the first semiconductor region, and the second semiconductor region are all composed of SiGe.

Optionally, the central waveguide region, the n-doped semiconductor region, the p-doped semiconductor region, the lightly p-doped semiconductor region, and the lightly n-doped semiconductor region are all composed of SiGe.

Optionally, the plurality of electrodes includes a common electrode located at the common doped region.

Optionally, the plurality of electrodes includes a plurality of lumped electrodes.

Optionally, the Mach-Zehnder waveguide modulator is configured to operate in a push-pull mode.

Optionally, in all embodiments described herein, the SiGe waveguides are formed from intrinsic SiGe (iSiGe).

Optionally, the active region means that waveguides in this region have PIN or PN junctions, and the electrodes can be either lumped electrodes or traveling wave electrodes. The waveguide in the active region is made of SiGe material, outside of this region may be made of SiGe or Si material.

For Mach-Zehnder modulators with PIN junctions, the p region may be SiGe material or Si material doped with boron, and the n region may be SiGe or Si material doped with phosphorus or arsenic. During operation, the PIN junction may be forward biased so that carriers are injected into the intrinsic region, resulting in the desired dispersion.

The intrinsic region is not intentionally doped, but may exhibit some background doping.

For Mach-Zehnder modulators with PN junctions, the p region has SiGe material doped with boron, and the n region has SiGe material doped with phosphorus or arsenic.

During operation, the PN is reverse biased by applying bias to the electrodes. This reverse bias across the PN junction results in carrier depletion, thereby producing the desired dispersion effect.

In some embodiments, the field is created effectively from a line at the base of the waveguide on one side (in other words at the base of the trench) and across the opposing side of the waveguide. This ensures that the optical mode is effectively in contact with a smaller doped area and optical loss is consequently less. For an exemplary 50 µm modulator length, simulation results show that the optical loss is reduced by about 1.0 dB comparing with where both sidewalls are doped (as in U.S. Pat. No. 8,346,028).

In some embodiments, doping is on either side of a waveguide but not in the exposed side wall of the waveguide. A structure is disclosed by Dawnay et al (U.S. Pat. No. 6,584,239) except that (a) the material is Si (not SiGe) and the effect is electro-optic and not FK and (b) Dawnay discloses an etch to the depth of the oxide layer whereas, in this invention the oxide layer is not exposed.

In the field of germanium photodetectors many structures have been described. However, many of these are vertical stack junction structures which are often more costly to manufacture than horizontal structures and may not be suitable to integrate with Si waveguide on SOI platform, or they are structures where light evanesces from the light transmitting waveguide into a receiving germanium region and are therefore less efficient. The photodetector structures of this invention are structures where silicon/germanium is fabricated into the waveguide and the control and monitoring electrodes are lateral—in other words a horizontal structure. Vivien et al (Optics Express Vol 15, No 15, (2007) p 9843) report a germanium photodetector that has MSM (metal-semiconductor-metal) structure in which there is no PN junction (or PIN junction) and no waveguide in the germanium sensing material, therefore, the photodetector of Vivien et al has the disadvantages of high bias voltage and low responsivity.

According to some embodiments of the present invention, there is provided a Mach-Zehnder waveguide modulator including: a first arm including a first optical waveguide, and a second arm including a second optical waveguide; wherein the first optical waveguide includes a junction; wherein the Mach-Zehnder waveguide modulator further includes a plurality of electrodes for providing a bias across the junction to enable control of the phase of light travelling through the junction; wherein the junction includes: a first semiconductor region corresponding to either a p-doped region or an n-doped region; and a second semiconductor region corresponding to the other of the p-doped or n-doped region; wherein at least one of the first semiconductor region and the second semiconductor region includes a vertical doped portion which extends along the side of the waveguide, and wherein no more than one side of the first optical waveguide includes a vertically doped portion.

In some embodiments, the junction further includes a central waveguide region, and the junction is a PIN junction.

In some embodiments, the vertical doped portion only extends in the vertical direction along a portion of the side wall of the first optical waveguide, such that the central waveguide region has a greater height than the vertical doped portion.

In some embodiments, the vertical doped portion extends in the vertical direction along the entire side of the first optical waveguide.

In some embodiments, the PIN junction is configured to control the phase of light propagating in the first optical waveguide upon application of a forward bias across the PIN junction.

In some embodiments, the central waveguide region of the junction is composed of SiGe.

In some embodiments, the first optical waveguide further includes: an intervening lightly p-doped semiconductor region located between the p-doped region and the central waveguide region, the intervening lightly p-doped semiconductor region having a lower dopant concentration than the p-doped region; or an intervening lightly n-doped semiconductor region located between the n-doped region and the central waveguide region, the intervening lightly n-doped semiconductor region having a lower dopant concentration than the n-doped region.

In some embodiments, the junction includes: a first semiconductor region corresponding to either a p-doped region or an n-doped region; a second semiconductor region corresponding to the other of the p-doped or n-doped region; and a central waveguide region.

In some embodiments, the PIN junction further includes: an intervening lightly n-doped semiconductor region located between the n-doped region and the central waveguide region; and an intervening lightly p-doped semiconductor region located between the p-doped region and the central waveguide region, wherein: the intervening lightly n-doped semiconductor region has a lower dopant concentration than the n-doped region, the intervening lightly p-doped semiconductor region has a lower dopant concentration than the p-doped region, and the central waveguide region, the n-doped region, the p-doped region, the lightly p-doped semiconductor region, and the lightly n-doped semiconductor region are all composed of SiGe.

In some embodiments, the junction is a PN junction.

In some embodiments, the PN junction is configured to control the phase of light propagating in the first optical waveguide upon application of a reverse bias across the PN junction.

In some embodiments, the junction is configured to control the phase of light propagating in the first optical waveguide via free-carrier plasma dispersion.

In some embodiments: the second optical waveguide includes a junction, and the junction of the second optical waveguide includes: a first semiconductor region corresponding to either a p-doped region or an n-doped region; and a second semiconductor region corresponding to the other of the p-doped or n-doped region.

In some embodiments, the first semiconductor region of the first optical waveguide is integral with the first semiconductor region of the second optical waveguide in a region between the first and second arms, forming a common doped region.

In some embodiments, the plurality of electrodes includes a common electrode located at the common doped region.

In some embodiments, the first semiconductor region of the first optical waveguide is electrically isolated from the first semiconductor region of the second optical waveguide by a central isolated region between the first and second arms.

According to some embodiments of the present invention, there is provided a Mach-Zehnder waveguide modulator including: a first arm including a first optical waveguide, and a second arm including a second optical waveguide; wherein the first optical waveguide includes a PIN junction, wherein the Mach-Zehnder waveguide modulator further includes a plurality of electrodes for providing a bias across the PIN junction to enable control of the phase of light travelling through the PIN junction; wherein the PIN junction includes: a first semiconductor region corresponding to either a p-doped region or an n-doped region; a second semiconductor region corresponding to the other of the p-doped or n-doped region; and a central waveguide region, and wherein at least one of the first semiconductor region and the second semiconductor region includes a vertical doped portion which extends along the side of the first optical waveguide.

In some embodiments, the vertical doped portion only extends in the vertical direction along a portion of the side wall of the first optical waveguide, such that the central waveguide region has a greater height than the vertical doped portion.

In some embodiments, the vertical doped portion extends in the vertical direction along the entire side of the first optical waveguide.

In some embodiments, no more than one side of the first optical waveguide includes a vertically doped portion and no more than one side of the second optical waveguide includes a vertically doped portion.

According to some embodiments of the present invention, there is provided a Mach-Zehnder waveguide modulator including: a first arm including a first SiGe optical waveguide, and a second arm including a second SiGe optical waveguide; wherein the first SiGe optical waveguide includes a junction, wherein the Mach-Zehnder waveguide modulator further includes a plurality of electrodes for providing a bias across the junction to enable control of the phase of light travelling through the junction, and wherein the plurality of electrodes includes a plurality of lumped electrodes.

In some embodiments, the junction further includes a central waveguide region, and the junction is a PIN junction.

In some embodiments, the junction includes: a first semiconductor region corresponding to either a p-doped region or an n-doped region; a second semiconductor region corresponding to the other of the p-doped or n-doped region; and a central SiGe waveguide region, wherein at least one of the first semiconductor region and the second semiconductor region includes a vertical doped portion which extends along the side of the first SiGe optical waveguide, wherein the vertical doped portion only extends in the vertical direction along a portion of the side wall of the first SiGe optical waveguide, such that the central SiGe waveguide region has a greater height than the vertical doped portion.

In some embodiments, the junction includes: a first semiconductor region corresponding to either a p-doped region or an n-doped region; a second semiconductor region corresponding to the other of the p-doped or n-doped region; and a central SiGe waveguide region, wherein at least one of the first semiconductor region and the second semiconductor region includes a vertical doped portion which extends along the side of the first SiGe optical waveguide, wherein the vertical doped portion extends in the vertical direction along the entire side of the first SiGe optical waveguide.

In some embodiments, the junction is configured to control the phase of light propagating in the first SiGe optical waveguide via free-carrier plasma dispersion.

BRIEF DESCRIPTION OF THE DRAWINGS

These and other features and advantages of the present invention will be appreciated and understood with reference to the specification, claims, and appended drawings wherein:

FIG. 32D shows modelled waveforms for the waveguide of FIG. 30;
FIG. 43 shows an example of a Mach-Zehnder modulator comprising PN junctions regions;
FIG. 44 shows an example of an alternative Mach-Zehnder modulator comprising PN junction regions.

DETAILED DESCRIPTION

The detailed description set forth below in connection with the appended drawings is intended as a description of exemplary embodiments of a Mach-Zehnder waveguide modulator provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
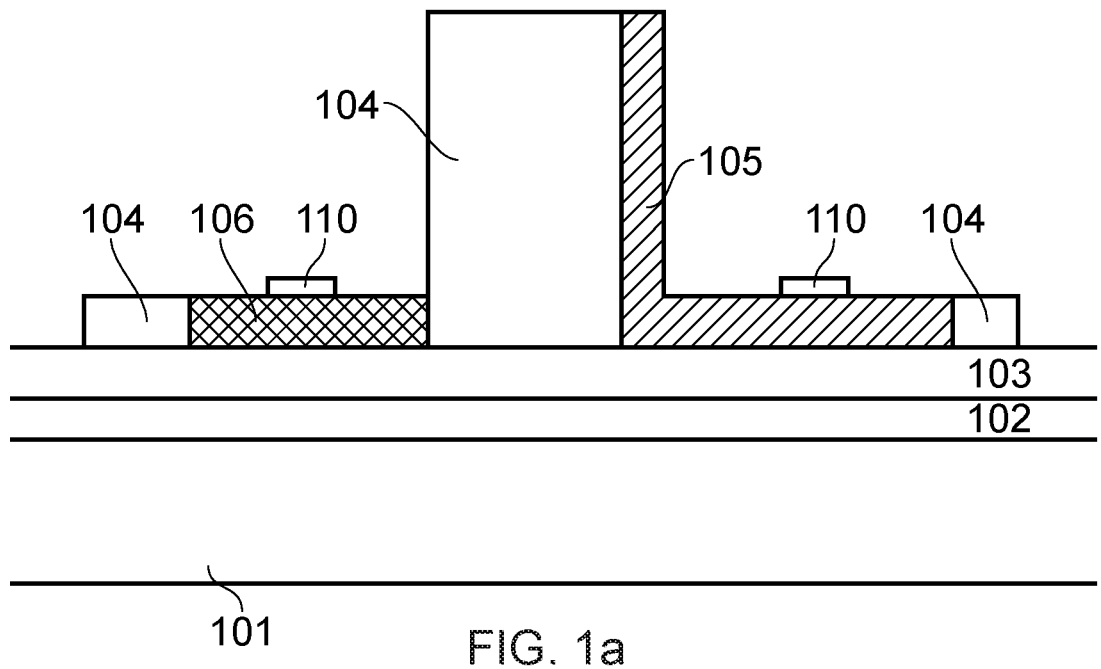
FIG. 1A shows an example of a waveguide optical device for use with the present invention.

In FIG. 1A is shown a portion of a SOI chip. This has a silicon base (101) with an insulating layer of silicon dioxide (102). A cavity has been etched into the silicon layer above the oxide and intrinsic SiGe (104) has been grown in a region and etched to create an upstanding waveguide (as shown in FIG. 1). The SiGe is typically grown upon a residual thin (200+/−100 nm) layer of silicon (103) but can also be grown directly upon the silicon dioxide layer (102). Typically such an active waveguide would be contiguously connected to a passive Si waveguide, providing light to the active region and carrying light from the active region. In order to dope appropriately, the waveguide is masked in appropriate steps to allow doping to be applied as shown at 105 for p++ and 106 for n++. The p++ doping is in the sidewall (110) to form a PN junction between region 105 and region 106 in the optical waveguide. The PN junction overlaps with the optical mode to have a strong FK effect in the waveguide. It may be advantageous, for example to control the electric field or to reduce optical loss, to create non-uniform doping in the doped regions 105 and/or 106. For example, up to 4 levels of doping could be created within regions 105 and/or 106. The contact electrodes are 110.

It is preferred that the p++ doping is in the sidewall and the n++ doping in the lateral surface and not on a sidewall because the intrinsic SiGe (104) is typically lightly n doped (typically at $1\times10^{15}$ to $1\times10^{16}$ cm$^{-3}$). Thus the pn junction for a device of this type with a p doped side wall will be in the region of the optical mode and will be a more effective modulator than if the reverse arrangement of doping were used with lightly p doped intrinsic active semiconductor. However, the reverse arrangement of doping is within the scope of this invention and would be effective when the so-called intrinsic SiGe were lightly p doped. However, a lightly p doped region will typically have a higher concentration of dopant than the intrinsic region (lightly n doped) and an n++ wall has higher optical absorption than p++ doped wall.

Waveguides of this invention are optionally of approximately 3 µm height above the oxide layer but a smaller dimension, for example 0.5 µm is also possible.

Figure 1B:
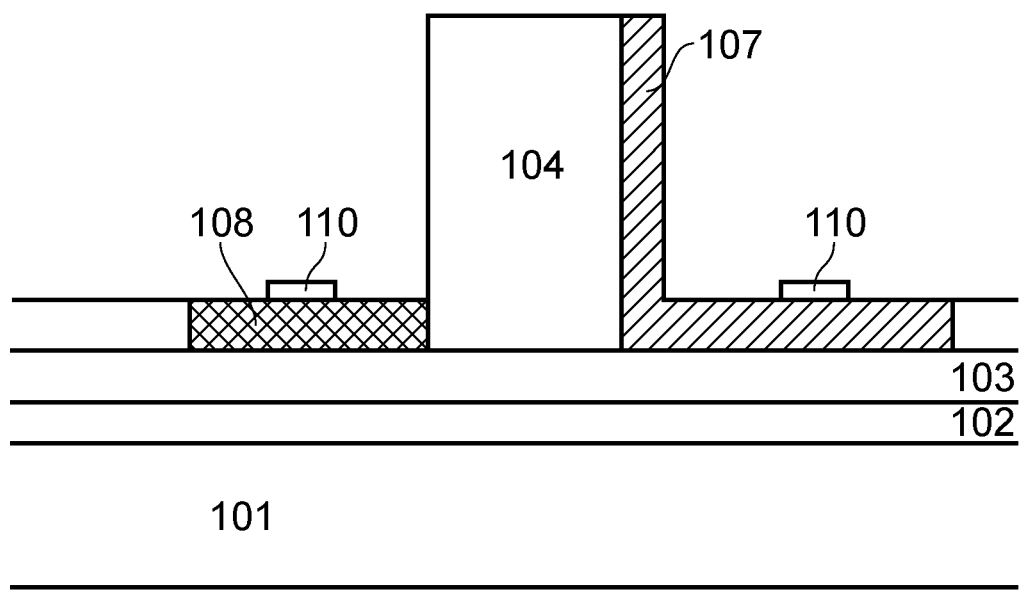
FIG. 1B shows an example of a waveguide optical device for use with the present invention.

In a further embodiment of this invention, the doped waveguide wall may be made of doped silicon. This has the advantage of reducing the optical loss even more. Furthermore, the doped regions of the waveguide slab may also be made of silicon. In FIG. 1B is shown an example where the intrinsic SiGe is 104. Region 107 is a p doped silicon in the wall 111 of the waveguide and region 108 is n doped silicon. Alternatively region 108 may be n doped SiGe. The doping may be in the opposite sense with n doping in the silicon side wall and p doping in the slab region. Furthermore the intrinsic SiGe may be lightly p doped rather than the normal lightly n doped material. The contact electrodes are 110. The means of manufacturing such structures would be similar to that of the device of FIG. 7.

Figure 1C:
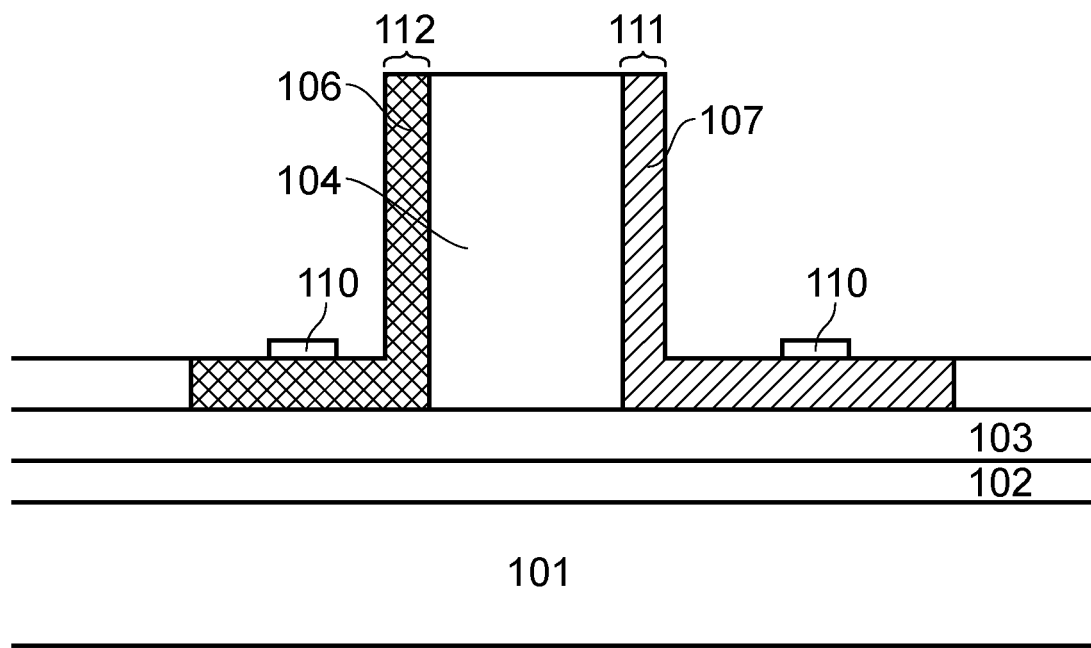
FIG. 1C shows an example of a waveguide optical device for use with the present invention.
Figure 1D:
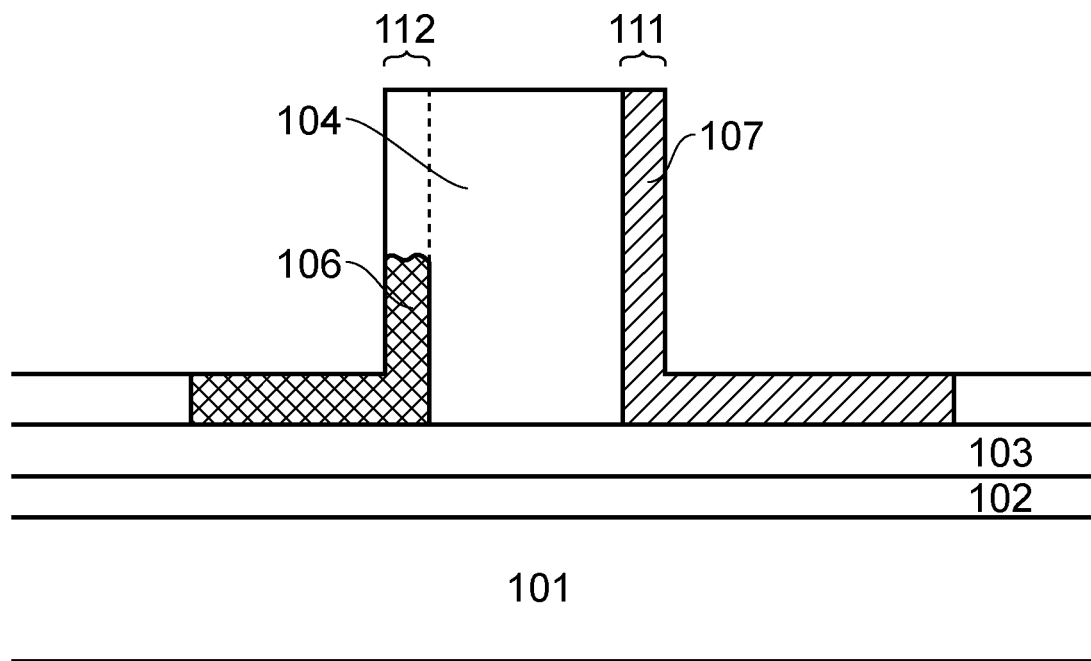
FIG. 1D shows an example of a waveguide optical device for use with the present invention.

Yet further embodiments of the present invention are illustrated in FIGS. 1C and 1D. In FIG. 1C the wall regions of the waveguides are shown as 111 and 112. As shown, region 106 is n doped active material including a doped wall region 112. Wall 111 is made of silicon as is the connected slab region and this entire region 107 is p doped. As in earlier embodiments the doping may be in the opposite sense and the intrinsic region, normally very lightly n doped, may be p doped.

In FIG. 1D is shown a structure similar to that of FIG. 1C but where the doped region 106 does not extend to the top of the waveguide wall 112. Again the doping may be arranged in the opposite sense. Furthermore, the wall which is entirely doped may be the wall made of intrinsic active semiconductor and the partially doped wall may be the silicon wall. The dopant implanted into either of the vertical regions may not extend to the very top of the vertical region. There may be an undoped section of the vertical region which is substantially undoped. The undoped section may be located above a doped section of the vertical region. Such a substantially undoped region may have the same doping as any intrinsic doping of the central region. The extent/height of the doped section in the first and second vertical regions may be different (for example, FIG. 1D). The height of the doped section in each the first and second vertical regions may be asymmetrical about the central region.

In some embodiments as described herein, one wall of the waveguide is partially undoped. It is meant that the dopant may only extend to a certain height up the wall from the base. There may therefore be a vertical section of the wall that is doped, and a vertical section of the wall above the doped section which is substantially undoped. This undoped region or section of the wall may have no, or substantially no dopant added. There may be some intrinsic dopant in the material of the wall which is consequently present in the undoped section.

In accordance with invention 1, the vertical region may be a region of the central region located at an edge of the central region. The presence of the dopants in the vertical regions (which may be only in one vertical region) therefore define the locations of the vertical regions within the central region. The vertical regions, the lateral regions, and central region may be composed of the same material, which may be for example SiGe (or Ge for examples outside of the scope of the current claims) or any suitable alternative known to those skilled in the art. The lateral regions, vertical regions and the central region could be integral with one another.

The lateral regions, vertical regions and the central region may be formed from a single slab of material, which is then etched away to form the upstanding central region. In this case the lateral regions and the vertical regions may be selectively doped by masking during the fabrication process.

Alternatively, the vertical region may be a distinct element which abuts the common region. Where the vertical region is a distinct element, the distinct element may be composed of a different material from the active material of the central region. For example, the central region may be composed of SiGe (or Ge), and the vertical regions and the lateral regions may be composed of Si.

It is also possible, that the doped vertical region and doped lateral region on a first side of the waveguide be composed of doped SiGe (or doped Ge), and the doped lateral region and the vertical region on the opposite be composed of doped Si, for example.

During operation of the active optical waveguides, electrodes attached to the doped lateral regions may be used to apply electrical energy to the vertical doped regions. The electrical energy application may be in the form of a bias between the first and second lateral doped regions. Each vertical doped region may be integral with the adjacent doped lateral region, and as a consequence, any electrical energy applied to the lateral regions is also applied to the doped vertical regions. Consequently, a corresponding electrical bias may be generated between the doped vertical regions. This application of electrical energy forms an electrical field in the active material through which light passes. Such an electric field in the active material can be formed without generating a significant electrical current through the active material.

The active material may be a material in which the Franz-Keldysh effect occurs in response to the application of the bias to the doped regions, and the consequent electric field which is formed. The Franz-Keldysh effect is a change in optical absorption and/or optical phase of light passing through the central active region. The Franz-Keldysh effect is caused by the presence of an electric field in the active material of the central active region. For instance, the Franz-Keldysh effect allows an electron in a valence band to be excited into a conduction band by absorbing a photon, even though the energy of the photon which is absorbed is smaller than the band gap. In other words, the active material may have a slightly larger band gap energy than the photon energy of the light to be modulated. The application of the bias between the doped regions, and, and the consequent electric field formed across the active central region, lowers the absorption edge and makes absorption of a photon possible. The hole and electron carrier wavefunctions overlap when the electric field is applied and generation of an electron-hole pair becomes possible. As a result, the central active region can absorb light signals received by the central active region. Increasing the electrical field may increase the amount of light absorbed by the central region. Accordingly, electronics that are connected to the electrodes can be used to tune the electrical field so as to tune the amount of light absorbed by the active material of the central region. As a result, the electronics can modulate the electrical field in order to modulate the amplitude of the outgoing light signal.

Although outside of the scope of the claims of this invention, the active optical device of each waveguide arms of the modulators of the present invention may also be used as a photodetector by applying a reverse bias across the common central region, by suitable application of electrical charge to the electrodes, which are electrically connected to the doped vertical region(s) via the doped lateral regions. This reverse bias means that at least some of the light passing through the central region will be absorbed by the central common region. This absorption may cause a current to flow through the central common region between the doped regions. Measurement of such a current flow may then be indicative of the receipt of a light signal. The intensity of the current generated may depend on the power or intensity of the light received (the light passing through the central region). In this way the active optical waveguide can be configured to operate as a photodetector.

Further embodiments of a waveguide modulator will now be described in relation to FIGS. 2A-2C, typically with waveguide ridge width of less than 1 μm and preferably less than 0.6 μm. Also typically, the height of the waveguide ridge above the oxide layer is arranged such that more than 50% of the power of the optical mode is located below the top of the slab region of the SiGe (or Ge or other appropriate semiconductor material) on either side of the ridge.

Figure 2A:
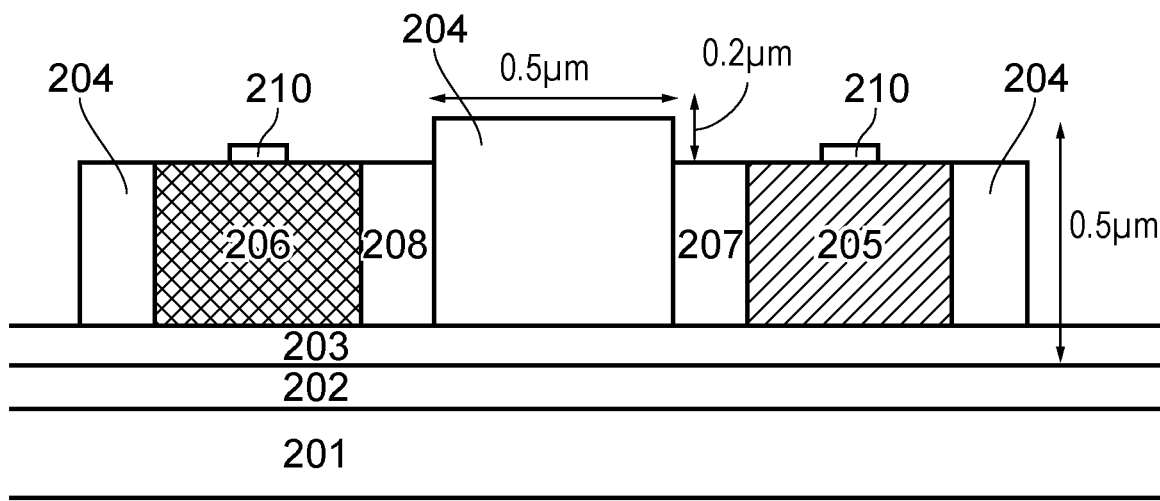
FIG. 2A shows an example of a waveguide platform suitable for forming part of the modulator of the present invention.
Figure 2B:
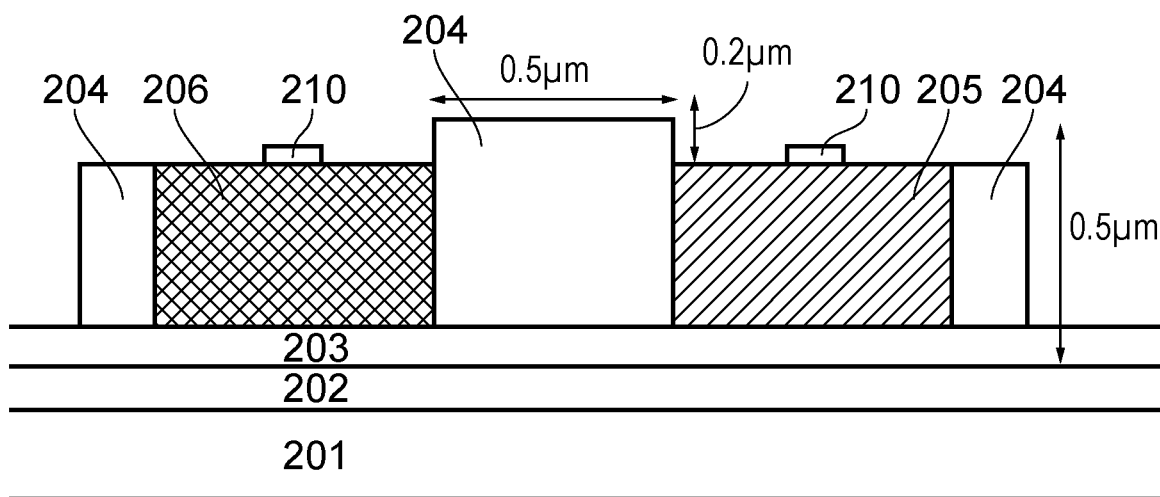
FIG. 2B shows an example of a waveguide platform suitable for forming part of the modulator of the present invention.

In FIGS. 2A and 2B the numbers correspond to the numbers in FIG. 1. The upstanding rib waveguide is a single mode waveguide with PIN junction. The central part (204) (iSiGe) of the waveguide has dimensions around 0.5×0.5 μm. The upstanding height is 0.2 micron (approx.). The two sides of the slab waveguide are doped with n and p types, so there is an electric field in the central iSiGe when the PIN is reverse biased, therefore the FK effect may be induced in the central part to modulate the light. In the structure of FIG. 2A lighter doped regions are inserted between the active intrinsic SiGe waveguide and the more heavily doped regions (to reduce the optical loss). The lightly p doped region is 207 and the lightly n doped region is 208. The more heavily doped regions are 205 (p) and 206 (n). Compared with structure in FIG. 2A, the structure in FIG. 2B will have bigger optical loss but smaller driving voltage and higher speed. Both structures can be used to make photodetectors. The advantages of these structures are 1) small size; 2) high speed; 3) low driving voltage thus low power consumption.

Such a structure may be created on an SOI platform by etching a cavity in the silicon close to the oxide layer, growing SiGe of the appropriate composition in the cavity, planarising the surface of the wafer using chemical mechanical polishing (CMP) or similar and then etching the waveguides in the silicon and SiGe material to form a contiguous waveguide through the two materials. The SiGe at the sides of the SiGe waveguide is then selectively doped to provide the electrical contact regions and the regions creating the electric field across the optical waveguide.

Figure 2C:
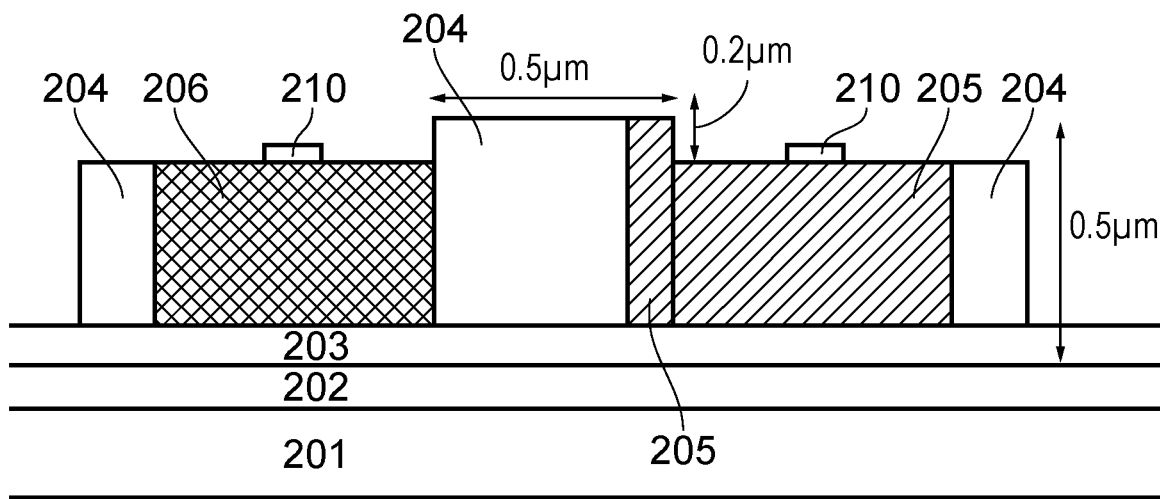
FIG. 2C shows an example of a waveguide platform suitable for forming part of the modulator of the present invention.

A further embodiment is shown in FIG. 2C. Here is shown in cross section the small size waveguide as in the above description but with doping on one side only of the upstanding ridge. This has similar advantages to the structures of FIG. 1 with the added benefits of small size, especially speed of operation and lower power consumption. Again it is preferable that the side of the upstanding ridge is p doped (contiguous with the p doping of the slab region) but the opposite arrangement is quite practical—where the side of the n doping in the slab has the side of the waveguide n-doped. It is often useful to grade the doping so that the region closest to the optical mode has a lower dopant concentration. Electrical contacts are shown as 210.

These embodiments are particularly advantageous in creating high speed modulators where the active waveguide (SiGe) of the modulator is of the smaller dimensions. In this case the small waveguide SiGe modulator would be integrated onto an SOI platform having typically 3 um waveguides and the modulator would be connected to the 3 um waveguides by waveguide tapers constructed in the silicon.

Mach-Zehnder (MZ) modulators constructed in waveguides on an SOI platform may be made with the structures in either FIG. 1 or 2 as the active areas in their arms. Such structures are illustrated in FIGS. 3, 4, 5, 6 and 7.

Figure 4:
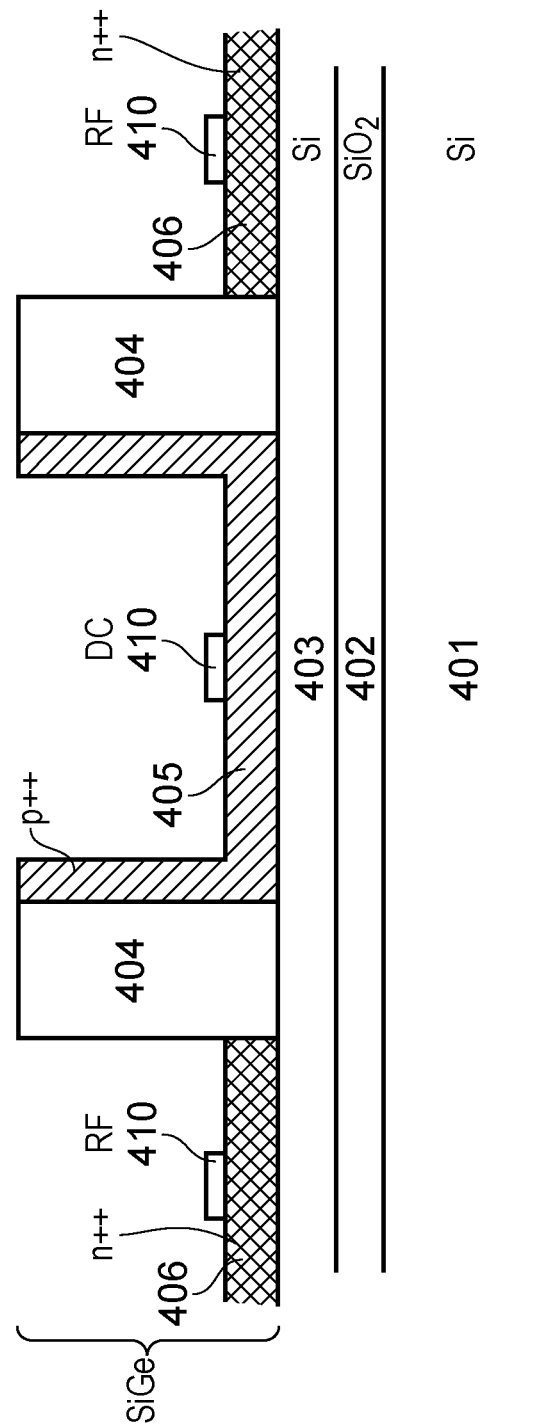
FIG. 4 shows a schematic example of a waveguide modulator according to the present invention.

FIG. 4 shows a cross section through the waveguide arms of a Mach-Zehnder modulator of one embodiment of this invention. The waveguides are made of intrinsic SiGe (404) upon a silicon on oxide base. Here the waveguides are made in a single cavity of SiGe and the p doped side walls (405) are shown on the inner sides and a DC bias contact is placed centrally to provide a common bias for the two active waveguides. The n doped regions (406) are positioned on the outer sides and support RF contacts.

The common doped region may be located between the waveguide arms of the Mach-Zehnder modulator. This common region may comprise the similarly doped lateral regions of each of the active optical waveguide comprised in each arm. For example, the p-doped lateral region of an optical waveguide of the first arm may be integral with the p-doped lateral region of an optical waveguide in the second arm. In this example, there is a p-doped common region located between the arms. There may also be an n-doped lateral region on an opposite side of the each optical waveguide to the common p-doped region. In such an example embodiment, the arrangement of the doped regions of the first optical waveguide is a mirror-image of the doped regions of the second optical waveguide. The reverse arrangement is equally an embodiment of the present invention. In the reverse example, the common region would be n-doped and the outer regions of each waveguide would be p-doped.

As a further refinement of the present invention, it may be that the at least partially doped vertical region of each of the active optical waveguides in each arm is integral with the common region located between the arms. Conversely, it is equally possible that the at least partially doped wall of each of the active optical waveguides is integral with the lateral region on the outer sides of the active optical waveguides.

Figure 5:
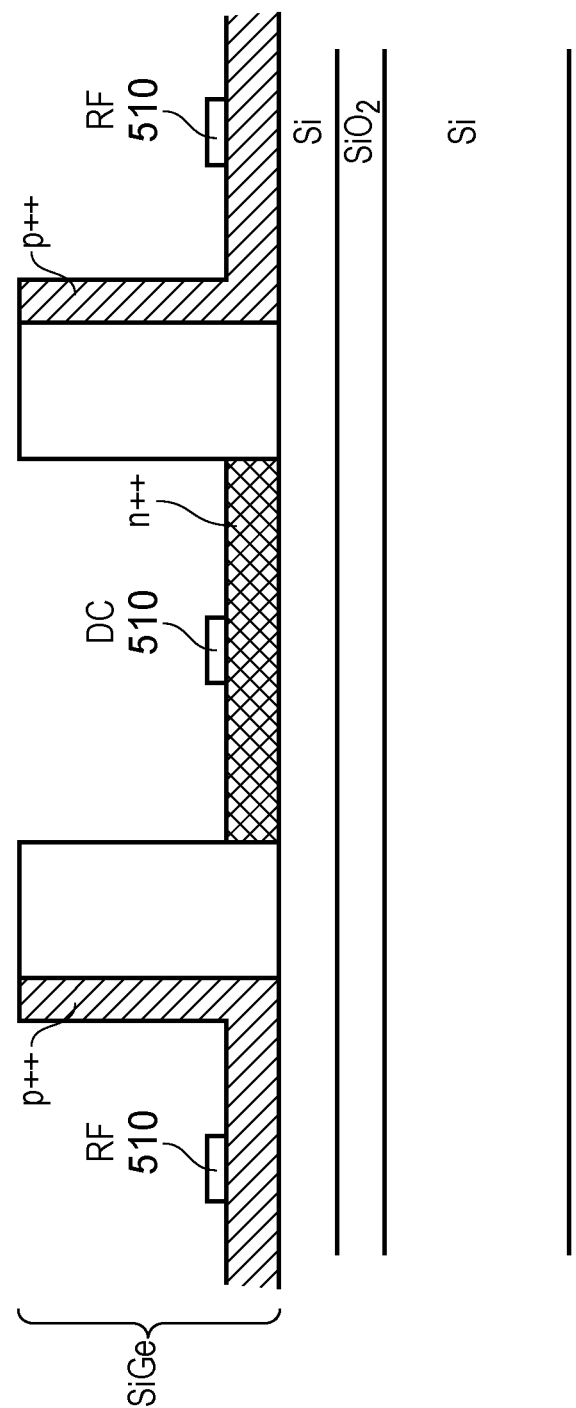
FIG. 5 shows a schematic example of a waveguide modulator according to the present invention.

FIG. 5 shows an alternative arrangement of equal merit where the n doped region is centrally located and the p doped regions are on the outer sides of the Mach-Zehnder waveguide structure.

In respect of the modulators of FIGS. 4 and 5, in accordance with the teaching of Invention 1, the side wall doping can be n, but p doping of the side walls is to be preferred.

Figure 6A:
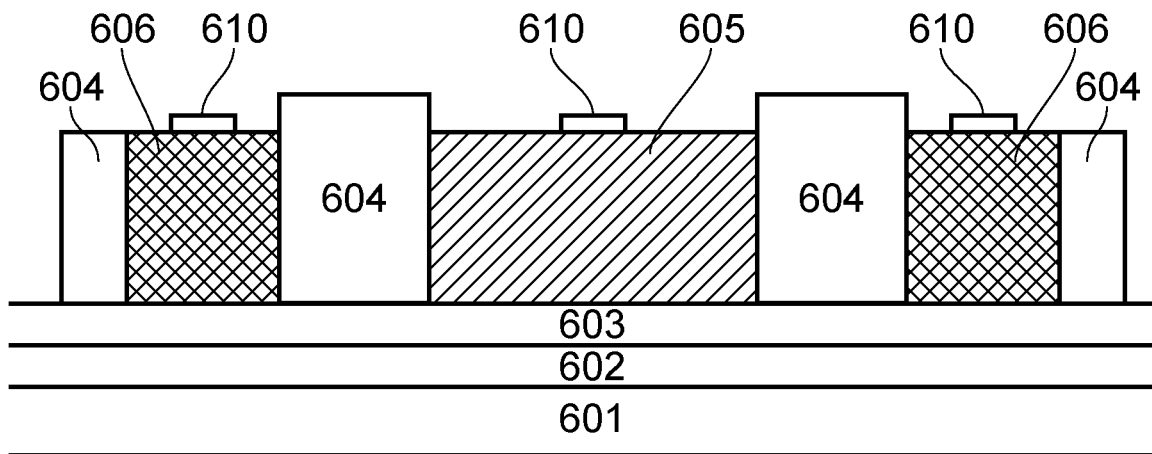
FIG. 6A shows a schematic example of a waveguide modulator according to the present invention.
Figure 6B:
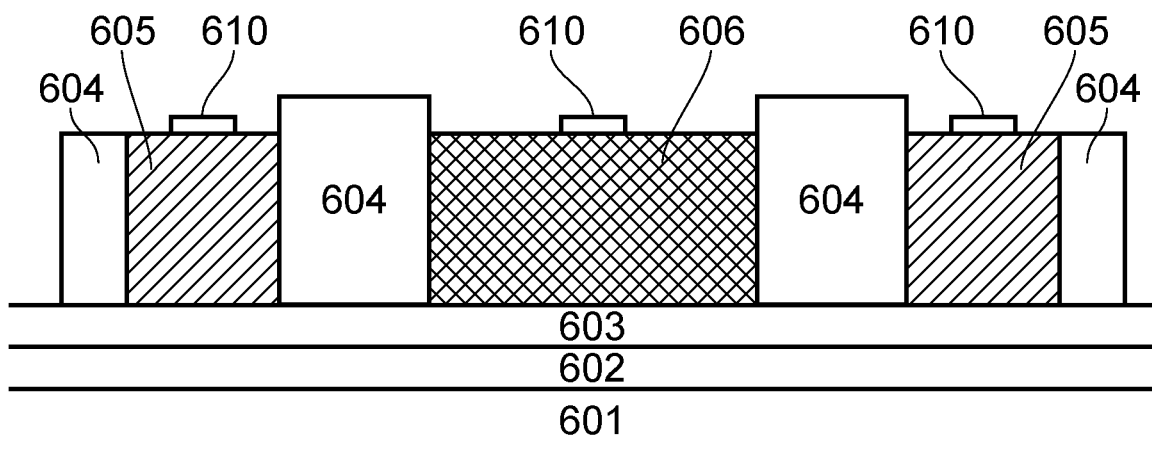
FIG. 6B shows a schematic example of a waveguide modulator according to the present invention.

In FIG. 6 are shown upstanding waveguides in SiGe, Ge or similar material where the waveguides are of the type described in relation to FIG. 2. Here they are assembled into Mach-Zehnder structures. The SiGe waveguides are fabricated upon an SOI chip. Then doped regions are numbered in accordance with the earlier figures and it will be clear that intermediate lightly doped regions may be used in accordance with the teaching of FIG. 2A.

Figure 7A:
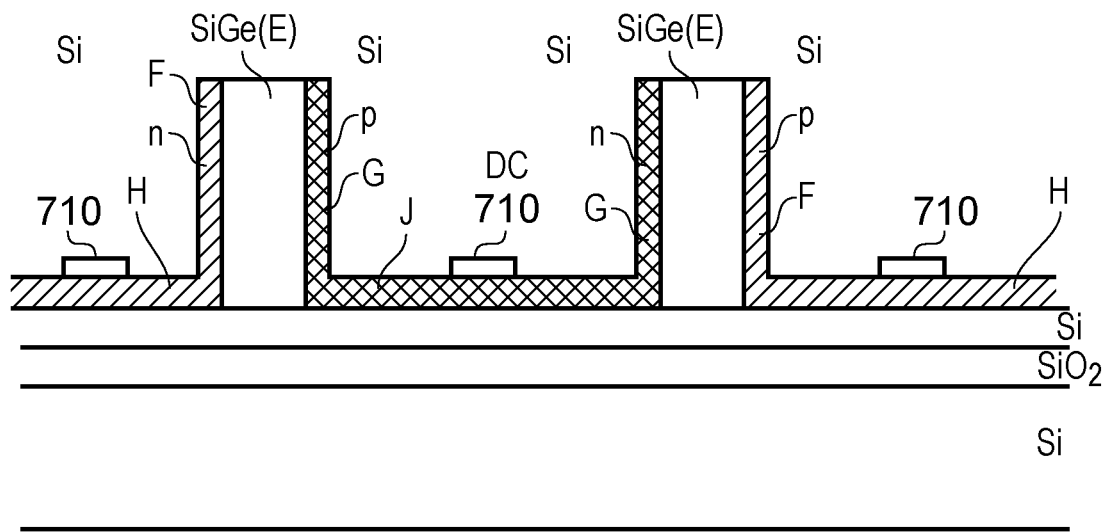
FIG. 7A shows a schematic example of a waveguide modulator according to the present invention.
Figure 7B:
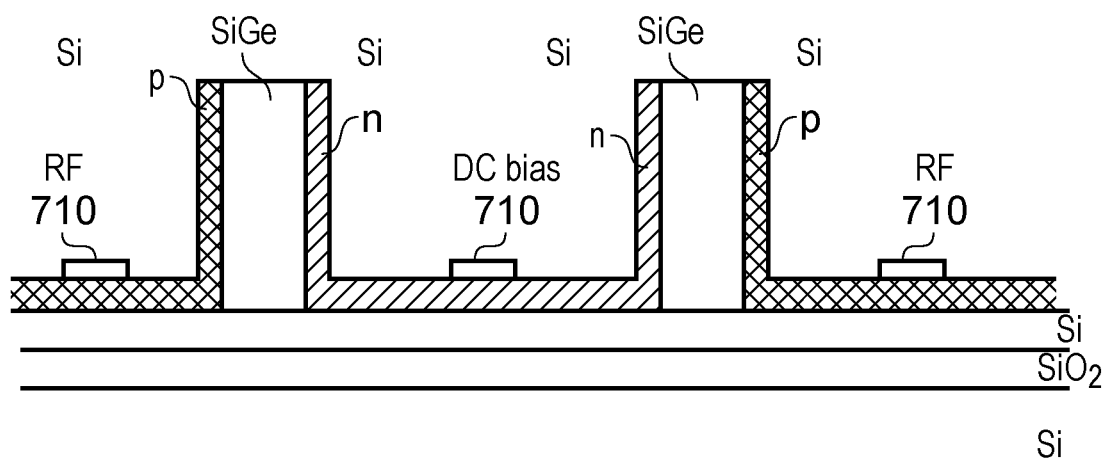
FIG. 7B shows a schematic example of a waveguide modulator according to the present invention.

In FIG. 7 are shown SiGe channel waveguides based on SOI layer (SiGe channel width 0.2-0.5 μm, channel height 0.5-2.6 μm, width of Si side-cladding 0.1-0.2 μm and height of Si side-cladding 0.5-2.6 μm depending on the waveguide platform). A channel (or slot) is created in an SOI wafer and filled with SiGe. After the wafer has been planarised, waveguides are then etched in the silicon to create silicon waveguides contiguous with waveguides with a SiGe central part (E) but with some silicon remaining to form the side-cladding walls of the waveguide. Doping is then applied to the silicon layers (F and G) on either side of the waveguide, taking care not to dope the SiGe or Ge. The SiGe waveguide is contiguous with passive silicon waveguides acting to carry light to the active region and to carry it away. Portions of the lateral regions (H and J) are also doped so that convenient electrical contacts can be made at metallised areas (not shown). The advantage of this structure is that a lower voltage is required for a given modulation depth (compared with U.S. Pat. No. 8,346,028) with lower optical loss since optical mode is mainly confined in the SiGe channel area with less amplitude in the Si side cladding area which is doped.

For all of the cross-section structures of Mach-Zehnder modulators shown in FIGS. 3, 4, 5, 6 and 7, various arrangements may be constructed along the length of the waveguide. In FIG. 3, some of these arrangements are illustrated. FIG. 3A illustrates a lumped electrode created in a SiGe region (cavity) built upon an SOI wafer. The light incident at the input x of the device is split, typically using a multi-mode interference (MIMI) device to divide the light between the arms of the Mach-Zehnder modulator. Other light splitting means will be known to one skilled in the art. Each of the arms is created through a region of SiGe. There is a central DC bias electrode, typically dispose on the surface of the horizontal doped region and the RF drive for the electrodes is achieved through metal contacts placed on the horizontal portions of the lateral horizontal doped regions.

Figure 3A:
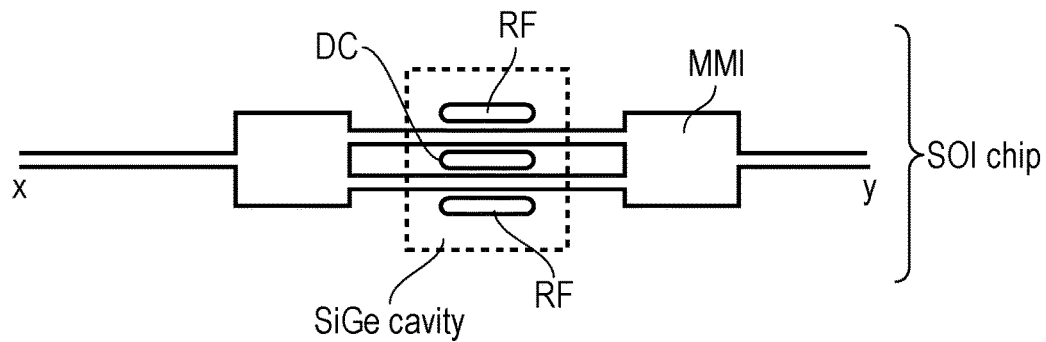
FIG. 3A shows a schematic example of a plurality of electrodes for use with the present invention.
Figure 3B:
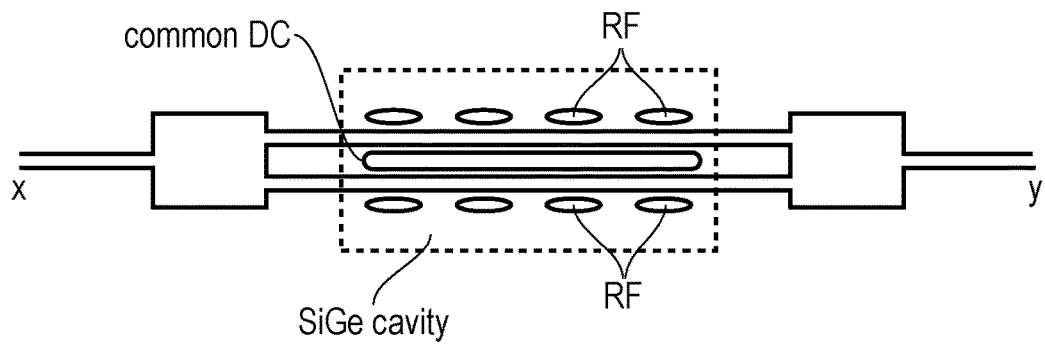
FIG. 3B. shows a schematic example of a plurality of electrodes for use with the present invention.
Figure 3C:
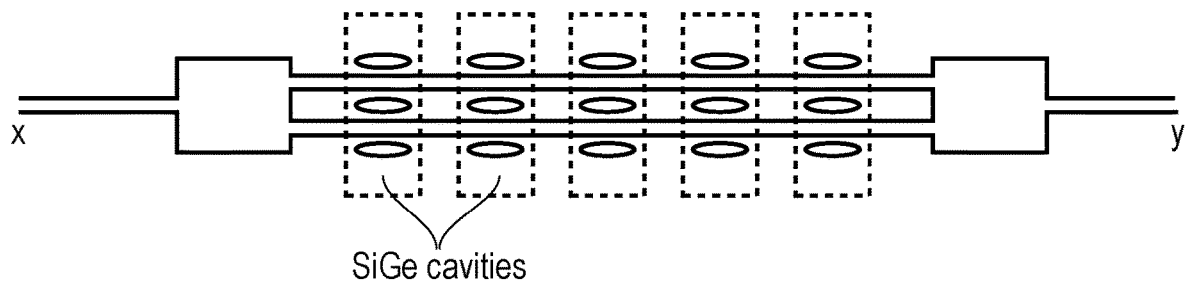
FIG. 3C shows a schematic example of a plurality of electrodes for use with the present invention.

FIG. 3B shows an example of cascade lumped electrodes (series of electrodes) fabricated in a SiGe region (cavity) of the chip such that high speed modulation may be achieved. FIG. 3C shows an example where there are multiple regions (cavity) of SiGe, each having appropriate electrodes. The advantage of such structures is that they have lower power consumption, but the disadvantage is that they are more complicated to drive and control.

Figure 3D:
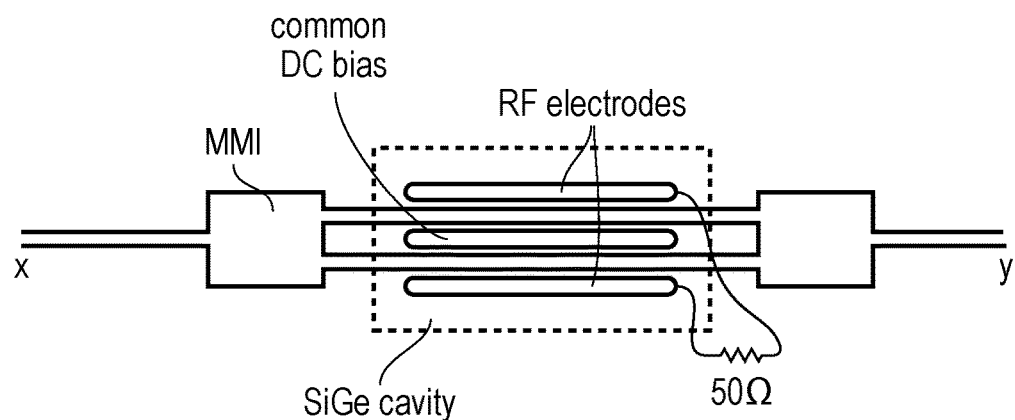
FIG. 3D shows a schematic example of a plurality of electrodes for use with the present invention.
Figure 3E:
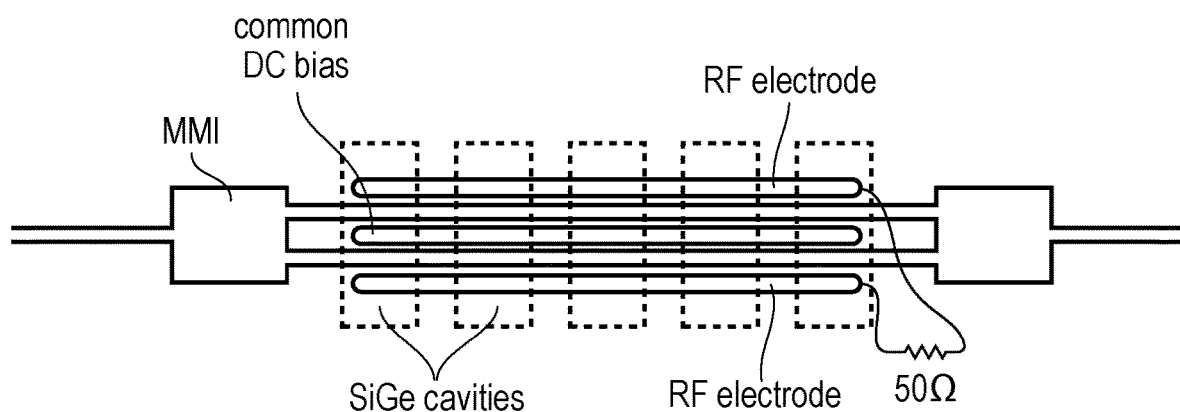
FIG. 3E shows a schematic example of a plurality of electrodes for use with the present invention.

FIG. 3D shows an example of a traveling wave electrode fabricated in a SiGe region (cavity) of the chip such that high speed modulation may be achieved. FIG. 3E shows an example where there are multiple regions of SiGe a modulator has traveling wave electrodes. The traveling wave electrodes are not necessary the same structures shown in FIGS. 3D and 3E which are just examples. The definition of traveling wave electrodes in this patent is any electrodes that are terminated with resistors (typical 50 ohm value). The advantages of traveling wave electrodes are to have high speed, low driving voltage and large extinction ratio, but the disadvantages of traveling wave structures are that they tend to be longer (100 μm to 5 mm), so occupy more space than lumped electrodes, and they consume more power than lumped electrodes due to the 50 ohm termination resistance with existing driving techniques.

Typically, the Mach-Zehnder modulators of this invention would be fabricated on a silicon-on-insulator (SOI) chip. FIG. 3 illustrate a MZ interferometer in which the input signal is received at an input waveguide to a multi-mode interference coupler (MMI) which divides equally the input light into the two arms of the MZ interferometer structure. The central region of the MZ modulator is a silicon/germanium cavity. At the very least the optical waveguides in this region are made of silicon/germanium of an appropriate stoichiometric ratio to cover interested wavelength range. As shown in FIGS. 4, 5, 6 and 7, the one side (inner side) of the waveguides are p or n doped and the other sides are oppositely doped (that is n or p doped respectively). The MZ is DC biased at the central electrode and RF signals are applied to the arms of the interferometer at electrodes contacted at the two sides. When the MZ modulator of FIG. 4, 5, 6 or 7 is operated in a push-pull mode, in one arm the DC electric field and RF electric field are in the same direction; but in the other arm the DC electric field and the RF electric field are in opposite direction, the phase change in the two arms induced by the electric field change has the same amplitude but opposite direction due to the carrier plasma dispersion effect. Therefore, the total phase change in the two arms is doubled, which reduces the drive voltage in half.

Figure 8A:
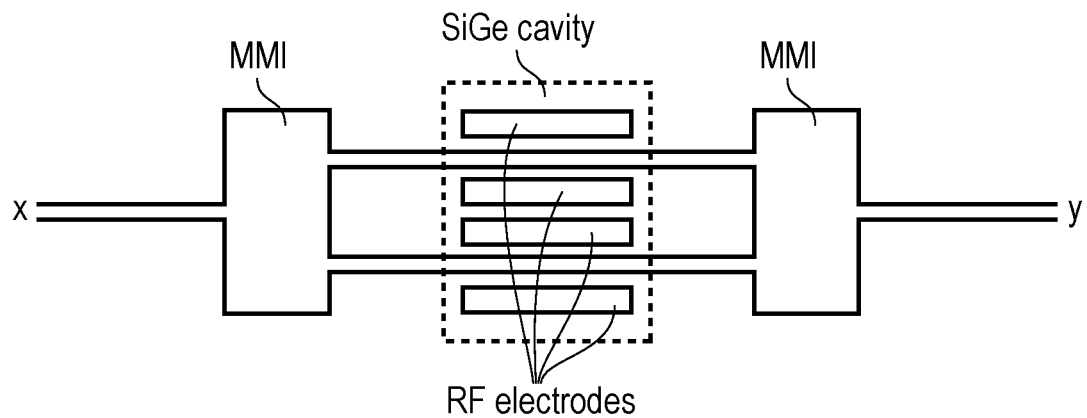
FIG. 8A shows a schematic example of a waveguide modulator according to the present invention.

Further embodiments are disclosed in relation to FIG. 8, which illustrate a Mach-Zehnder (MZ) interferometer constructed with MIMI couplers on an SOI chip. FIG. 8A is a plan view of one possible structure. As with previous embodiments, the incoming light (at x), may be divided and recombined by various means known to one skilled in the art.

Figure 8B:
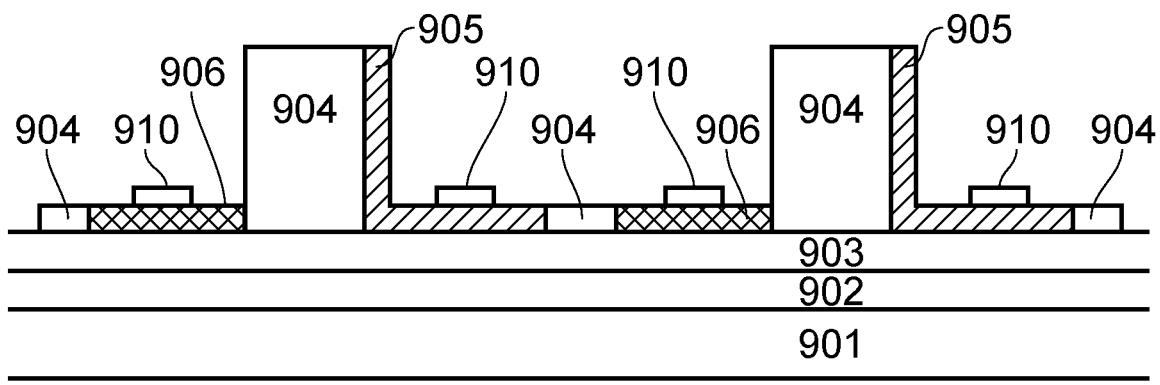
FIG. 8B shows a schematic example of a waveguide modulator according to the present invention.

In this invention the arms of the MZ are isolated from each other—in other words there is no common bias. Each of the arms is effectively a phase shifter fabricated in a SiGe cavity (enclosed in dotted line in FIG. 8A) in the silicon chip. As shown in FIG. 8B the waveguides of the structure of FIG. 1 are in the driven region of the modulator and they are made of SiGe of an appropriate stoichiometric ratio to cover the wavelength of interest. In a preferred mode of operation, to each arm of the modulator is applied an RF modulating signal at the electrodes marked 910, where the two RF signals are out of phase—effectively producing a push-pull drive for the MZ modulator.

Figure 8C:
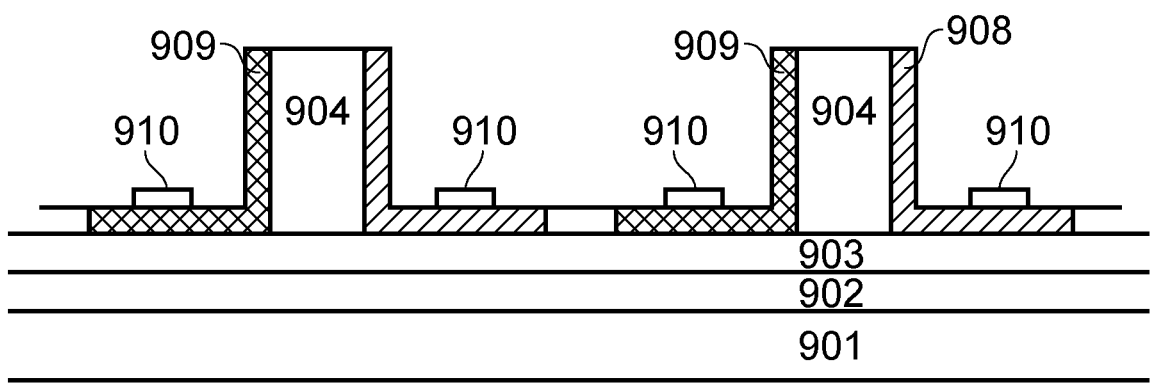
FIG. 8C shows a schematic example of a waveguide modulator according to the present invention.
Figure 9:
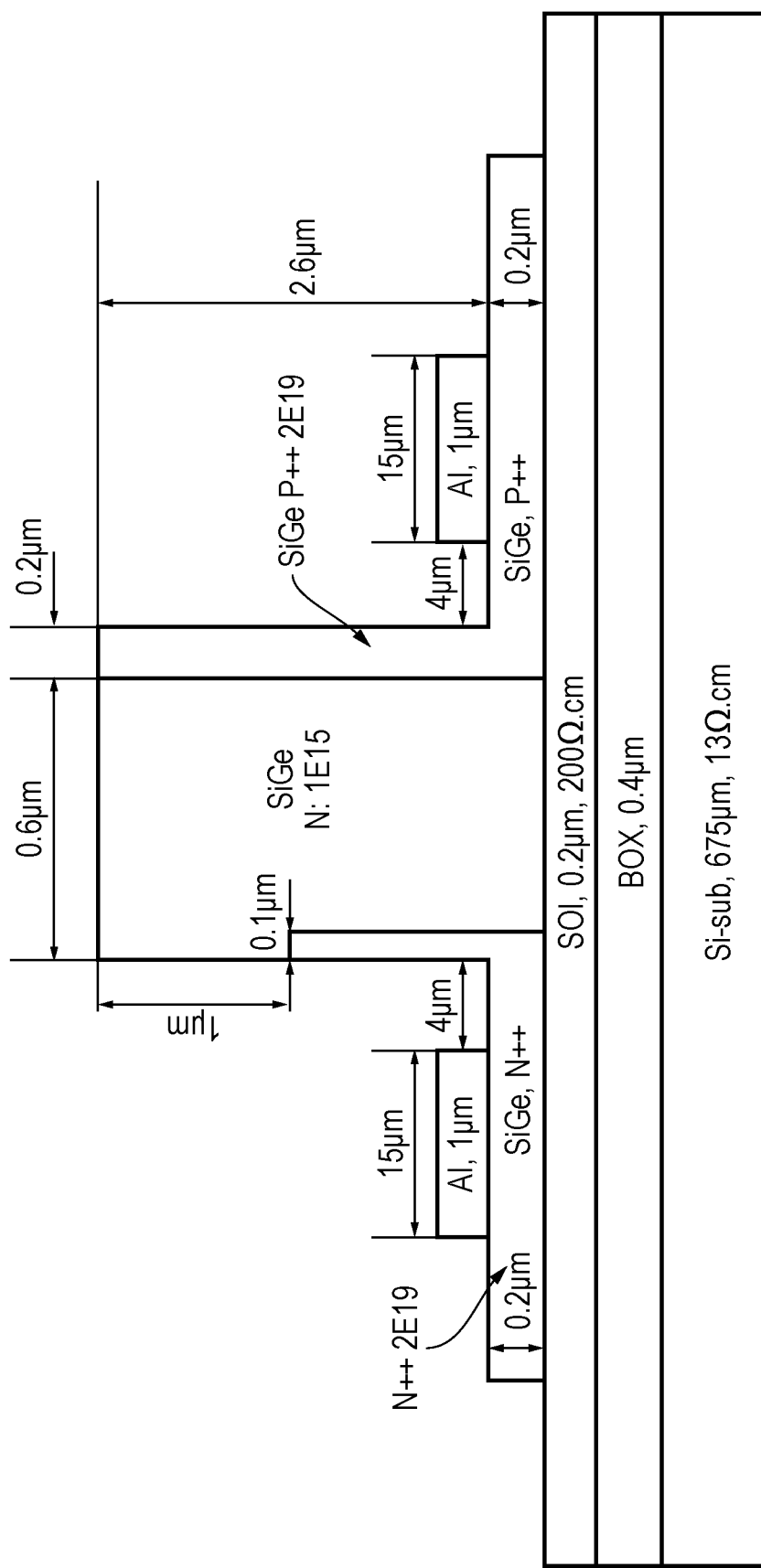
FIG. 9 shows an example of a waveguide optical device for use with the present invention.
Figure 10A:
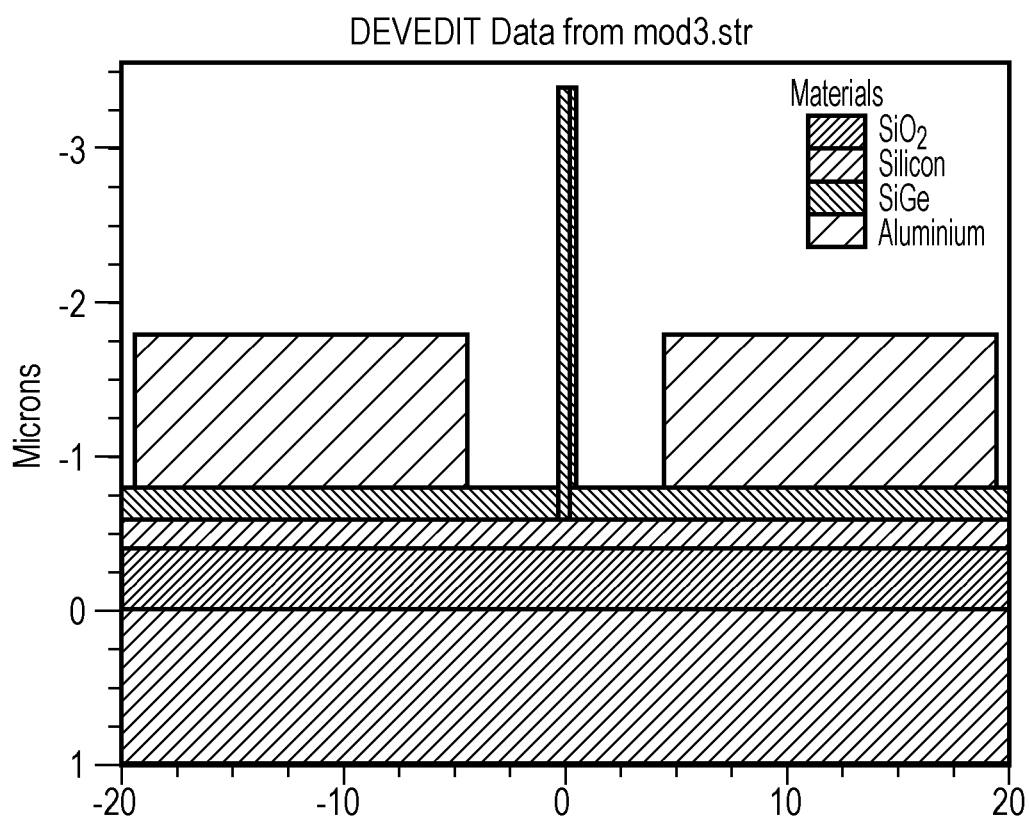
FIG. 10A shows parameters used to model the waveguide device of FIG. 9.
Figure 10B:
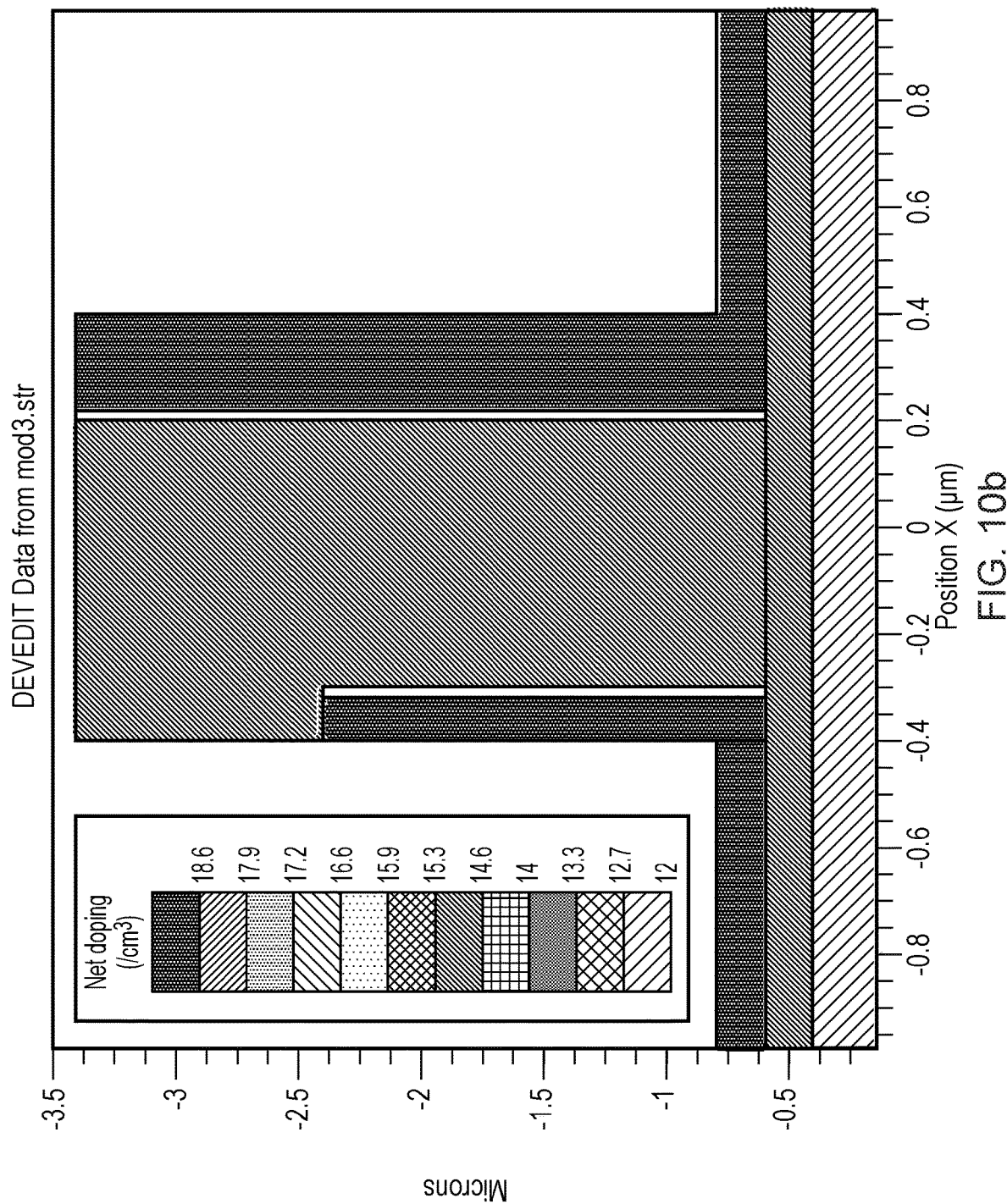
FIG. 10B shows parameters used to model the waveguide device of FIG. 9.
Figure 11A:
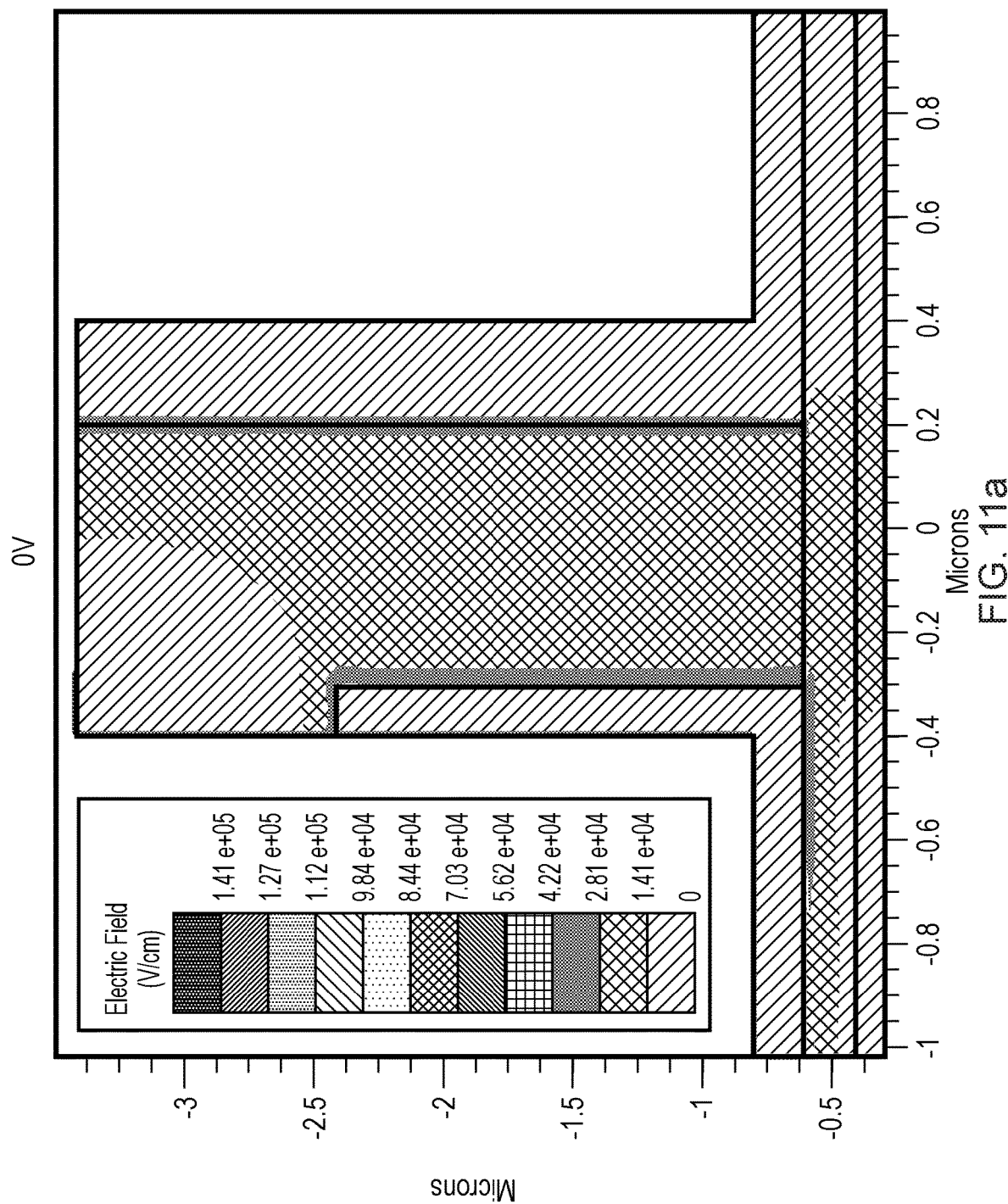
FIG. 11A shows modelled waveforms for the waveguide of FIG. 9.
Figure 11B:
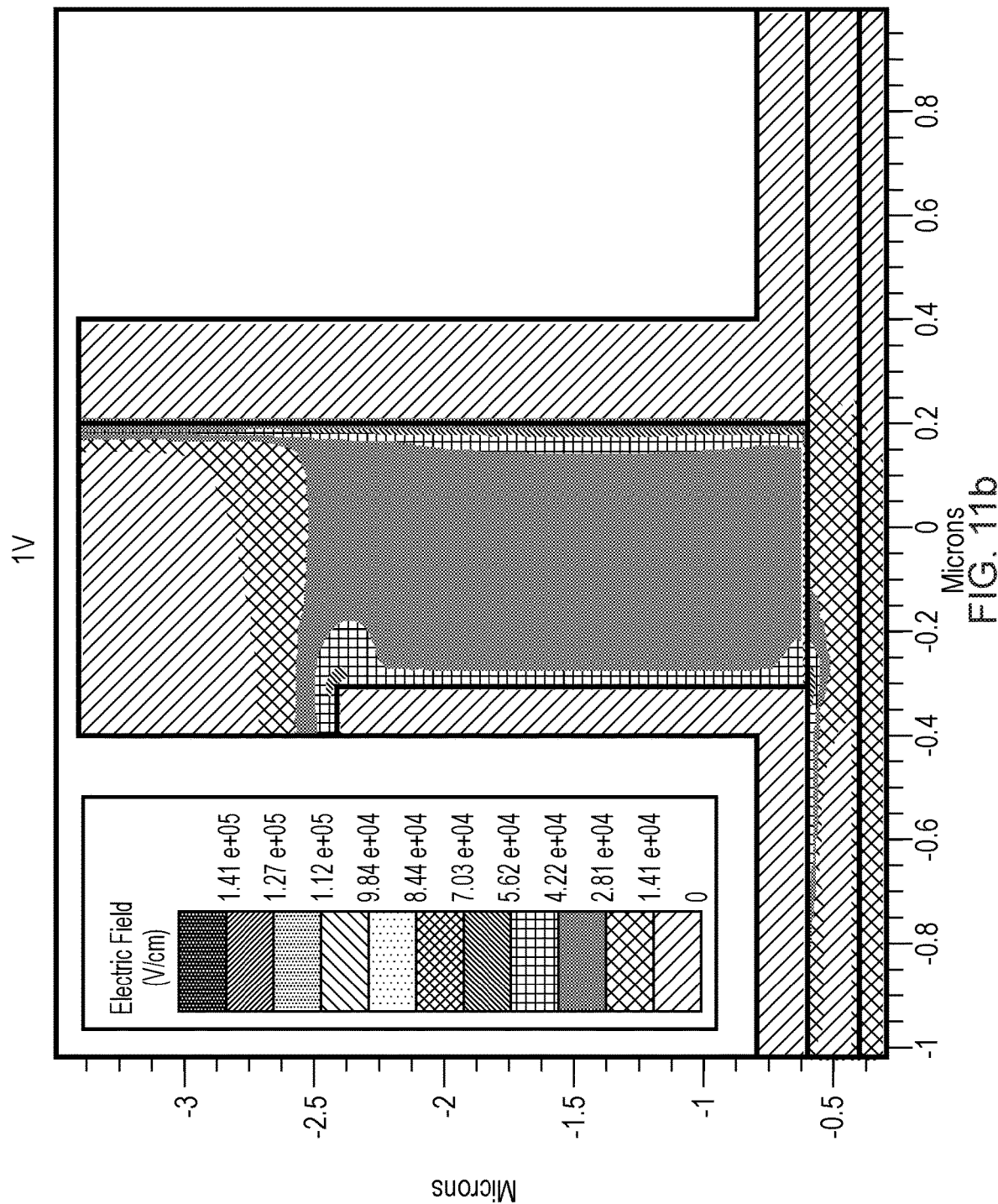
FIG. 11B shows modelled waveforms for the waveguide of FIG. 9.
Figure 11C:
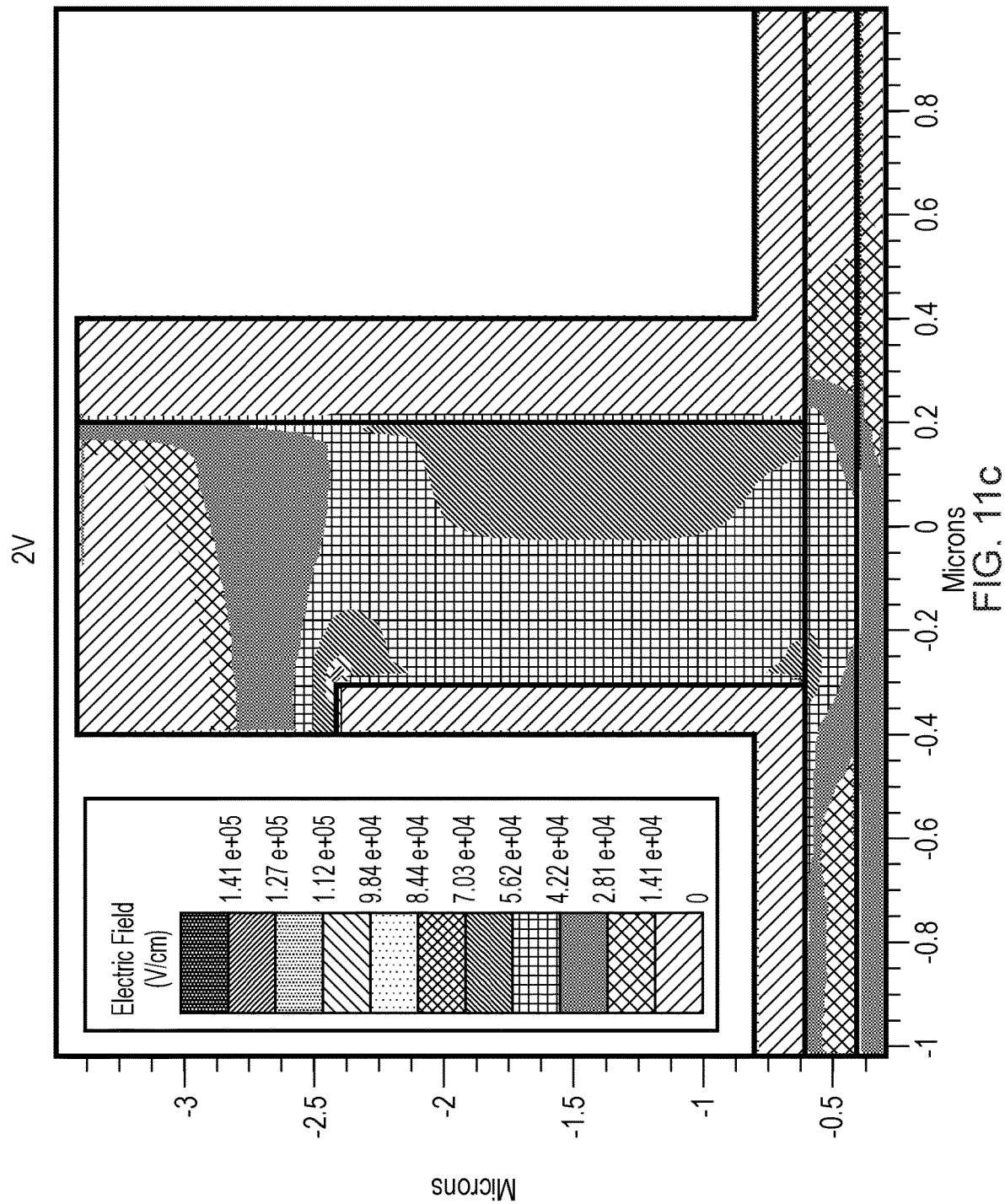
FIG. 11C shows modelled waveforms for the waveguide of FIG. 9.
Figure 11D:
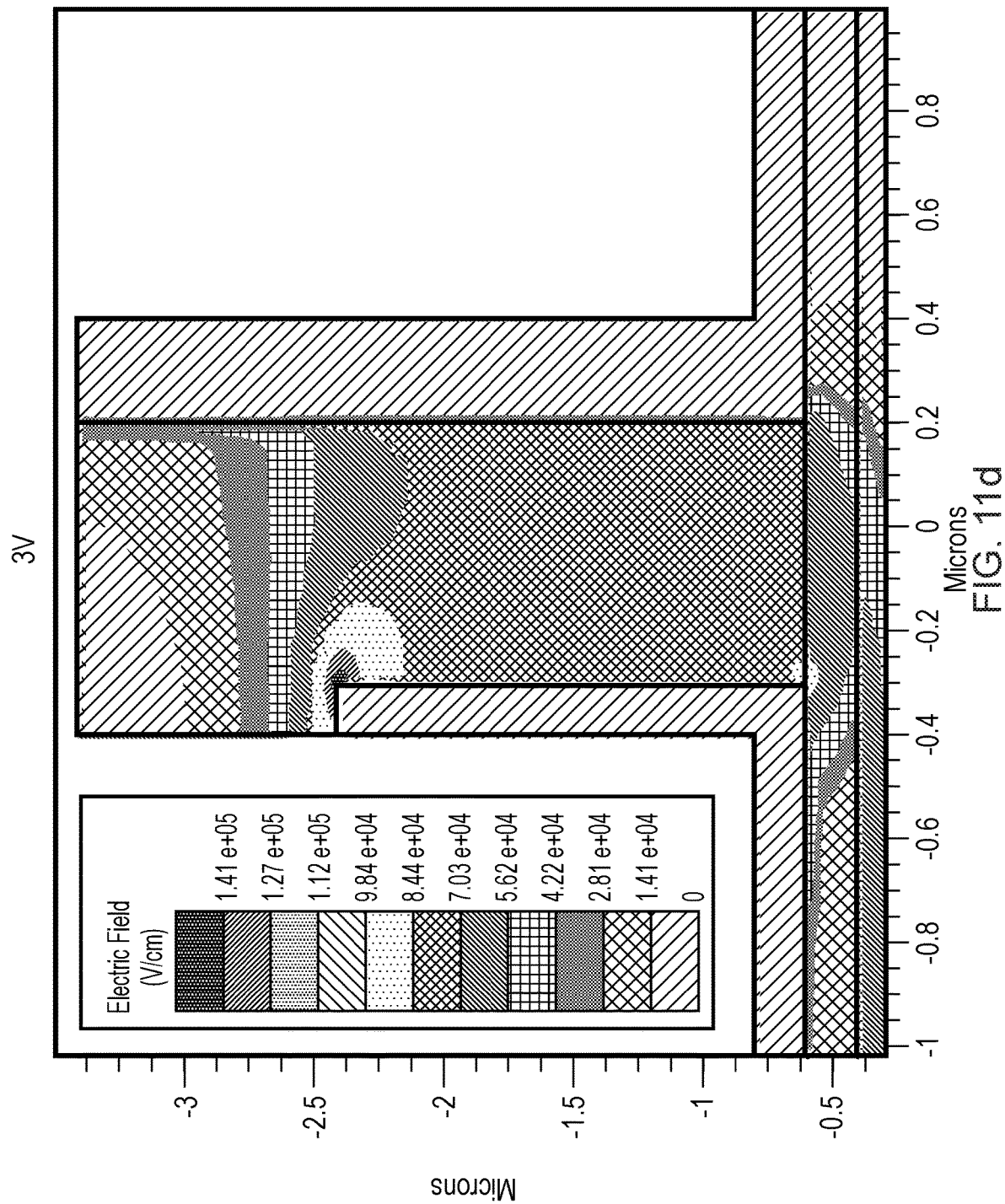
FIG. 11D shows modelled waveforms for the waveguide of FIG. 9.
Figure 12:
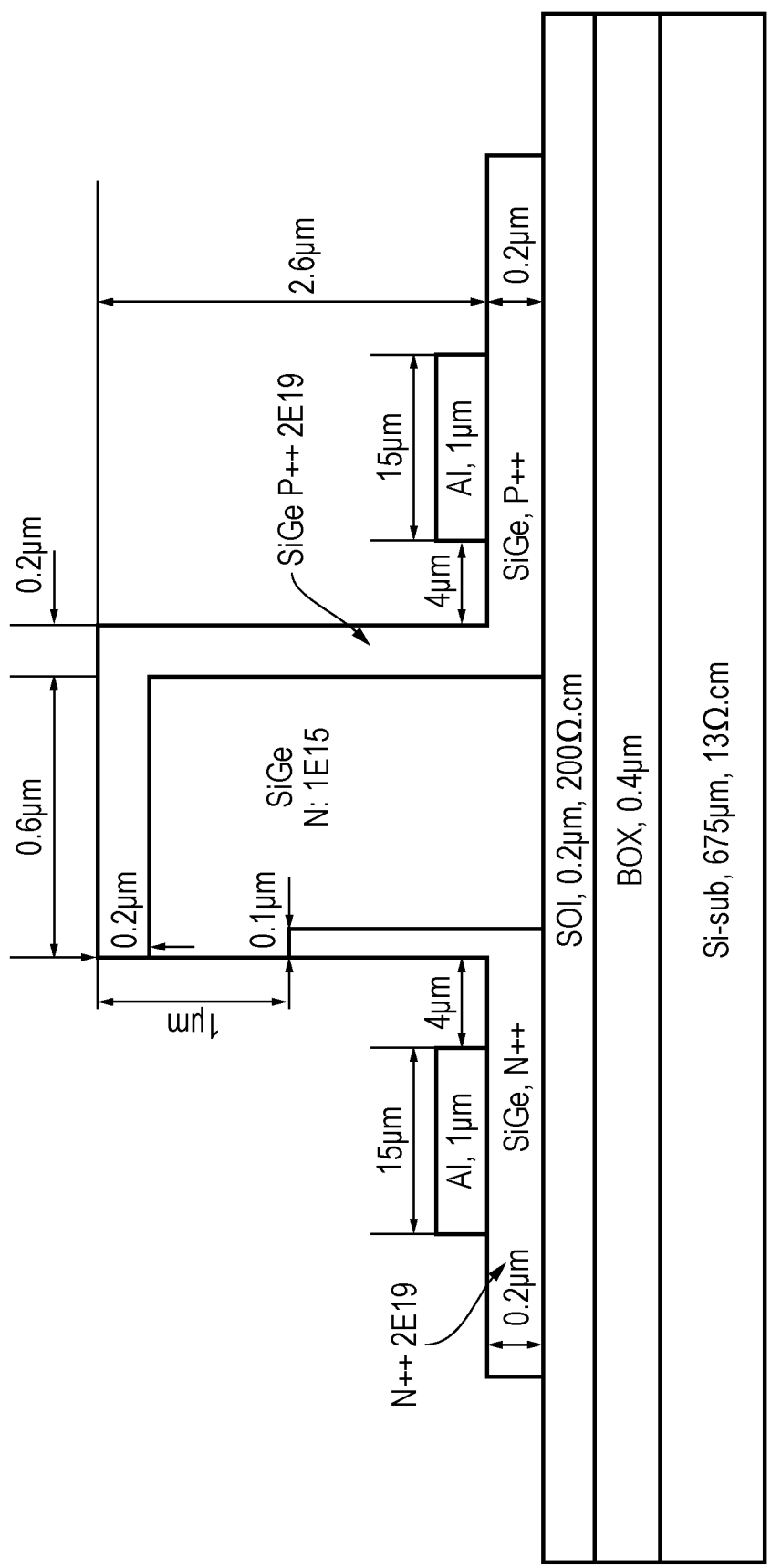
FIG. 12 shows an example of a waveguide optical device for use with the present invention.
Figure 13A:
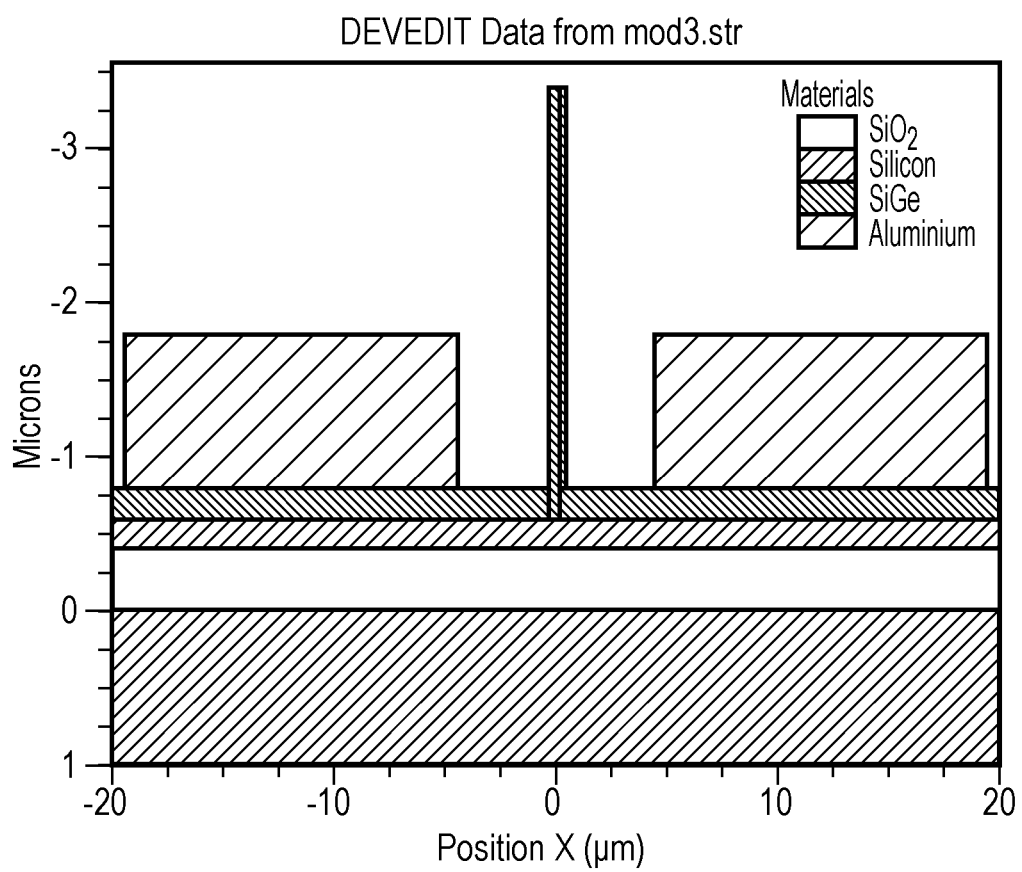
FIG. 13A shows parameters used to model the waveguide device of FIG. 12.
Figure 13B:
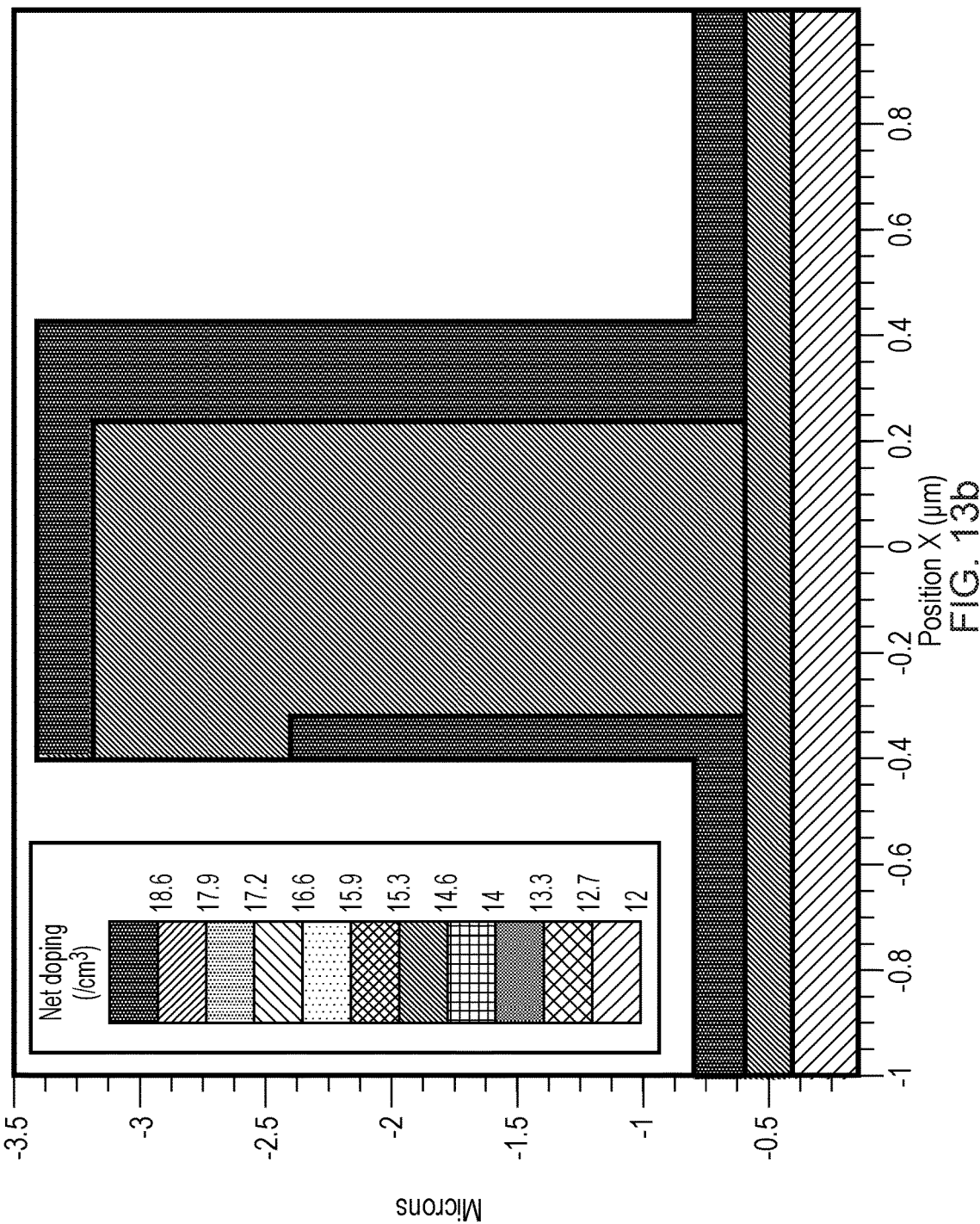
FIG. 13B shows parameters used to model the waveguide device of FIG. 12.
Figure 14A:
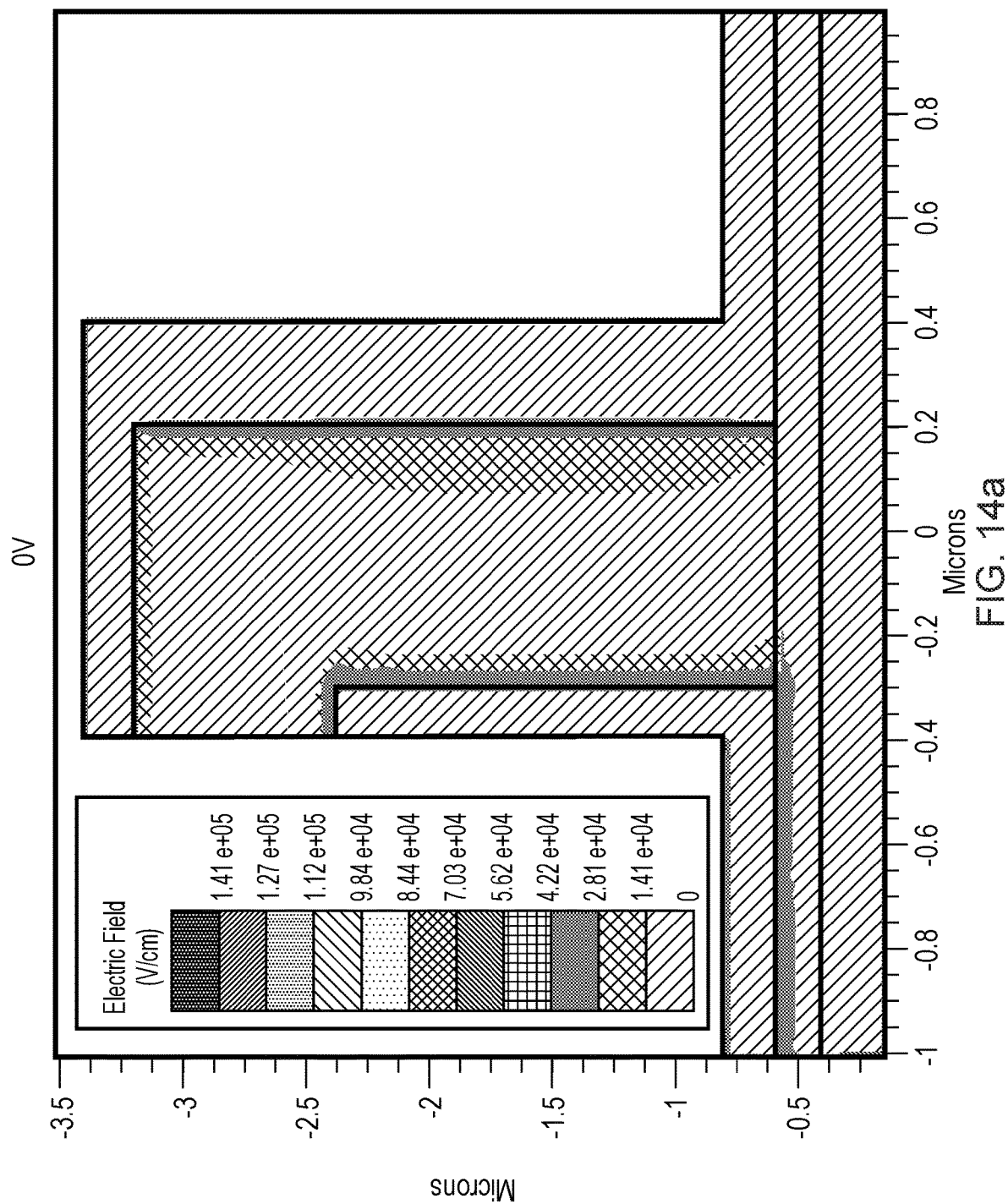
FIG. 14A shows modelled waveforms for the waveguide of FIG. 12.
Figure 14B:
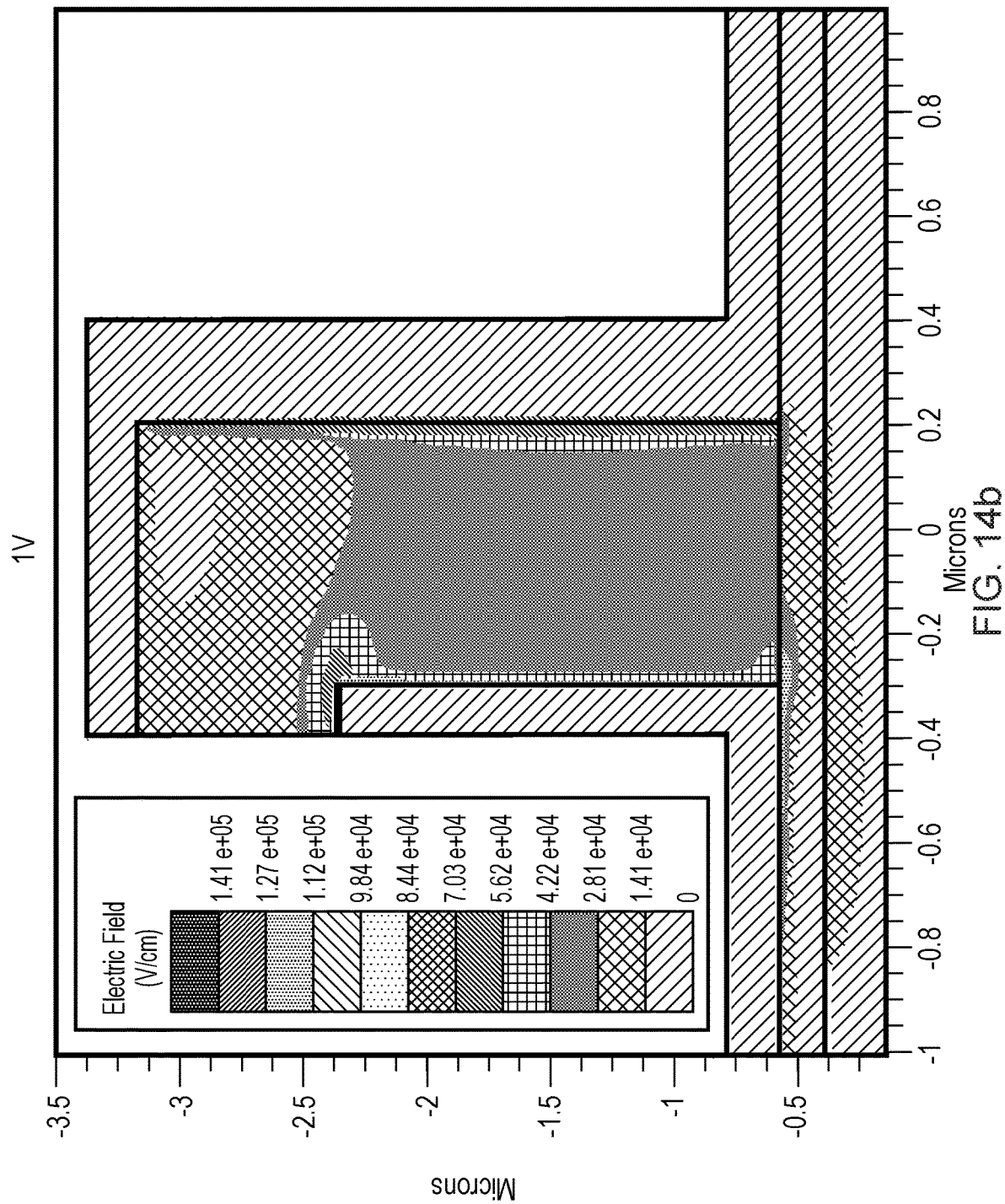
FIG. 14B shows modelled waveforms for the waveguide of FIG. 12.
Figure 14C:
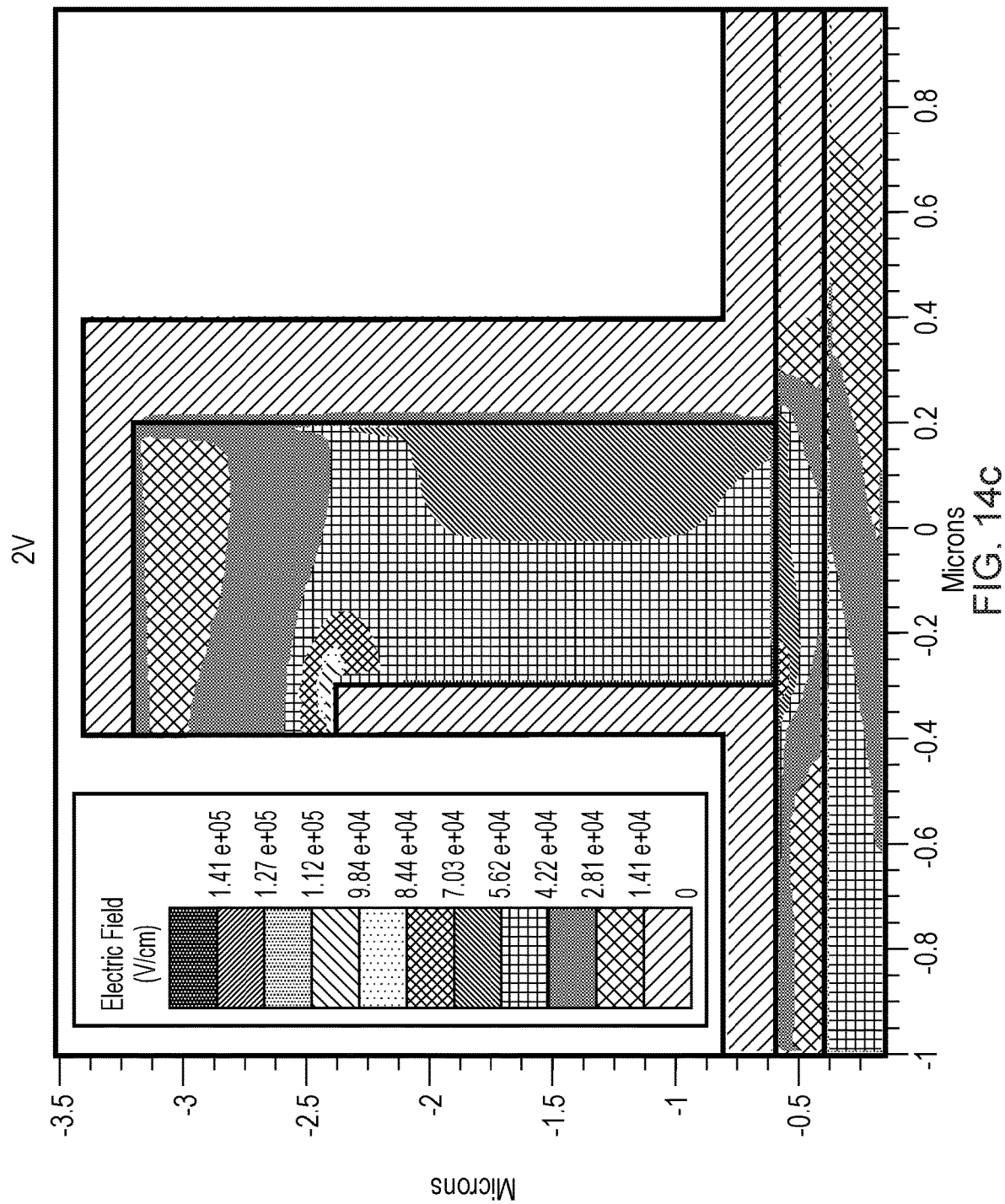
FIG. 14C shows modelled waveforms for the waveguide of FIG. 12.
Figure 14D:
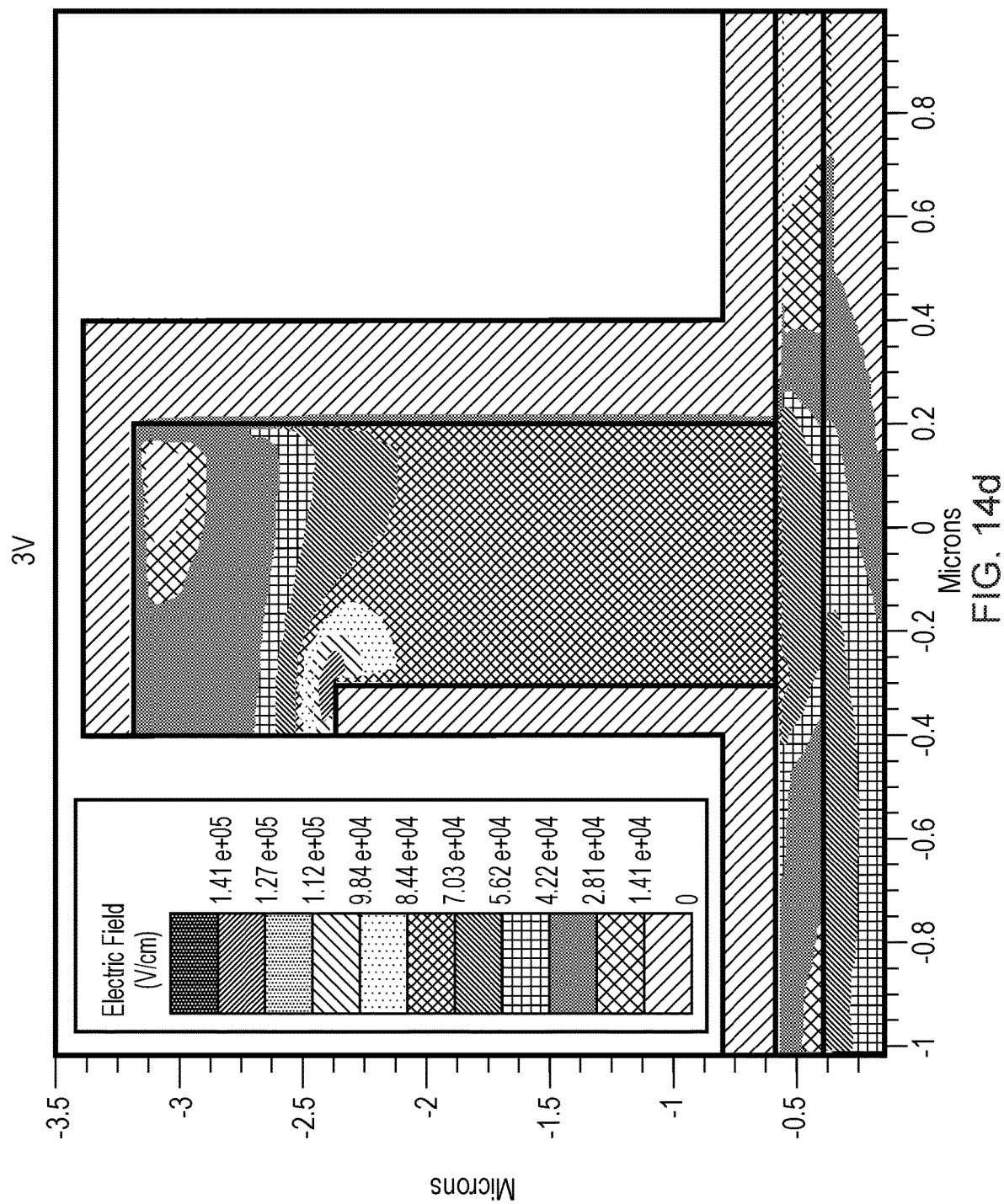
FIG. 14D shows modelled waveforms for the waveguide of FIG. 12.
Figure 15:
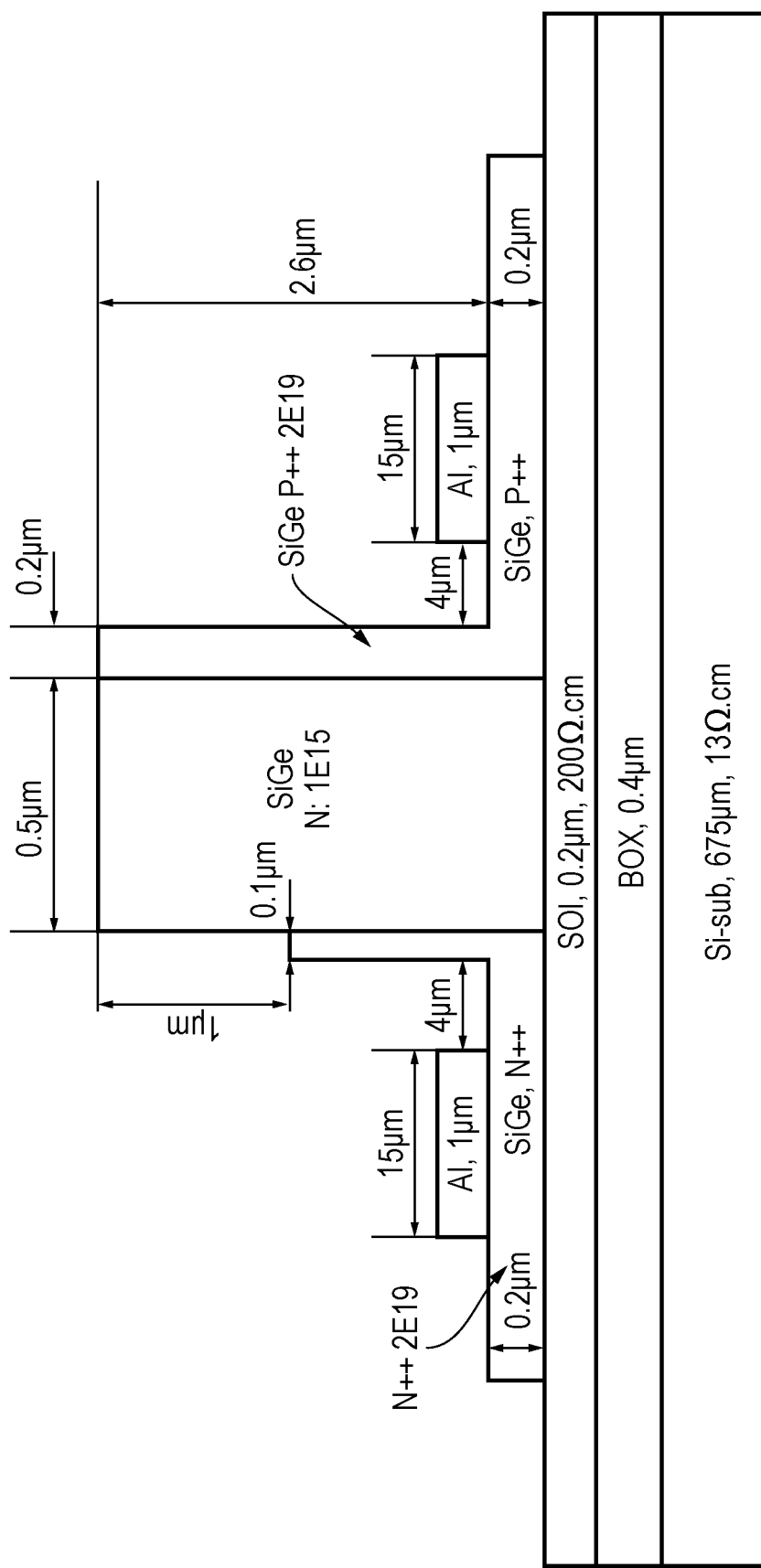
FIG. 15 shows an example of a waveguide optical device for use with the present invention.
Figure 16A:
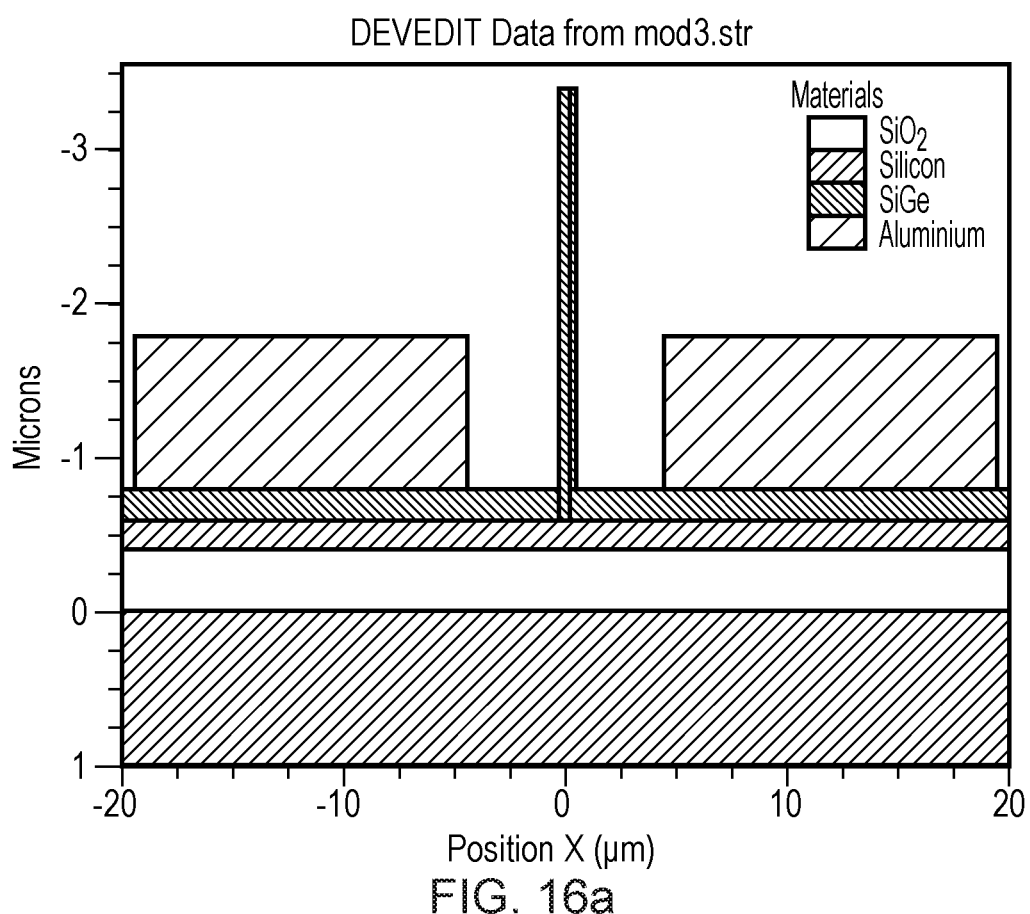
FIG. 16A shows parameters used to model the waveguide device of FIG. 15.
Figure 16B:
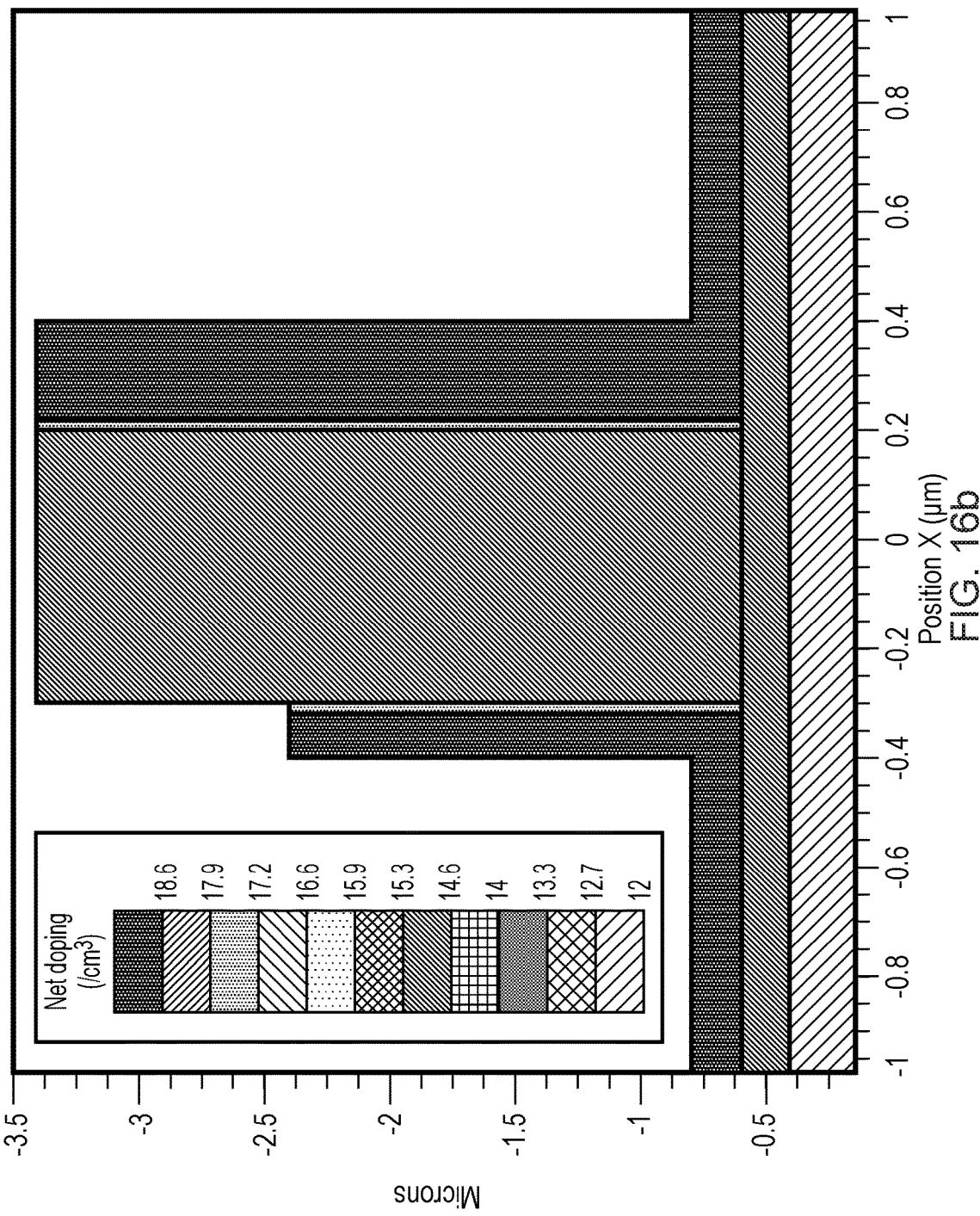
FIG. 16B shows parameters used to model the waveguide device of FIG. 15.
Figure 17A:
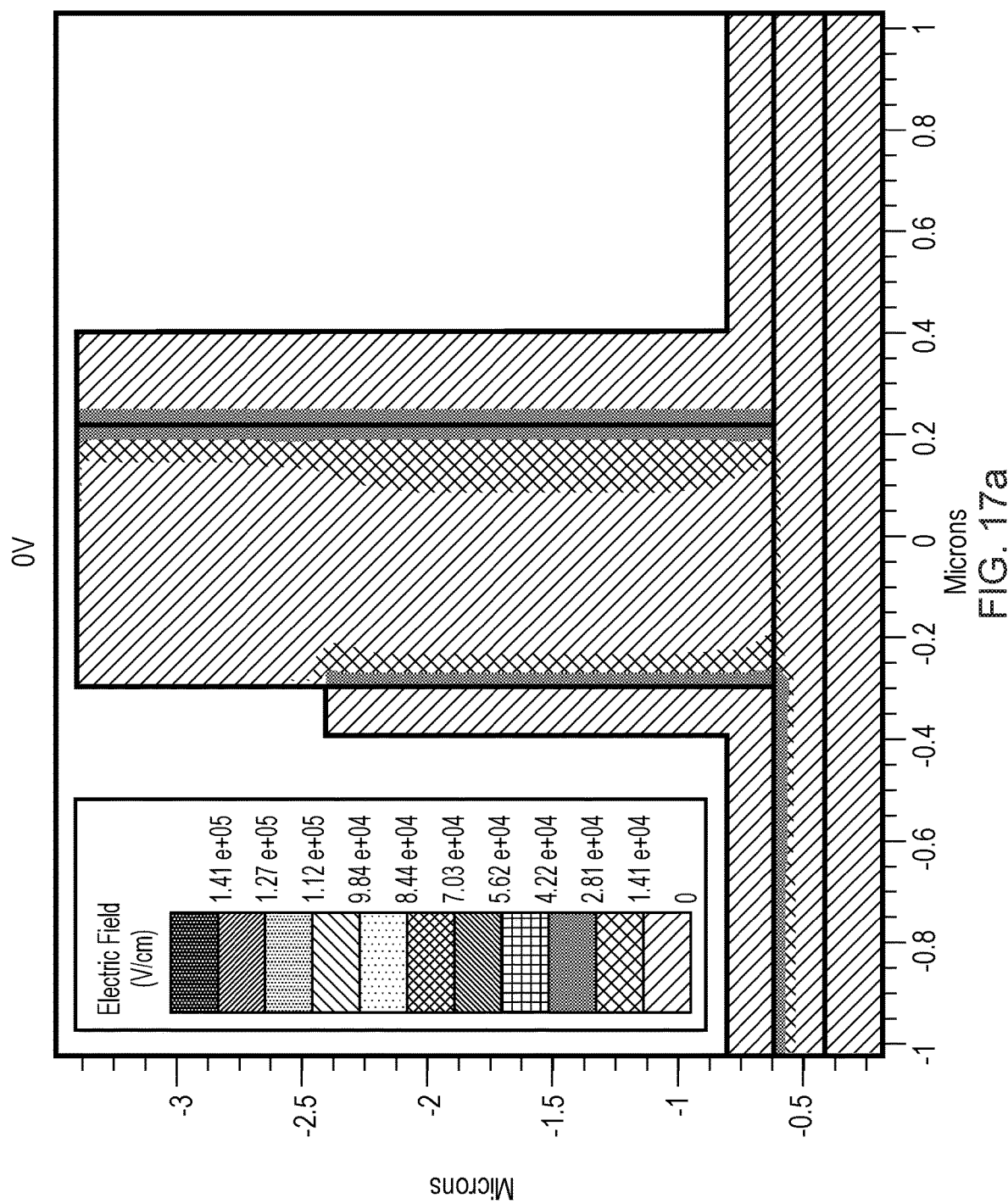
FIG. 17A shows modelled waveforms for the waveguide of FIG. 15.
Figure 17B:
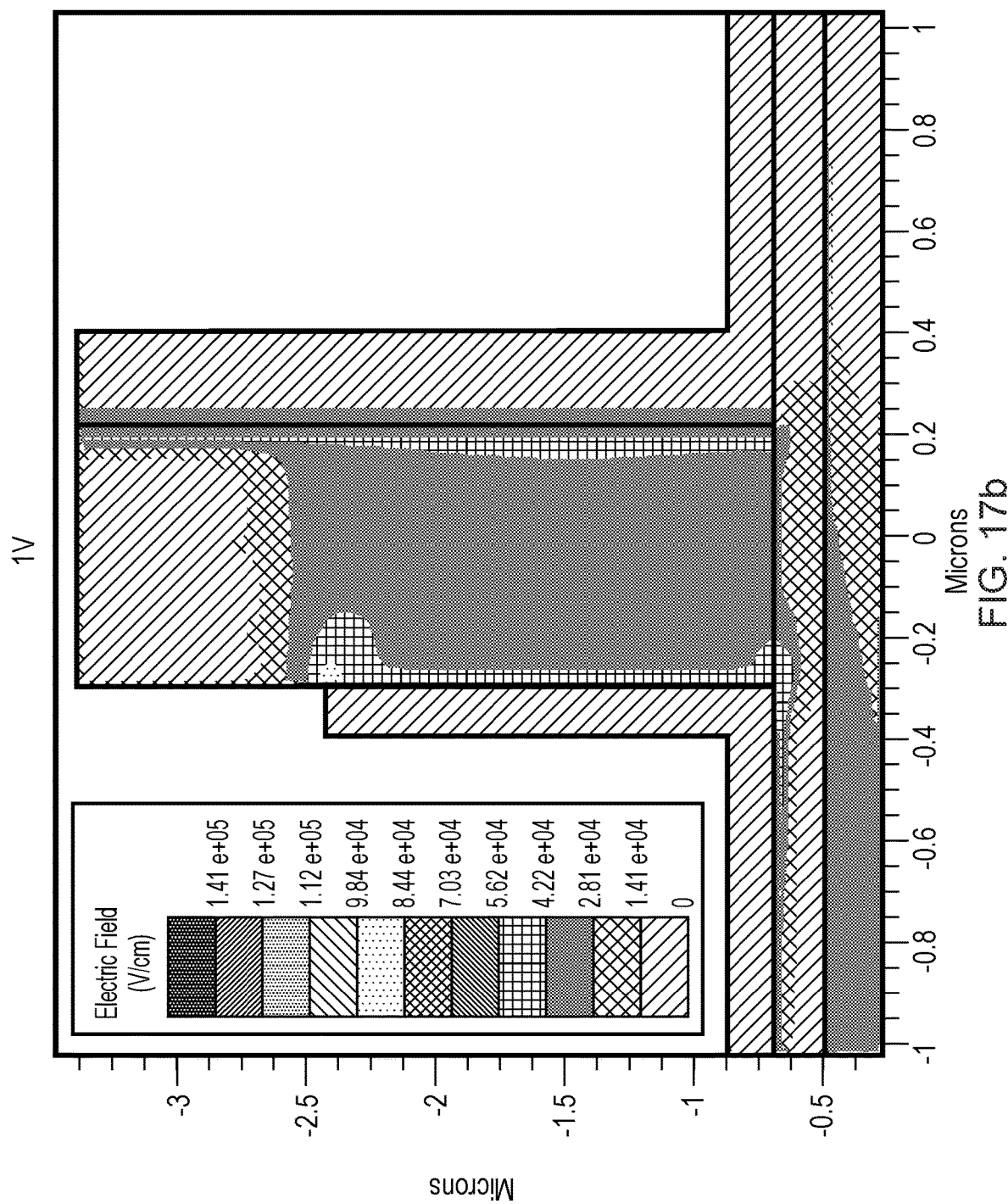
FIG. 17B shows modelled waveforms for the waveguide of FIG. 15.
Figure 17C:
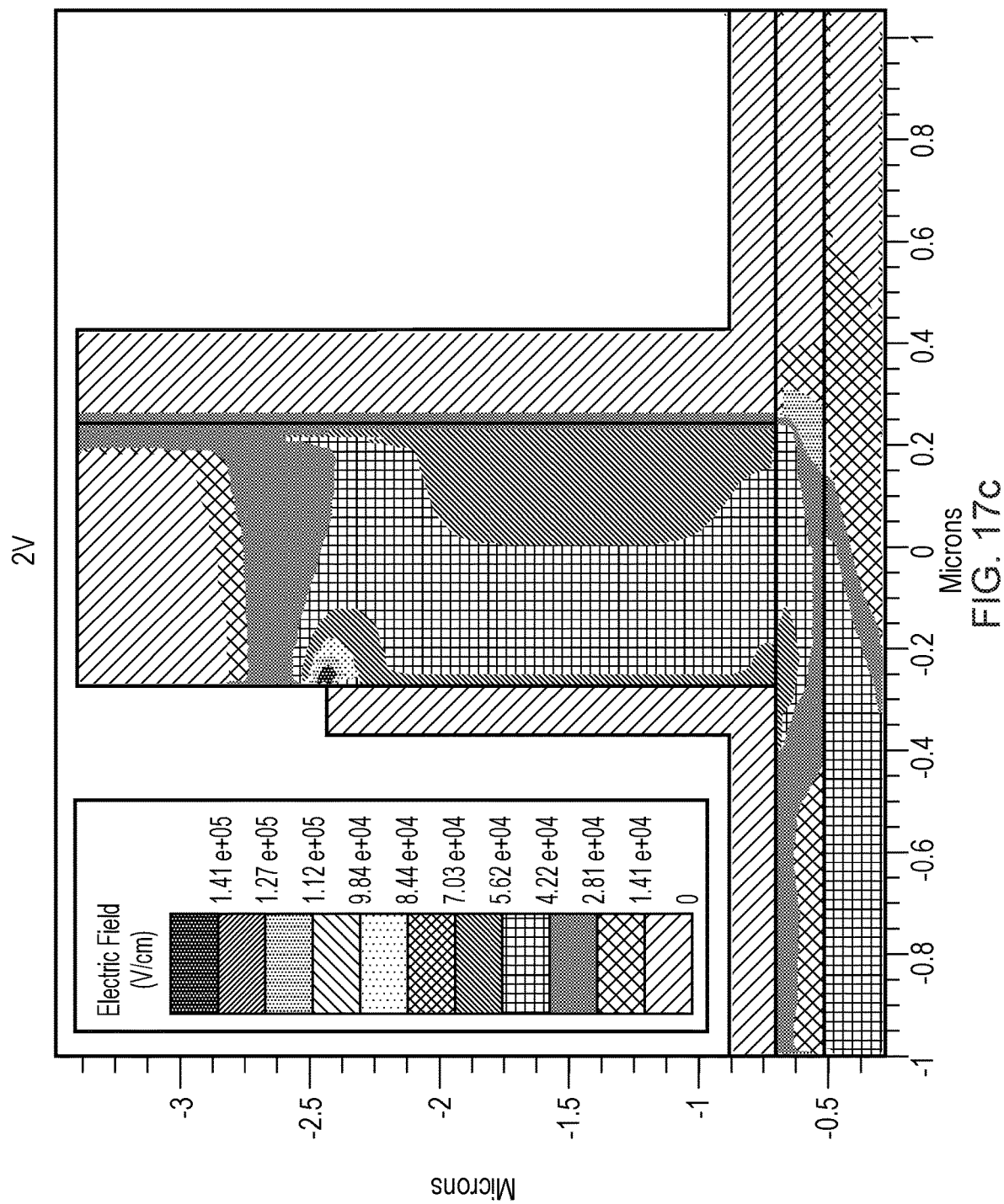
FIG. 17C shows modelled waveforms for the waveguide of FIG. 15.
Figure 17D:
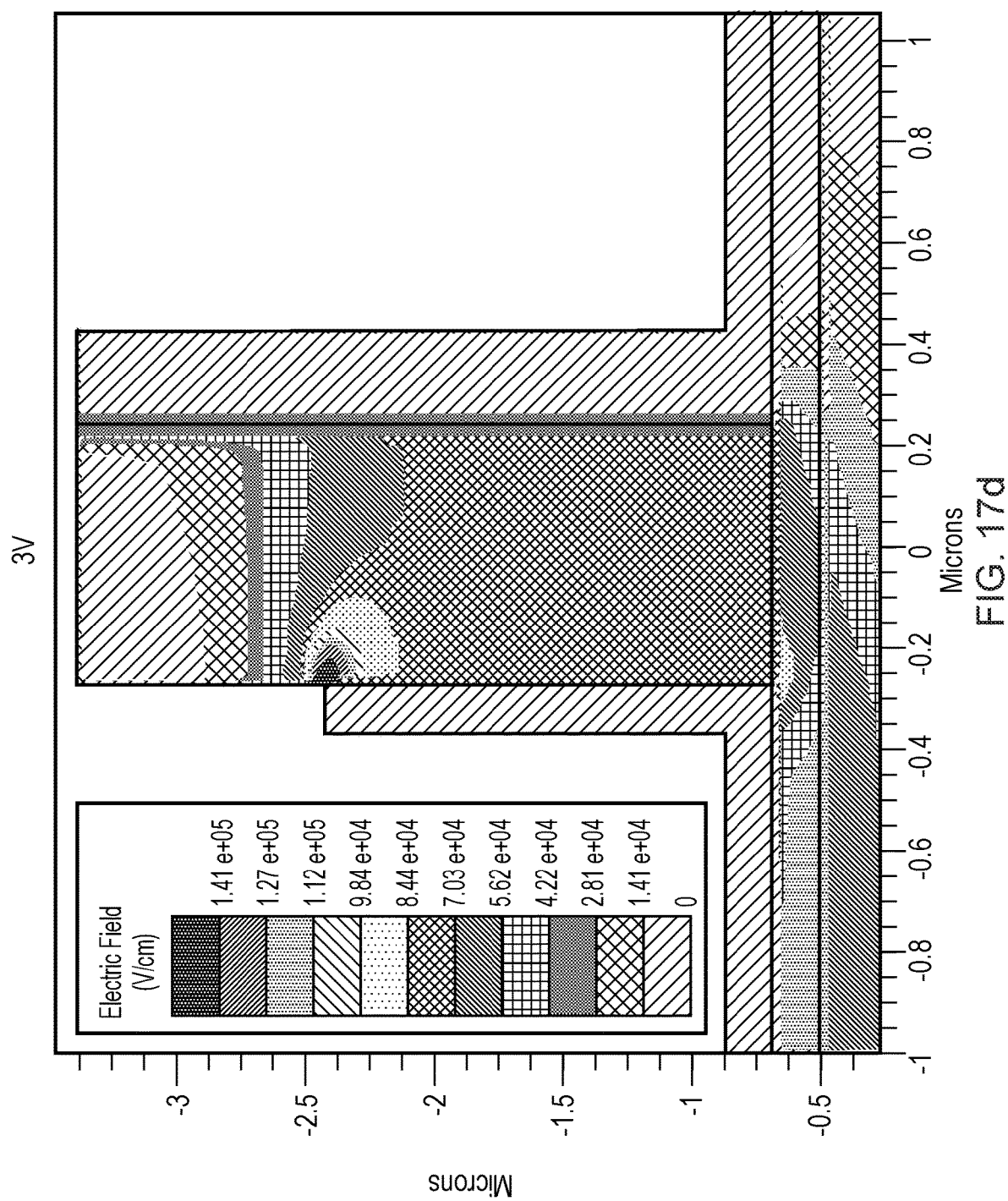
FIG. 17D shows modelled waveforms for the waveguide of FIG. 15.
Figure 18:
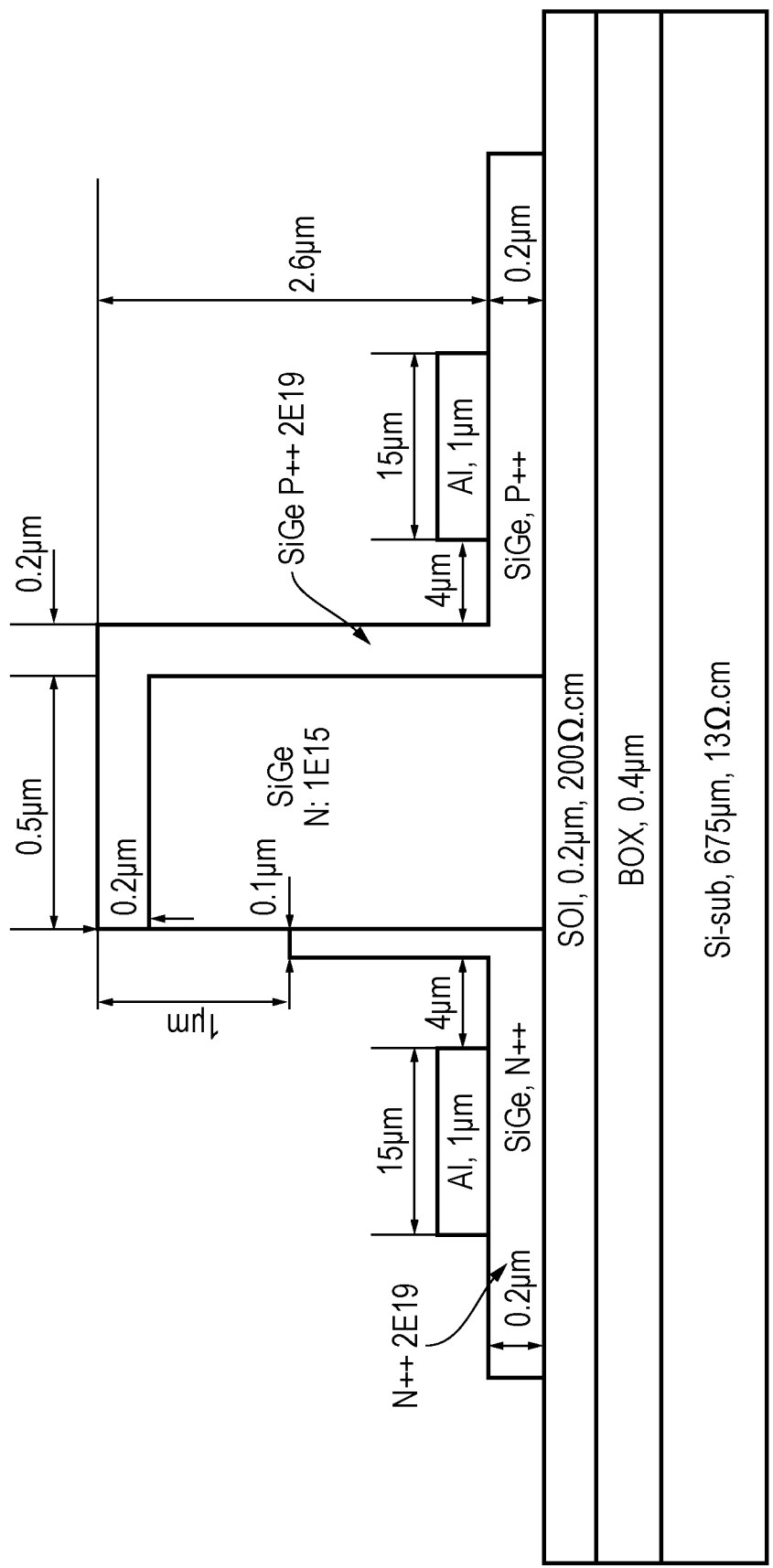
FIG. 18 shows an example of a waveguide optical device for use with the present invention.
Figure 19A:
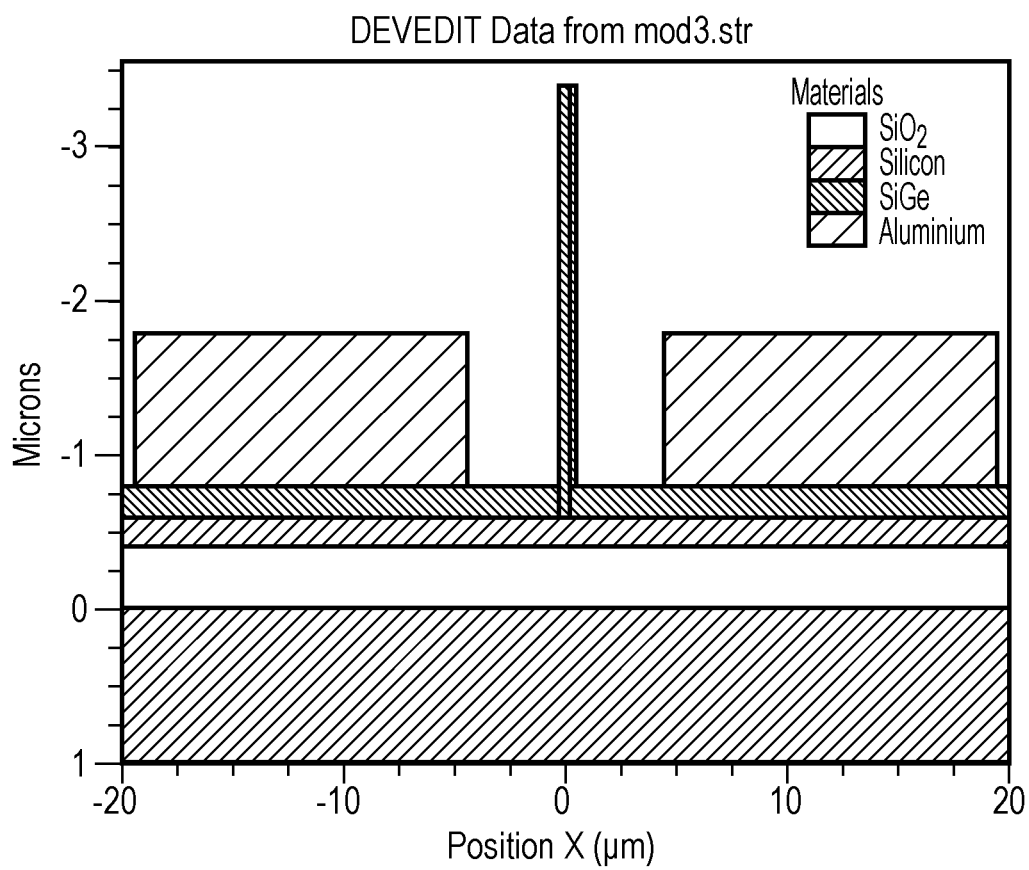
FIG. 19A shows parameters used to model the waveguide device of FIG. 18.
Figure 19B:
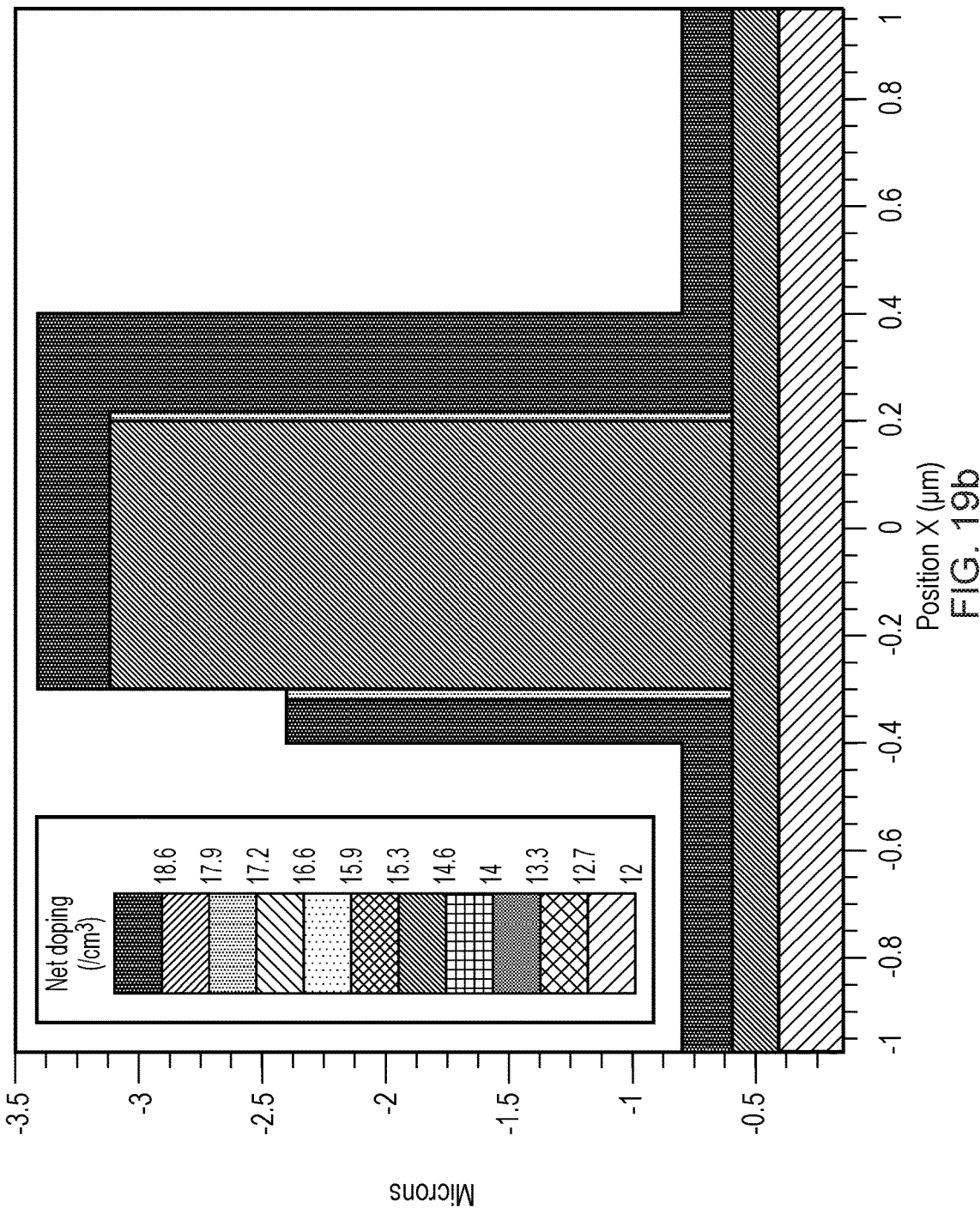
FIG. 19B shows parameters used to model the waveguide device of FIG. 18.
Figure 20A:
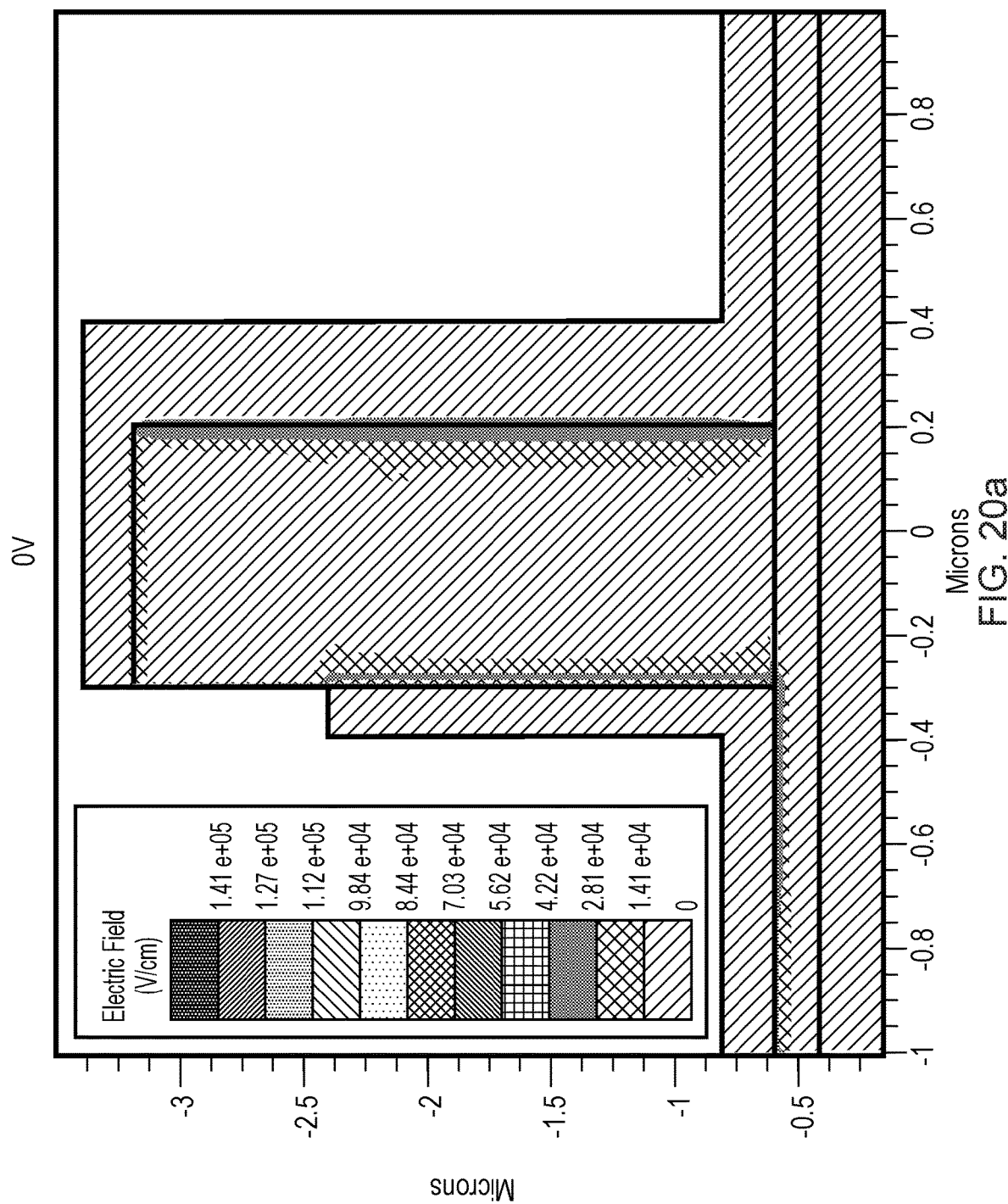
FIG. 20A shows modelled waveforms for the waveguide of FIG. 18.
Figure 20B:
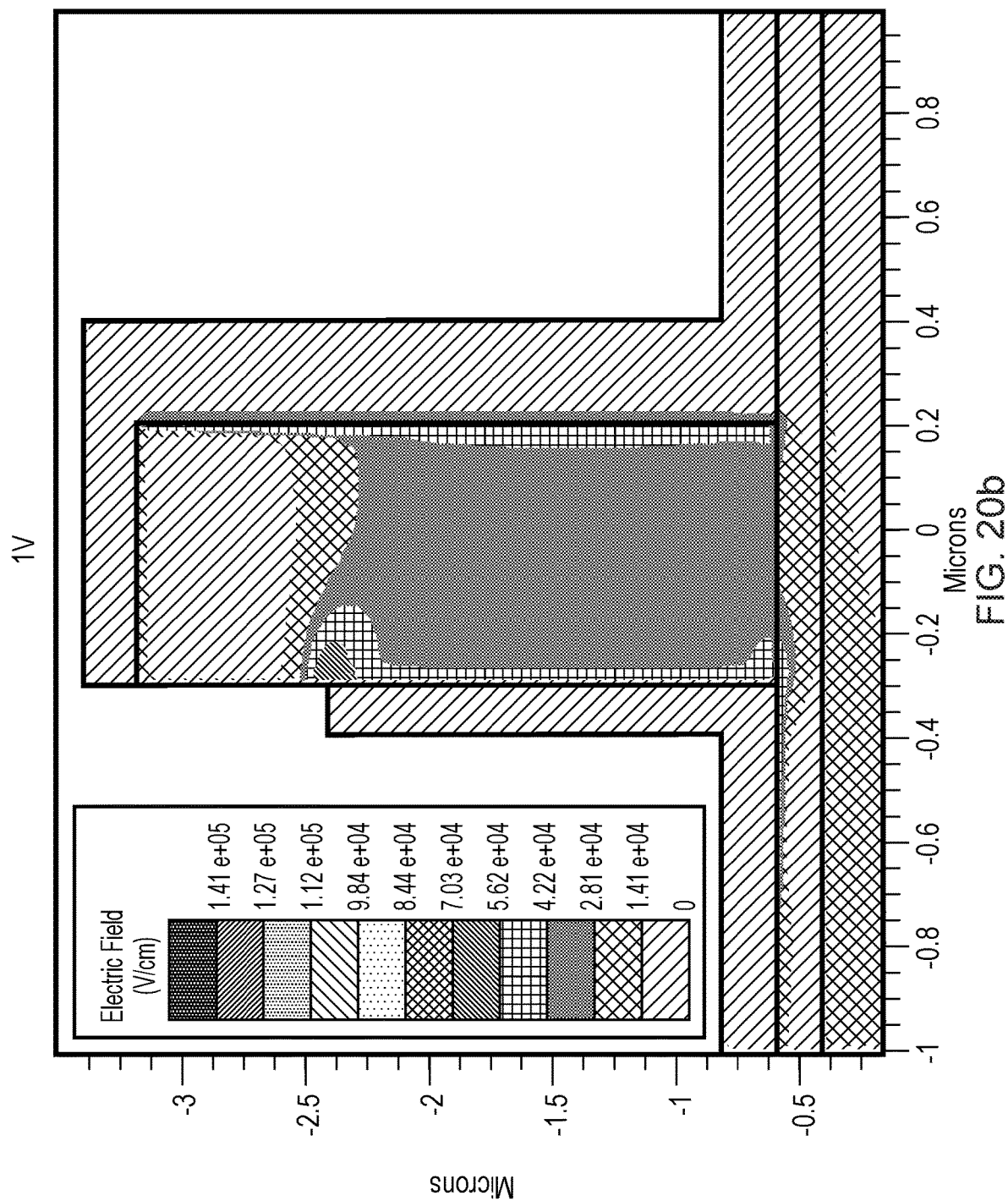
FIG. 20B shows modelled waveforms for the waveguide of FIG. 18.
Figure 20C:
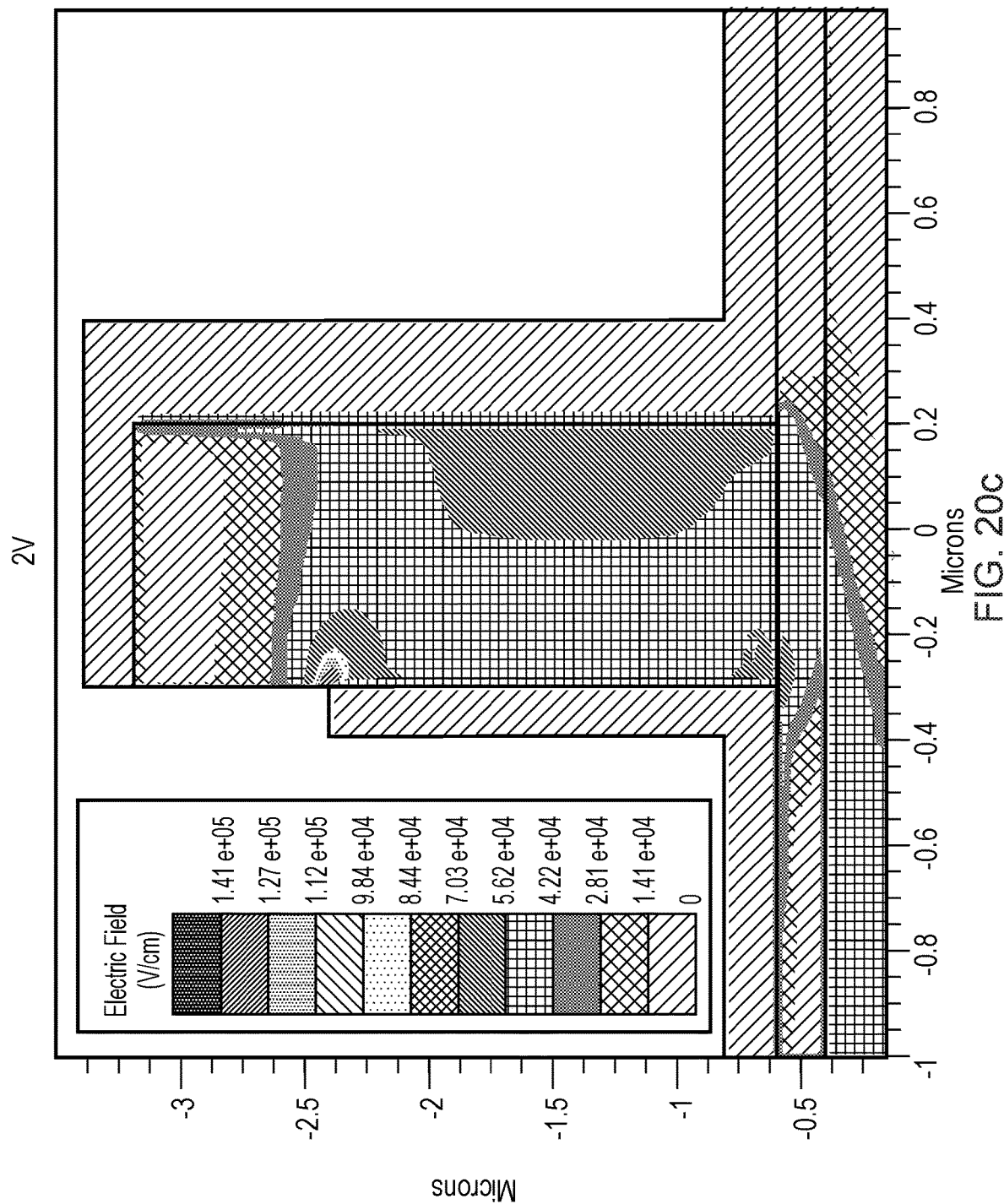
FIG. 20C shows modelled waveforms for the waveguide of FIG. 18.
Figure 20D:
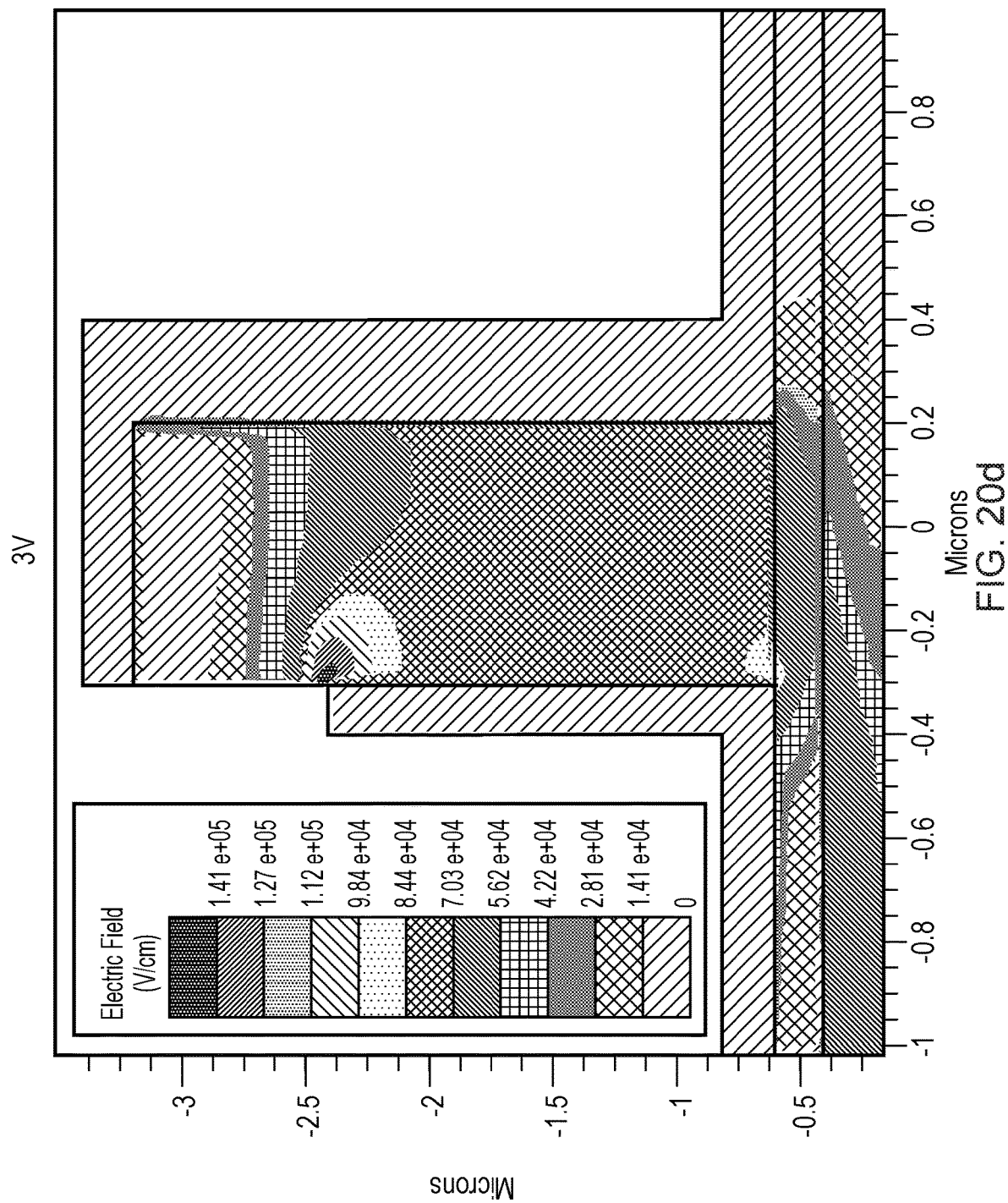
FIG. 20D shows modelled waveforms for the waveguide of FIG. 18.
Figure 21:
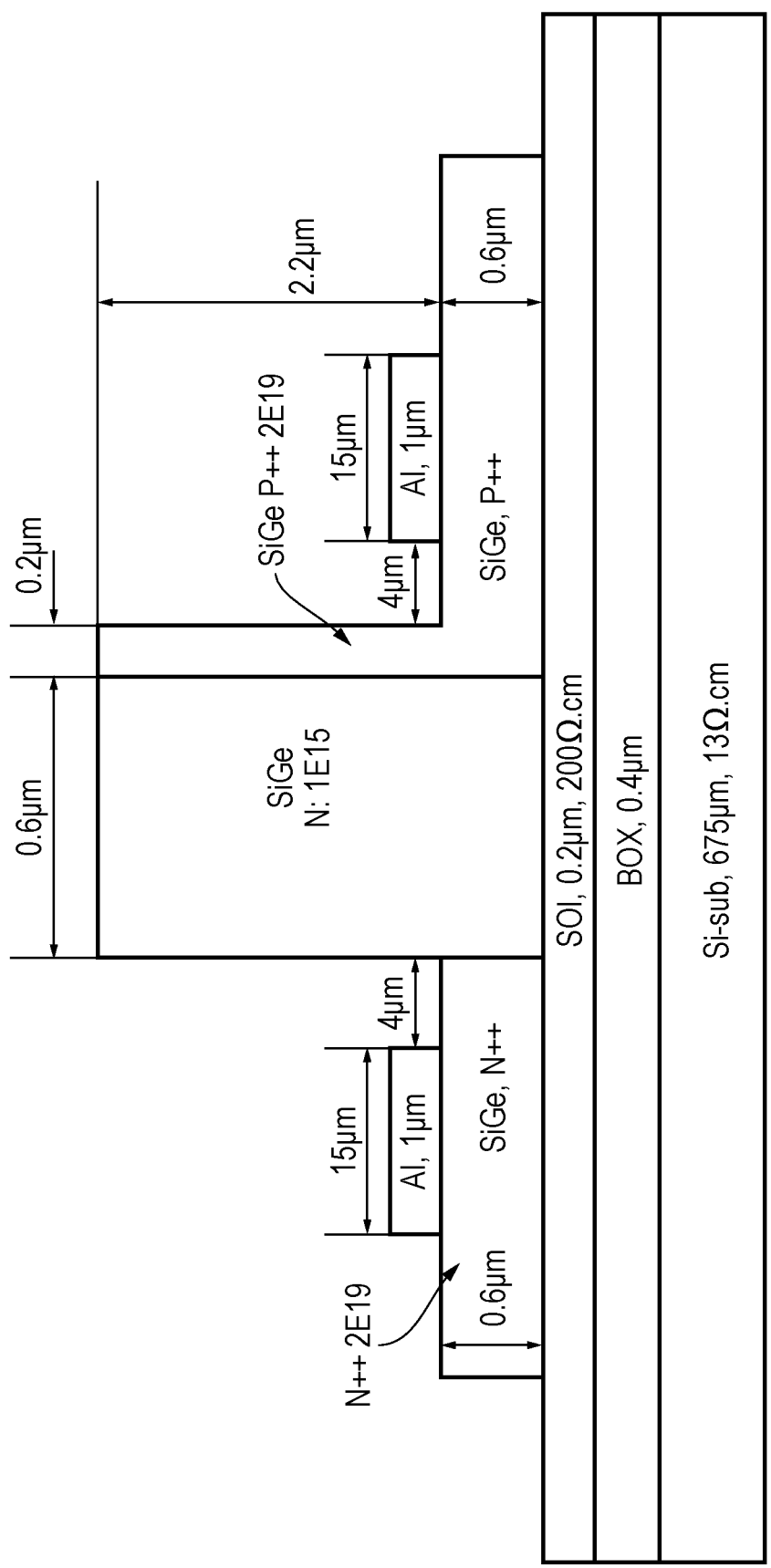
FIG. 21 shows an example of a waveguide optical device for use with the present invention.
Figure 22A:
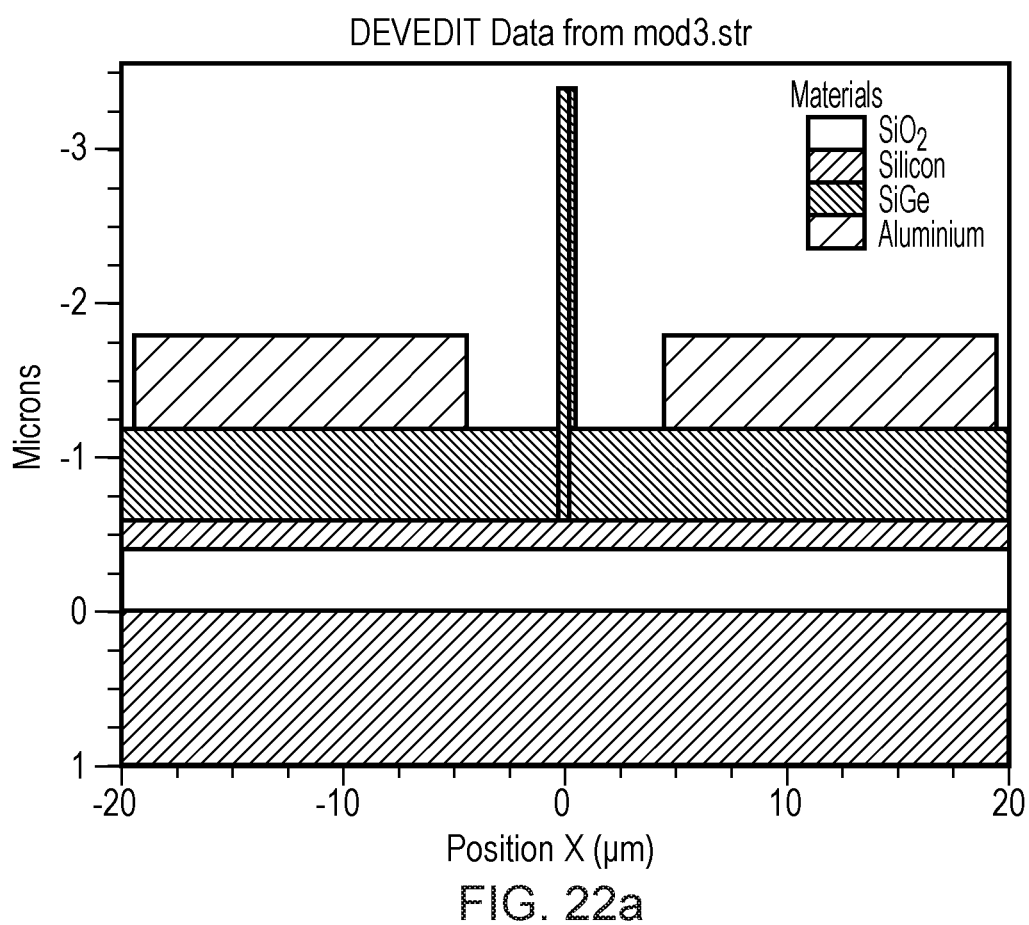
FIG. 22A shows parameters used to model the waveguide device of FIG. 21.
Figure 22B:
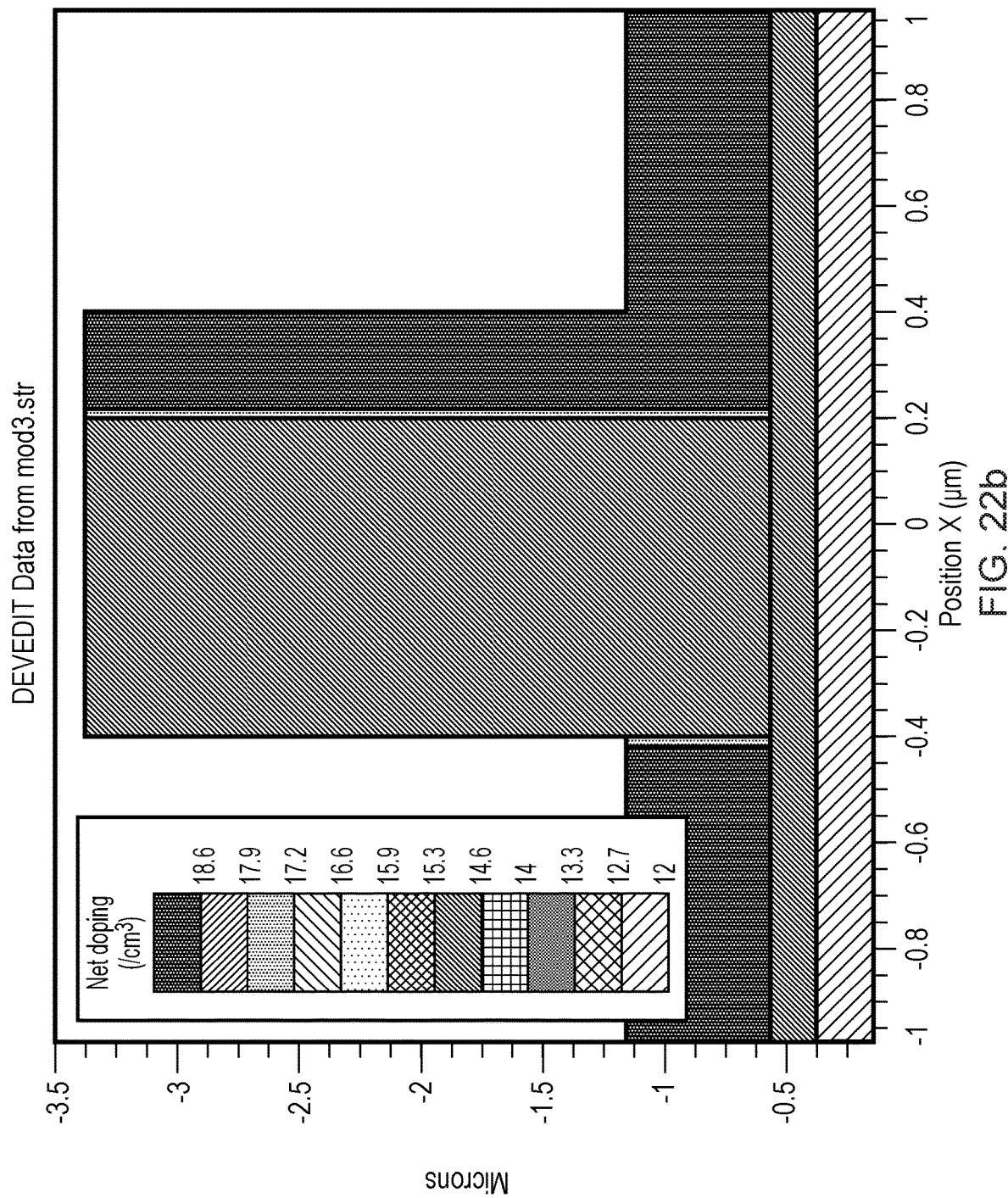
FIG. 22B shows parameters used to model the waveguide device of FIG. 21.
Figure 23A:
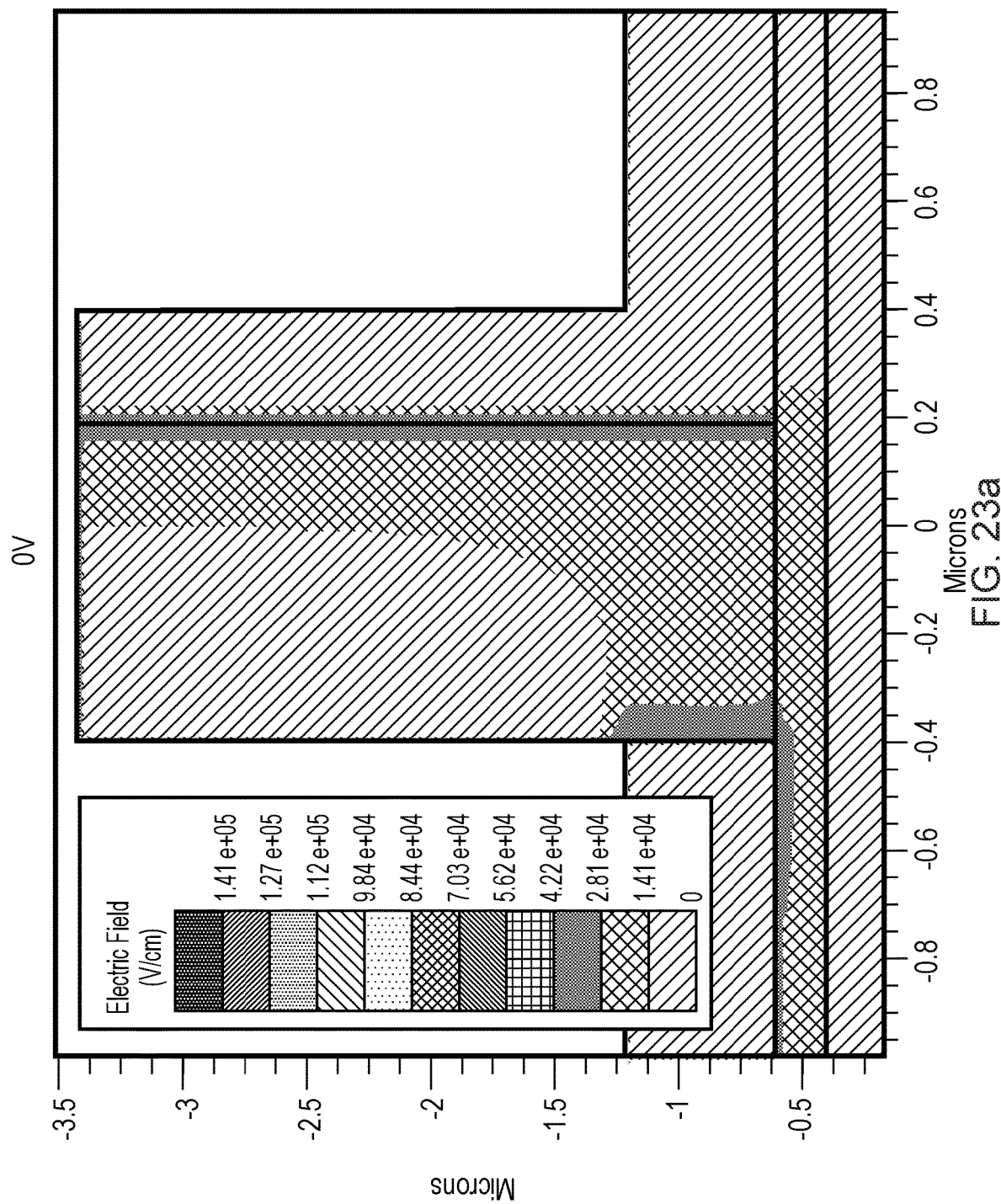
FIG. 23A shows modelled waveforms for the waveguide of FIG. 21.
Figure 23B:
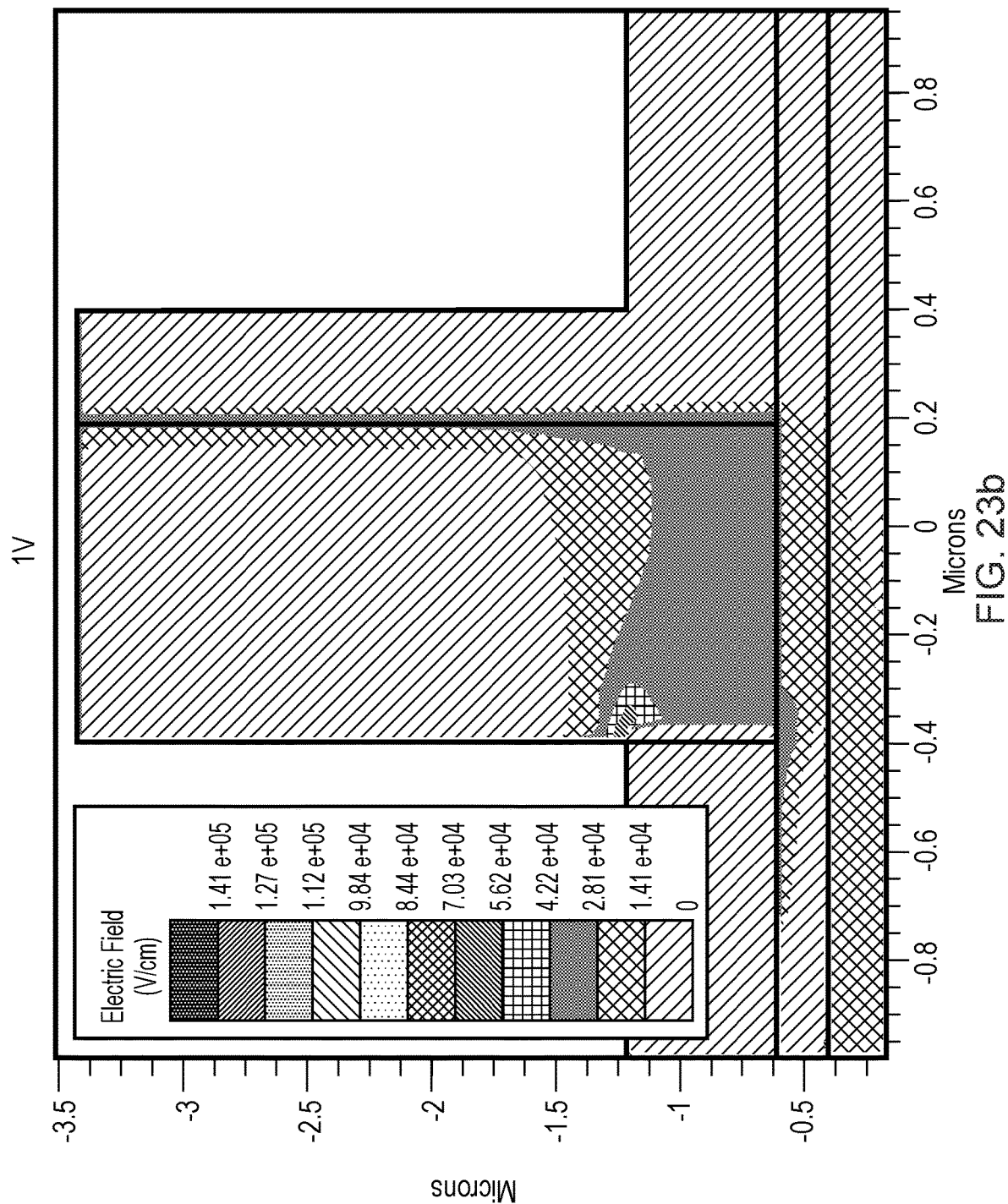
FIG. 23B shows modelled waveforms for the waveguide of FIG. 21.
Figure 23C:
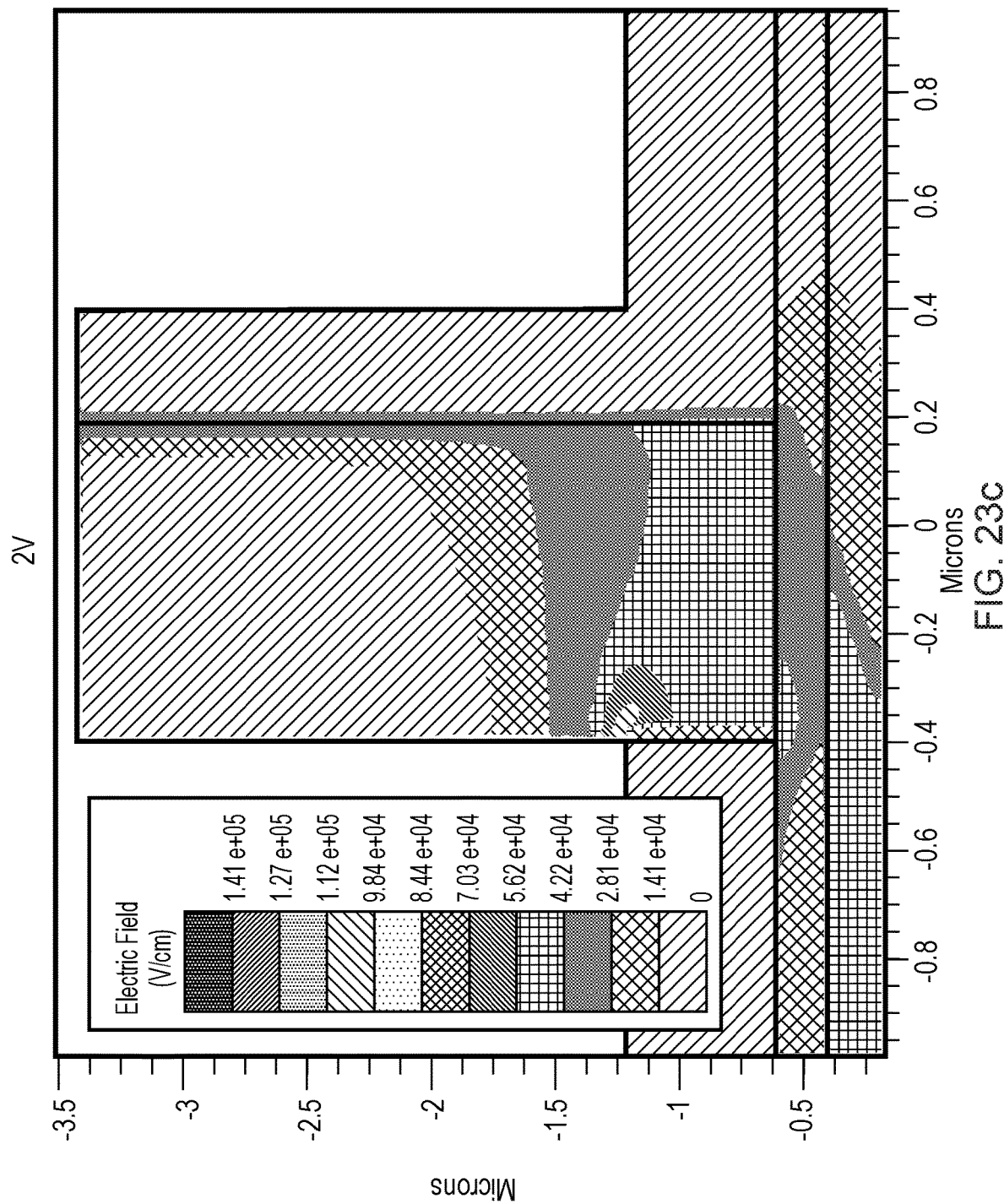
FIG. 23C shows modelled waveforms for the waveguide of FIG. 21.
Figure 23D:
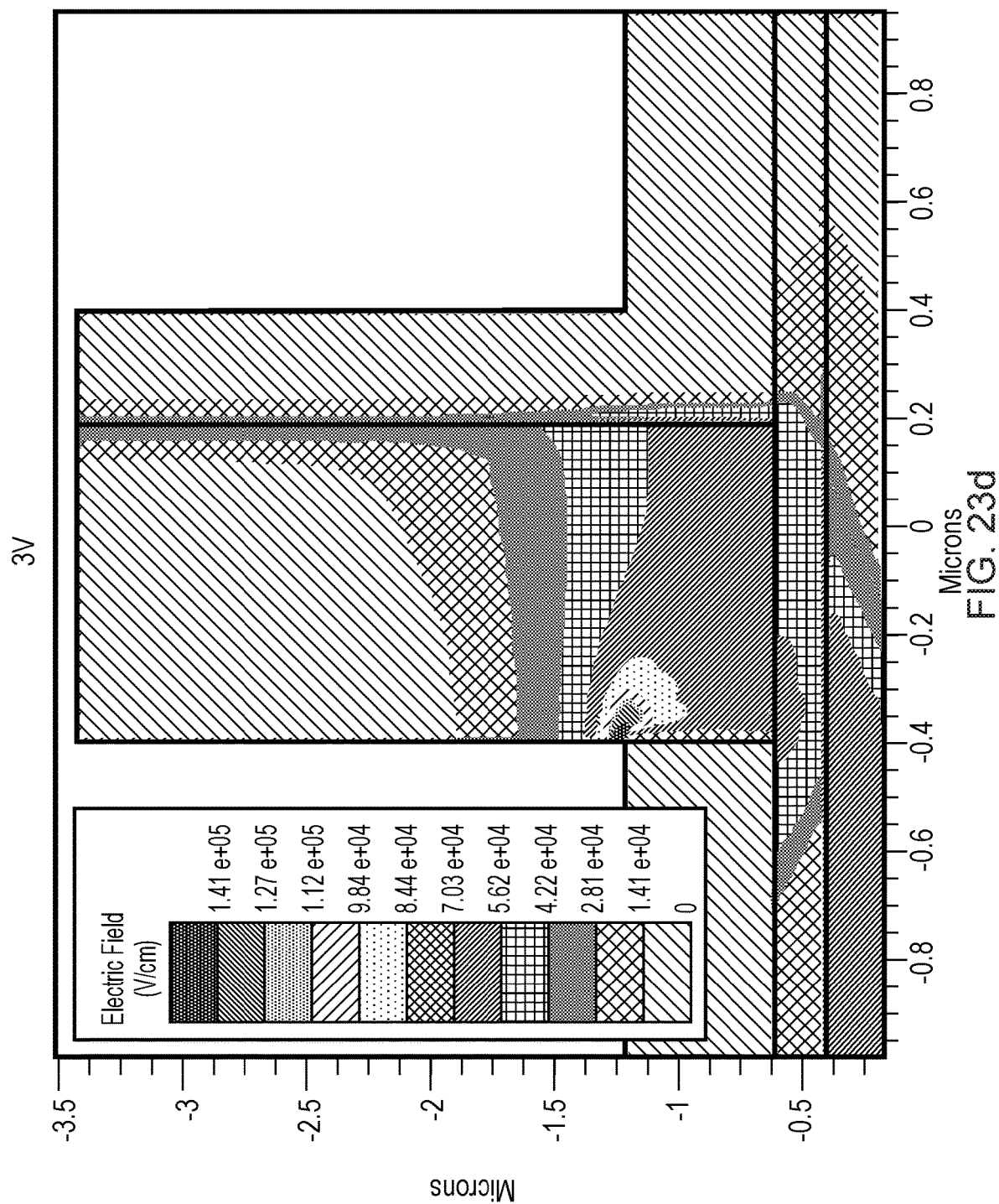
FIG. 23D shows modelled waveforms for the waveguide of FIG. 21.
Figure 24:
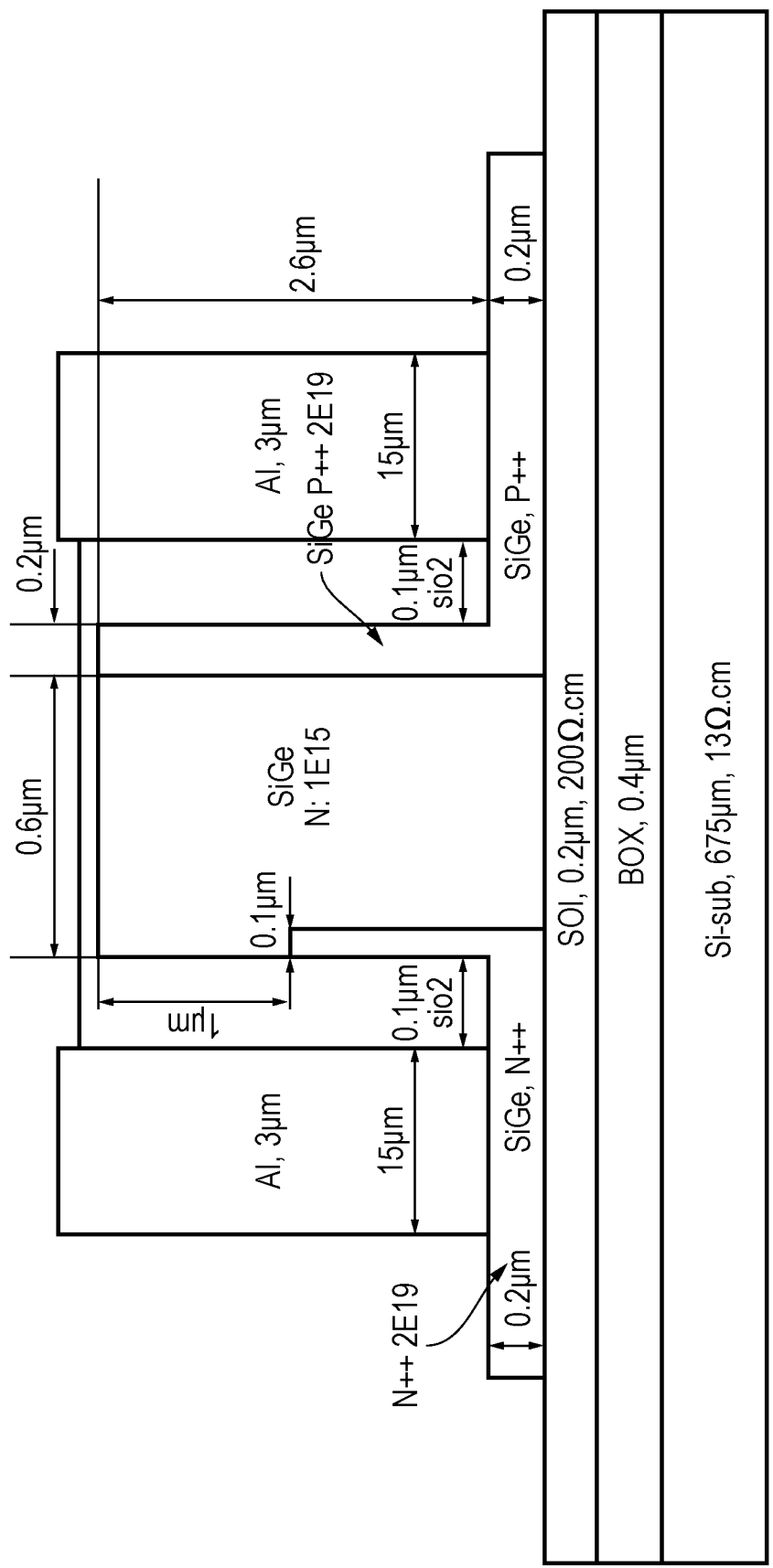
FIG. 24 shows an example of a waveguide optical device for use with the present invention.
Figure 25A:
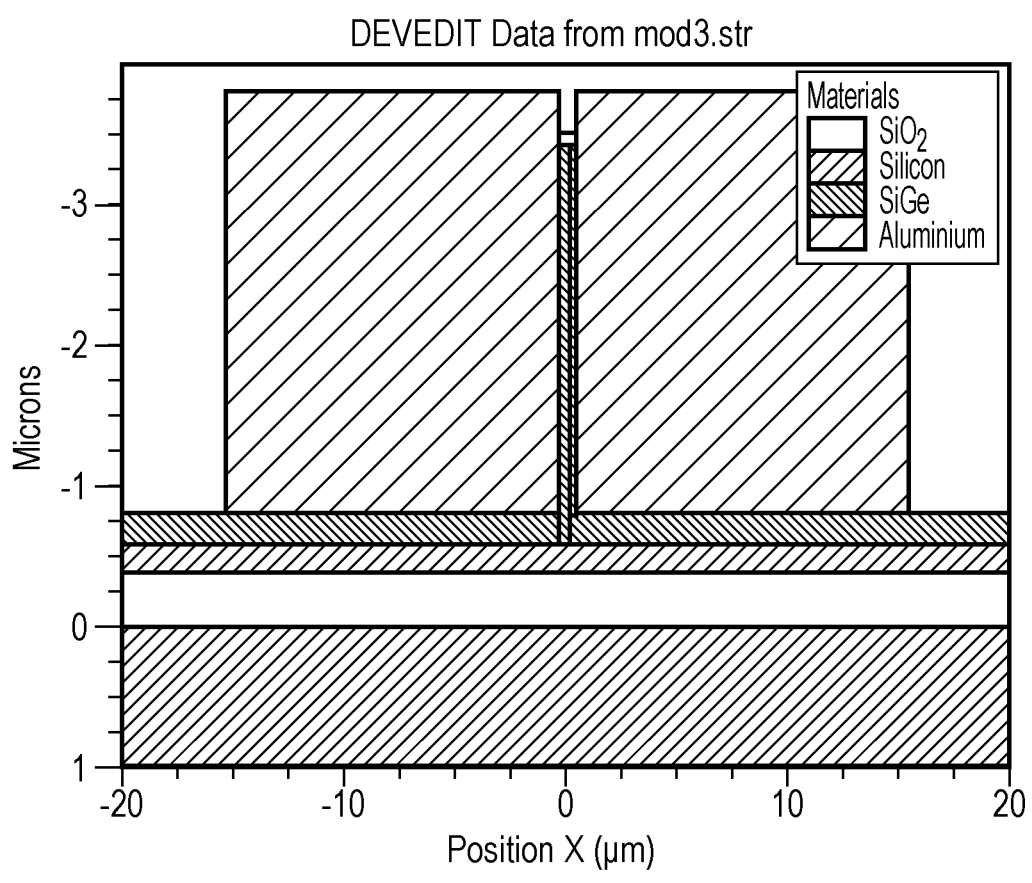
FIG. 25A shows parameters used to model the waveguide device of FIG. 24.
Figure 25B:
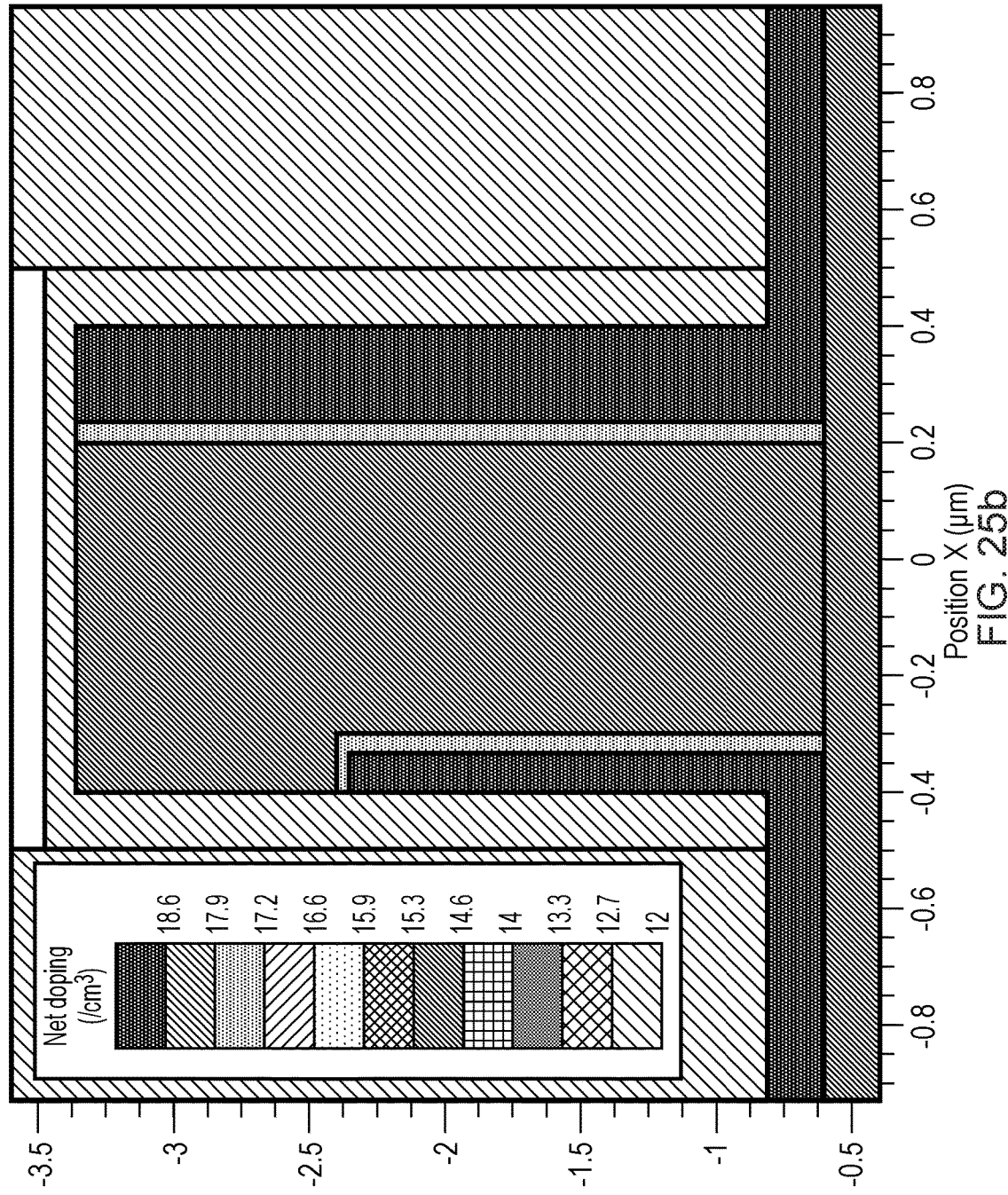
FIG. 25B shows parameters used to model the waveguide device of FIG. 24.
Figure 26A:
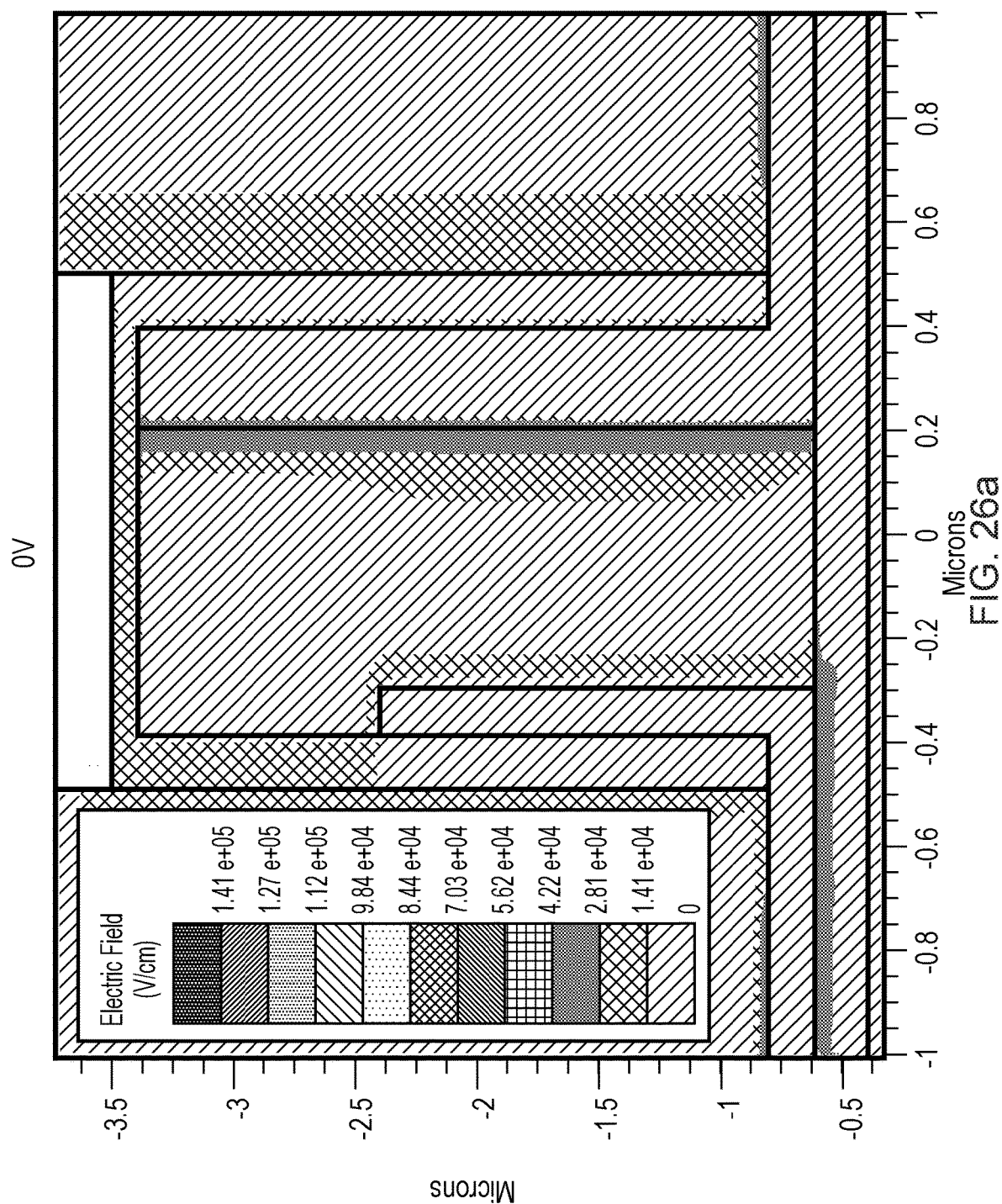
FIG. 26A shows modelled waveforms for the waveguide of FIG. 24.
Figure 26B:
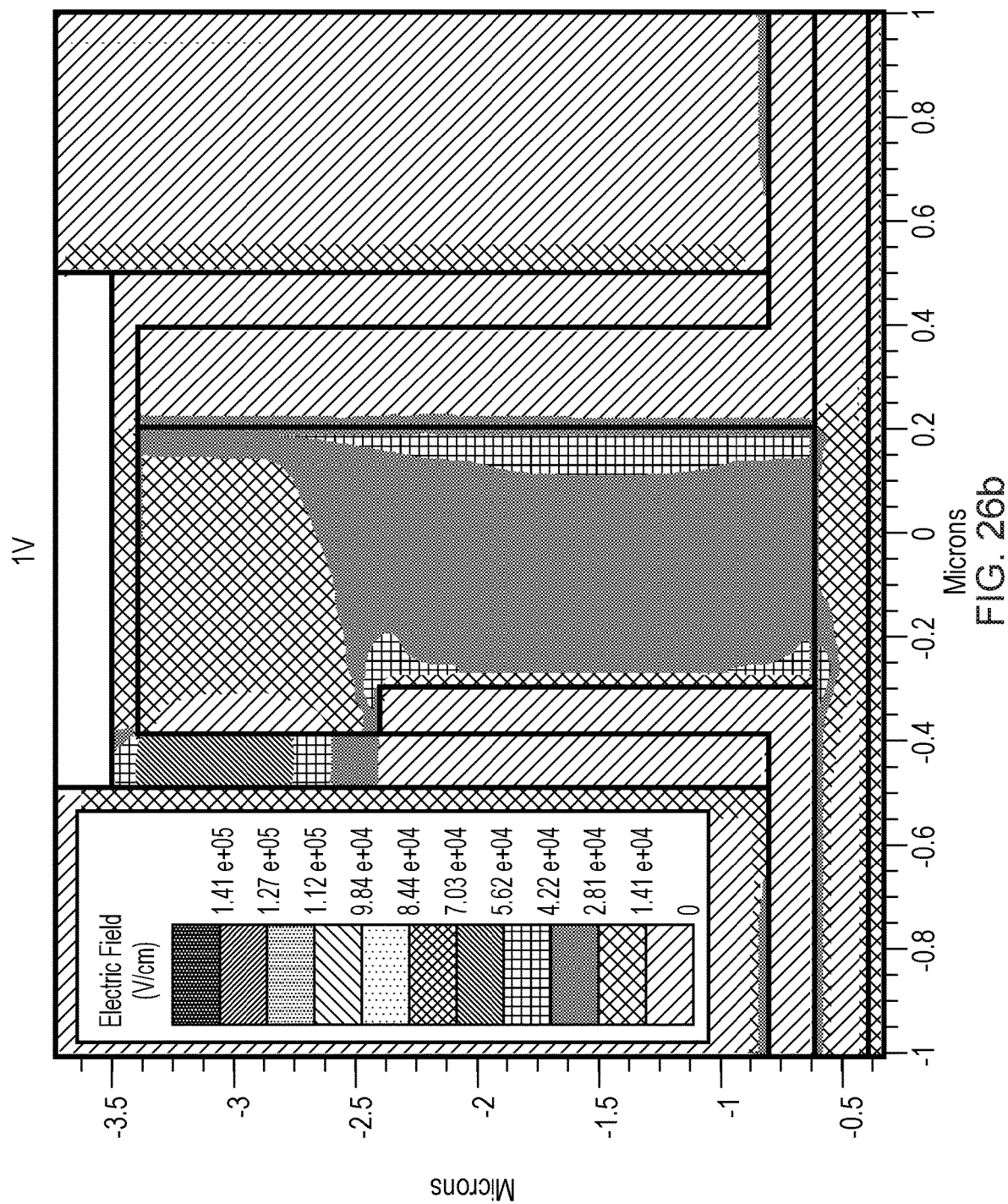
FIG. 26B shows modelled waveforms for the waveguide of FIG. 24.
Figure 26C:
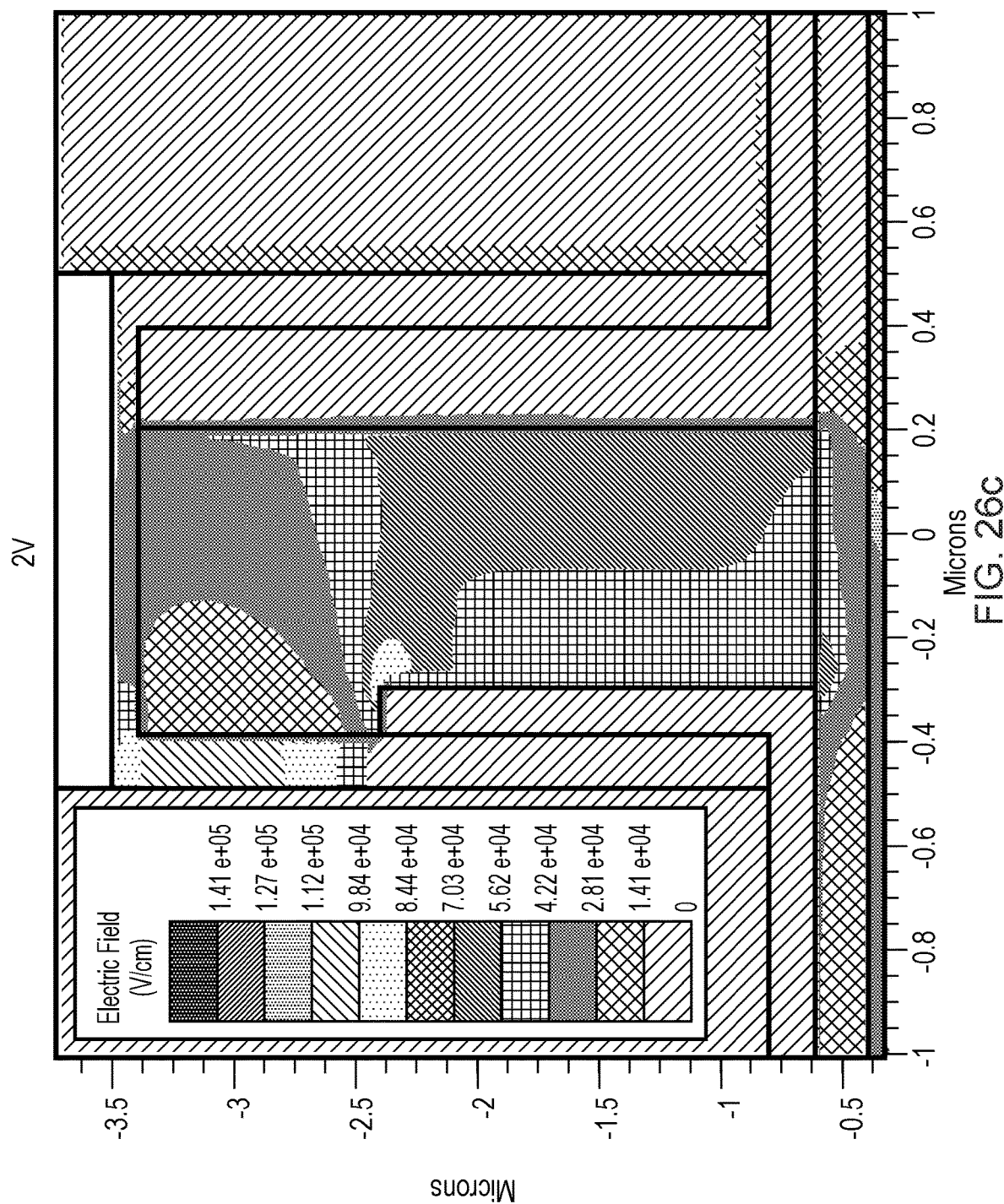
FIG. 26C shows modelled waveforms for the waveguide of FIG. 24.
Figure 26D:
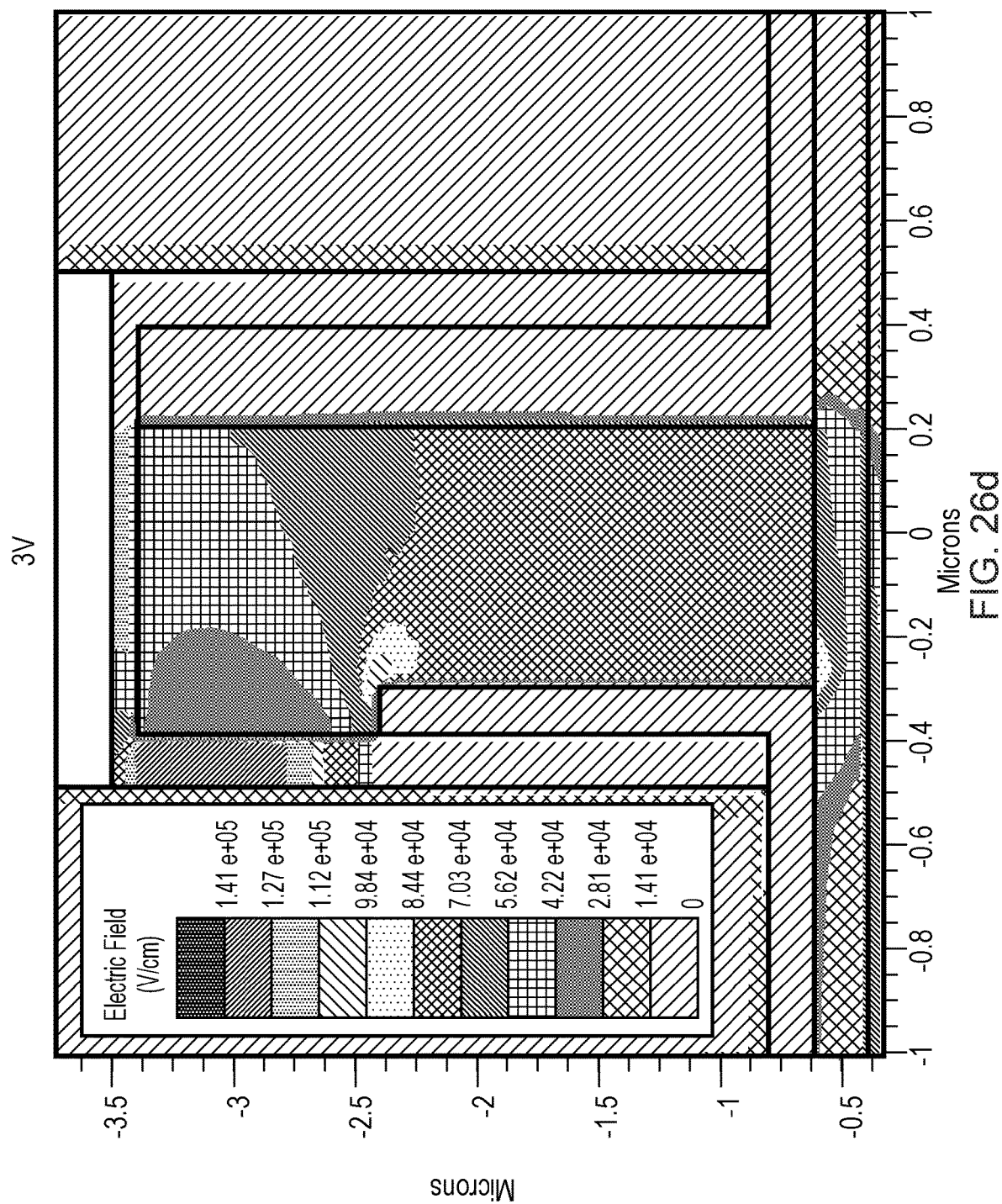
FIG. 26D shows modelled waveforms for the waveguide of FIG. 24.
Figure 27:
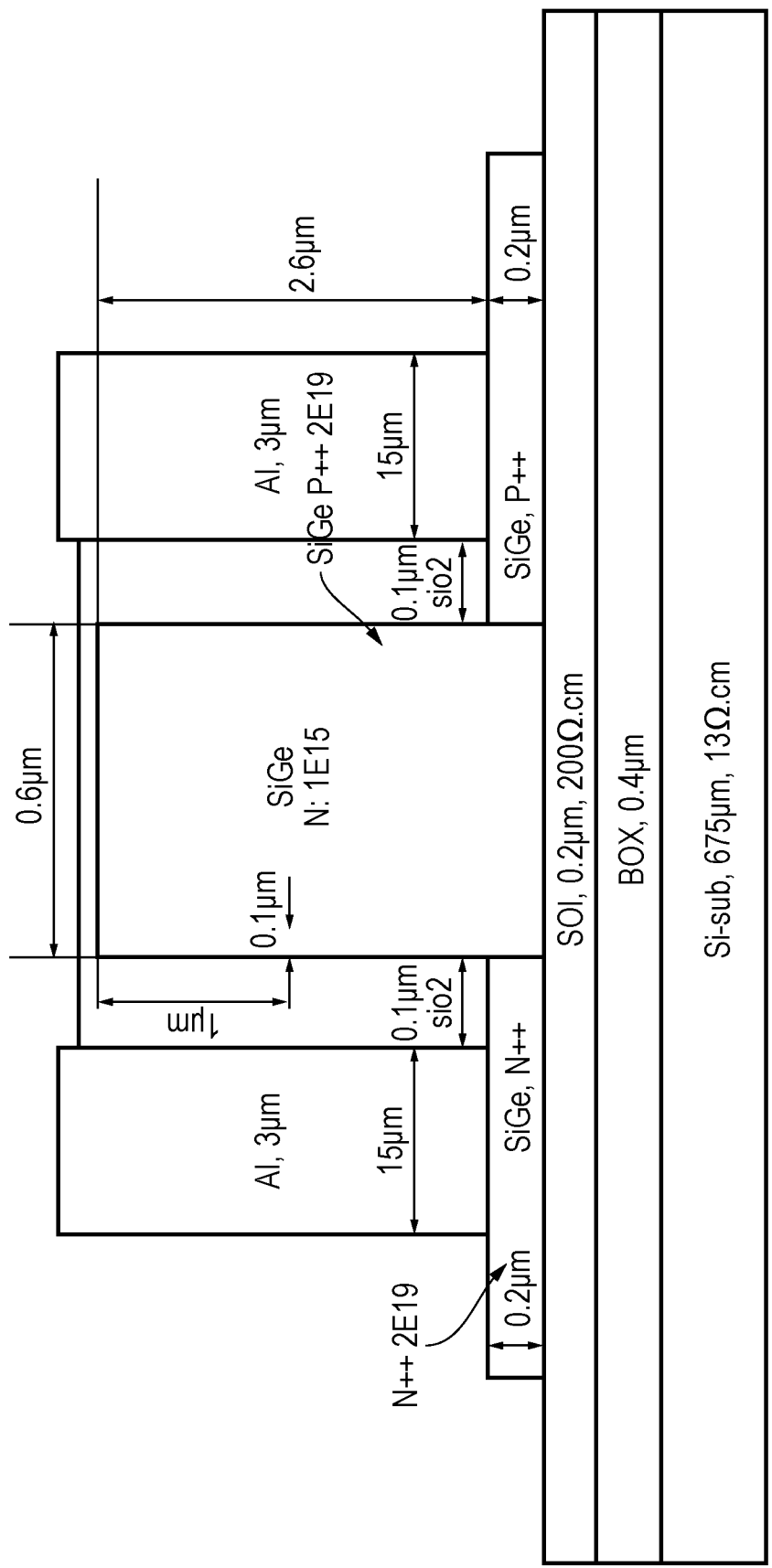
FIG. 27 shows an example of a waveguide optical device for use with the present invention.
Figure 28A:
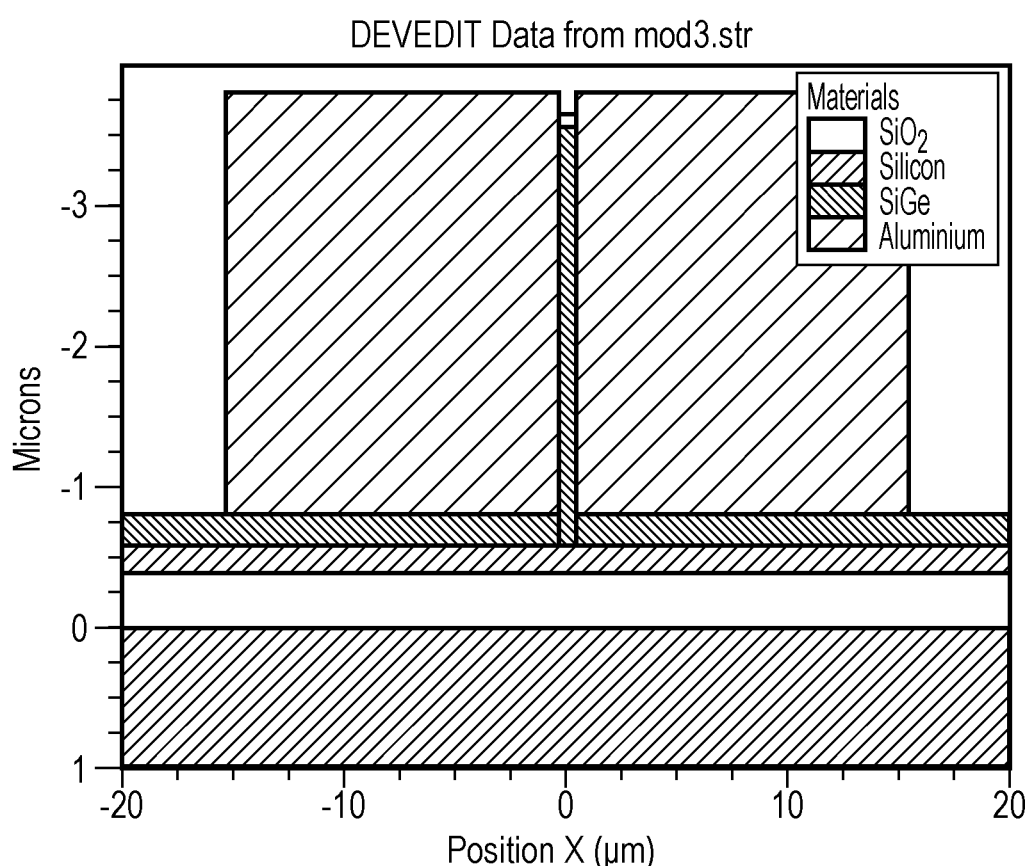
FIG. 28A shows parameters used to model the waveguide device of FIG. 27.
Figure 28B:
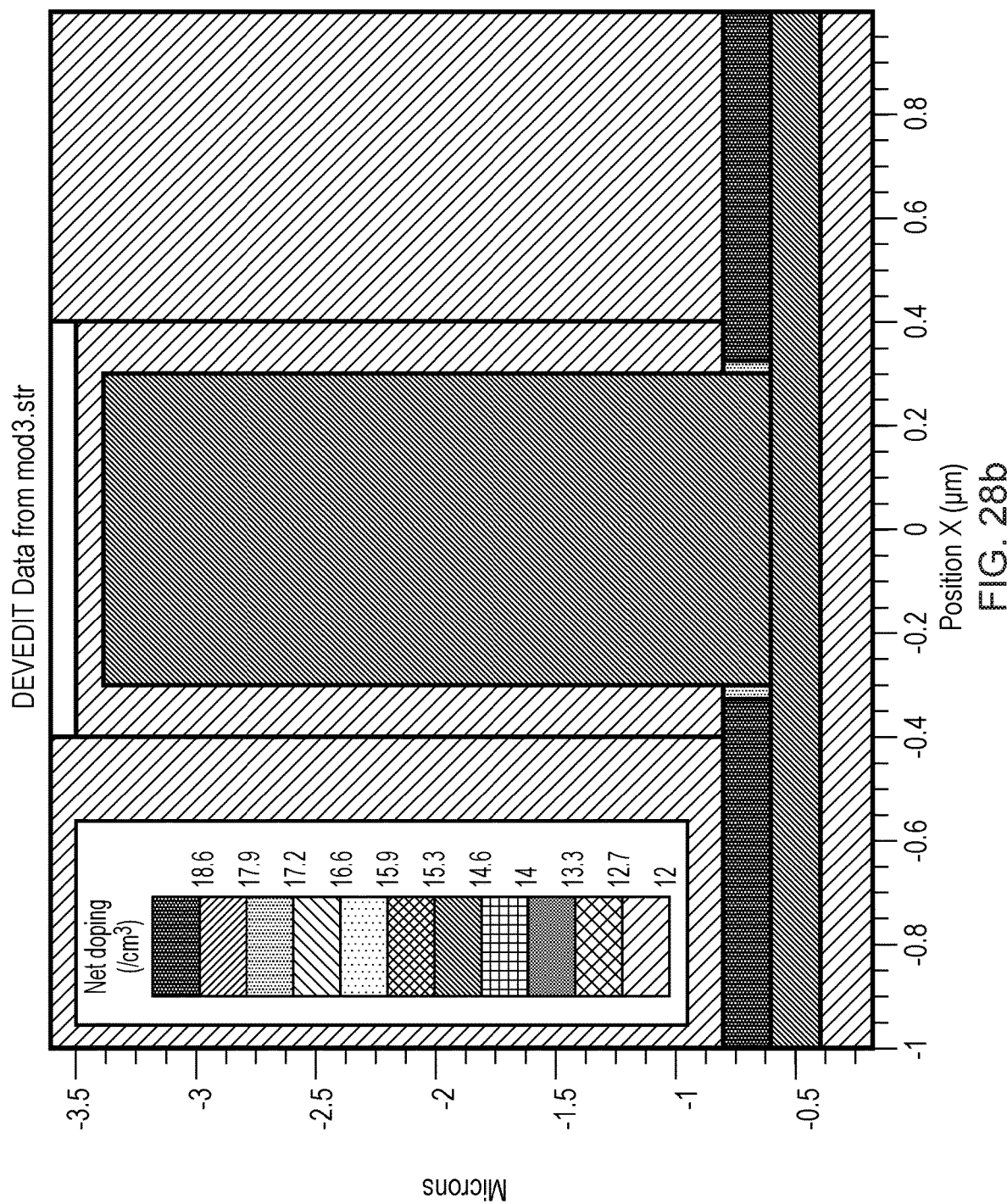
FIG. 28B shows parameters used to model the waveguide device of FIG. 27.
Figure 29A:
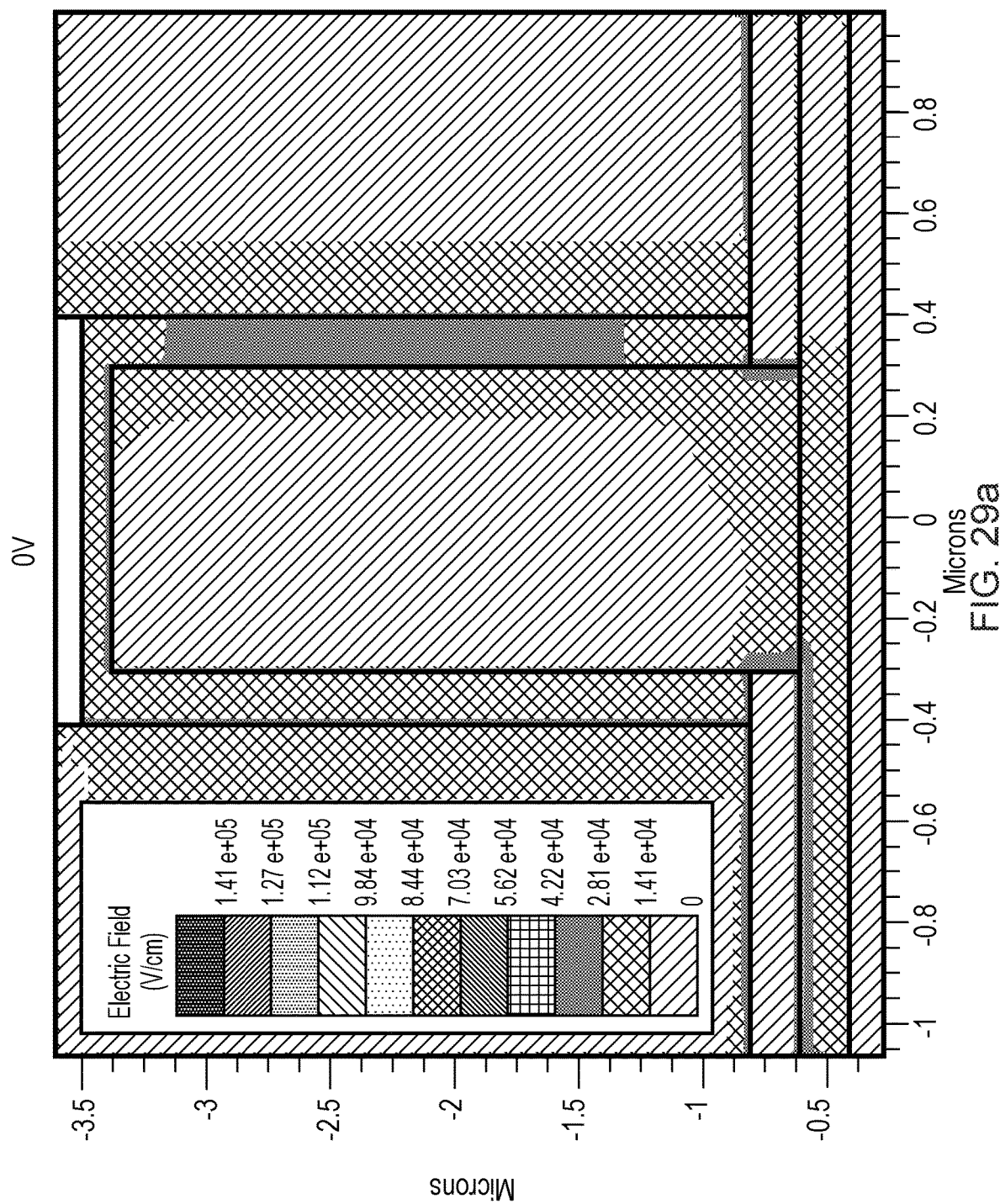
FIG. 29A shows modelled waveforms for the waveguide of FIG. 27.
Figure 29B:
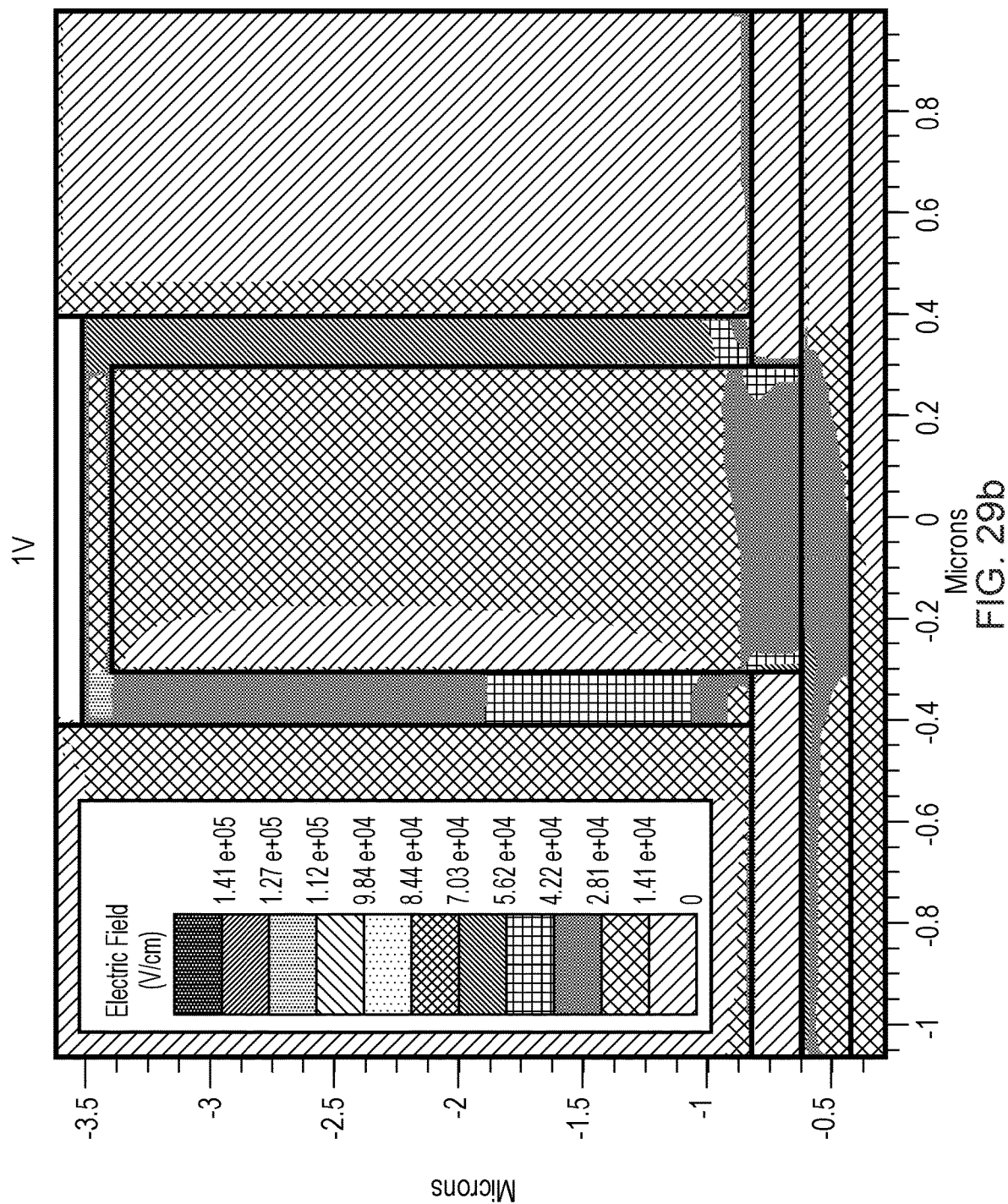
FIG. 29B shows modelled waveforms for the waveguide of FIG. 27.
Figure 29C:
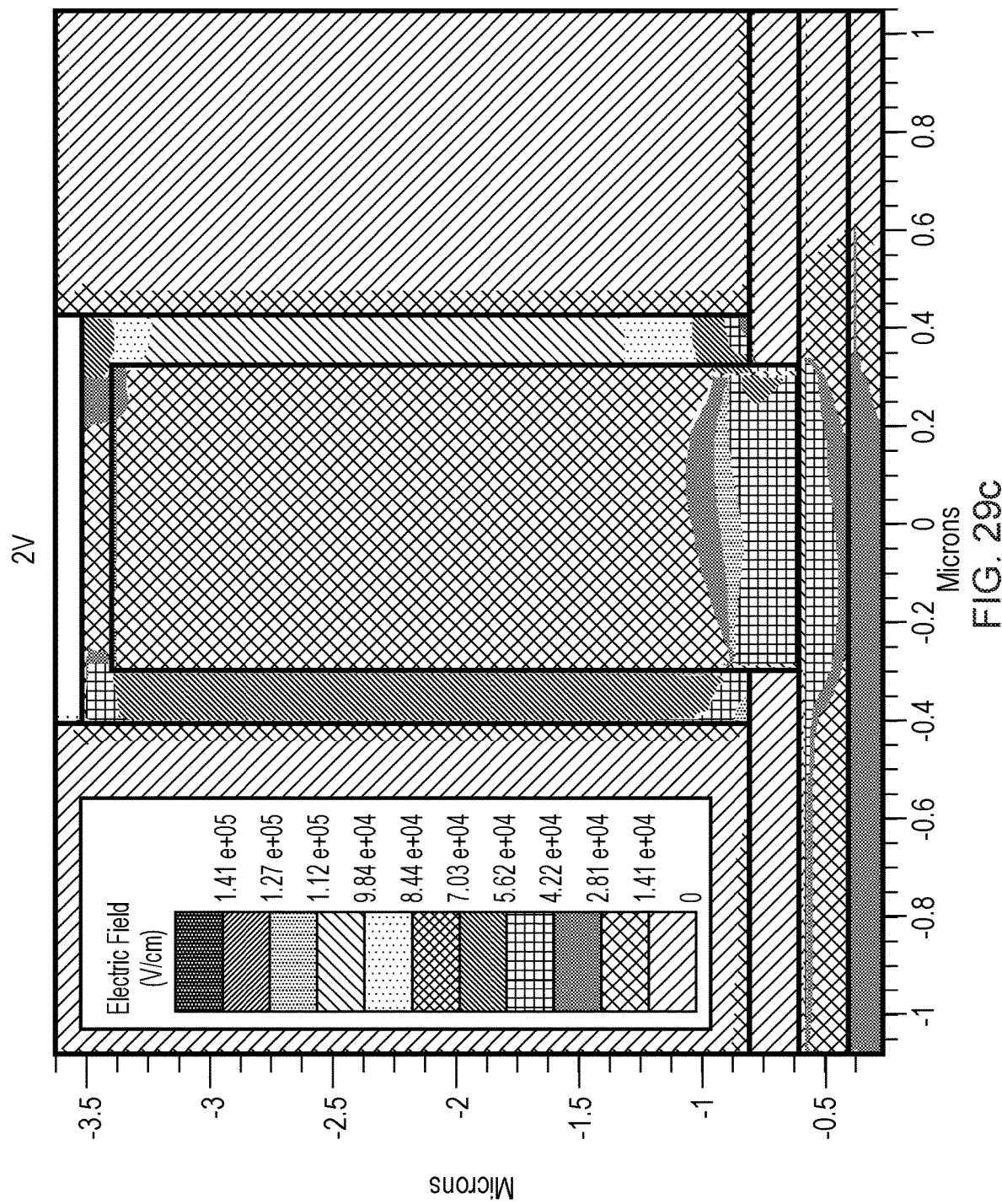
FIG. 29C shows modelled waveforms for the waveguide of FIG. 27.
Figure 29D:
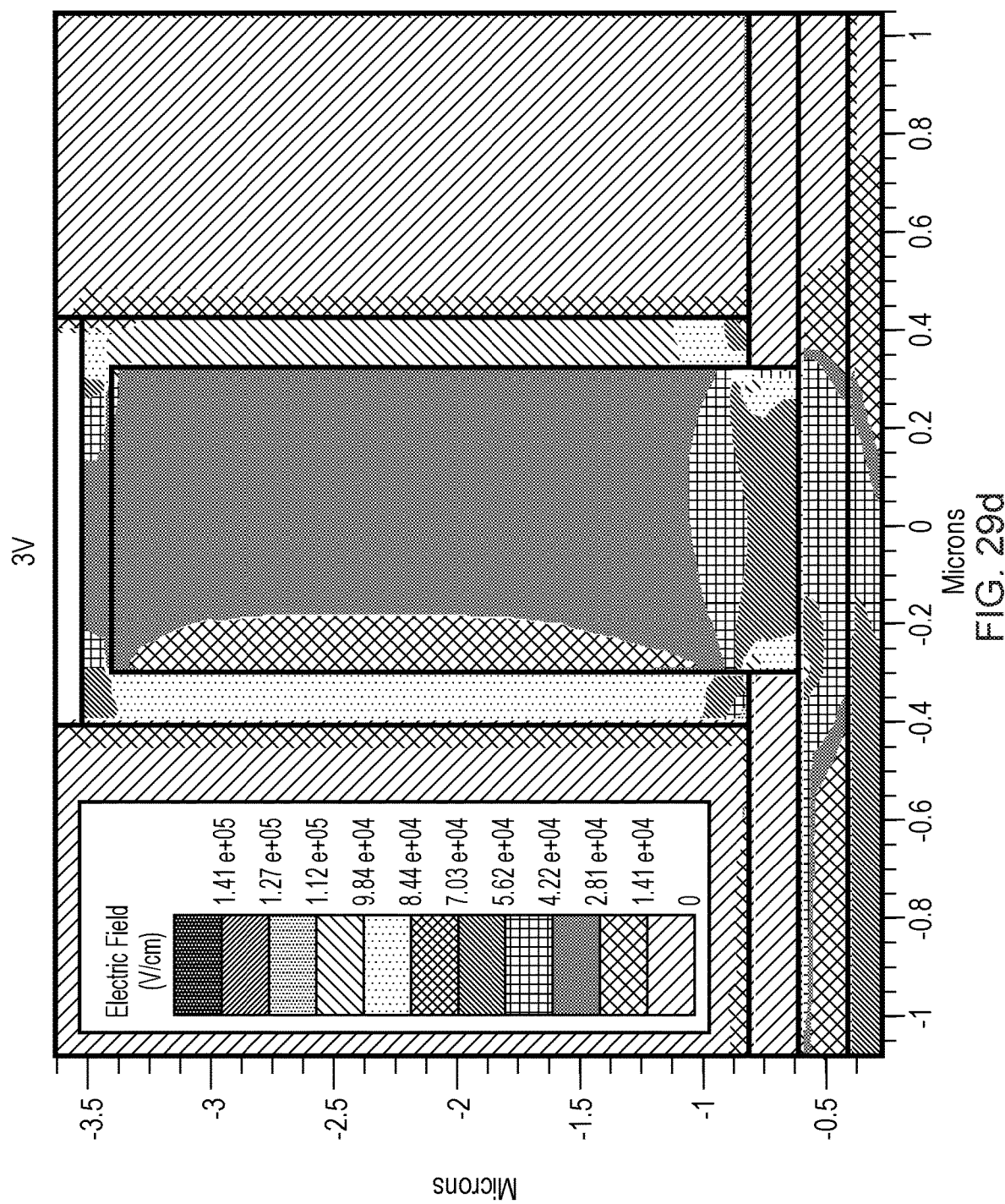
FIG. 29D shows modelled waveforms for the waveguide of FIG. 27.
Figure 30:
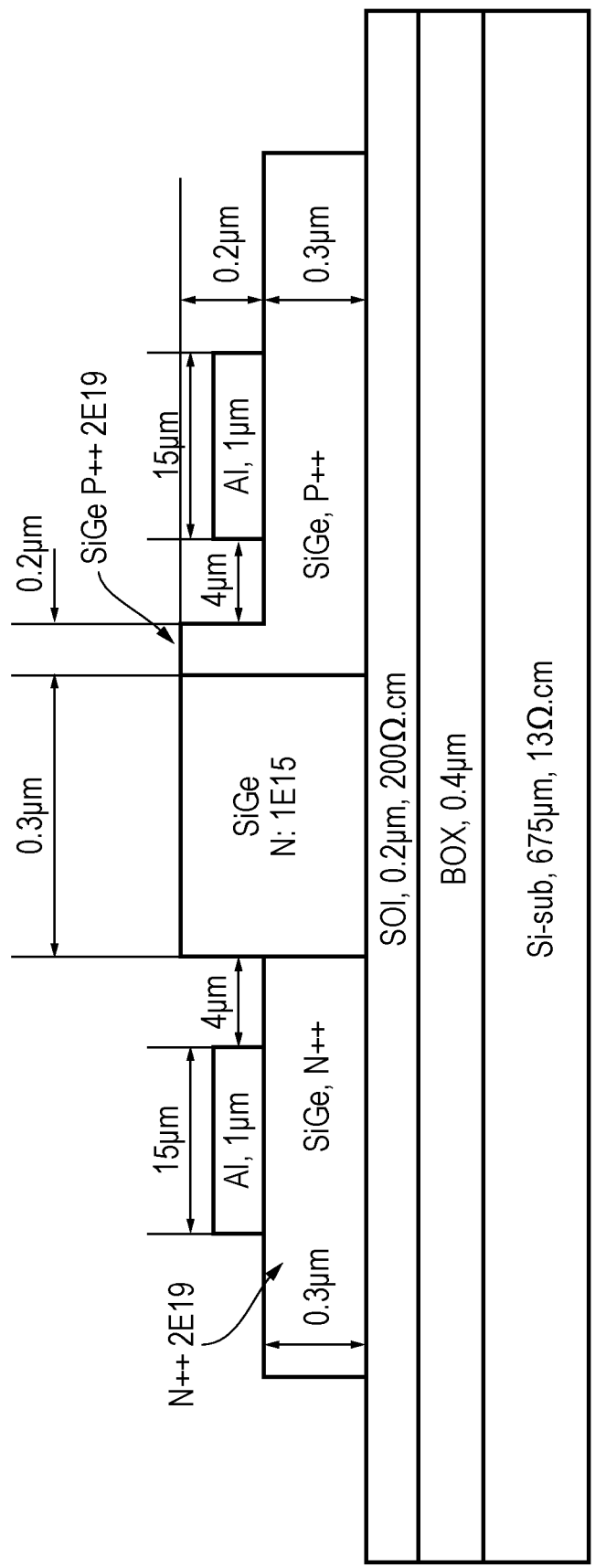
FIG. 30 shows an example of a waveguide optical device for use with the present invention.
Figure 31A:
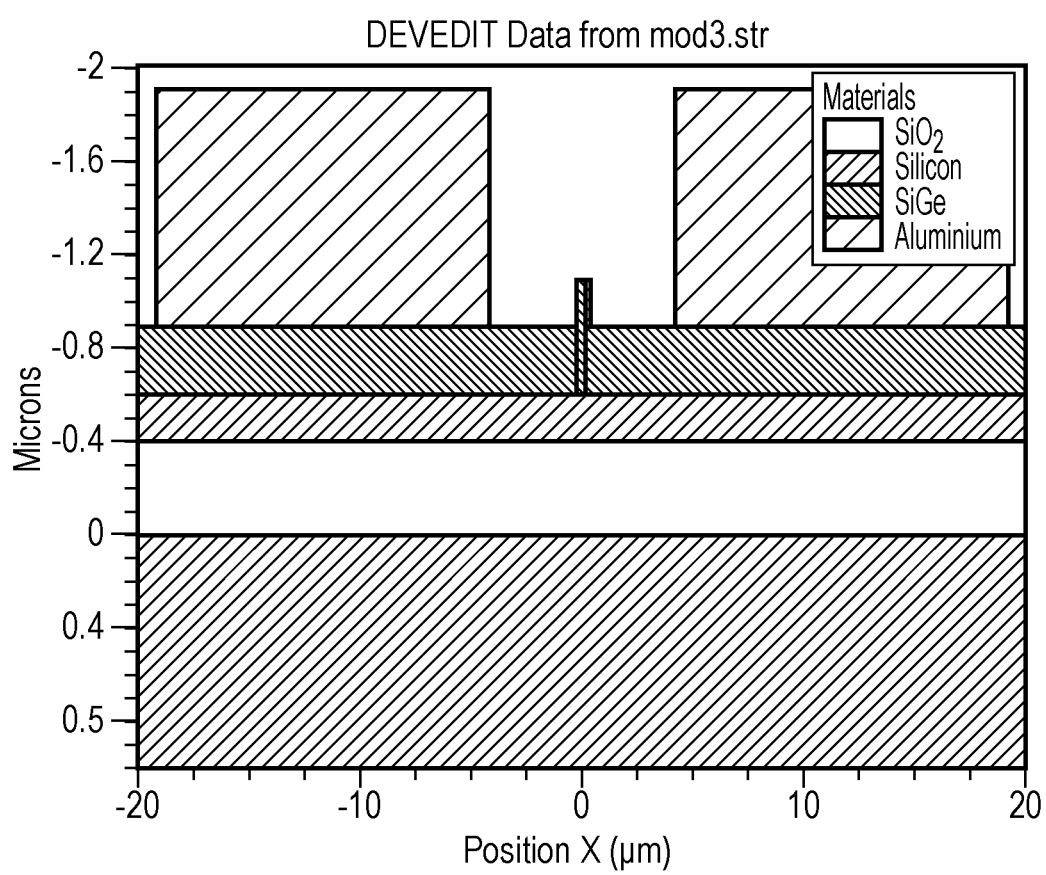
FIG. 31A shows parameters used to model the waveguide device of FIG. 30.
Figure 31B:
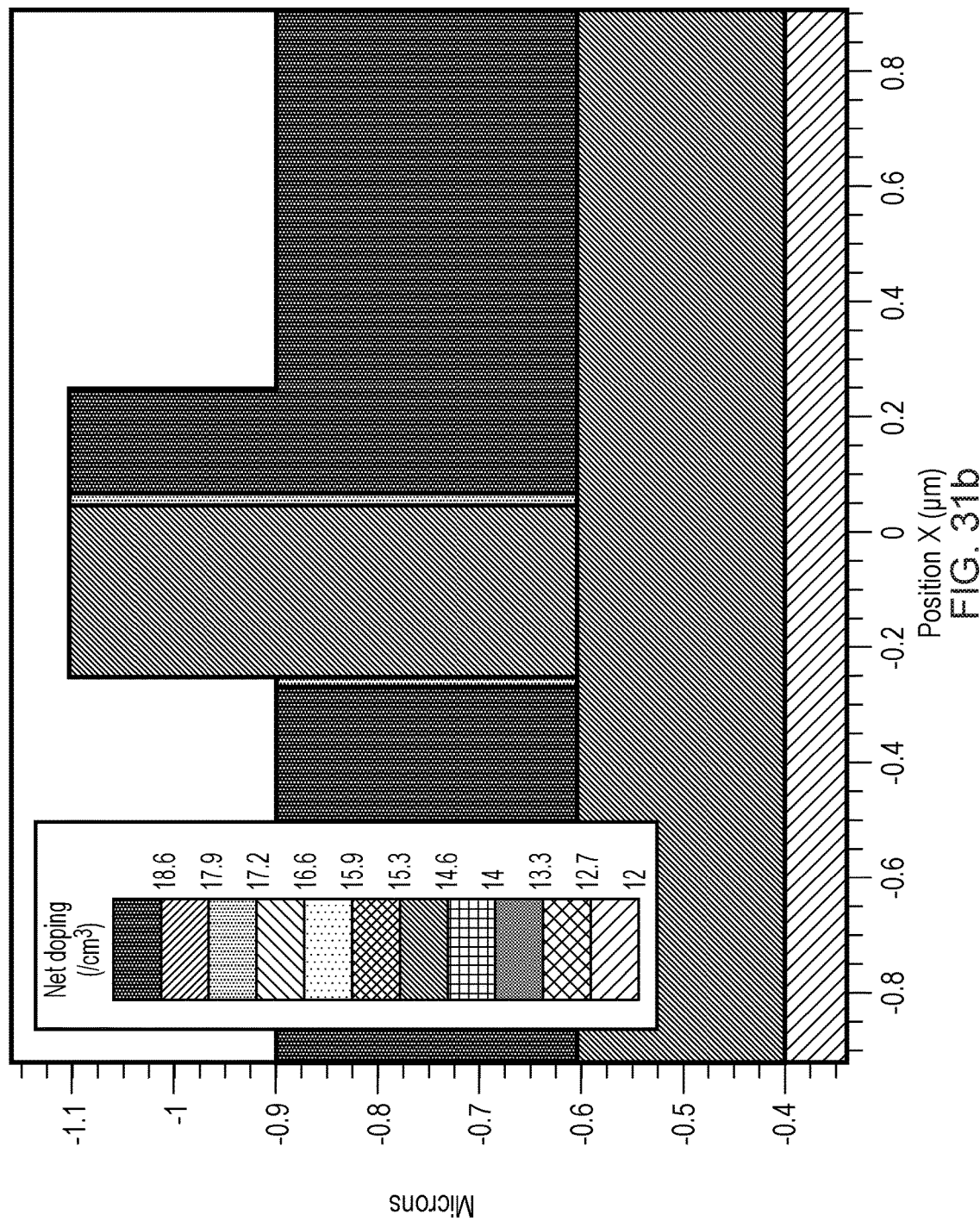
FIG. 31B shows parameters used to model the waveguide device of FIG. 30.
Figure 32A:
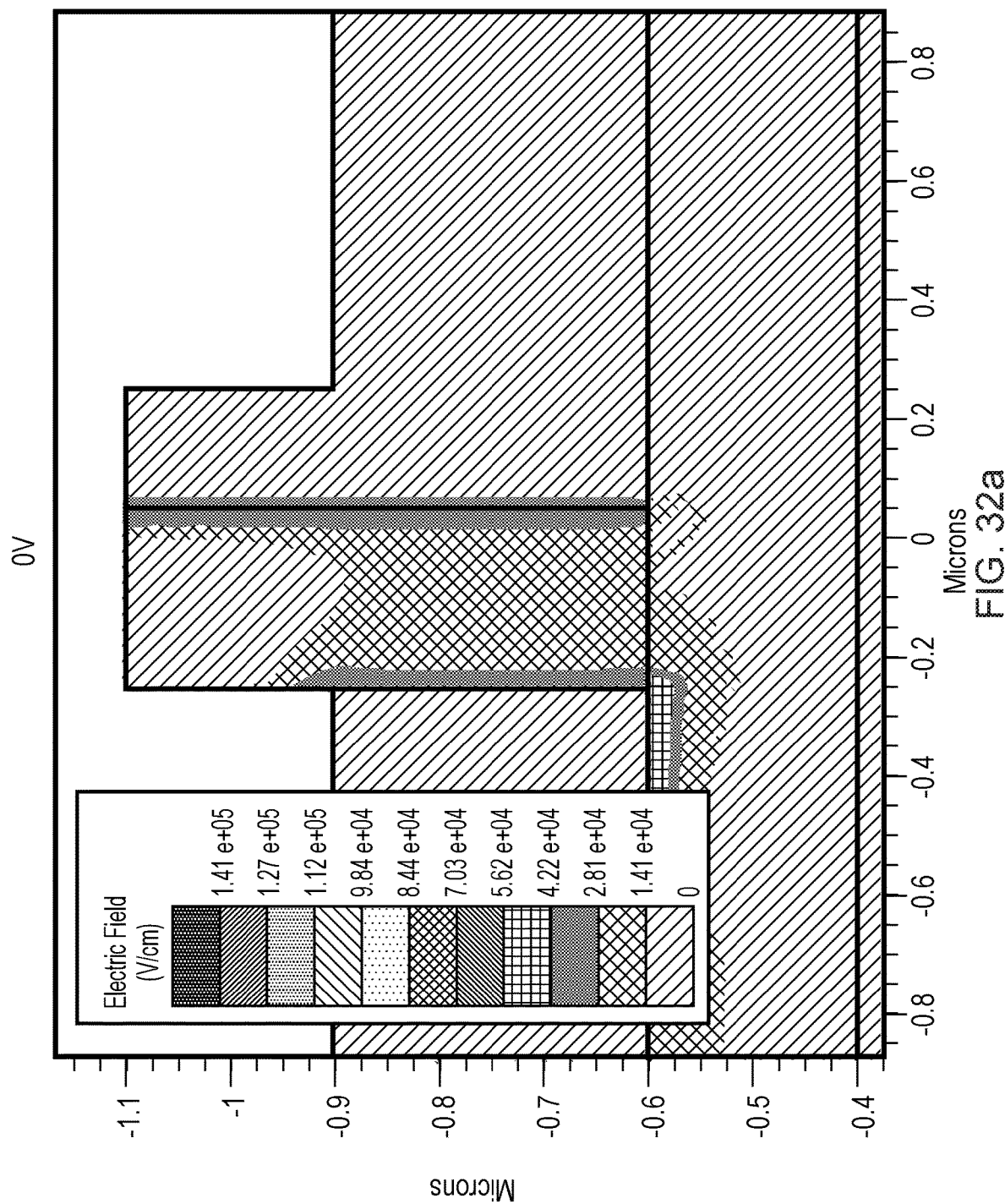
FIG. 32A shows modelled waveforms for the waveguide of FIG. 30.
Figure 32B:
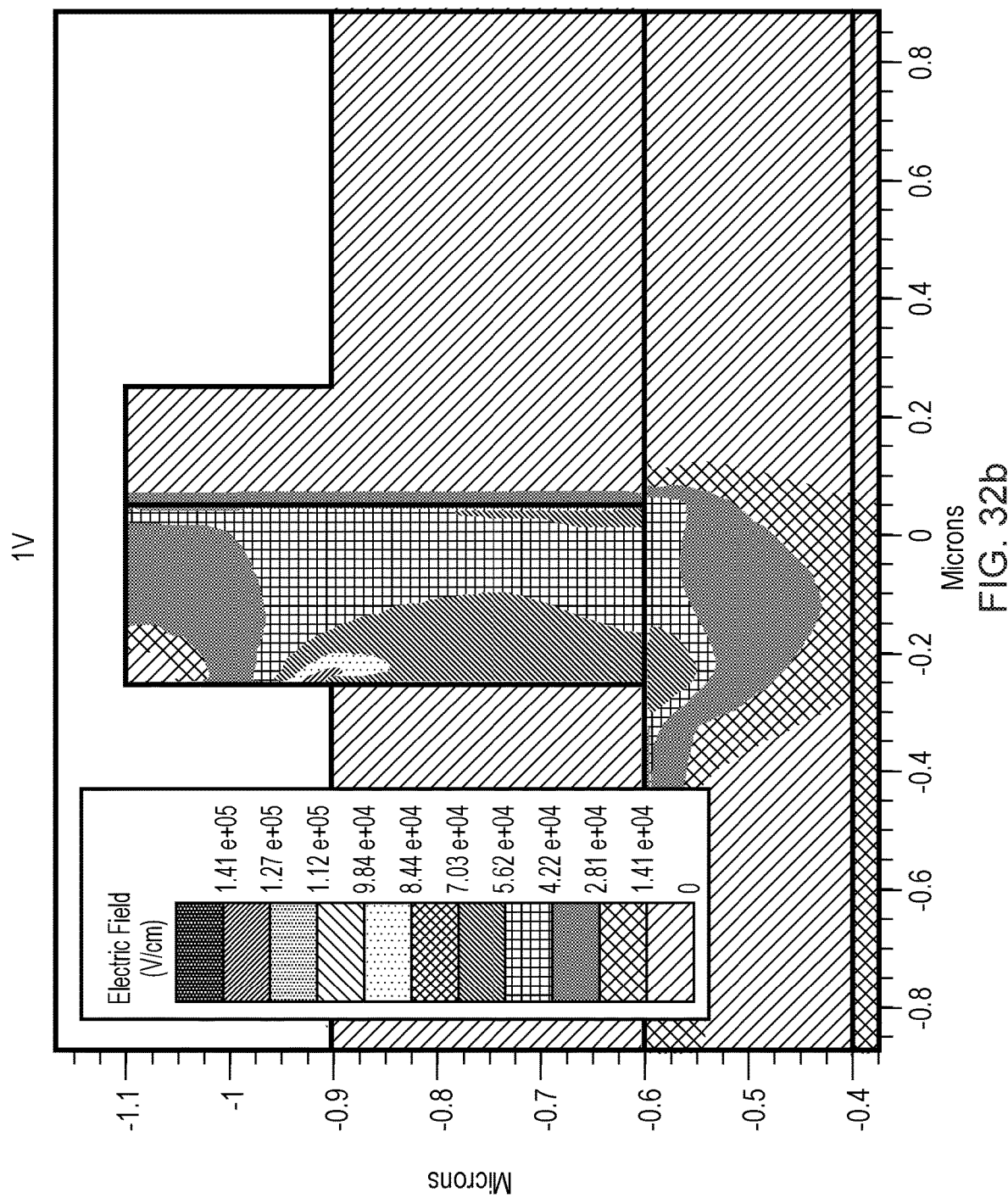
FIG. 32B shows modelled waveforms for the waveguide of FIG. 30.
Figure 32C:
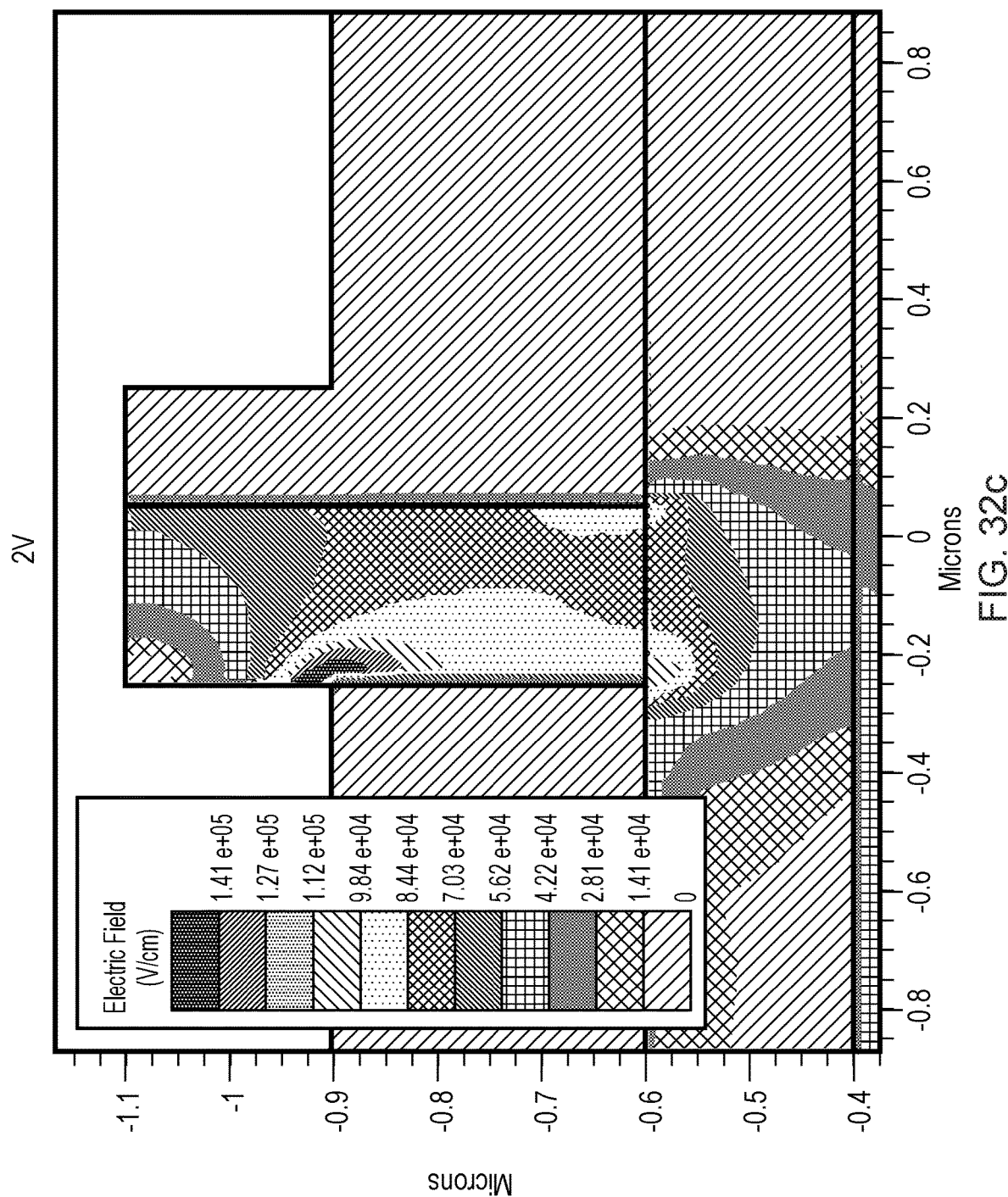
FIG. 32C shows modelled waveforms for the waveguide of FIG. 30.
Figure 33:
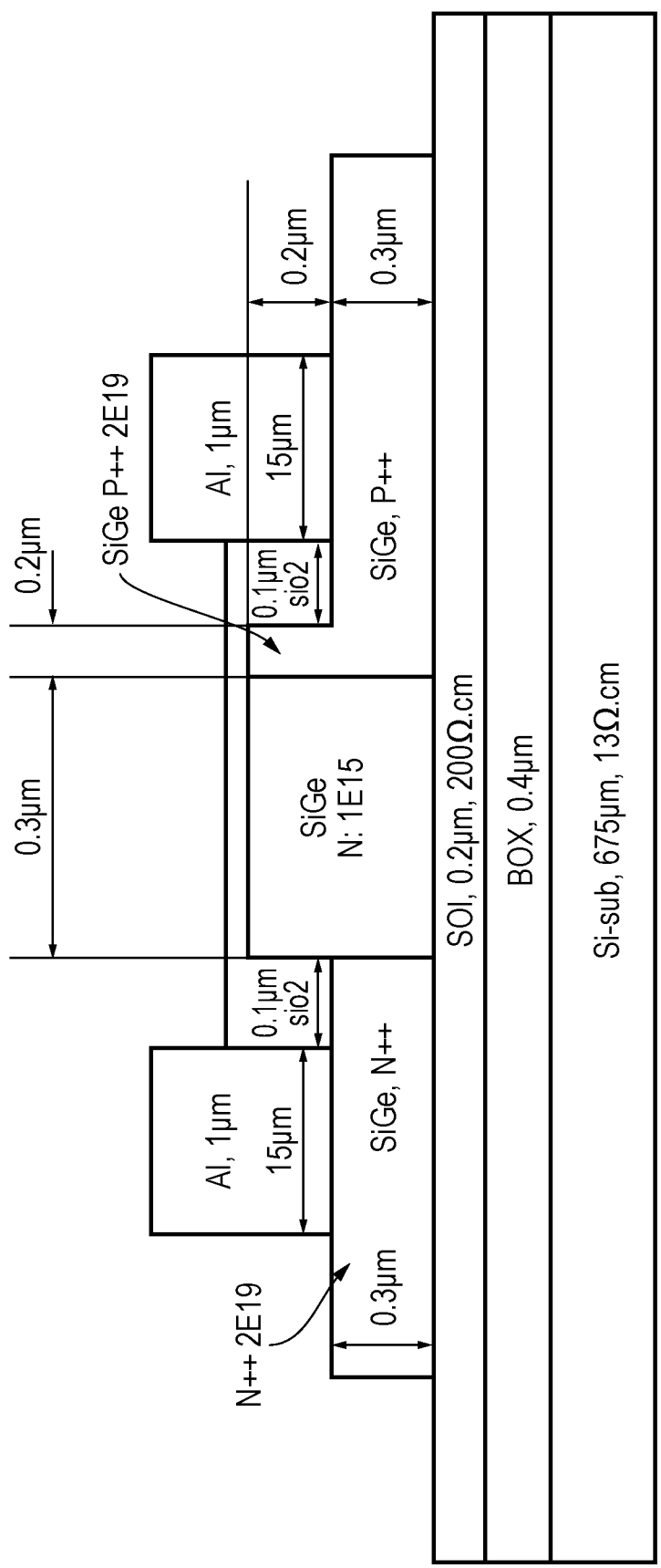
FIG. 33 shows an example of a waveguide optical device for use with the present invention.
Figure 34A:
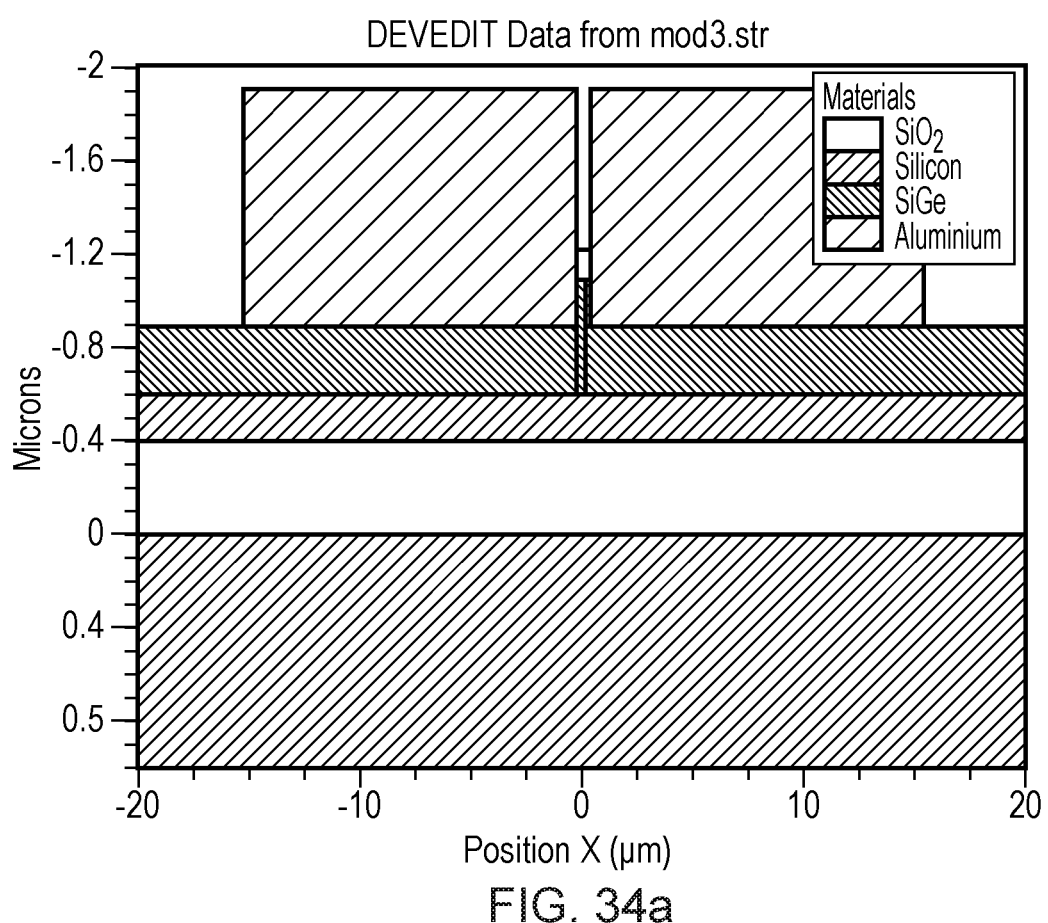
FIG. 34A shows parameters used to model the waveguide device of FIG. 33.
Figure 34B:
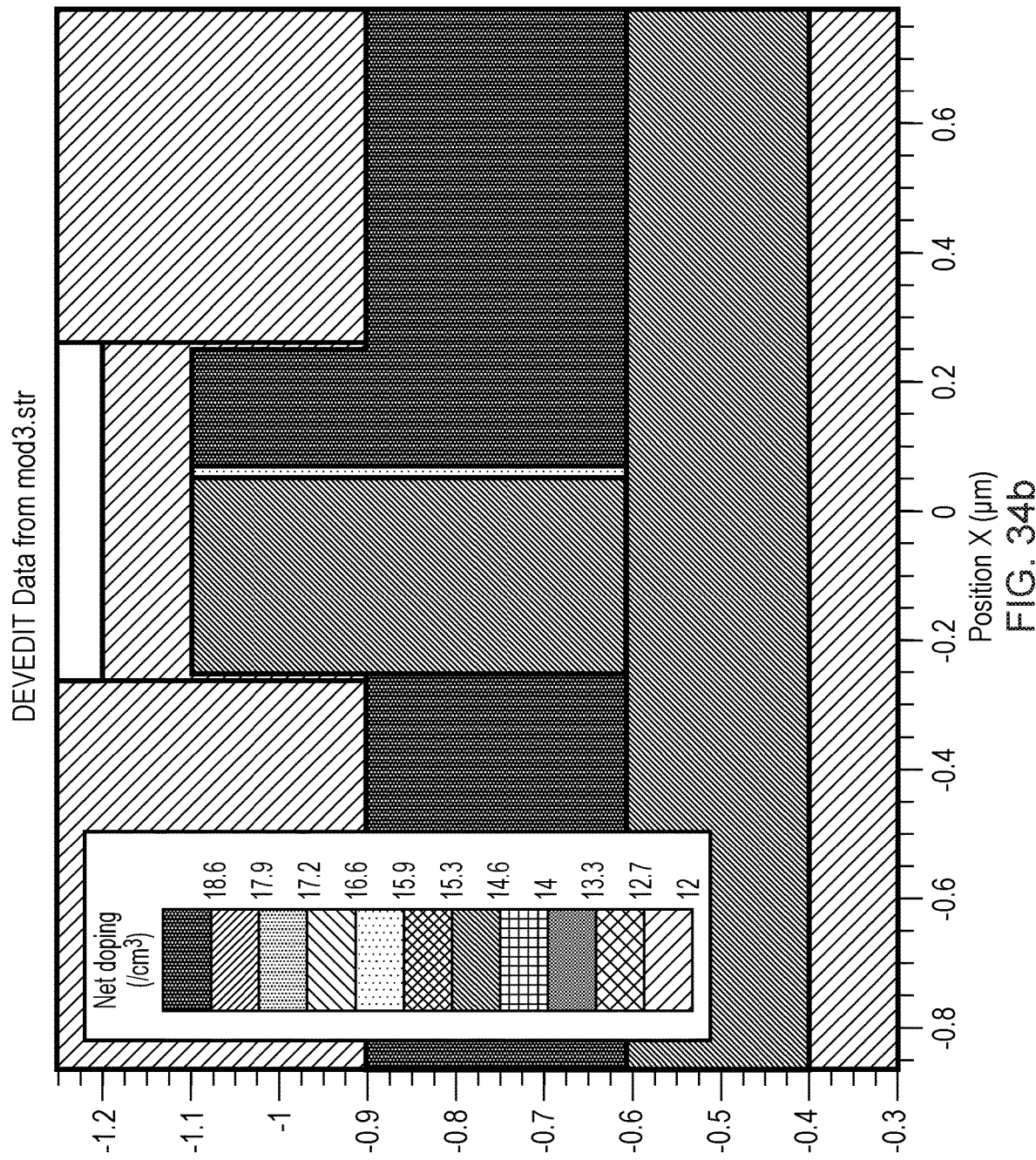
FIG. 34B shows parameters used to model the waveguide device of FIG. 33.
Figure 35A:
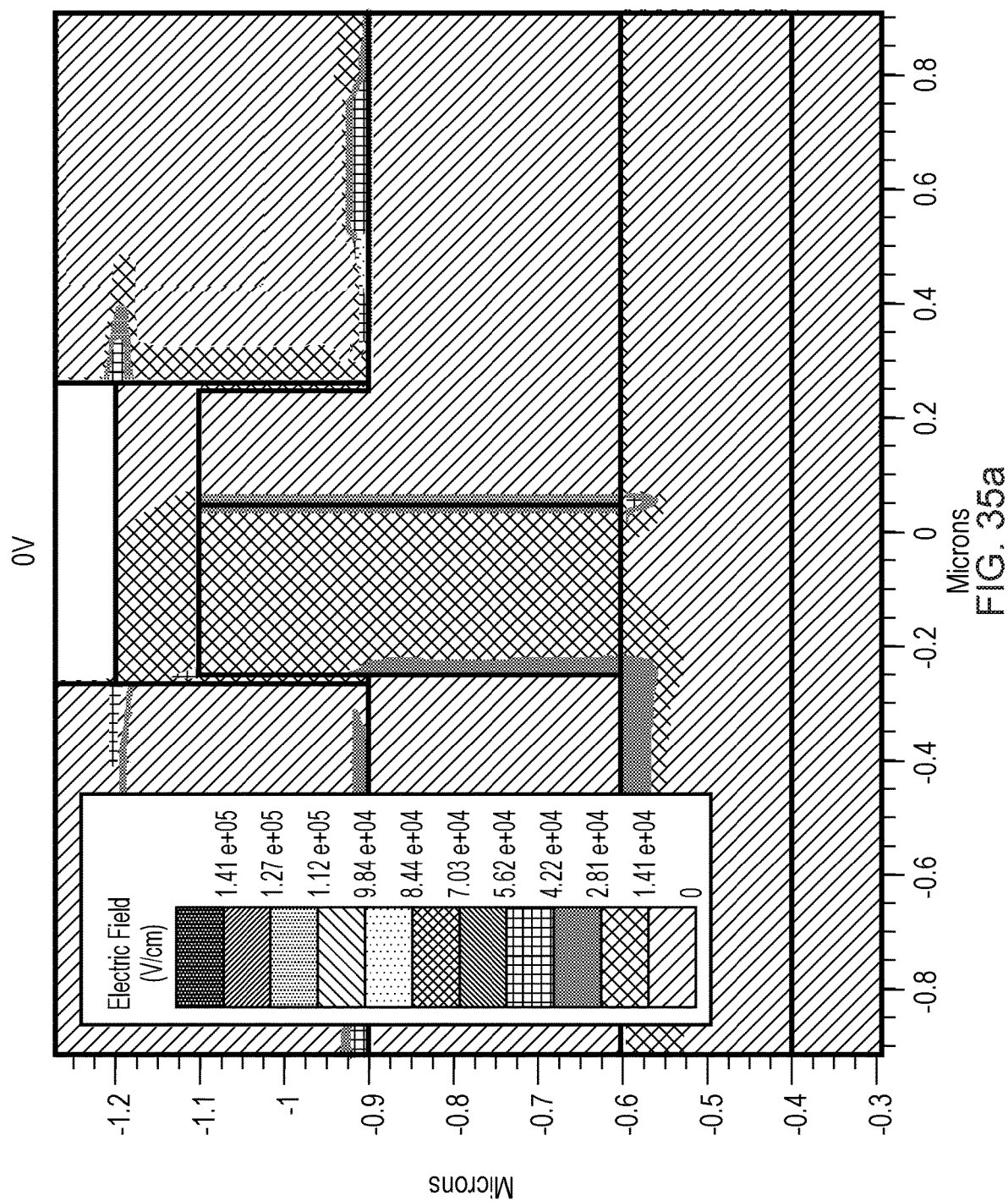
FIG. 35A shows modelled waveforms for the waveguide of FIG. 33.
Figure 35B:
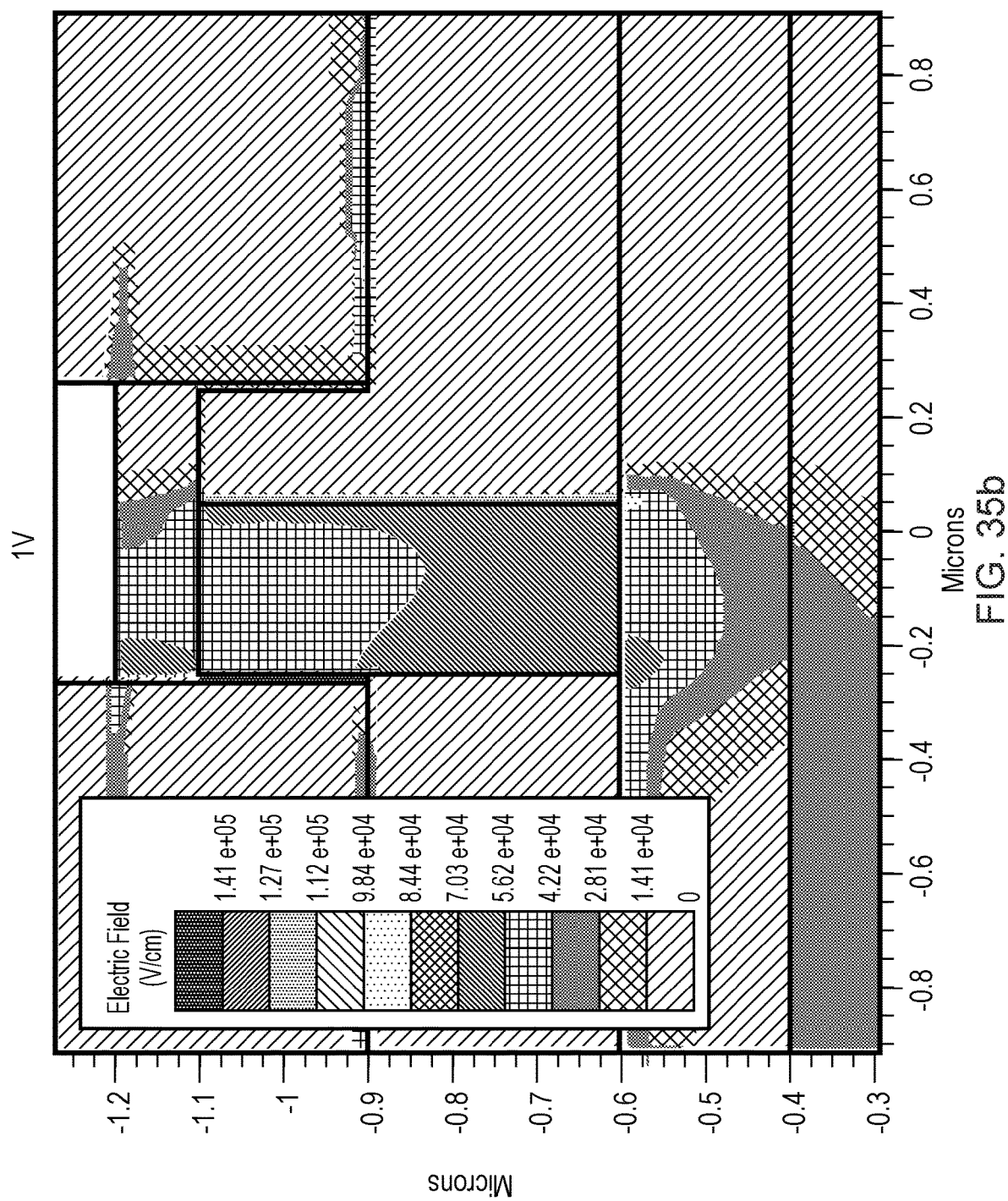
FIG. 35B shows modelled waveforms for the waveguide of FIG. 33.
Figure 35C:
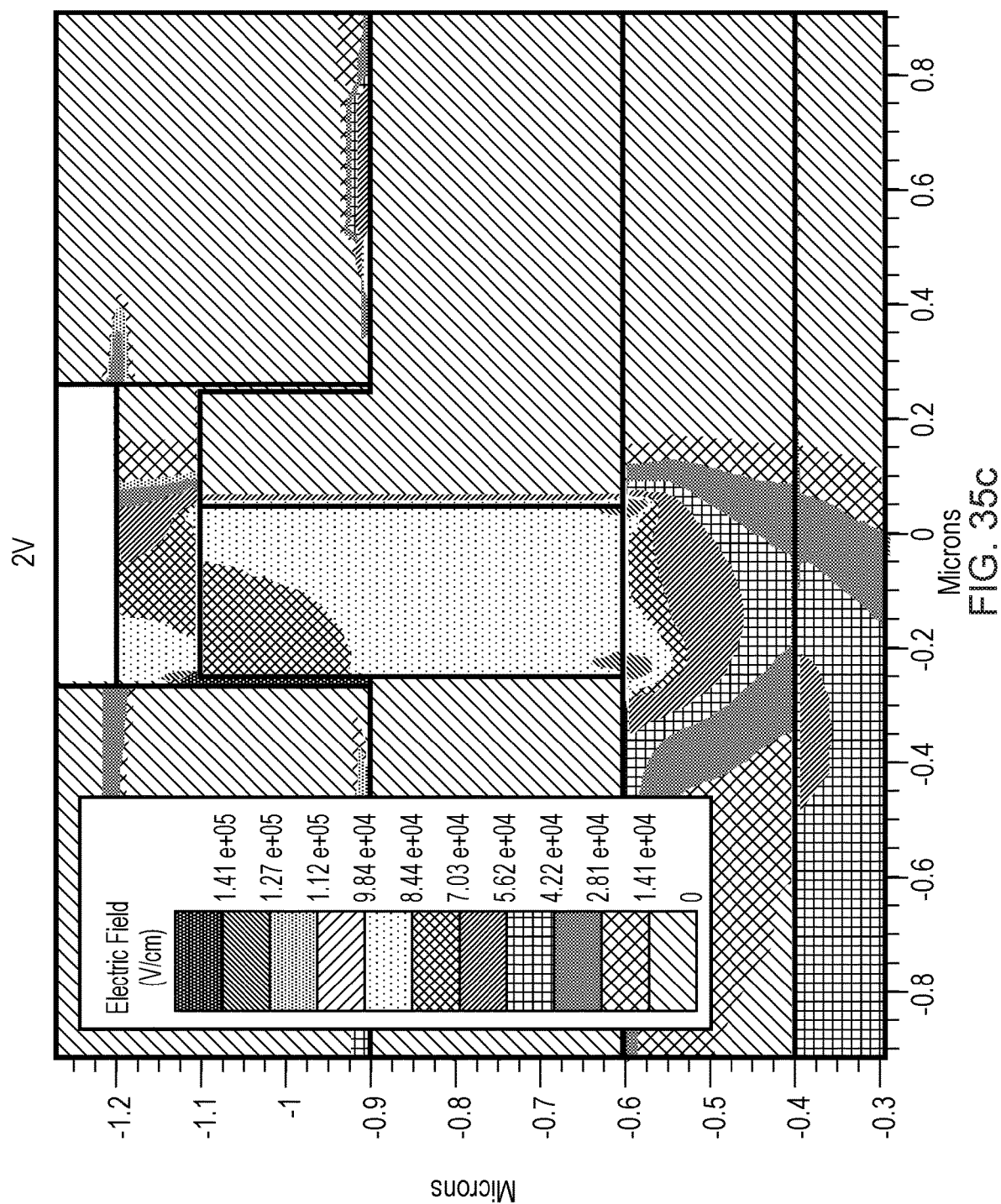
FIG. 35C shows modelled waveforms for the waveguide of FIG. 33.
Figure 35D:
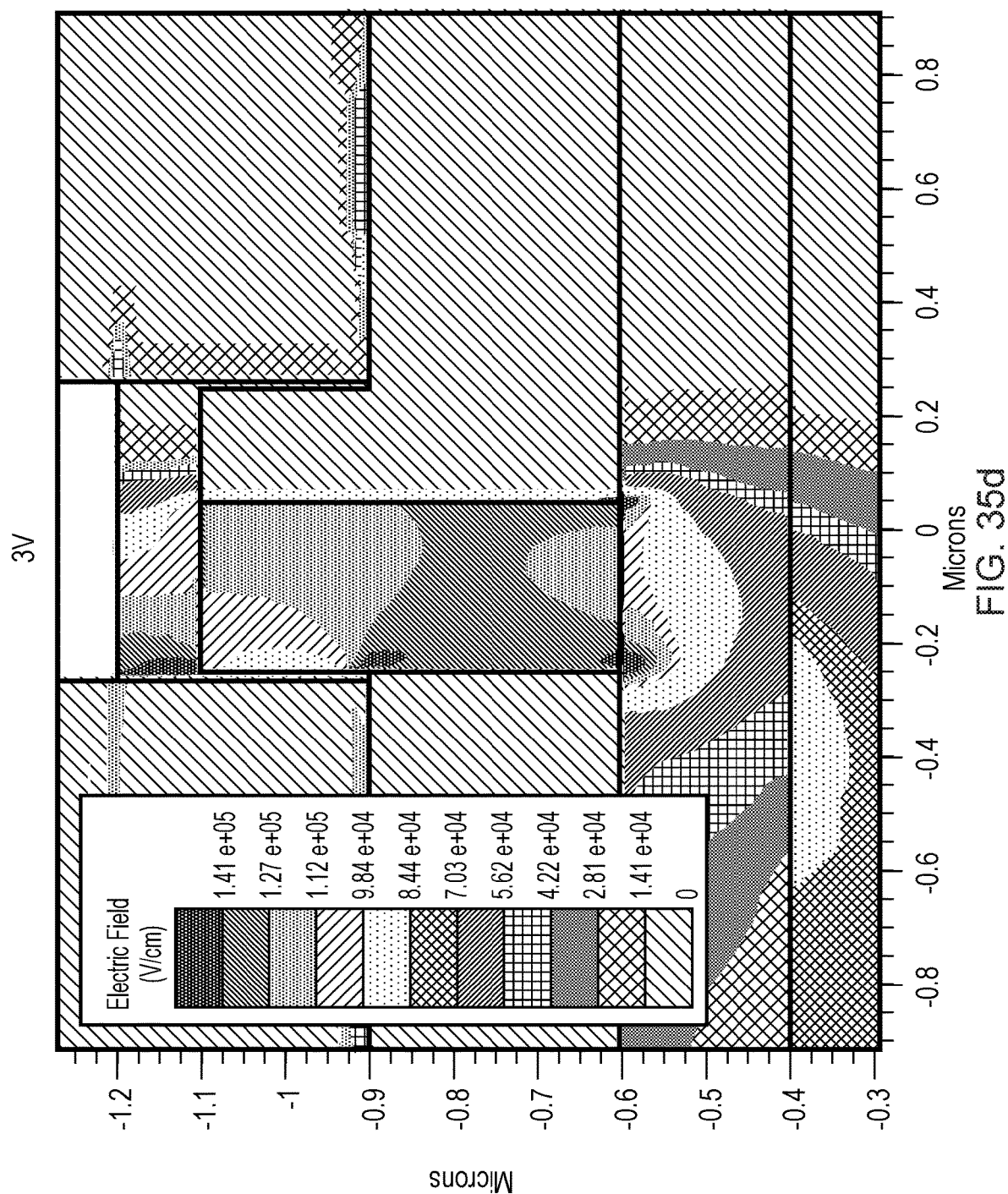
FIG. 35D shows modelled waveforms for the waveguide of FIG. 33.
Figure 36:
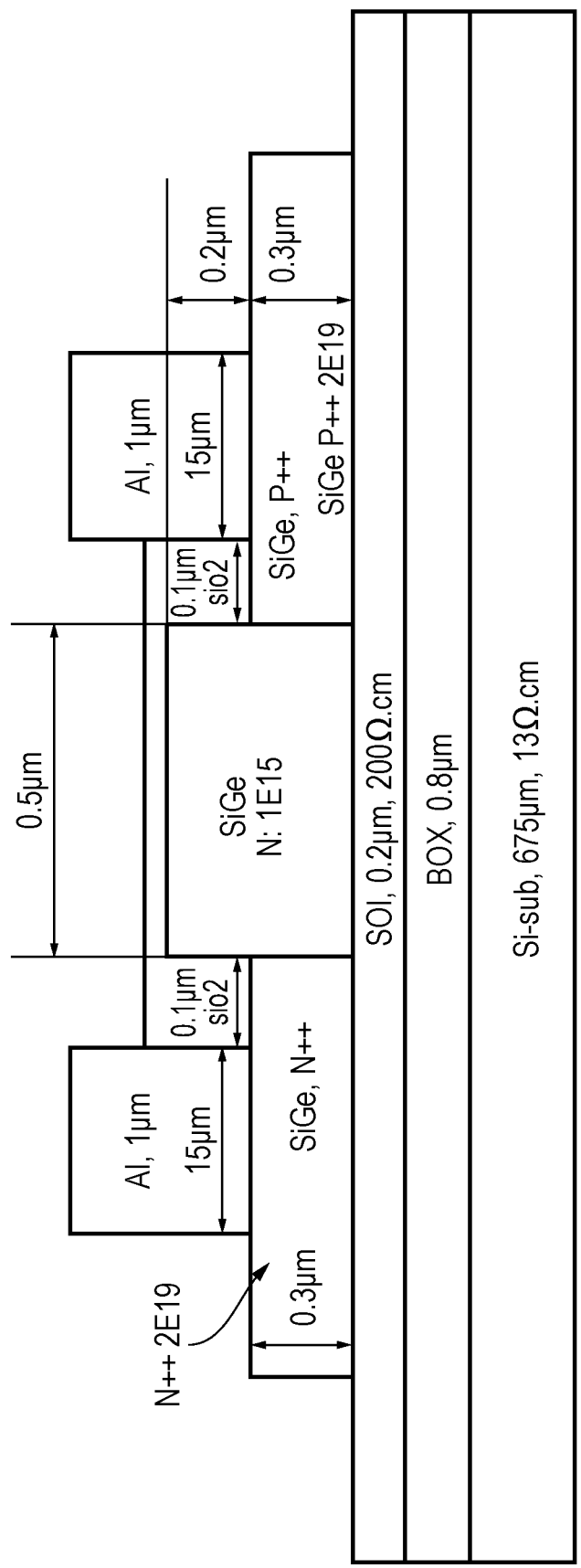
FIG. 36 shows an example of a waveguide optical device for use with the present invention.
Figure 37A:
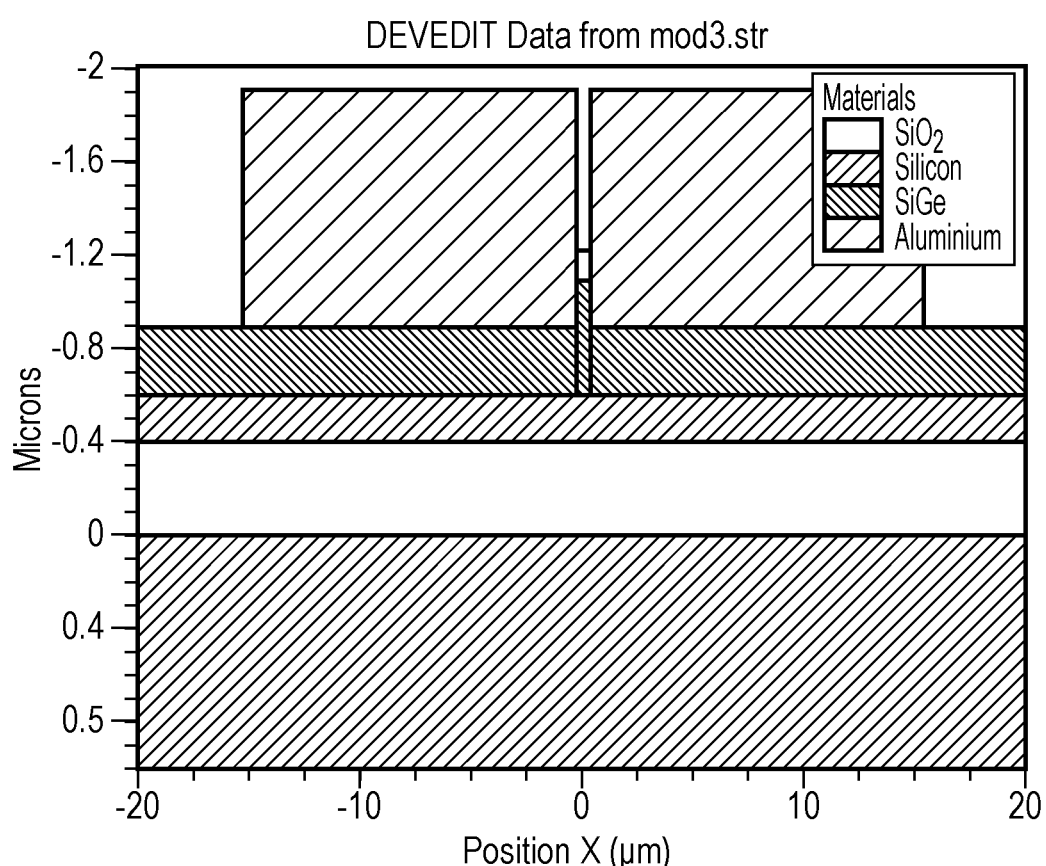
FIG. 37A shows parameters used to model the waveguide device of FIG. 36.
Figure 37B:
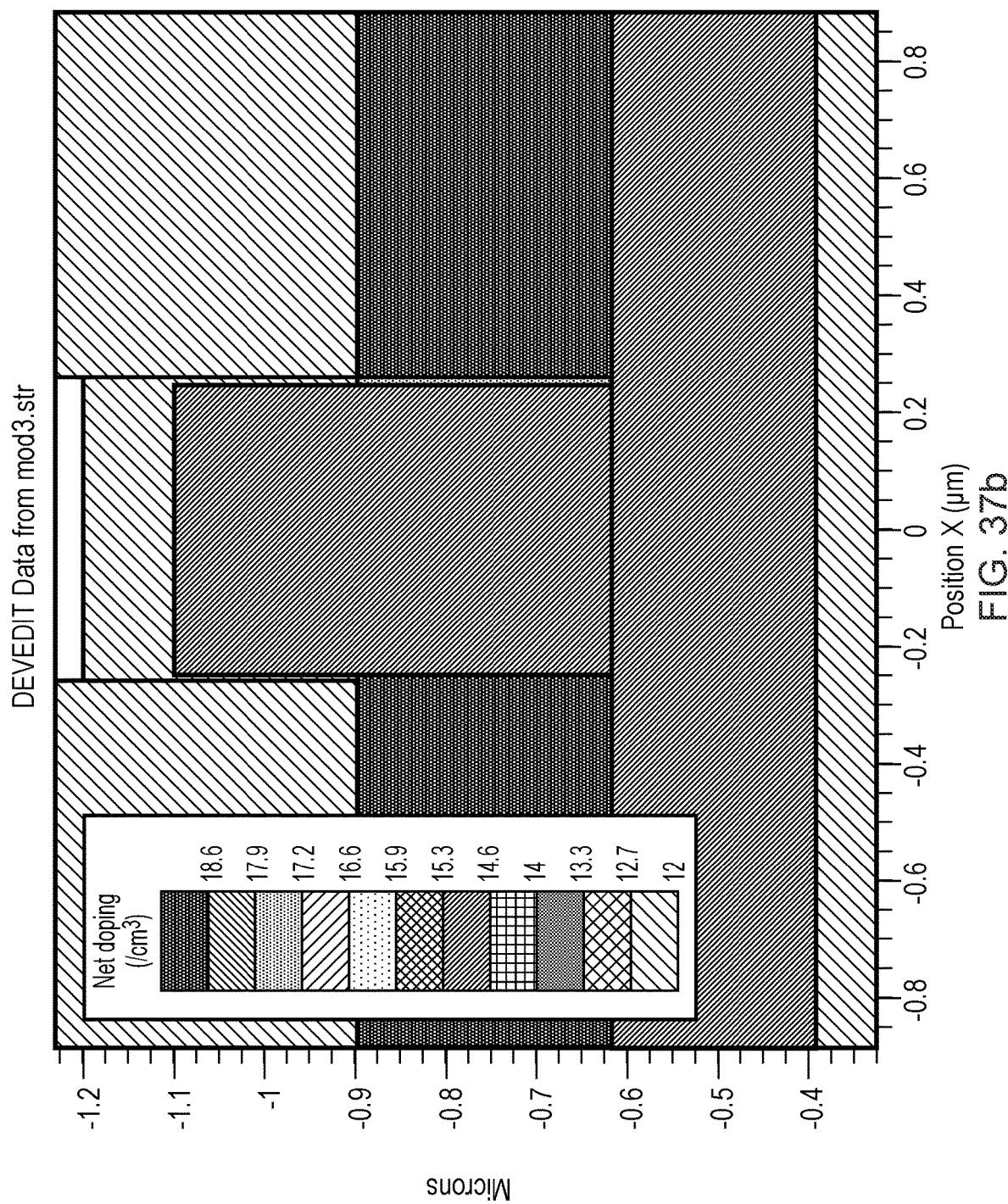
FIG. 37B shows parameters used to model the waveguide device of FIG. 36.
Figure 38A:
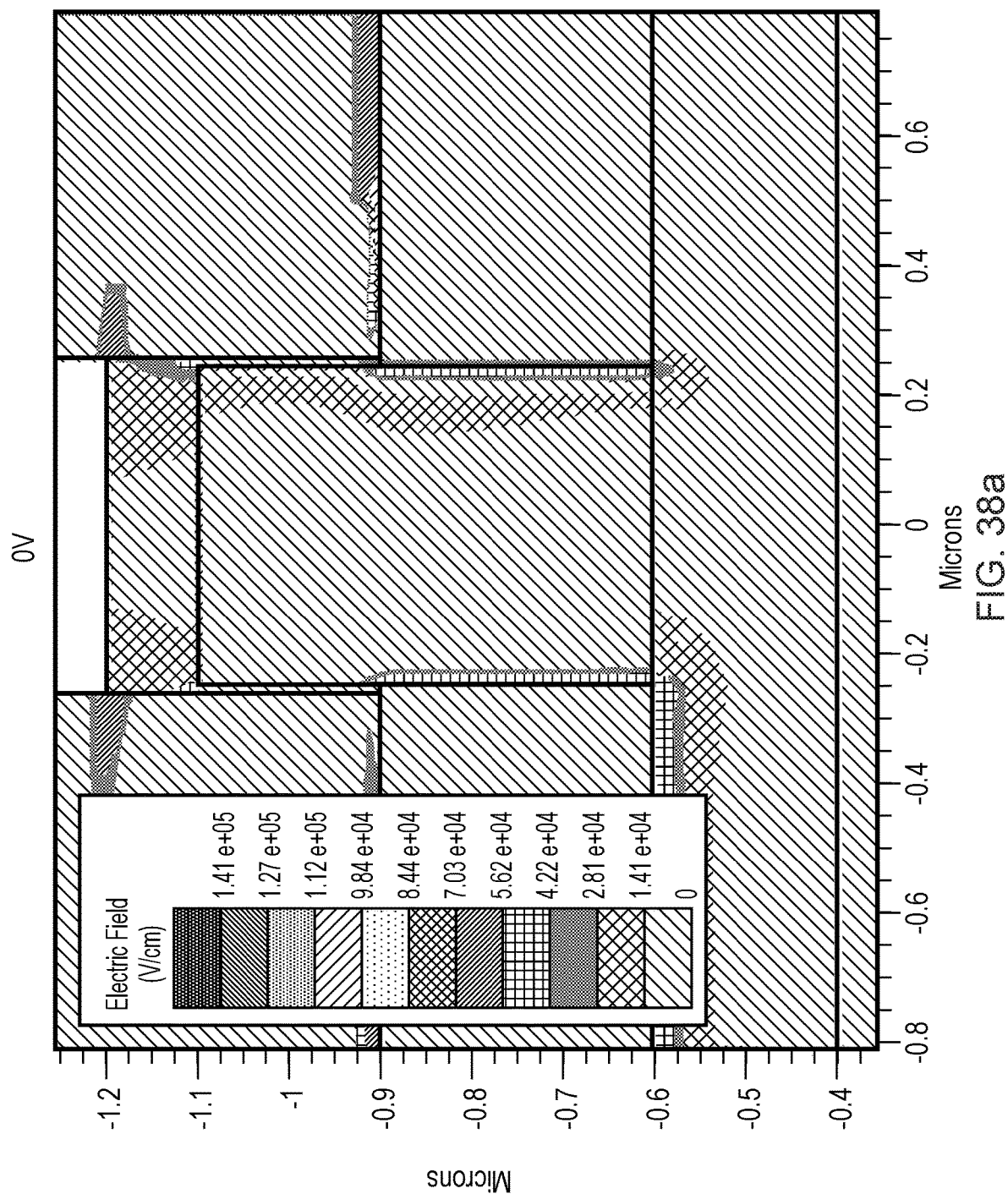
FIG. 38A shows modelled waveforms for the waveguide of FIG. 36.
Figure 38B:
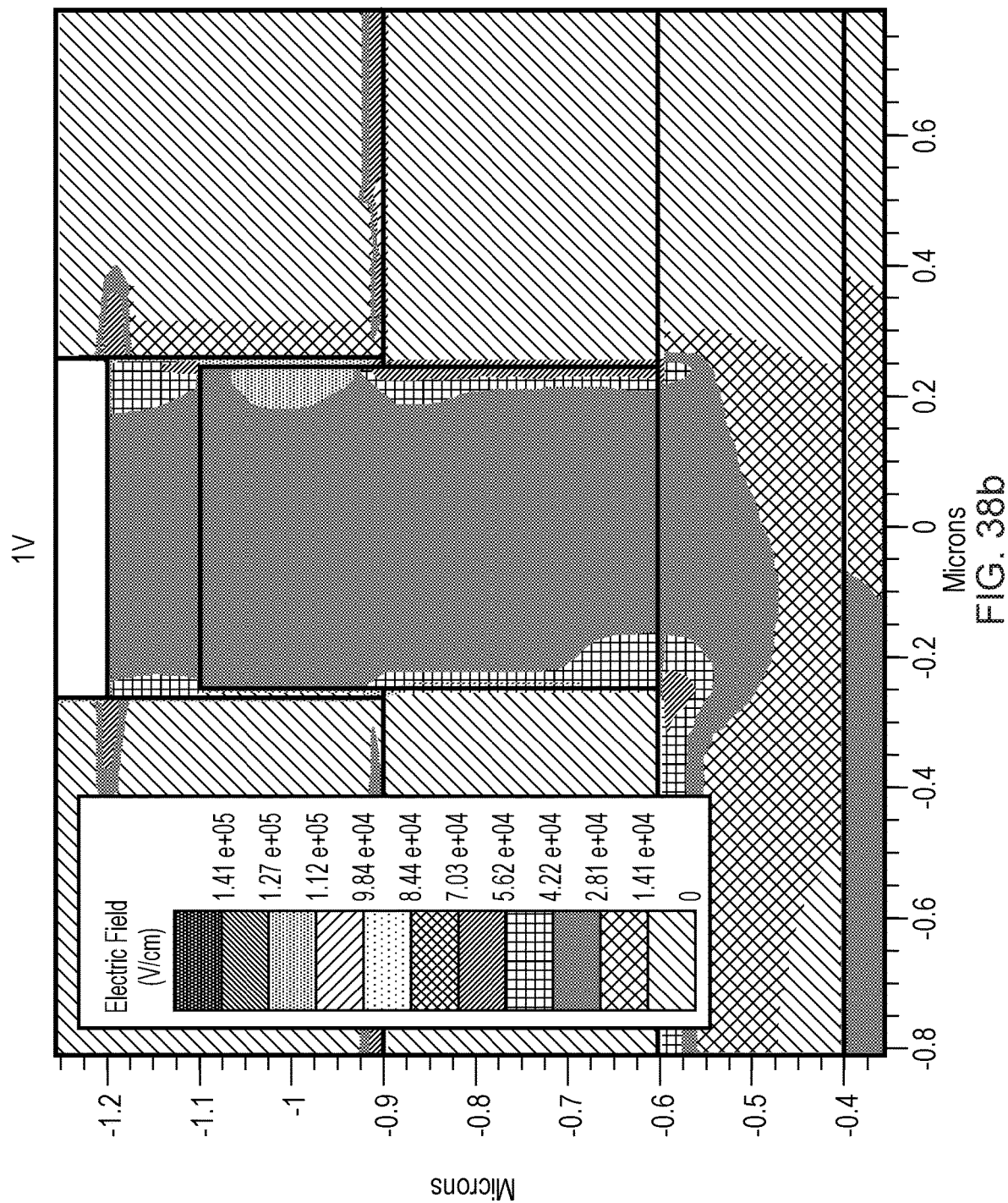
FIG. 38B shows modelled waveforms for the waveguide of FIG. 36.
Figure 38C:
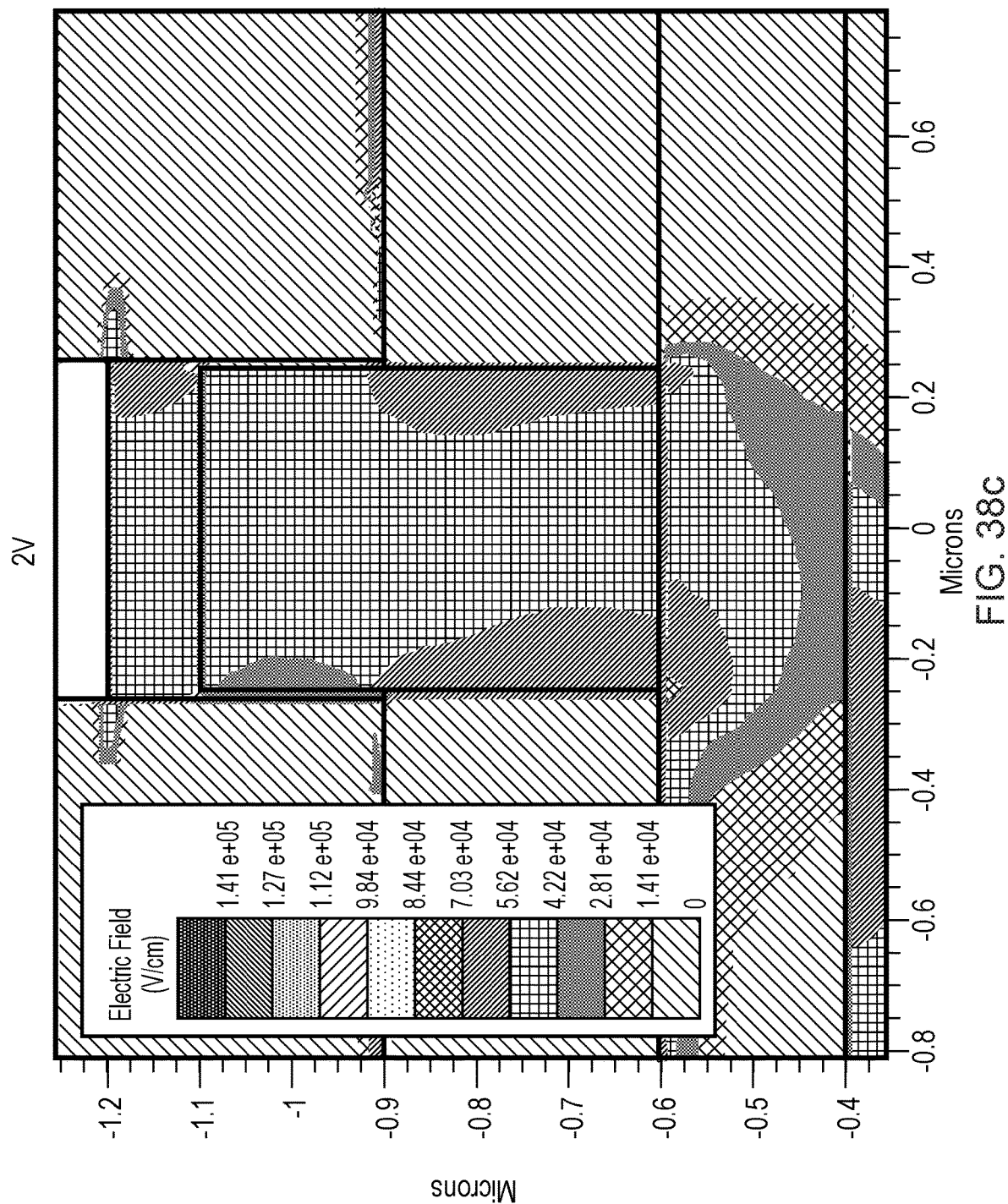
FIG. 38C shows modelled waveforms for the waveguide of FIG. 36.
Figure 38D:
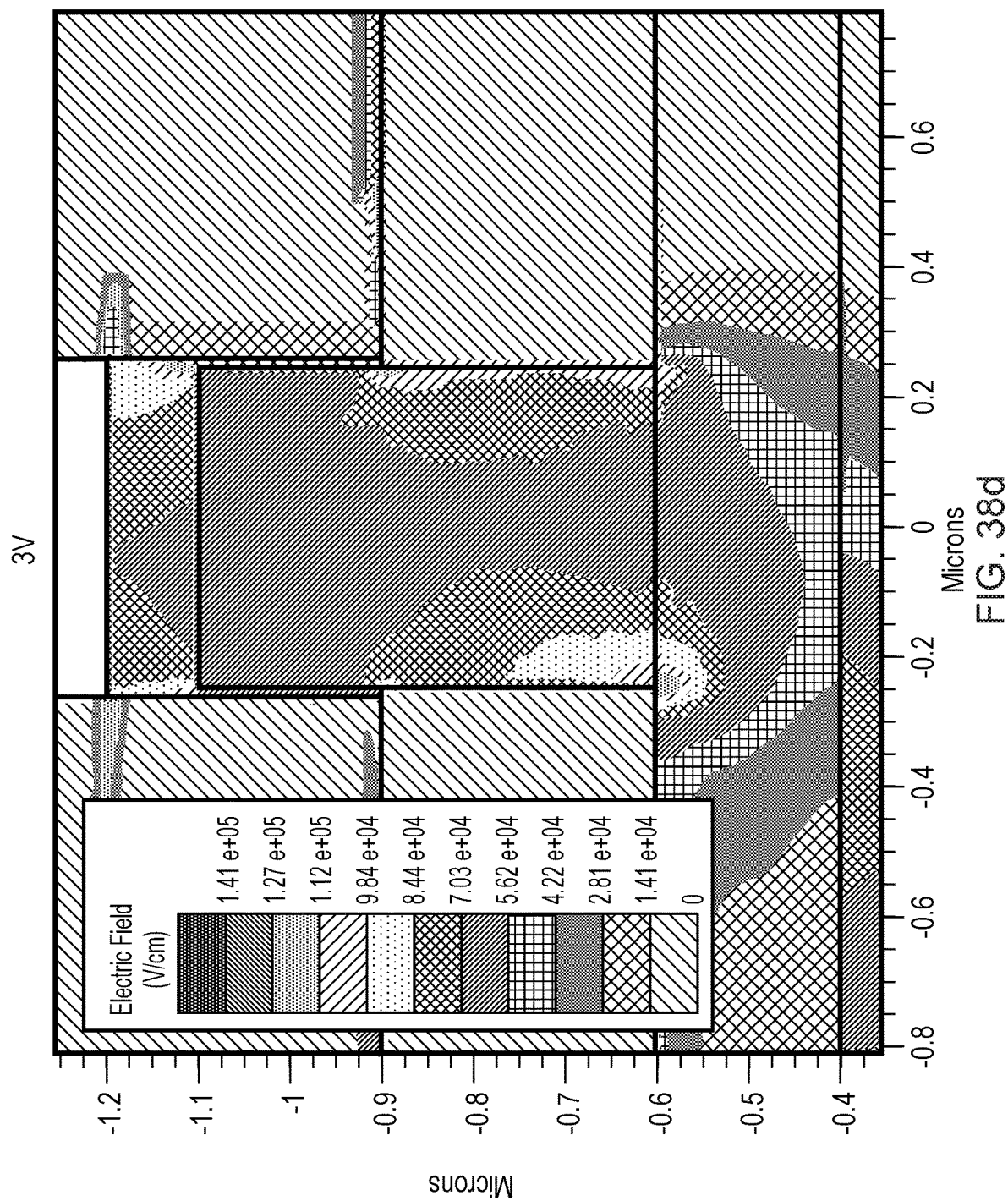
FIG. 38D shows modelled waveforms for the waveguide of FIG. 36.

In this embodiment any of the waveguide structures of FIGS. 1 (FIG. 8B) and 2 may be used as well as SiGe waveguides with doped Si sidewalls (FIG. 8C). In addition, as for Invention 3, multiple lumped electrodes or traveling wave electrodes with single SiGe cavity and multiple lumped electrodes or traveling wave electrode with multiple SiGe cavities may be used.

It will be appreciated that features of each of the Inventions described herein may be combined with one another in arrangements not explicitly claimed as such.

Mach-Zehnder Modulator

There is here described a Mach-Zehnder modulator (MZM). The MZM has an optical splitter, two arms which may be substantially parallel, and an optical combiner. Each arm comprises an optical waveguide in which light is guided. Each of the waveguide arms can have one or more active optical sectors. In one example, each of the two arms of the MZM will generally have more than one active optical sector, but it is equally possible to have a single active optical sector in each arm of the MZM.

A sequence of active optical sectors may be provided in each waveguide arm, light being guided along the waveguides constructed though each active sector. The sequence of active optical sectors along each arm may be generally aligned.

Each waveguide in an active optical sector in the MZM may have a doped wall on each side. Each waveguide in an active optical sector may have a first wall which is doped to the full height of the wall. In other, words the whole of the wall on the first side of the central region may be doped. At the same time, the second wall opposite to the first wall may be at least partially doped. Partial doping of this wall may equate to the dopant only extending a certain fraction up the height of the second wall. There may equally be no doping in the second wall. The result of such a doping scheme may be that the distribution of doping in the first and second walls of the active optical waveguide sector is asymmetrical in cross-section. For example, the first wall may be a p-doped to a first height, and the second wall may be n-doped to a second height and the first and second heights may not be the same. Equally, the first wall may be n-doped to a first height, and the second wall may be p-doped to a second height. The first and second heights may not be the same. Equally, the first wall may be a p-doped to a first height, and the second wall may be substantially undoped. Equally, the first wall may be n-doped to a first height, and the second wall may be substantially undoped. When the second wall is undoped, there may be a lateral doped region adjacent to the second wall which is doped. The doping at an edge of this lateral doped region may be in contact with the active central region.

The sense of the doping will be opposite in opposing walls (or a lateral region in the case that one of the walls is undoped) on either side of the central region, one wall will be p-doped and the opposite wall (or lateral region) will be n-doped for a given active optical waveguide sector. Extending outwards from the base of each doped wall may be a doped lateral region. The doping of each lateral region will be of the same sense as the doping in the doped wall from which it extends. In this way, each doped wall and adjacent doped lateral region together may have a cross-section which is "L"-shaped. Advantageously, electrical connections may then be formed on the lateral regions, which are electrically connected (via the doping) to the vertical walls (which may be partially doped). The lateral regions may provide a convenient surface on which to form electrical connections. In this way, an electrical signal which is applied to an electrode which is attached to a lateral doped region is transmitted, because of the common doping, to the adjacent vertical doped region.

The waveguide arms of the MZM are generally parallel and there will exist an inner region between the arms. A pair of active optical waveguide sectors, a first active optical waveguide sector comprised in the first arm and a second active optical waveguide sector comprised in a second arm that are adjacent with one another, will both be adjacent to the inner region located between the arms of the MZM. The inner region may be also be doped. The doping of the inner region may be the same as the doping in the adjacent lateral regions of each of the adjacent active optical waveguide sectors. It may be that the adjacent lateral regions of the active optical waveguide sectors meet one another in the inner region. The inner region may effectively join the adjacent lateral regions of each of the adjacent active optical waveguide sectors. The material of the adjacent lateral regions in the inner region may be integral with one another, forming an inner doped region. A DC bias or an electrical signal which is applied to the inner doped region is consequently applied to the inner doped lateral regions (which may be integral with one another in the inner region). Because the doped lateral regions in the inner region are each connected to the inner doped vertical regions, any electrical signal applied to the inner lateral regions is also applied to the vertical doped regions adjacent to the inner region. In this way an electrical connection providing an electrical signal to the inner region is applied similarly to the doped vertical regions of adjacent active optical waveguide sectors in each arm.

For an active optical waveguide to cause a change the phase of light passing through it, an electric field must be formed in the central region. To form this field an electrical connection must be applied to both of the doped opposite sides of each active optical waveguide sector in the MZM. As described above, this electrical connection may conveniently be applied to the lateral doped regions adjacent, and electrically connected to, the vertical regions. As well as a common electrode provided to apply a common bias to the inner doped walls of an adjacent pair of active optical waveguide sectors, there may also be at least one electrical connection applied to each of the outer doped walls of the adjacent pair of active optical waveguides. To apply the electrical signal to each of the outer doped vertical walls, the electrical connection may be applied to the respective doped lateral regions, which extend from the doped vertical region(s). In this way, for each active optical waveguide sector, by applying a bias or a reverse bias between the common region and an outer doped wall, an electric field is formed within the central region. The electrical connection to the outer doped regions may be an RF signal, which provides the modulation signal for the optical phase change to be applied. This electric field may then give rise to a phase change in the light passing through the central region.

For an adjacent pair of active optical waveguide sectors, one waveguide sector comprised in the first arm and the other active optical sector comprised in the second arm, there may be two outer doped walls and two inner doped walls (one inner wall and one outer wall either side of each of the active optical waveguide sectors). The inner doped walls may be connected to inner doped lateral regions to form a common doped region between the arms of the MZM. The two outer walls will have the same doping sense as one another, for example both outer doped walls may be p-doped or both outer walls may be n-doped. The inner walls and the common region will be doped in the opposite sense to the outer walls. For example, where the outer walls are both p-doped, the inner walls may both be n-doped. Conversely, where the outer walls are both n-doped, the inner walls may both be p-doped. As described above, it may be that there is only partial doping in one of the walls for each of the active optical waveguide sectors. Equally, it may be that there is no doping in one of the walls for each of the active optical waveguide sectors. This equates to an asymmetrical doping cross-sectional profile for each of the pairs of active optical waveguide sectors.

Where each arm of the MZM includes a plurality of active optical waveguide sectors, this plurality can be described as a plurality of adjacent pairs of active optical waveguide sectors. Each pair of active optical waveguide sectors can be configured as described above. Where a number of pairs are comprised along the length of the MZM, the central region of all of the active optical sectors comprised in each arm will be aligned to allow the containment of light. Each active optical waveguide sector may be used to impart a different magnitude of phase change to the light. The cross-sectional profile of the dopants across a pair of active optical waveguide sectors may be symmetrical about an axis passing through the common region located between the active optical waveguides. Equally, the cross-sectional profile of the dopants across a pair of active optical waveguide sectors may be asymmetrical. In the asymmetrical case for each pair the dopants' profile in each active optical waveguide sector may be the same. The total phase change applied to the light in an arm of the MZM may be the sum of the phase changes applied by the active optical waveguides comprised in that arm. Each active optical waveguide sector may be used to impart a different magnitude of phase change to the light.

Where there is a plurality of pairs of active optical waveguide sectors along the length of the MZM, the common regions of the pairs may be aligned with one another along the length of the MZM. A common signal may be applied to the aligned central regions. This may be achieved with a common electrode rail which runs along the length of the common regions and is electrically connected to each of the common regions. Alternatively, there may be provided a sequence of individual electrical connections to the common regions, and these electrical connections may be electrically connected to each other, for example using a wire connection. In both examples, the same electrical signal may be applied to all of the common regions.

The outer vertical regions and the outer lateral regions of a plurality of pairs of active optical waveguide sectors may also be aligned along the length of the MZM. Along a sequence of outer lateral regions along each side of the MZM there may be a separate lumped electrode provided on each lateral region. In this case each waveguide sector can have a bias between the common electrical connection to the common region of the between the arms of MZM and the outer lumped electrode. The phase change of the light contained within the first arm may be opposite to that in the second arm. In this way the MZM may be configured to be operated in a "push-pull" mode.

Alternatively, a rail electrical connection may be connected to a plurality of aligned outer doped regions on each side of the MZM. This rail may form a travelling wave electrode. The outer rail on the first side of the MZM may be terminated with the outer rail on the opposite side of the MZM.

The advantages of various embodiments of the present invention can be further understood by the mathematical models presented in FIGS. 9 to 38.

Further embodiments of Mach-Zehnder modulators having PIN junctions are described below in relation to FIGS. 39 and 40. This Mach-Zehnder modulators operate as push-pull Mach-Zehnders with forward bias.

Figure 39:
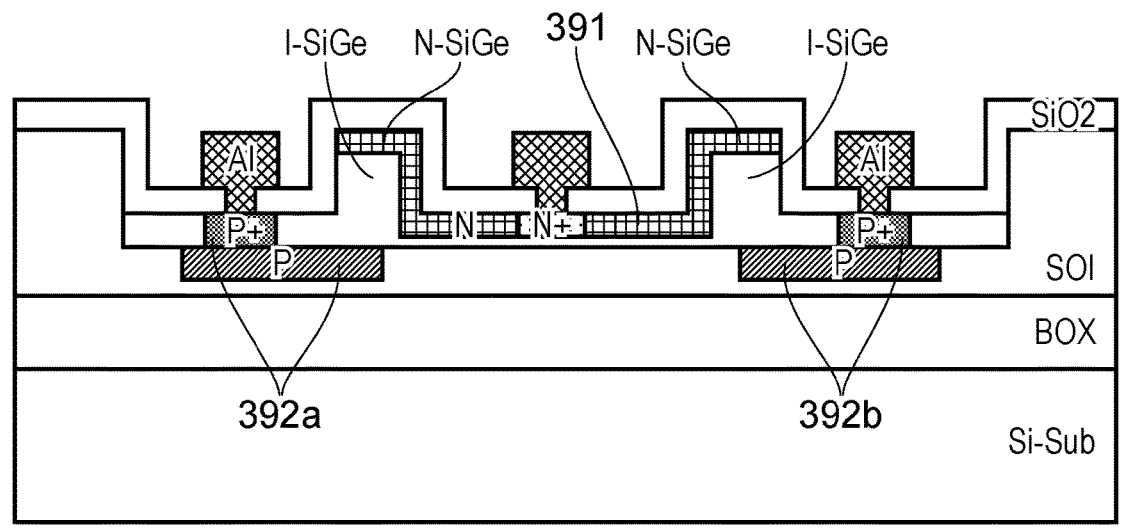
FIG. 39 shows a further example of a Mach-Zehnder waveguide modulator according to the present invention.

FIG. 39 depicts a Mach-Zehnder waveguide modulator wherein the left and right waveguides are formed from SiGe, the SiGe portion laying on top of a silicon-on-insulator (SOI) base. For each of the left and right waveguides, the junction region is a PIN junction, the PIN region comprising a first doped region in the form of an n doped region (N), 391 and a second doped region in the form of a p doped region 392a, 392b.

For each waveguide, the N doped region extents vertically along the side wall of the waveguide, laterally along the upper surface of the waveguide, and laterally at the base of the ridge, away from the waveguide. The N doped regions of the two waveguides meet to form a shared N doped region between the left arm and right arm of the Mach-Zehnder modulator. A concentrated sub-region N+ is located within the N doped region, between the two waveguide.

The p doped region for each waveguide consists of a first p doped sub region (P), located within the SOI layer, and a second more concentrated p+ sub region (P+), in electrical contact with the p sub region, the p+ sub region being located within the SiGe material.

A plurality of electrodes are located in contact with the n+ and p+ sub regions. Since the n+ sub region is shared, a central common electrode is also shared between the two waveguides.

Figure 40:
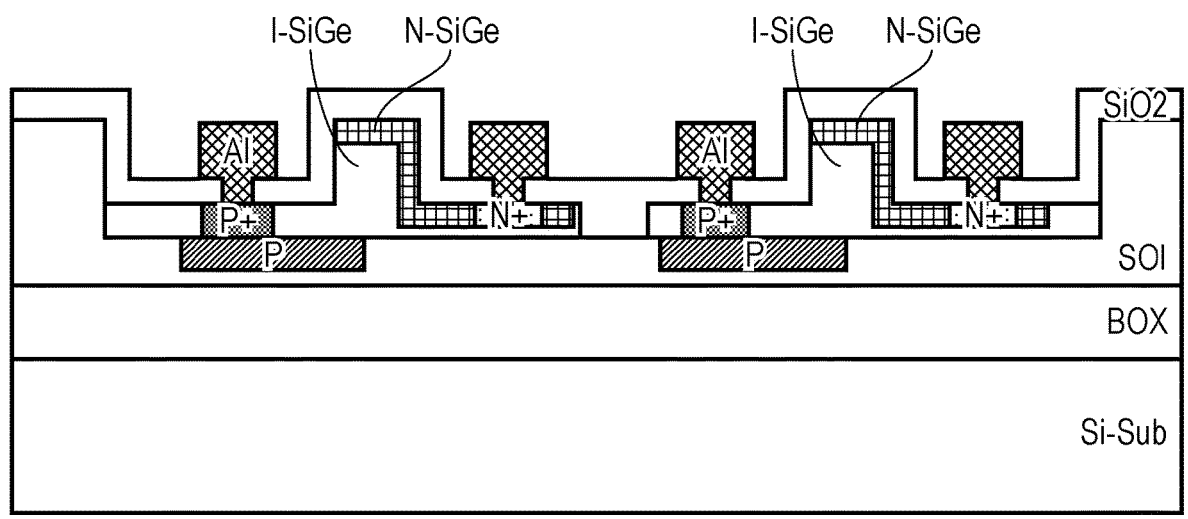
FIG. 40 shows a further example of a Mach-Zehnder waveguide modulator according to the present invention.

The embodiment shown in FIG. 40 differs from that of FIG. 39 in that there is no shared doped region. In FIG. 39, the waveguide junctions for respective arms can be thought of as mirror images of each other. For FIG. 40, this is not the case. Instead, the central region between the two waveguides comprises the N doped region of one waveguide and the p doped region of the other waveguide, separated by an insulating gap. This results in an extra n+ region and an extra electrode.

Examples of Mach-Zehnder modulators comprising PN junction regions are described below in relation to FIGS. 41-45. As used herein, a "junction region" of a waveguide is a region of the waveguide that contains a semiconductor junction. For example, a "PIN junction region" of a waveguide is a region of the waveguide that contains a PIN junction.

Figure 41:
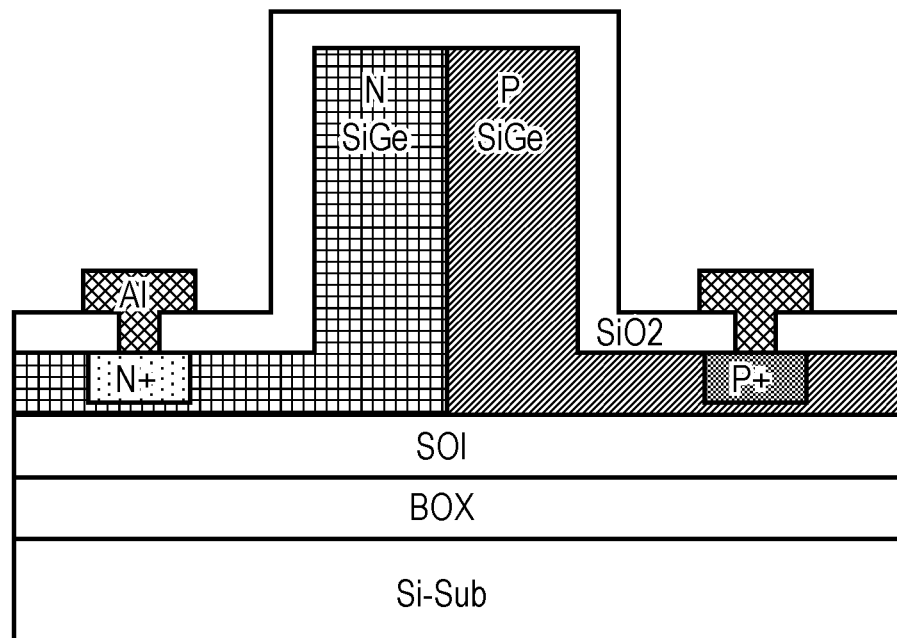
FIG. 41 shows an example of a PN junction waveguide optical device for use with the present invention.
Figure 42:
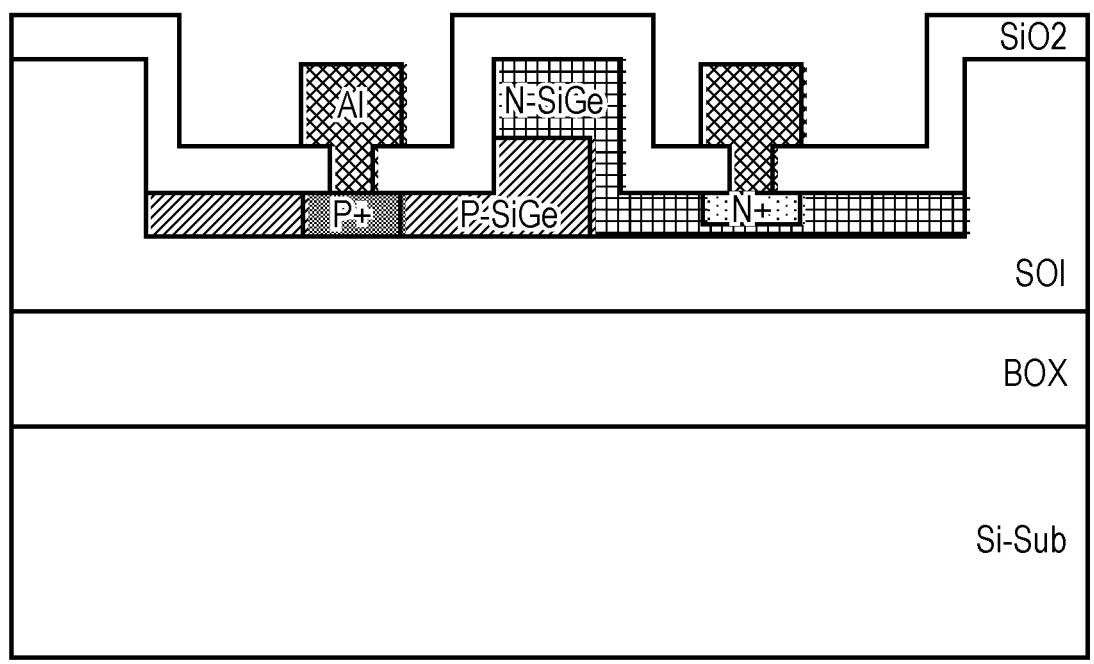
FIG. 42 shows a further example of a PN junction waveguide optical device for use with the present invention.

FIGS. 41 and 42 show two different designs for optical PN devices that could be used to form the PN junction region of each waveguide of the Mach-Zehnder waveguide modulator. In the embodiment of FIG. 41, the N doped region and P doped region each extend vertically along the entire height of one side of the waveguide. The meet at a vertical or substantially vertical boundary within the SiGe waveguide.

In the embodiment of FIG. 42, only one of the doped portions extends up to the full height of one of the side walls of the waveguide, in this case the N doped region. At the top of the waveguide, the N doped region extends laterally along the upper surface of the waveguide.

FIGS. 43 and 44 show Mach-Zehnder modulators where the doped junctions are formed from optical devices such as that of FIG. 41. In each of these embodiments, the doped region between the two waveguide arms is shared.

Figure 45:
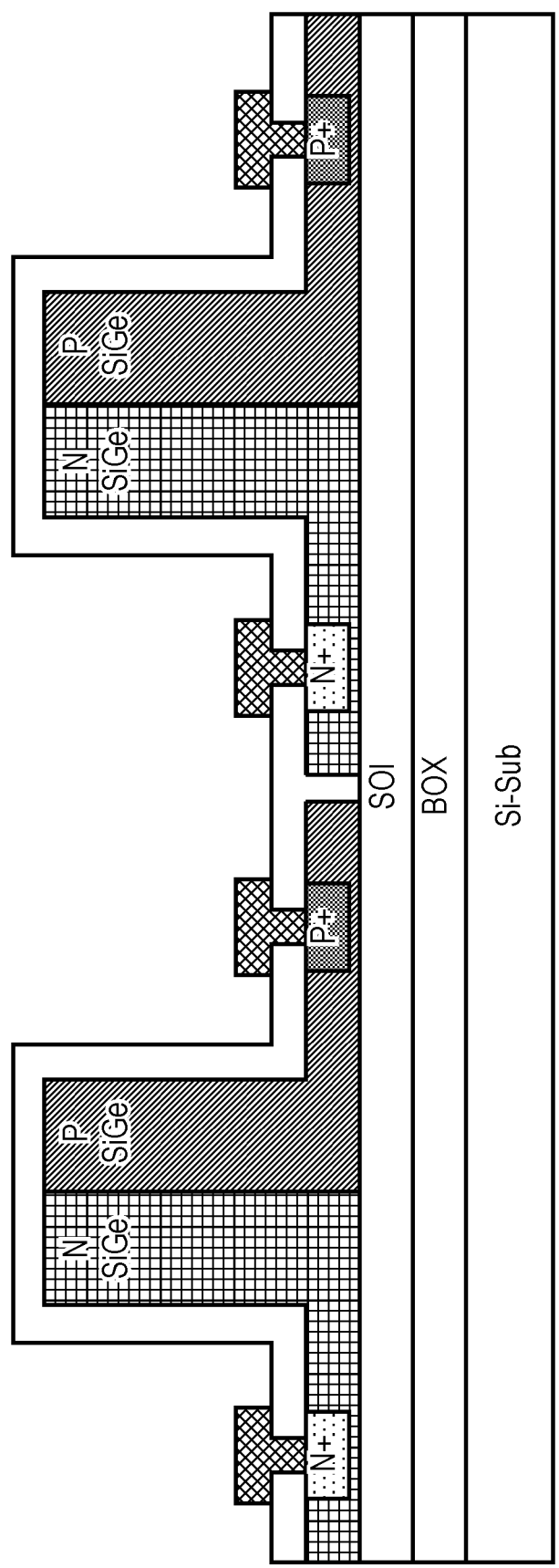
FIG. 45 shows an example of yet another Mach-Zehnder modulator comprising PN junction regions.

FIG. 45 also shows a Mach-Zehnder modulator formed from devices such as that of FIG. 41. However, in this case, the central region in-between the waveguides includes an n doped region of one waveguide and a p doped region of the other waveguide, the two doped regions being separated by an intrinsic region. In other words, this Mach-Zehnder modulator has arms with two PIN junctions separated. This Mach-Zehnder modulator operates as push-pull with forward bias.

Possible arrangements of the plurality of electrodes relative to the active regions of the junctions for use with Mach-Zehnder modulators are described below in relation to FIGS. 46 to 48.

Figure 46:
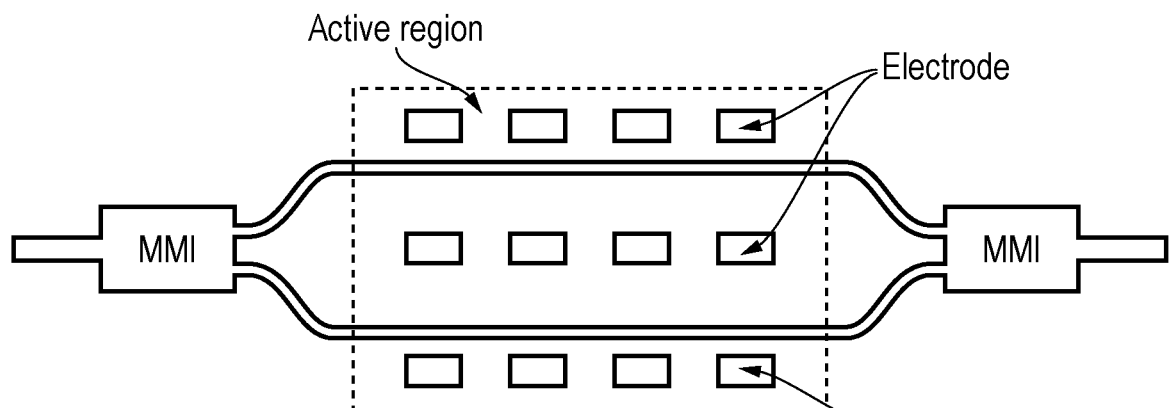
FIG. 46 shows an example of an arrangement of a plurality of electrodes relative to the active regions of the junctions for use with Mach-Zehnder modulators according to the present invention.

In the embodiment of FIG. 46, a continuous active region is present. The single continuous active region extends over an area along the length of both waveguides and also within the space between the waveguides. The portion of the waveguides within the active region has either PIN (forward bias) or PN junction (reverse bias); and the electrodes can be either lumped electrodes or traveling wave electrodes.

Figure 47:
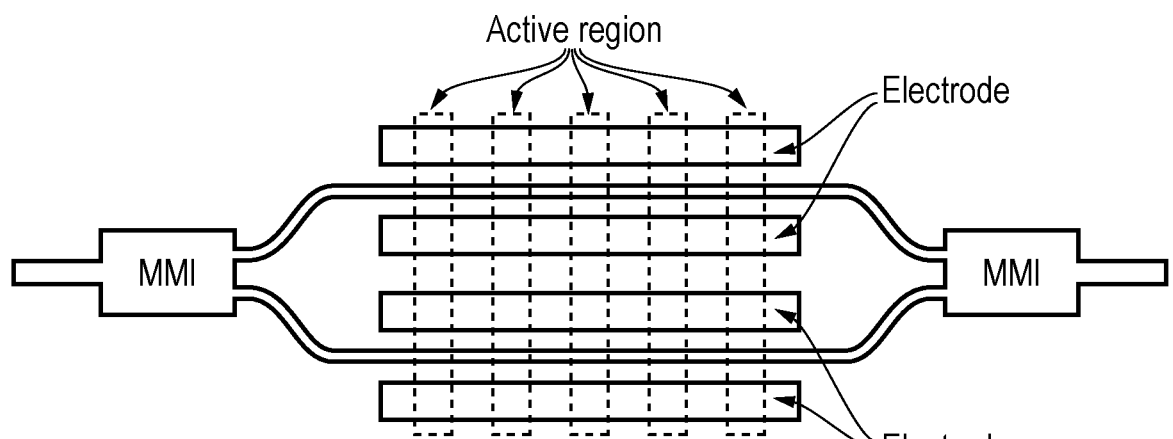
FIG. 47 shows another example of an arrangement of a plurality of electrodes relative to the active regions of the junctions for use with Mach-Zehnder modulators according to the present invention.
Figure 48:
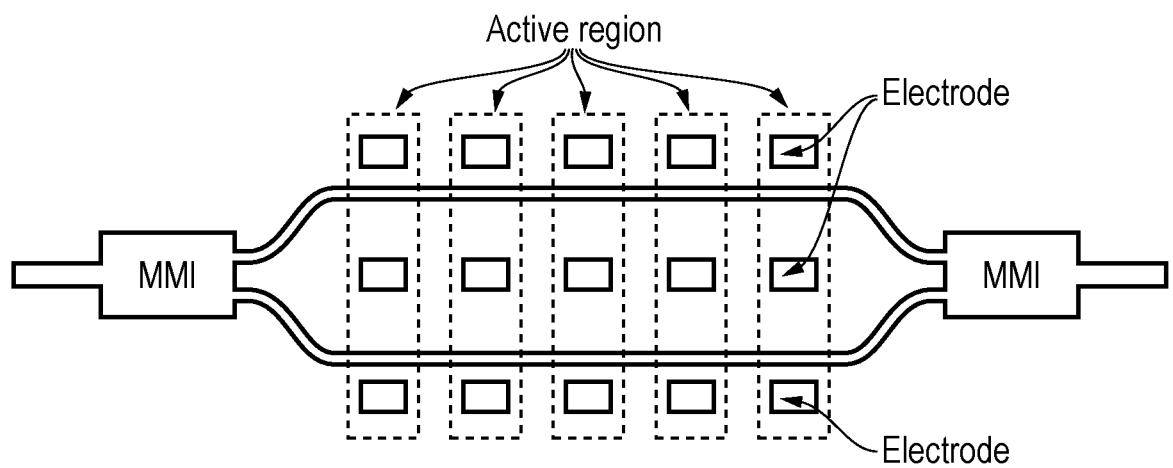
FIG. 48 shows an example of an arrangement of a plurality of electrodes relative to the active regions of the junctions for use with Mach-Zehnder modulators according to the present invention.

In the embodiment of FIG. 47, strips of active regions lie transverse or substantially transverse (substantially perpendicular) to strips of electrodes. The strips of electrodes extend along a direction parallel to that of the waveguides. Again, the portions of the waveguides within the active region has either PIN (forward bias) or PN junction (reverse bias); and the electrodes can be either lumped electrodes or traveling wave electrodes The embodiment of FIG. 48 differs from that of FIG. 47 in that the electrodes are discrete rather than continuous strips. Again, the portion of the waveguides within the active region has either PIN (forward bias) or PN junction (reverse bias); and the electrodes can be either lumped electrodes or traveling wave electrodes.

FIGS. 49-52 show optical device structures analogous to structures disclosed in U.S. patent application Ser. No. 16/393,889 (the "'889 Application"), differing from those of the '889 application in that, in the structures of FIGS. 49-52, the BOX layer does not extend continuously under the device but instead a portion of the BOX layer has been removed, exposing a portion of the silicon substrate, and the active region of the device is formed from one or more crystalline materials that are grown on the portion the silicon substrate thus exposed, as disclosed in U.S. patent application Ser. No. 16/420,096 (the "'096 application"). As such, the structures of FIGS. 49-52 are substrate-based optoelectronic devices on the silicon substrate. As used herein, a "substrate-based" optoelectronic device on a substrate is an optoelectronic device having an active region that is joined by a continuously crystalline path to the substrate, e.g., one that is formed by one or more (e.g. epitaxial) crystalline deposition methods the first of which involves growing crystalline material on the substrate, using the substrate as a crystal seed. As such, a substrate-based optoelectronic device is distinct from an optoelectronic device having an active region that is separated from the substrate by a non-crystalline insulating layer such as an amorphous buried oxide (BOX) layer. Similarly, a "substrate-based" optical waveguide (or active optical waveguide) is an optical waveguide (or active optical waveguide) that is joined by a continuously crystalline path to the substrate.

Figure 49:
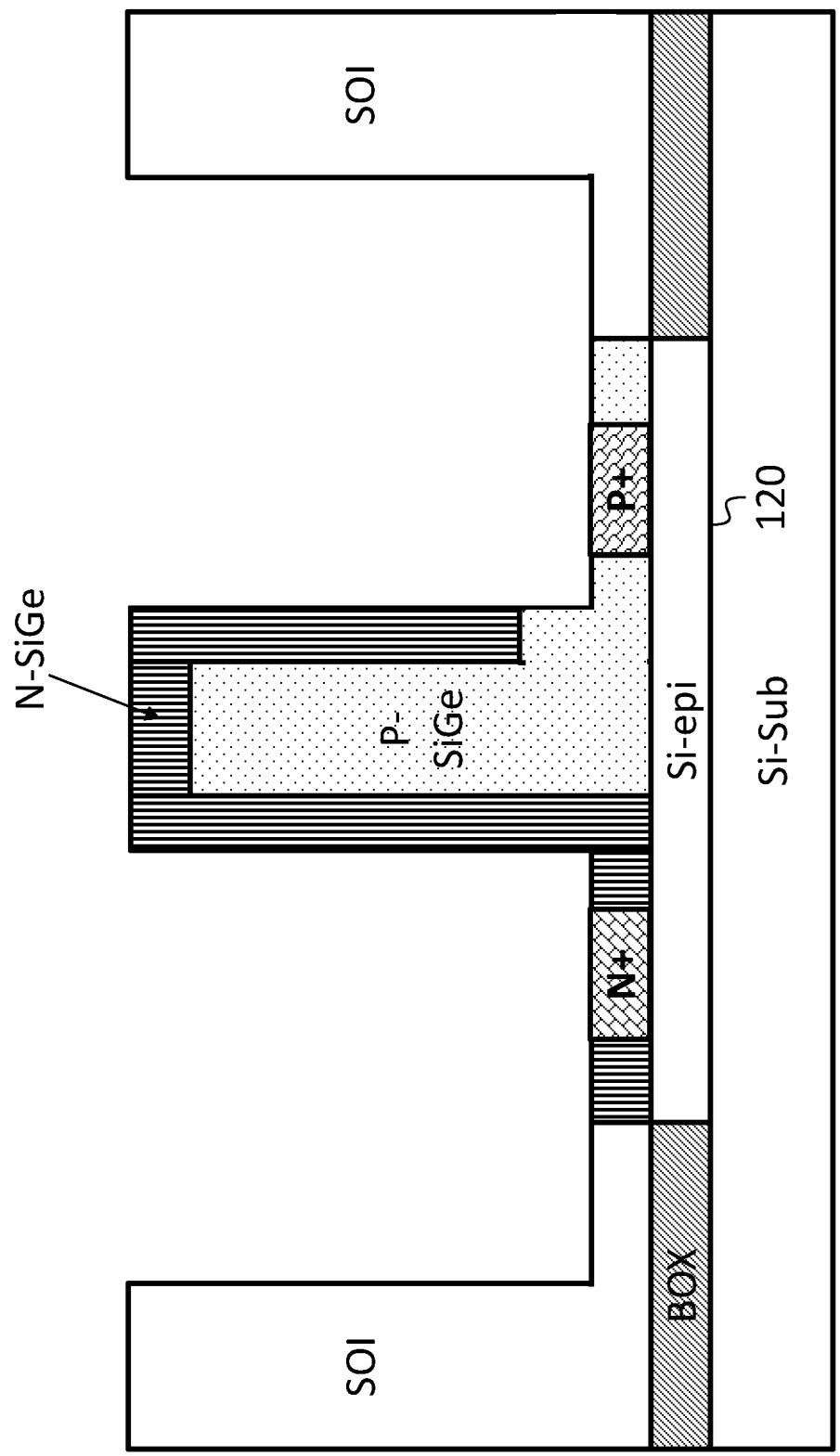
FIG. 49 shows an example of a waveguide optical device, according to an embodiment of the present invention.
Figure 50:
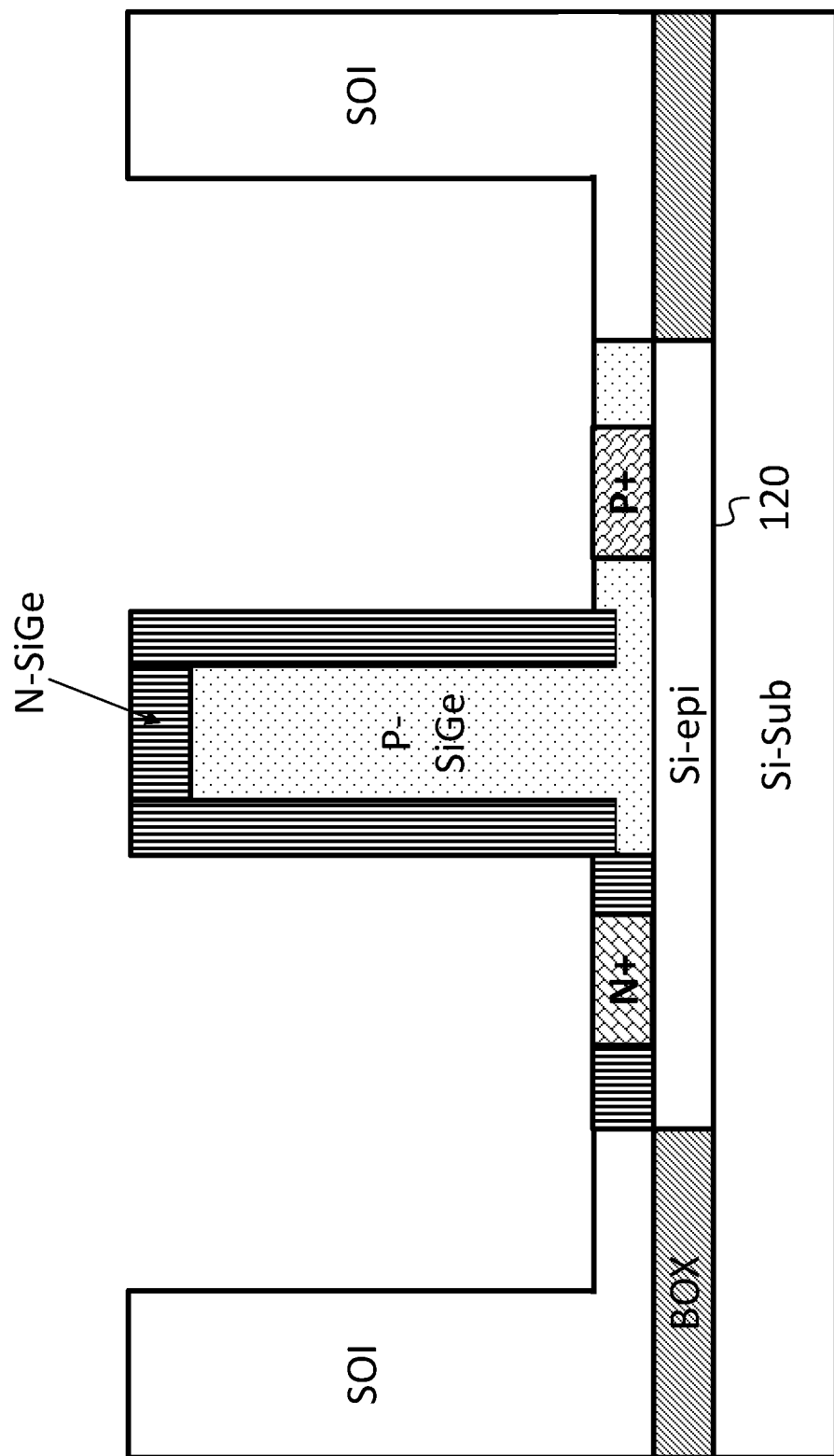
FIG. 50 shows an example of a waveguide optical device, according to an embodiment of the present invention.
Figure 51:
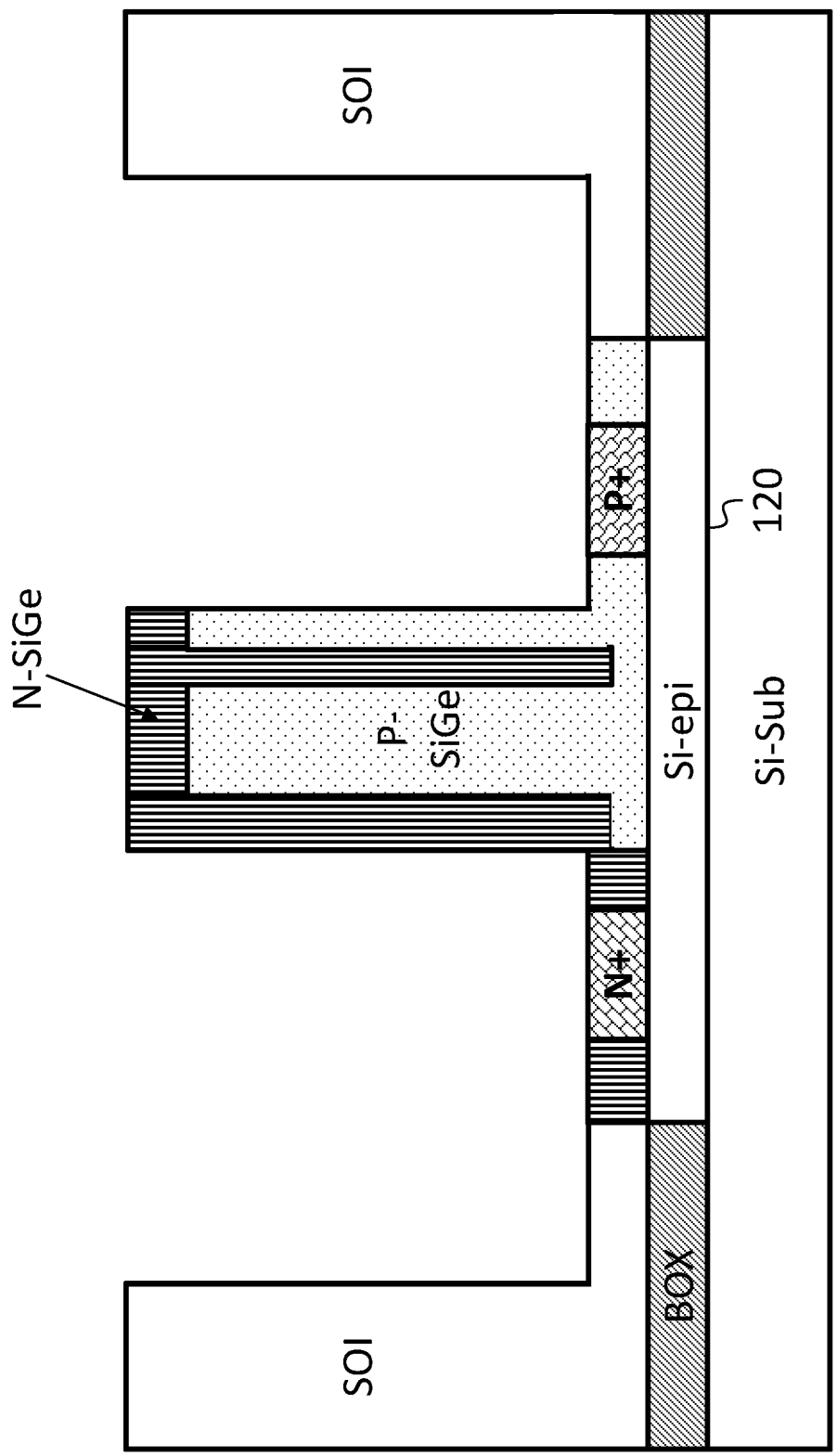
FIG. 51 shows an example of a waveguide optical device, according to an embodiment of the present invention.
Figure 52:
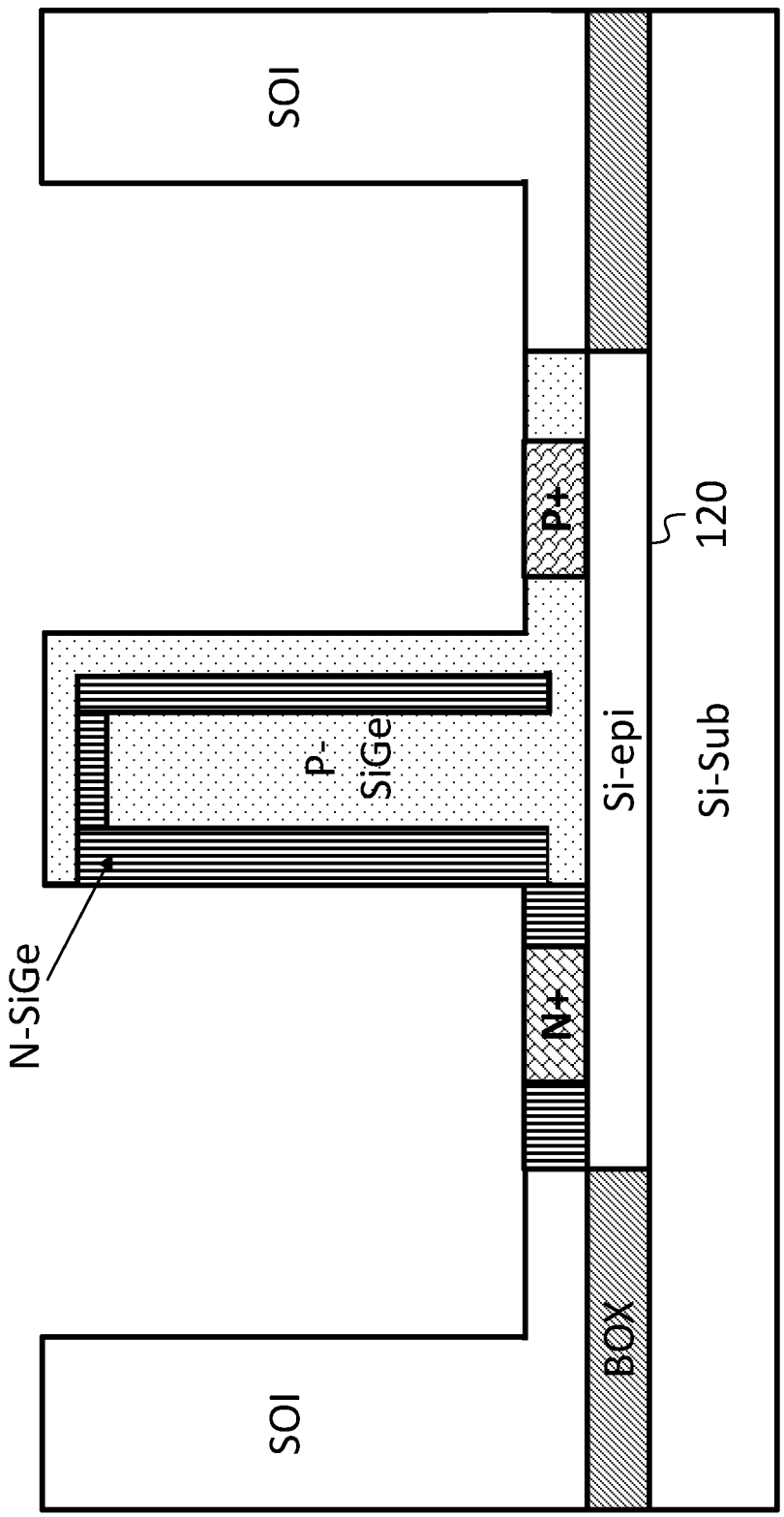
FIG. 52 shows an example of a waveguide optical device, according to an embodiment of the present invention.

For example, FIG. 4B of the '889 application is analogous to FIG. 49, FIG. 4A of the '889 application is analogous to FIG. 50, FIG. 4C of the '889 application is analogous to FIG. 51, and FIG. 4E of the '889 application is analogous to FIG. 52. In each case, a crystalline cladding layer that replaces a portion of the BOX layer may act to confine the lower end of the optical mode of the waveguide (e.g., as a result of the crystalline cladding layer's having a lower index of refraction than the rib of the waveguide).

Figure 53:
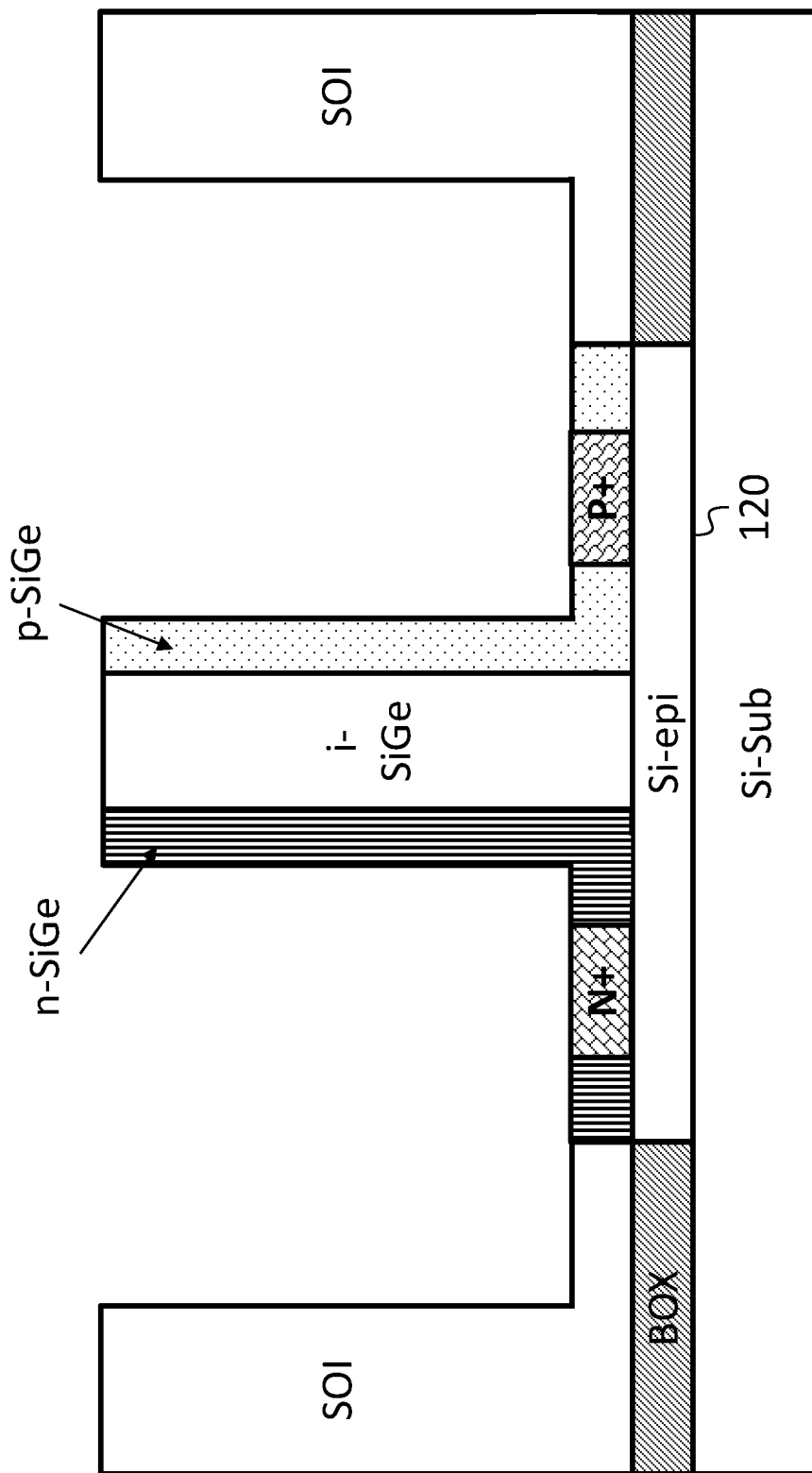
FIG. 53 shows an example of a waveguide optical device, according to an embodiment of the present invention.

A similar modification may be made to any of the embodiments of FIGS. 1a-48, the modification in each case involving the replacement of a portion of the BOX layer with a crystalline cladding layer, as disclosed in the '096 application. For example, FIG. 53 is similar to FIG. 1c, with part of the silicon dioxide layer 102 of FIG. 1c having been replaced, in FIG. 53, with the crystalline cladding layer 120.

As used herein, the word "or" is inclusive, so that, for example, "A or B" means any one of (i) A, (ii) B, and (iii) A and B. It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

The following numbered paragraphs (paras.) contain statements of broad combinations of the inventive technical features herein disclosed:—

Group A

1A. An active optical waveguide, comprising:
a central waveguide region composed of an active material;
a first vertical region on a first side of the central region, the first vertical region being at least partially doped, and;
a second vertical region on a second side of the central region
the second vertical region being at least partially undoped or intrinsic, and;
a first doped lateral region adjacent to the first vertical region,
a second doped lateral region adjacent to the second vertical region;
wherein the doping in the second lateral region is of an opposite sense to the doping in first vertical region.

2A. An active optical waveguide according to any preceding para, wherein:
the first vertical region is composed of the active material or Si.

3A. An active optical waveguide according to any preceding para, wherein:
the second vertical region is composed of the active material or Si.

4A. An active optical waveguide according to any preceding para, wherein:
the first lateral region is composed of the active material or Si.

5A. An active optical waveguide according to any preceding para, wherein:
the second lateral region is composed of the active material or Si.

6A. An active optical waveguide according to any preceding para, wherein:
the active material is Ge or SiGe.

7A. An active optical waveguide according to any preceding para, wherein:
the second vertical region is completely undoped or intrinsic.

8A. An active optical waveguide according to any preceding para, wherein:
the first vertical region is p-doped and the second lateral region is n-doped.

9A. An active optical waveguide according to any one of paras 1A-7A, wherein:
the first vertical region is n-doped, and the second lateral region is p-doped.

10A. An active optical waveguide according to any preceding para, wherein:
the doping concentration in the first vertical region is non-uniform across thickness of the first vertical region.

11A. An active optical waveguide according to any preceding para, wherein:
the doping concentration in the second lateral region is non-uniform across a width of the second lateral region.

12A. An active optical waveguide according to any preceding para further comprising:
at least one electrical contact on the first lateral region, and;
at least one electrical contact on the second lateral region.

13A. An active optical waveguide according to any preceding para, wherein:
the vertical extent of the doping in the first vertical region exceeds the thickness of the doping in the second lateral region.

14A. An active optical waveguide according to any preceding para, wherein:
the vertical extent of the doping in the first vertical region exceeds the height of any doping in the second vertical region.

15A. An active optical waveguide according to any preceding para, wherein:
the central region is intrinsically n-doped.

16A. An active optical waveguide according to any preceding para, wherein:
a pn-junction is formed within the central region between the first vertical region and the second lateral region.

17A. An optical waveguide according to any preceding para, wherein:
the waveguide is located on a silicon on insulator (SOI) base.

18A. An optical device including an active optical waveguide according to any preceding para, wherein:
the device is an optical modulator.

19A. An optical device including an active optical waveguide according to any preceding para, wherein in use:
the application of an electric field to the central region, between the first vertical region and the second lateral region, gives rise to a Franz-Keldysh (FK) effect in the active material.

20A. An optical device including an active optical waveguide according to any preceding para, wherein:
the device is a photodetector.

21A. An optical device according to any one of paras 18A-20A, wherein:
the device is connected to at least one Si waveguide.

22A. An optical device according to any one of paras 18A-20A, wherein:
the active material is SiGe, and;
the device is connected to at least one Si waveguide.

Group B

1B. An active optical waveguide comprising:
a central waveguide region being made from an undoped or intrinsic semiconductor material;
a first doped semiconductor region on a first side of the central waveguide region;
a second doped semiconductor region on a second side of the central waveguide region;
wherein the first and second sides of the central waveguide region are opposite one another;
the doping in the first semiconductor region is of an opposite sense to the doping in the second semiconductor region, and;
the central waveguide region has a greater height than either of the first doped semiconductor region and the second doped semiconductor region.

2B. An active optical waveguide according to para 1B, wherein:
the first semiconductor region is p-doped, and;
the second semiconductor region is n-doped.

3B. An active optical waveguide according to para 1 or para 2, wherein:
the first semiconductor region, the second semiconductor region, and the central waveguide region together form a PIN junction.

4B. An active optical waveguide according to any preceding para, further comprising:
an intervening lightly p-doped semiconductor region located between the p-doped semiconductor region and the central waveguide region;
wherein the intervening lightly p-doped semiconductor region has a lower dopant concentration than the p-doped semiconductor region.

5B. An active optical waveguide according to any preceding para, further comprising:
an intervening lightly n-doped semiconductor region located between the n-doped semiconductor region and the central waveguide region;
wherein the intervening lightly n-doped semiconductor region has a lower dopant concentration than the n-doped semiconductor region.

6B. An active optical waveguide according to any preceding para, wherein:
the central waveguide is composed of Ge or SiGe.

7B. An active optical waveguide according to any preceding para, wherein:
the central waveguide is composed of Ge or SiGe and the doped semiconductor regions are composed of Si.

8B. An active optical waveguide according to any one of paras 1B-5B, wherein:
the central waveguide region, the first semiconductor region, and the second semiconductor region are all composed of Ge or SiGe.
9B. An active optical waveguide according to any one of para 4B or para 5B, wherein:
the central waveguide region, the n-doped semiconductor region, the p-doped semiconductor region, the lightly p-doped semiconductor region, and the lightly n-doped semiconductor region are all composed of Ge or SiGe.
10B. An optical waveguide according to any preceding para, wherein:
the waveguide is located on a silicon on insulator (SOI) base.
11B. A optical waveguide according to any preceding para, wherein:
a wall of the central waveguide region adjacent to the p-doped semiconductor region is p-doped.
12B. A optical waveguide according to any preceding para, wherein:
a wall of the central waveguide region adjacent to the n-doped semiconductor region is n-doped.
13B. An optical device including an active optical waveguide according to any preceding para, wherein:
the device is an optical modulator.
14B. An optical device including an active optical waveguide according to any preceding para, wherein in use:
the application of an electric field to the central region, between the first vertical region and the second lateral region, gives rise to a Franz-Keldysh (FK) effect in the active material.
15B. An optical device including an active optical waveguide according to any preceding para, wherein:
the device is a photodetector.
16B. An optical device according to any one of paras 13B-15B, wherein:
the device is connected to at least one Si waveguide.
17B. An optical device according to any one of paras 13B-15B, wherein:
the active material is Ge or SiGe, and;
the device is connected to at least one Si waveguide.
18B. An optical device according any one of paras 11B and 12B is connected to at least one Si waveguide of a larger size than the central waveguide via at least one Si waveguide spot size converter.
19B. A optical waveguide according to any preceding para, wherein:
the central region is upstanding from the p-doped region and the n-doped region by a distance that is less than the height of the p-doped region or the n-doped region.
Group C: MZ with (Optical Devices of Group A);
1C. A Mach-Zehnder modulator with two arms, comprising:
a left arm comprising a left active optical waveguide, and a right arm comprising a right active optical waveguide;
wherein each of the left and right optical waveguides are according to any para of Group A;
wherein the first lateral region of the left optical waveguide is integral with the first lateral region of the right optical waveguide in a region between the left and right arms, forming a common doped region.
2C. A Mach-Zehnder modulator according to para 1C, further comprising:
a common electrode connected to the common doped region.
3C. A Mach-Zehnder modulator according to para 1C, further comprising:
a plurality of common lumped electrodes attached to the common doped region along the waveguide.
4C. A Mach-Zehnder modulator according to para 3C, wherein:
the plurality of common lumped electrodes are electrically connected to each other.
5C. A Mach-Zehnder modulator according to any preceding para, further comprising:
a single left electrode connected to the second lateral region of the left waveguide, and;
a single right electrode connected to the second lateral region of the right waveguide.
6C. A Mach-Zehnder modulator according to para 5C, wherein:
the left and right electrodes are each lumped electrodes or traveling wave electrodes.
7C. A Mach-Zehnder modulator according to para 2C or para 3C, further comprising:
a plurality of left lumped electrodes connected along the waveguide to the second lateral region of the left waveguide, and;
a plurality of right lumped electrodes connected along the waveguide to the second lateral region of the right waveguide;
wherein the number of left lumped electrodes and the number of right lumped electrodes are the same.
8C. A Mach-Zehnder modulator according to para 7C, wherein:
the plurality of left lumped electrodes, the plurality of right lumped electrodes, and the plurality of central electrodes are contained within a single of active material.
9C. A Mach-Zehnder modulator according to para 3C, further comprising:
a plurality of left lumped electrodes connected along the waveguide to the second lateral region of the left waveguide, and;
a plurality of right lumped electrodes connected along the waveguide to the second lateral region of the right waveguide;
wherein the number of left lumped electrodes, the number of right lumped electrodes, and the number of common electrodes is the same.
10C. A Mach-Zehnder modulator according to para 9C, wherein:
the plurality of left lumped electrodes, the plurality of right lumped electrodes, and the central electrode are contained within a single of active material.
11C. A Mach-Zehnder modulator according to any one of paras 7C-9C, wherein:
the electrodes comprises a plurality of electrode subgroups, each electrode subgroup comprising:
at least one of the plurality of right electrodes;
at least one of the plurality of left electrodes, and;
at least one of the plurality of central electrodes;
each electrode subgroup being located in a separate cavity of active material from each other electrode subgroup.
12C. A Mach-Zehnder modulator according to any preceding para, wherein:
the modulator is configured to be operated in a push-pull mode.
13C. A Mach-Zehnder modulator according to any preceding para, wherein:
each arm of the modulator is configured to be operated as a phase modulator.

Group D: MZ with (Optical Devices of Group B);

1D. A Mach-Zehnder modulator comprising:
a left arm and a right arm:
the left arm comprising a left active optical waveguide, and;
the right arm comprising a right active optical waveguide;
wherein each of the left and right optical waveguides are according to any para of Group B, and;
wherein the first doped semiconductor region of the left waveguide is integral with the first doped semiconductor region of the right waveguide in a common doped region located between the left arm and the right arm.

2D. A Mach-Zehnder modulator according to para 1D, further comprising:
a common electrode attached to the common doped region.

3D. A Mach-Zehnder modulator according to para 1D, further comprising:
a plurality of common electrodes attached to the common doped region along the waveguide.

4D. A Mach-Zehnder modulator according to para 3D, wherein:
the plurality of common electrodes are electrically connected to each other.

5D. A Mach-Zehnder modulator according to para 2D, further comprising:
a single left electrode connected to the second doped semiconductor region of the left waveguide, and;
a single right electrode connected to the second doped semiconductor region of the right waveguide.

6D. A Mach-Zehnder modulator according to para 5D, wherein:
the left and right electrodes are each lumped electrodes or traveling wave electrodes.

7D. A Mach-Zehnder modulator according to para 2D or para 3D, further comprising:
a plurality of left lumped electrodes connected along the waveguide to the second doped semiconductor region of the left waveguide, and;
a plurality of right lumped electrodes connected along the waveguide to the second doped semiconductor region of the right waveguide;
wherein the number of left lumped electrodes and the number of right lumped electrodes are the same.

8D. A Mach-Zehnder modulator according to para 7D, wherein:
the plurality of left lumped electrodes, the plurality of right lumped electrodes, and the plurality of central electrodes are contained within a single cavity of active material.

9D. A Mach-Zehnder modulator according to para 3D, further comprising:
a plurality of left lumped electrodes connected along the waveguide to the second doped semiconductor region of the left waveguide, and;
a plurality of right lumped electrodes connected along the waveguide to the second doped semiconductor region of the right waveguide;
wherein the number of left lumped electrodes, the number of right lumped electrodes, and the number of common electrodes are the same.

10D. A Mach-Zehnder modulator according to para 9D, wherein:
the plurality of left lumped electrodes, the plurality of right lumped electrodes, and the central electrode are contained within a single cavity of active material.

11D. A Mach-Zehnder modulator according to para 9D, wherein:
the electrodes comprise a plurality of electrode subgroups, each electrode subgroup comprising:
at least one of the plurality of right lumped electrodes;
at least one of the plurality of left lumped electrodes, and;
at least one of the plurality of central electrodes;
each electrode subgroup being located in a separate cavity of active material from each other electrode subgroup.

12D. A Mach-Zehnder modulator according to any preceding para, wherein:
the modulator is configured to be operated in a push-pull mode.

13D. A Mach-Zehnder modulator according to any preceding para, wherein:
each arm of the modulator is configured to be operated as a phase modulator.

Group E: MZ with Doped Si Walls

1E. A Mach-Zehnder modulator, comprising a left arm and a right arm:
the left arm comprising a left active optical waveguide, and;
the right arm comprising a right active optical waveguide;
each active optical waveguide comprising:
a SiGe central waveguide region;
a first wall of doped Si on a first side of the central region;
a second wall of doped Si on a second side of the central region, and;
a first lateral region of doped Si adjacent to the first wall, the first lateral region having the same doping as the first wall, and;
a second lateral region of doped Si adjacent to the second wall;
the second lateral region having the same doping as the second wall;
wherein, the first lateral region of the left optical waveguide is integral with the first lateral region of the right optical waveguide in a common doped region located between the arms of the modulator.

2E. A Mach-Zehnder modulator according to para 1E, wherein:
the common doped region and the first walls are each n-doped and;
the second walls are p-doped.

3E. A Mach-Zehnder modulator according to para 1E, wherein:
the common doped region and the first walls are each p-doped and;
the second walls are n-doped.

4E. A Mach-Zehnder modulator according to any preceding para, further comprising:
a common electrode attached to the common doped region.

5E. A Mach-Zehnder modulator according to any one of paras 1E-3E, further comprising:
a plurality of common electrodes attached to the common doped region along the waveguide.

6E. A Mach-Zehnder modulator according to para 5E, wherein:
the plurality of common electrodes are electrically connected to each other.

7E. A Mach-Zehnder modulator according to any one of paras 1E-4E, further comprising:
a single left electrode connected to the second lateral region of the left waveguide, and;
a single right electrode connected to the second lateral region of the right waveguide.

8E. A Mach-Zehnder modulator according to para 5E, wherein:
the left and right electrodes are each lumped electrodes or traveling wave electrodes.

9E. A Mach-Zehnder modulator according to para 4E, further comprising:
a plurality of left lumped electrodes connected along the waveguide to the second lateral region of the left waveguide, and;
a plurality of right lumped electrodes connected along the waveguide to the second lateral region of the right waveguide;
wherein the number of left lumped electrodes and the number of right lumped electrodes is the same.

10E. A Mach-Zehnder modulator according to para 9E, wherein:
the plurality of left lumped electrodes, the plurality of right lumped electrodes, and the plurality of central electrodes are contained within a single cavity of active material.

11E. A Mach-Zehnder modulator according to para 5E, further comprising:
a plurality of left lumped electrodes connected along the waveguide to the second lateral region of the left waveguide, and;
a plurality of right lumped electrodes connected along the waveguide to the second lateral region of the right waveguide;
wherein the number of left lumped electrodes, the number of right lumped electrodes, and the number of common electrodes are the same.

12E. A Mach-Zehnder modulator according to para 9E, wherein:
the plurality of left lumped electrodes, the plurality of right lumped electrodes, and the central electrode are contained within a single of active material.

13E. A Mach-Zehnder modulator according to para 11E, wherein:
the electrodes comprises a plurality of electrode subgroups, each electrode subgroup comprising:
at least one of the plurality of right lumped electrodes;
at least one of the plurality of left lumped electrodes, and;
at least one of the plurality of central electrode;
each electrode subgroup being located in a separate cavity of active material from each other electrode subgroup.

14E. A Mach-Zehnder modulator according to any preceding para, wherein:
the modulator is configured to be operated in a push-pull mode.

15E. A Mach-Zehnder modulator according to any preceding para, wherein:
each arm of the modulator is configured to be operated as a phase modulator.

Group F: MZ with Isolated Arms According to the Optical Waveguide Devices of Group A.

1F. A Mach-Zehnder modulator with two arms, comprising:
a left arm comprising a left active optical waveguide, and the right arm comprising a right active optical waveguide;
each of the left and right optical waveguides are according to any para of Group A;
wherein the left optical waveguide is electrically isolated from the right optical waveguide by a central isolating region.

2F. A Mach-Zehnder modulator according to para 1F, wherein:
the first vertical regions are each n-doped and;
the second lateral regions are each p-doped.

3F. A Mach-Zehnder modulator according to para 1F, wherein:
the first vertical regions are each p-doped and;
the second lateral regions are each n-doped.

4F. A Mach-Zehnder modulator according to any preceding para, further comprising:
a first single left electrode connected to the first lateral region of the left waveguide, and;
a first single right electrode connected to the first lateral region of the right waveguide.
a second single left electrode connected to the second lateral region of the left waveguide, and;
a second single right electrode connected to the second lateral region of the right waveguide.

5F. A Mach-Zehnder modulator according to para 4F, wherein:
the first single left electrode, the first single right electrode, the second single left electrode and the second single right electrode are each a lumped electrode or a traveling wave electrode.

6F. A Mach-Zehnder modulator according to any one of paras 1F-3F, further comprising:
a first plurality of left lumped electrodes connected along the first lateral region of the left waveguide, and;
a first plurality of right lumped electrodes connected along the first lateral region of the right waveguide;
a second plurality of left lumped electrodes connected along the second lateral region of the left waveguide, and;
a second plurality of right lumped electrodes connected along the second lateral region of the right waveguide;
wherein the number of first left lumped electrodes, the number of first right lumped electrodes, the number of second left lumped electrodes, and the number of second right lumped electrodes are the same.

7F. A Mach-Zehnder modulator according to para 6F, wherein:
wherein the plurality of first left lumped electrodes, the plurality of first right lumped electrodes, the plurality of second left lumped electrodes, and the plurality of second right lumped electrodes are located in a single cavity of active material.

8F. A Mach-Zehnder modulator according to para 6F, wherein:
the electrodes comprises a plurality of electrode subgroups, each electrode subgroup comprising: at least one of the plurality of first right lumped electrodes;
at least one of the plurality of first left lumped electrodes;
at least one of the plurality of second right lumped electrodes;
at least one of the plurality of second left lumped electrodes, and;
each electrode subgroup being located in a separate cavity of active material from each other electrode subgroup.

9F. A Mach-Zehnder modulator according to any preceding para, wherein:
each arm of the modulator is configured to be operated as a phase modulator.

Group G: MZ with Isolated Arms According to the Optical Devices of Group B

1G. A Mach-Zehnder modulator comprising:
a left arm and a right arm:
the left arm comprising a left active optical waveguide, and;
the right arm comprising a right active optical waveguide;
wherein each of the left and right optical waveguides are according to any para of Group B, and;
wherein the left waveguide is electrically isolated from the right waveguide by a central isolating region.

2G. A Mach-Zehnder modulator according to para 1G, wherein:
the first semiconductor regions are each n-doped and;
the second semiconductor regions are each p-doped.

3G. A Mach-Zehnder modulator according to para 1G, wherein:
the first semiconductor regions are each p-doped and;
the second semiconductor regions are each n-doped.

4G. A Mach-Zehnder modulator according to any one of paras 1G-3G, further comprising:
a first single left electrode connected to the first semiconductor region of the left waveguide, and;
a first single right electrode connected to the first semiconductor region of the right waveguide.
a second single left electrode connected to the second semiconductor region of the left waveguide, and;
a second single right electrode connected to the second semiconductor region of the right waveguide.

5G. A Mach-Zehnder modulator according to para 4G, wherein:
the first single left electrode, the first single right electrode, the second single left electrode and the second single right electrode are each a lumped electrode or a traveling wave electrode.

6G. A Mach-Zehnder modulator according to any one of paras 1G-3G, further comprising:
a first plurality of left lumped electrodes connected along the first semiconductor region of the left waveguide, and;
a first plurality of right lumped electrodes connected along the first semiconductor region of the right waveguide;
a second plurality of left lumped electrodes connected along the second semiconductor region of the left waveguide, and;
a second plurality of right lumped electrodes connected along the second semiconductor region of the right waveguide;
wherein the number of first left lumped electrodes, the number of first right lumped electrodes, the number of second left lumped electrodes, and the number of second right lumped electrodes are the same.

7G. A Mach-Zehnder modulator according to para 6G, wherein:
the plurality of first left lumped electrodes, the plurality of first right lumped electrodes, the plurality of second left lumped electrodes, and the plurality of second right lumped electrodes are contained with a single cavity of active material.

8G. A Mach-Zehnder modulator according to para 6G, wherein:
the electrodes comprises a plurality of electrode subgroups, each electrode subgroup comprising:
at least one of the plurality of first right lumped electrodes;
at least one of the plurality of first left lumped electrodes, and;
at least one of the plurality of second right lumped electrodes;
at least one of the plurality of second left lumped electrodes, and;
each electrode subgroup being located in a separate cavity of active material from each other electrode subgroup.

9G. A Mach-Zehnder modulator according to any preceding para, wherein:
each arm of the modulator is configured to be operated as a phase modulator.

Group H: MZ with Isolated Arms, the Arms Including Doped Si Walls

1H. A Mach-Zehnder modulator, comprising a left and a right arm, the left and right arms being parallel, wherein:
each of the two arms comprises at least one active optical waveguide, each active optical waveguide comprising:
a SiGe central waveguide region;
a first wall of doped Si on a first side of the central region;
a second wall of doped Si on a second side of the central region, and;
a first lateral region of doped Si adjacent to the first wall, the first lateral region having the same doping as the first wall, and;
a second lateral region of doped Si adjacent to the second wall;
the second lateral region having the same doping as the second wall;
wherein the doping in the first wall is of an opposite sense to the doping in second wall, and;
wherein, the left optical waveguide is electrically isolated from the right optical waveguide by a central isolating region.

2H. A Mach-Zehnder modulator according to para 1H, wherein:
the first walls are each n-doped and;
the second walls are each p-doped.

3H. A Mach-Zehnder modulator according to para 1H, wherein:
the first walls are each p-doped and;
the second walls are each n-doped.

4H. A Mach-Zehnder modulator according to any one of paras 1H-3H, further comprising:
a first single left electrode connected to the first lateral region of the left waveguide, and;
a first single right electrode connected to the first lateral region of the right waveguide.
a second single left electrode connected to the second lateral region of the left waveguide, and;
a second single right electrode connected to the second lateral region of the right waveguide.

5H. A Mach-Zehnder modulator according to para 4H, wherein:
the first and second left and right electrodes are each lumped electrodes or traveling wave electrodes 6H. A Mach-Zehnder modulator according to para 4H, further comprising:
a first plurality of left lumped electrodes connected along the first lateral region of the left waveguide, and;
a first plurality of right lumped electrodes connected along the first lateral region of the right waveguide;
a second plurality of left lumped electrodes connected along the second lateral region of the left waveguide, and;
a second plurality of right lumped electrodes connected along the second lateral region of the right waveguide;
wherein the number of first left lumped electrodes, the number of first right lumped electrodes, the number of second left lumped electrodes, and the number of second right lumped electrodes are the same.

7H. A Mach-Zehnder modulator according to para 9H, wherein:
the plurality of left lumped electrodes, the plurality of right lumped electrodes, and the plurality of central electrodes are contained within a single cavity of active material.

8H. A Mach-Zehnder modulator according to para 9H, wherein:
the electrodes comprises a plurality of electrode subgroups, each electrode subgroup comprising:
at least one of the plurality of first right lumped electrode;
at least one of the plurality of first left lumped electrode, and;
at least one of the plurality of second right lumped electrodes;
at least one of the plurality of second left lumped electrodes, and;
each electrode subgroup being located in a separate cavity of active material from each other electrode subgroup.

9H. A Mach-Zehnder modulator according to any preceding para, wherein:
each arm of the modulator is configured to be operated as a phase modulator.

Group I

1I. A system, comprising:
a silicon-on-insulator chip, and
an active optical waveguide,
wherein the silicon-on-insulator chip comprises:
a substrate,
an insulating layer, on the substrate, and
a silicon layer on the insulating layer; and
wherein:
the active optical waveguide comprises:
a central waveguide region composed of an active material;
a first vertical region on a first side of the central waveguide region, the first vertical region being at least partially doped;
a second vertical region on a second side of the central waveguide region, the second vertical region being at least partially doped;
a first doped lateral region adjacent to the first vertical region; and
a second doped lateral region adjacent to the second vertical region,
the doping in the second vertical region is of an opposite sense to the doping in the first vertical region,
the doping in the second doped lateral region is of an opposite sense to the doping in the first doped lateral region, and
the active optical waveguide is a substrate-based optical waveguide on the substrate.

2I. A system according to para 1I, wherein the first vertical region is p-doped and the second doped lateral region is n-doped.

3I. A system according to any one of the preceding paras, wherein the first vertical region is n-doped, and the second doped lateral region is p-doped.

4I. A system according to any one of the preceding paras, further comprising:
at least one electrical contact on the first doped lateral region, and
at least one electrical contact on the second doped lateral region.

5I. A system according to any one of the preceding paras, wherein the vertical extent of the doping in the first vertical region exceeds the height of any doping in the second vertical region.

6I. A system according to any one of the preceding paras, wherein:
the central waveguide region is intrinsically n-doped, and
a PN junction is formed within the central waveguide region between the first vertical region and the second doped lateral region.

7I. A system according to any one of the preceding paras, comprising:
an optical device including the active optical waveguide, and
a silicon waveguide,
wherein the optical device is connected to the silicon waveguide.

8I. A system according to any one of the preceding paras, comprising an optical device including the active optical waveguide, wherein the optical device is an optical modulator.

9I. A system according to any one of the preceding paras, wherein, in use, the application of an electric field to the central waveguide region, between the first vertical region and the second doped lateral region, gives rise to a Franz-Keldysh (FK) effect in the active material.

10I. A system according to any one of the preceding paras, wherein the active material is Ge or SiGe.

Group J

1J. A system, comprising:
a silicon-on-insulator chip, and
an active optical waveguide,
wherein the silicon-on-insulator chip comprises:
a substrate,
an insulating layer, on the substrate, and
a silicon layer on the insulating layer; and
wherein:
the active optical waveguide comprises:
a central waveguide region made from an undoped or intrinsic semiconductor material;
a first doped semiconductor region on a first side of the central waveguide region; and
a second doped semiconductor region on a second side of the central waveguide region,
the first and second sides of the central waveguide region are opposite one another,
the doping in the first doped semiconductor region is of an opposite sense to the doping in the second doped semiconductor region, and
the active optical waveguide is a substrate-based optical waveguide on the substrate.

2J. A system according to para 1J, wherein:
the central waveguide region has a greater height than either of the first doped semiconductor region and the second doped semiconductor region, and
the central waveguide region is upstanding from the first doped semiconductor region and the second doped semiconductor region by a distance that is less than the height of the first doped semiconductor region or the second doped semiconductor region.

J3. A system according to any one of the preceding paras, wherein:
the first doped semiconductor region is p-doped,
the second doped semiconductor region is n-doped, and
the first doped semiconductor region, the second doped semiconductor region, and the central waveguide region together form a PIN junction.

J4. A system according to any one of the preceding paras, further comprising:
an intervening lightly p-doped semiconductor region located between the p-doped semiconductor region and the central waveguide region; and an intervening lightly n-doped semiconductor region located between the n-doped semiconductor region and the central waveguide region,
wherein:
the intervening lightly p-doped semiconductor region has a lower dopant concentration than the p-doped semiconductor region, and
the intervening lightly n-doped semiconductor region has a lower dopant concentration than the n-doped semiconductor region.

J5. A system according to any one of the preceding paras, wherein the n-doped semiconductor region, the p-doped semiconductor region, the lightly p-doped semiconductor region, and the lightly n-doped semiconductor region are all composed of Ge or SiGe.

J6. A system according to any one of the preceding paras, wherein the first doped semiconductor region and the second doped semiconductor region are both composed of Si.

J7. A system according to any one of the preceding paras, wherein the first doped semiconductor region and the second doped semiconductor region are both composed of Ge or SiGe.

J8. A system according to any one of the preceding paras, comprising:
an optical device including the active optical waveguide, and
a silicon waveguide,
wherein the optical device is connected to the silicon waveguide.

J9. A system according to any one of the preceding paras, comprising an optical device including the active optical waveguide, wherein the optical device is an optical modulator.

J10. A system according to any one of the preceding paras, wherein, in use, the application of an electric field to the central waveguide region, between the first vertical region and the second doped lateral region, gives rise to a Franz-Keldysh (FK) effect in the active material.

11J. A system according to any one of the preceding paras, wherein the active material is Ge or SiGe.

Although exemplary embodiments of a Mach-Zehnder waveguide modulator have been specifically described and illustrated herein, many modifications and variations will be apparent to those skilled in the art. Accordingly, it is to be understood that a Mach-Zehnder modulator constructed according to principles of this invention may be embodied other than as specifically described herein. The invention is also defined in the following claims, and equivalents thereof.

What is claimed is:

1. An active optical waveguide, comprising:
a central waveguide region composed of an active material;
a first vertical region on a first side of the central waveguide region, the first vertical region being at least partially doped;
a second vertical region on a second side of the central waveguide region, the second vertical region being at least partially doped;
a first doped lateral region adjacent to the first vertical region; and
a second doped lateral region adjacent to the second vertical region,
wherein:
the doping in the second vertical region is of an opposite sense to the doping in the first vertical region,
the doping in the second doped lateral region is of an opposite sense to the doping in the first doped lateral region,
a vertical extent of the doping in the first vertical region exceeds a height of any doping in the second vertical region, and
the active material is Ge or SiGe.

2. An active optical waveguide according to claim 1, wherein the first vertical region is p-doped and the second doped lateral region is n-doped.

3. An active optical waveguide according to claim 1, wherein the first vertical region is n-doped, and the second doped lateral region is p-doped.

4. An active optical waveguide according to claim 1, further comprising:
at least one electrical contact on the first doped lateral region, and
at least one electrical contact on the second doped lateral region.

5. A system, comprising:
an optical device including an active optical waveguide according to claim 1, and
a silicon waveguide,
wherein:
the active optical waveguide is located on a silicon on insulator (SOI) base, and
the optical device is connected to the silicon waveguide.

6. An optical device including an active optical waveguide according to claim 1, wherein the optical device is an optical modulator.

7. An optical device including an active optical waveguide according to claim 1, wherein the optical device is configured to give rise to a Franz-Keldysh (FK) effect in the active material in response to an application of an electric field to the central waveguide region, between the first vertical region and the second doped lateral region.

8. An active optical waveguide, comprising:
a central waveguide region composed of an active material;
a first vertical region on a first side of the central waveguide region, the first vertical region being at least partially doped;
a second vertical region on a second side of the central waveguide region, the second vertical region being at least partially doped;
a first doped lateral region adjacent to the first vertical region; and
a second doped lateral region adjacent to the second vertical region,
wherein:
the doping in the second vertical region is of an opposite sense to the doping in the first vertical region,
the doping in the second doped lateral region is of an opposite sense to the doping in the first doped lateral region,
the active material is Ge or SiGe,
the central waveguide region is intrinsically n-doped, and
a PN junction is formed within the central waveguide region between the first vertical region and the second doped lateral region.

9. An active optical waveguide comprising:
a central waveguide region made from an undoped or intrinsic semiconductor material;
a first doped semiconductor region on a first side of the central waveguide region; and
a second doped semiconductor region on a second side of the central waveguide region,
wherein:
the first and second sides of the central waveguide region are opposite one another,
the doping in the first doped semiconductor region is of an opposite sense to the doping in the second doped semiconductor region,
the first doped semiconductor region and the second doped semiconductor region are both composed of Ge or SiGe, and
the central waveguide region is composed of Ge or SiGe.

10. An active optical waveguide according to claim 9, wherein:
the central waveguide region has a greater height than either of the first doped semiconductor region and the second doped semiconductor region, and
the central waveguide region is upstanding from the first doped semiconductor region and the second doped semiconductor region by a distance that is less than the height of the first doped semiconductor region or the second doped semiconductor region.

11. An active optical waveguide according to claim 9, wherein the first doped semiconductor region and the second doped semiconductor region are both composed of Si.

12. A system, comprising:
an optical device including an active optical waveguide according to claim 9, and
a silicon waveguide,
wherein:
the active optical waveguide is located on a silicon on insulator (SOI) base, and
the optical device is connected to the silicon waveguide.

13. An optical device including an active optical waveguide according to claim 9, wherein the optical device is an optical modulator.

14. An optical device including an active optical waveguide according to claim 9, wherein the optical device is configured to give rise to a Franz-Keldysh (FK) effect in the central waveguide region in response to an application of an electric field to the central waveguide region, between the first doped semiconductor region and the second doped semiconductor region.

15. An active optical waveguide comprising:
a central waveguide region made from an undoped or intrinsic semiconductor material;
a p-doped semiconductor region on a first side of the central waveguide region;
an n-doped semiconductor region on a second side of the central waveguide region;
an intervening lightly p-doped semiconductor region located between the p-doped semiconductor region and the central waveguide region; and
an intervening lightly n-doped semiconductor region located between the n-doped semiconductor region and the central waveguide region,
wherein:
the first and second sides of the central waveguide region are opposite one another,
the central waveguide region is composed of Ge or SiGe,
the p-doped semiconductor region, the n-doped semiconductor region, and the central waveguide region together form a PIN junction,
the intervening lightly p-doped semiconductor region has a lower dopant concentration than the p-doped semiconductor region, and
the intervening lightly n-doped semiconductor region has a lower dopant concentration than the n-doped semiconductor region.

16. An active optical waveguide according to claim 15, wherein the n-doped semiconductor region, the p-doped semiconductor region, the intervening lightly p-doped semiconductor region, and the intervening lightly n-doped semiconductor region are all composed of Ge or SiGe.

17. A system, comprising:
a silicon-on-insulator chip, and
an optoelectronic device,
wherein the silicon-on-insulator chip comprises:
a substrate,
an insulating layer, on the substrate, and
a silicon layer on the insulating layer; and
wherein:
the optoelectronic device comprises a portion of an optical waveguide, the optical waveguide comprising a rib extending upwards from a surrounding slab;
the rib has a first sidewall, and a second sidewall parallel to the first sidewall;
the rib includes a first region of a first conductivity type and a second region of a second conductivity type different from the first conductivity type;
the second region has:
a first portion parallel to and extending to the first sidewall, and
a second portion parallel to the second sidewall;
the first region extends between the first portion of the second region and the second portion of the second region; and
the optoelectronic device is a substrate-based optoelectronic device on the substrate.

18. The system of claim 17, wherein:
the rib further includes a third region of the first conductivity type;
the third region is parallel to and extends to the second sidewall; and
the second portion of the second region is between the first region and the third region.

\* \* \* \* \*